United States Patent
Park et al.

(10) Patent No.: US 12,441,713 B2
(45) Date of Patent: Oct. 14, 2025

(54) ORGANIC COMPOUND AND ORGANIC ELECTROLUMINESCENT DEVICE COMPRISING THE SAME

(71) Applicant: SOLUS ADVANCED MATERIALS CO., LTD., Iksan-si (KR)

(72) Inventors: Woojae Park, Yongin-si (KR); Minsik Eum, Yongin-si (KR); Jaeyi Sim, Yongin-si (KR); Yonghwan Lee, Yongin-si (KR)

(73) Assignee: SOLUS ADVANCED MATERIALS CO., LTD., Iksan-si (KR)

( * ) Notice: Subject to any disclaimer, the term of this patent is extended or adjusted under 35 U.S.C. 154(b) by 831 days.

(21) Appl. No.: 17/299,190

(22) PCT Filed: Dec. 2, 2019

(86) PCT No.: PCT/KR2019/016862
§ 371 (c)(1),
(2) Date: Jun. 2, 2021

(87) PCT Pub. No.: WO2020/116881
PCT Pub. Date: Jun. 11, 2020

(65) Prior Publication Data
US 2022/0077400 A1    Mar. 10, 2022

(30) Foreign Application Priority Data

Dec. 3, 2018  (KR) .......... 10-2018-0153997

(51) Int. Cl.
| | | |
|---|---|---|
| *H01L 51/54* | (2006.01) | |
| *C07D 401/14* | (2006.01) | |
| *C07D 403/10* | (2006.01) | |
| *C07D 403/14* | (2006.01) | |
| *C07D 405/14* | (2006.01) | |
| *C09K 11/06* | (2006.01) | |
| *H10K 85/60* | (2023.01) | |
| *H10K 50/16* | (2023.01) | |

(52) U.S. Cl.
CPC ......... *C07D 403/10* (2013.01); *C07D 401/14* (2013.01); *C07D 403/14* (2013.01); *C07D 405/14* (2013.01); *C09K 11/06* (2013.01); *H10K 85/615* (2023.02); *H10K 85/622* (2023.02); *H10K 85/654* (2023.02); *H10K 85/6572* (2023.02); *H10K 85/6574* (2023.02); *C09K 2211/1018* (2013.01); *H10K 50/16* (2023.02)

(58) Field of Classification Search
None
See application file for complete search history.

(56) References Cited

U.S. PATENT DOCUMENTS

2017/0186962 A1    6/2017  Ren et al.

FOREIGN PATENT DOCUMENTS

| CN | 111406052 A | 7/2020 |
|---|---|---|
| KR | 10-2014-0094408 A | 7/2014 |
| KR | 10-2015-0092433 A | 8/2015 |
| KR | 10-2016-0090262 A | 7/2016 |
| KR | 10-2017-0078976 A | 7/2017 |
| KR | 10-2018-0055740 A | 5/2018 |
| KR | 10-2019-0055538 A | 5/2019 |

OTHER PUBLICATIONS

Machine Translation of KR20140094408. (Year: 2014).*
International Searching Authority, International Search Report of PCT/KR2019/016862 dated Apr. 3, 2020 [PCT/ISA/210].

* cited by examiner

*Primary Examiner* — Andrew K Bohaty
(74) *Attorney, Agent, or Firm* — Sughrue Mion, PLLC

(57) ABSTRACT

The present invention relates to: a novel compound having excellent electron transport ability and luminescence; and an organic EL device which includes the novel compound in one or more organic layers, and thus has improved characteristics, such as luminous efficiency, driving voltage, and lifespan.

16 Claims, No Drawings

ORGANIC COMPOUND AND ORGANIC ELECTROLUMINESCENT DEVICE COMPRISING THE SAME

CROSS REFERENCE TO RELATED APPLICATIONS

This application is a National Stage of International Application No. PCT/KR2019/016862 filed on Dec. 2, 2019, claiming priority based on Korean Patent Application No. 10-2018-0153997 filed on Dec. 3, 2018.

TECHNICAL FIELD

The present invention relates to a novel organic compound and an organic electroluminescent device using the same, and more particularly, to a compound having excellent electron transport ability and excellent luminescence characteristics and to an organic electroluminescent device having improved characteristics such as luminous efficiency, driving voltage, lifespan, and the like by including the compound in one or more organic layers.

Discussion of Related Art

Starting from Bernanose's observation of light emission from organic thin films in the 1950s, the study of organic electroluminescent devices (hereinafter, "EL devices") led to blue electroluminescence using anthracene monocrystals in 1965, and Tang suggested in 1987 an organic EL device in a stack structure which may be divided into functional layers of hole layers and light emitting layers. Then, in order to develop high efficiency, long lifespan organic EL devices, organic layers each having distinctive characteristics have been introduced in the EL devices, leading to the development of specialized materials used therein.

In organic EL devices, upon application of voltage between two electrodes, holes are injected from an anode (e.g., positive electrode) to an organic layer and electrons are injected from a cathode (e.g., negative electrode) into the organic layer. Injected holes and electrons meet each other to form excitons, and light emission occurs when the excitons fall to a ground state. In this case, materials used for the organic layer may be classified into, for example, luminescent materials, hole injection materials, hole transport materials, electron transport materials and electron injection materials depending on their function.

Luminescent materials may be classified into blue, green and red luminescent materials depending on their emission colors, and further into yellow and orange luminescent materials for realizing better natural colors. In addition, a host/dopant system may be employed in the luminescent material to increase color purity and luminous efficiency through energy transition.

Dopant materials may be classified into fluorescent dopants using organic materials and phosphorescent dopants using metal complex compounds which include heavy atoms such as Ir and Pt. In such a case, the developed phosphorescent materials may improve the luminous efficiency theoretically up to four times as compared to fluorescent materials, so attention is given to phosphorescent dopants as well as phosphorescent host materials.

To date, NPB, BCP and $Alq_3$, for example, are widely known as materials used in the hole injection layer, the hole transport layer, the hole blocking layer and the electron transport layer, and anthracene derivatives have been reported as luminescent materials. Particularly, metal complex compounds including Ir, such as FIrpic, $Ir(ppy)_3$, and $(acac)Ir(btp)_2$, which are known to have advantages in terms of efficiency improvement among luminescent materials, are used as blue, green and red phosphorescent dopant materials, and 4,4-dicarbazolybiphenyl (CBP) is used as a phosphorescent host material.

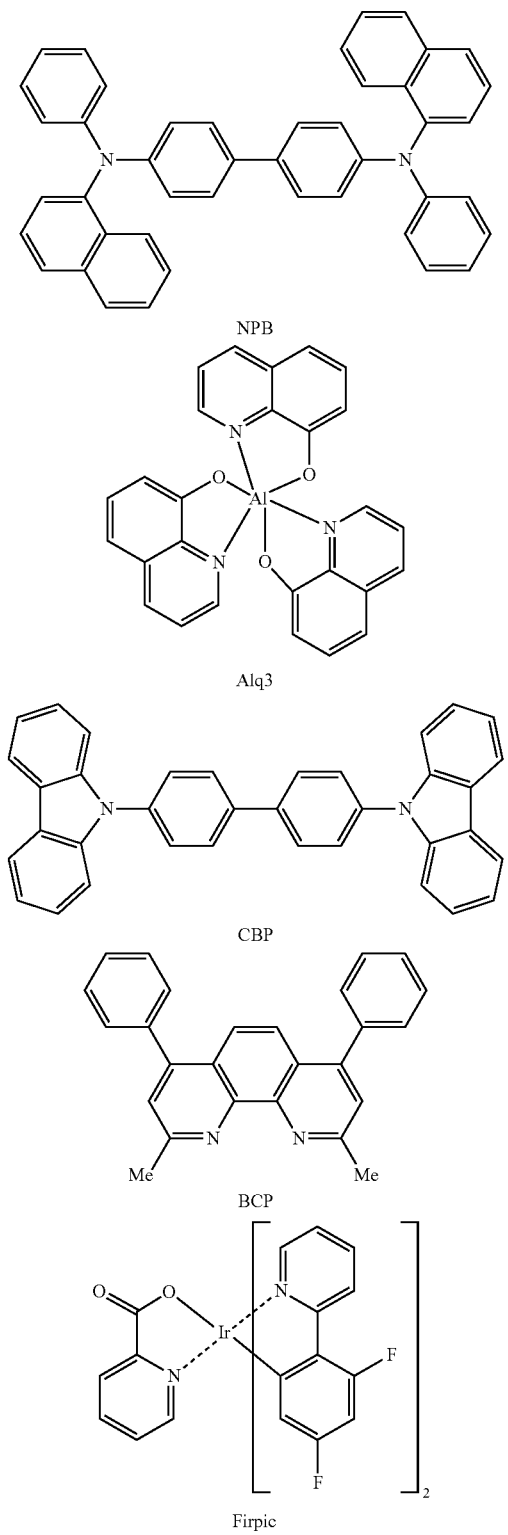

NPB $Alq_3$

CBP

BCP

Firpic

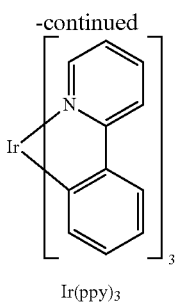

Ir(ppy)₃

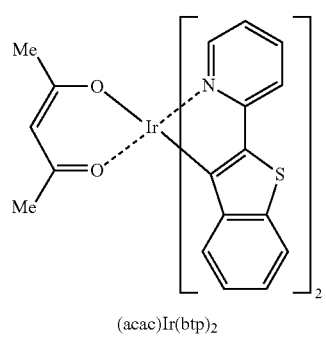

(acac)Ir(btp)₂

However, although conventional materials for organic layers are advantages in terms of luminescence properties, they have low glass transition temperatures, thus having poor thermal stability, and thus organic EL devices in which such conventional materials are used do not exhibit satisfactory lifespan characteristics.

Accordingly, there is a demand for organic layer materials that are excellent in performance.

PRIOR ART

Korean Patent Publication No. 2015-0092433 (Doosan Electronics)

DESCRIPTION OF THE INVENTION

[Technical Objectives]

The present invention is directed to a novel compound having excellent electron transport ability and luminescent characteristics to be applicable to an organic layer material of an organic EL device, specifically, a light emitting layer material, an electron transport layer material, or an electron transport auxiliary layer material.

In addition, the present invention is also directed to an organic EL device including the aforementioned novel compound, thereby having low driving voltage, high luminous efficiency, and improved lifespan.

[Technical Solution to the Problem]

According to an embodiment of the present invention, a compound is represented by the following Chemical Formula 1, wherein the compound is for an electron transport layer or an electron transport auxiliary layer:

[Chemical Formula 1]

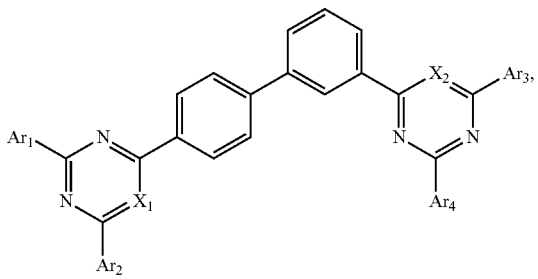

wherein in Chemical Formula 1,
one of $X_1$ and $X_2$ is $CR_1$ and the other is N;
$R_1$ is selected from the group consisting of: hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_1$ to $C_{40}$ phosphine group, a $C_1$ to $C_{40}$ phosphine oxide group and a $C_6$ to $C_{60}$ arylamine group,
$Ar_1$ to $Ar_4$ are each independently selected from the group consisting of: a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, and
the alkenyl group, the alkynyl group, the cycloalkyl group, the heterocycloalkyl group, the alkyl group, the aryl group, the heteroaryl group, the alkyloxy group, the aryloxy group, the alkylsilyl group, the arylsilyl group, the alkylboron group, the arylboron group, the arylphosphine group, the arylphosphine oxide group and the arylamine group of $R_1$ and $Ar_1$ to $Ar_4$ are each independently substituted or unsubstituted with one or more kinds of substituents selected from the group consisting of deuterium, a halogen group, a cyano group, a nitro group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_1$ to $C_{40}$ alkyl group, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, and when the substituents are plural in number, the substituents are the same as or different from each other.

According to an embodiment, an electron transport layer or an electron transport auxiliary layer includes the compound represented by Chemical Formula 1.

According to an embodiment, an organic electroluminescent device includes: an anode, a cathode, and one or more organic layer disposed between the anode and the cathode, wherein at least one of the one or more organic layer includes the compound represented by Chemical Formula 1.

In some embodiment, the organic layer including the compound represented by Chemical Formula 1 is selected from the group consisting of a light emitting layer, a hole injection layer, a hole transport layer, an electron injection layer, an electron transport layer, and an electron transport auxiliary layer.

Effects of the Invention

The compound represented by Chemical Formula 1 according to one or more embodiments of the present invention has excellent electron transport ability and luminescent characteristics to be applicable as an organic layer material of an organic EL device.

In particular, when the compound represented by Chemical Formula 1 according to one or more embodiments of the present invention is used as a material for a phosphorescent host, an electron transport layer, or an electron transport auxiliary layer, an organic EL device having a lower driving voltage and higher current efficiency than conventional host materials or electron transport materials may be prepared, and furthermore, it may be effectively applicable to a full-color display panel with improved performance and lifespan.

DETAILED DESCRIPTION OF THE INVENTION

Hereinafter, the present invention will be described in detail.

<Novel Organic Compounds>

A compound represented by Chemical Formula 1 according to the present invention has a base skeleton structure in which two different nitrogen-containing heterocycles are connected to each other by a biphenylene linker, of which one heterocycle is triazine, and the other one is pyrimidine. Since these triazine and pyrimidine are each a kind of 6-membered heterocycle with excellent electron withdrawing group (EWG) characteristics, they have strong electron-receiving characteristics. In addition, since triazine and pyrimidine having a strong EWG property are bonded at opposite ends, respectively, with respect to a major axis of molecules in the compound of Chemical Formula 1, it exhibits much stronger electron properties than a conventional bipolar material having both electron withdrawing group (EWG) and the electron donating group (EDG) properties. Accordingly, when the compound of Chemical Formula 1 is used as a material for an electron transport layer or an electron transport auxiliary layer, electrons may be well received from a cathode, and thus electrons may be smoothly transferred to a light emitting layer.

In addition, the compound of Chemical Formula 1 not only has a high triplet energy but also has a significantly increased molecular weight as compared to a conventional single 6-membered heterocyclic compound, and thus may have an improved glass transition degree and high thermal stability. Accordingly, in an organic EL device including the compound, durability and lifespan characteristics may be greatly improved.

In addition, the compound represented by Chemical Formula 1 is electrochemically stable, since two EWG groups (e.g., triazine, pyrimidine) are located at opposite ends of the molecular structure, and a biphenylene liner bonded in a para-meta position is linked between the two EWG groups.

Specifically, the compound has a structural characteristic in which with respect to one phenylene group (e.g., a first phenylene group) of the biphenylene linker, an adjacent nitrogen-containing heterocycle (e.g., an $X_1$-containing ring in Chemical Formula 1) and another phenylene group (e.g., a second phenylene group) are bonded in a para-position, and with respect to the another phenylene group (e.g., the second phenylene group), another nitrogen-containing heterocycle (e.g., an $X_2$-containing ring in Chemical Formula 1) and the phenylene group (e.g., the first phenylene group) are bonded in a meta-position. As such, the biphenyl linker linked in para-meta in such a manner extends a distance between the two EWG moieties, thereby minimizing interaction between these EWG moieties, and increasing the stability of the compound itself. In addition, the compound of Chemical Formula 1 including the biphenylene linker linked in para-meta exhibits an effect of inhibiting crystallization of an organic layer, as compared to the compound containing a biphenylene linker linked in para-para or meta-meta, while having the same skeleton structure. Accordingly, an organic EL device employing the compound of Chemical Formula 1 may exhibit excellent driving voltage and current efficiency and may greatly improve durability and lifespan characteristics.

In addition, the compound represented by Chemical Formula 1 is not only significantly advantageous in terms of electron transport characteristics, but also exhibits long lifespan characteristics. The excellent electron transport ability of such a compound may result in high efficiency and rapid mobility in an organic EL device, and thus facilitates adjustment of HOMO and LUMO energy levels according to a direction or position of substituents. Accordingly, it is possible to exhibit high electron transport properties in the organic EL device using such a compound.

When the compound of Chemical Formula 1 is applied as an organic layer material of an organic EL device, preferably a light emitting layer material (blue, green and/or red phosphorescent host material), an electron transport/injection layer material, and a light emitting auxiliary layer material, the performance and lifespan characteristics of the organic EL device may be greatly improved. Accordingly, such an organic EL device may maximize the performance of a full-color organic EL panel.

Meanwhile, red and green light emitting layers of the organic EL device may each use phosphorescent materials, and currently, technology maturity for the red and green light emitting layers is relatively high. On the other hand, a blue light emitting layer may use a fluorescent material and a phosphorescent material, of which the fluorescent material needs further performance improvement, and the blue phosphorescent material is still under development, so the entry barrier is relatively high. That is, while the blue light emitting layer has a high possibility of development, the technical difficulty is relatively high, so there is a limit to improving the performance (e.g., driving voltage, efficiency, lifespan, etc.) of a blue organic light emitting device including such a blue light emitting layer. Accordingly, in the present invention, the compound of Chemical Formula 1 may be applied as a material for an electron transport layer (ETL) or an electron transport auxiliary layer, in addition to the light emitting layer (EML). In such a way, by changing the material of the electron transport layer or the electron transport auxiliary layer which are used as a common layer in the organic EL device, the performance of the light emitting layer, specifically the blue light emitting layer, and the performance of the organic EL device including the light emitting layer may be improved.

According to the present invention, the compound represented by Chemical Formula 1 has a base skeleton structure in which two different nitrogen-containing heterocycles, e.g., triazine and pyrimidine, are located at opposite ends, and a biphenylene linker bonded in a para-meta position is linked therebetween.

In Chemical Formula 1, $X_1$ and $X_2$ that are introduced into two different nitrogen-containing heterocycles, respectively, may be different from each other, one of which may be $CR_1$, and the other may be a nitrogen atom (N). That is, the ring into which N is introduced may be a triazine ring, and the ring into which $CR_1$ is introduced may be a pyrimidine ring. By including two heterocycles containing at least two nitrogens as described above, excellent electron withdrawing characteristics may be exhibited, which is advantageous for electron injection and transporting.

In such an embodiment, $R_1$ may be selected from the group consisting of: hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_1$ to $C_{40}$ phosphine group, a $C_1$ to $C_{40}$ phosphine oxide group and a $C_6$ to $C_{60}$ arylamine group. Specifically, $R_1$ may preferably be selected from the group consisting of hydrogen, deuterium, a halogen group, a cyano group, a $C_1$ to $C_{40}$ alkyl group, a $C_6$ to $C_{60}$ aryl group and a heteroaryl group having 5 to 60 nuclear atoms, and more preferably, $R_1$ may be hydrogen.

The two nitrogen-containing heterocycles (e.g., $X_1$-containing heterocycle, $X_2$-containing heterocycle) according to the present invention may each be substituted with various substituents, e.g., $Ar_1$ to $Ar_4$.

Such $Ar_1$ to $Ar_4$ may be the same as or different from each other and may each independently be selected from the group consisting of: a $C_2$ to $C_{40}$ alkenyl group, a $C_2$ to $C_{40}$ alkynyl group, a $C_3$ to $C_{40}$ cycloalkyl group, a heterocycloalkyl group having 3 to nuclear atoms, a $C_1$ to $C_{40}$ alkyl group, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group. Specifically, it is preferable that $Ar_1$ to $Ar_4$ each independently be selected from the group consisting of a $C_1$ to $C_{40}$ alkyl group, a $C_6$ to $C_{60}$ aryl group, a heteroaryl group having 5 to 60 nuclear atoms, a $C_6$ to $C_{60}$ aryloxy group, a $C_6$ to $C_{60}$ arylphosphine oxide group and a $C_6$ to $C_{60}$ arylamine group, and more preferably, selected from a $C_6$ to $C_{60}$ aryl group and a heteroaryl group having 5 to 60 nuclear atoms. Most preferably, $Ar_1$ to $Ar_4$ may each independently be a $C_6$ to $C_{12}$ aryl group, such as a phenyl group or a biphenyl group.

However, in Chemical Formula 1, it is preferable to exclude the case where all of $Ar_1$ to $Ar_4$ are the same as each other. As an example, three of $Ar_1$ to $Ar_4$ may be the same as each other and the other may be different from the three of $Ar_1$ to $Ar_4$, or two of $Ar_1$ to $Ar_4$ may be the same as each other, and the other two may be different from the two of $Ar_1$ to $Ar_4$, or all of $Ar_1$ to $Ar_4$ may be different from each other. In particular, in the compound of Chemical Formula 1 according to the present invention, when two Ar groups (e.g., $Ar_1$ and $Ar_2$) introduced into the $X_1$-containing ring (e.g., triazine or pyrimidine) are the same as each other, it is preferable that two Ar groups (e.g., $Ar_3$ and $Ar_4$) introduced into the $X_2$-containing ring (pyrimidine or triazine) be different from each other. Alternatively, when two Ar groups (e.g., $Ar_1$ and $Ar_2$) introduced into the $X_1$-containing ring (e.g., triazine or pyrimidine) are different from each other, two Ar groups (e.g., $Ar_3$ and $Ar_4$) introduced into the $X_2$-containing ring (pyrimidine or triazine) may be the same as each other. The compound of the present invention having such a structure may not only structurally have primary asymmetry due to the triazine and pyrimidine introduced at opposite ends of the molecule, but also structurally have secondary asymmetry due to the difference of $Ar_1$ to $Ar_4$ substituents linked to the $X_1$-containing ring or the $X_2$-containing ring. Such asymmetry of the molecular structure suppresses crystallization, thereby increasing processability of the compound represented by Chemical Formula 1 and durability of the device.

In an embodiment of the present invention, $Ar_1$ to $Ar_4$ may be the same as or different from each other and may each independently be selected from the following structural formulas. In such a case, the case where all of $Ar_1$ to $Ar_4$ are the same as each other is excluded.

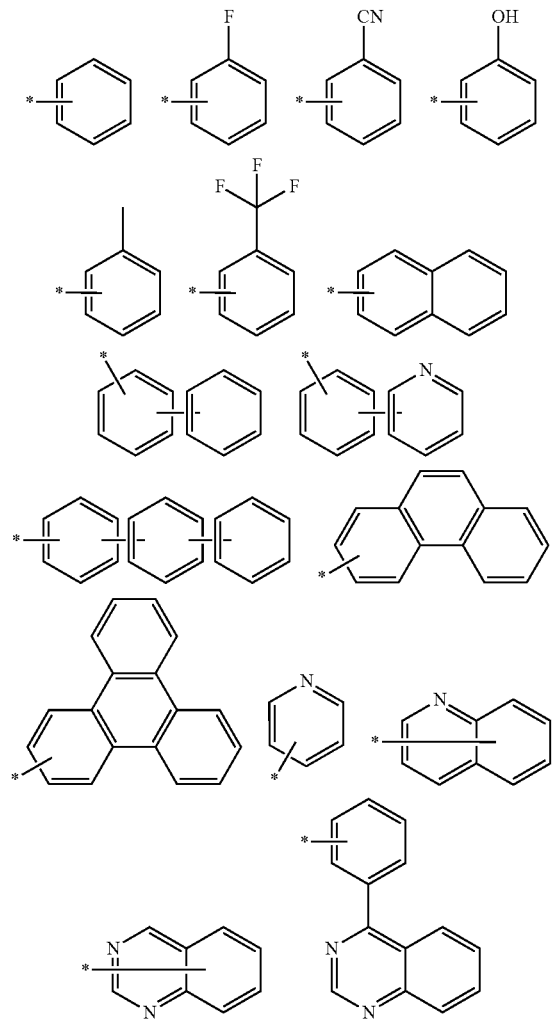

-continued

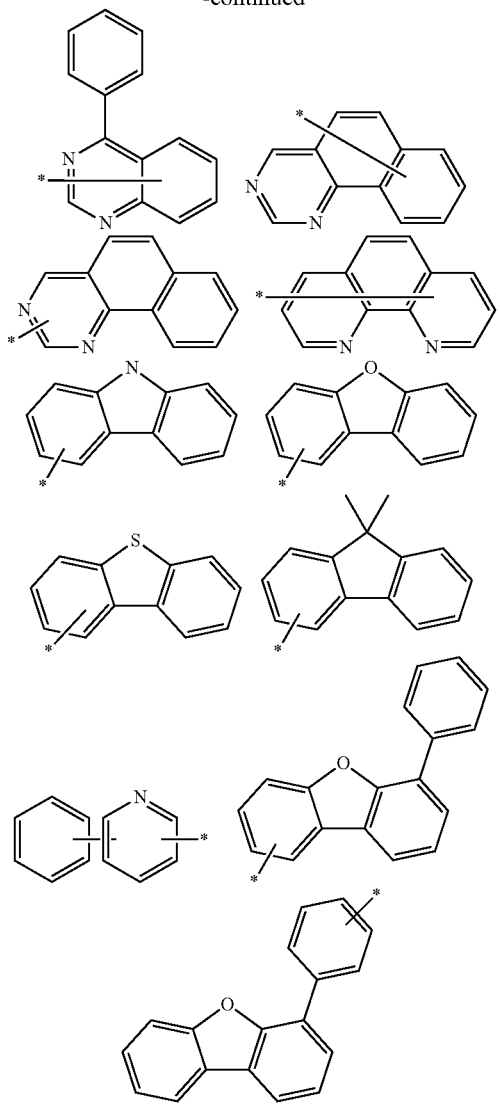

In the above structural formula, * means a site where a bond is made with Chemical Formula 1. In addition, although not illustrated in the above structural formula, at least one or more substituents known in the art (e.g., the same as the description of $R_1$) may be substituted.

In the above Chemical Formula 1, the alkenyl group, the alkynyl group, the cycloalkyl group, the heterocycloalkyl group, the alkyl group, the aryl group, the heteroaryl group, the alkyloxy group, the aryloxy group, the alkylsilyl group, the arylsilyl group, the alkylboron group, the arylboron group, the arylphosphine group, the arylphosphine oxide group and the arylamine group of $R_1$ and $Ar_1$ to $Ar_4$ may each independently be substituted or unsubstituted with one or more kinds of substituents selected from the group consisting of deuterium, a halogen group, a cyano group, a nitro group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_1$ to $C_{40}$ alkyl group, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, and when the substituents are plural in number, the substituents may be the same as or different from each other.

According to an embodiment of the present invention, the compound represented by Chemical Formula 1 may further be embodied in any one of the following Chemical Formula 2 or Chemical Formula 3. However, embodiments are not limited thereto.

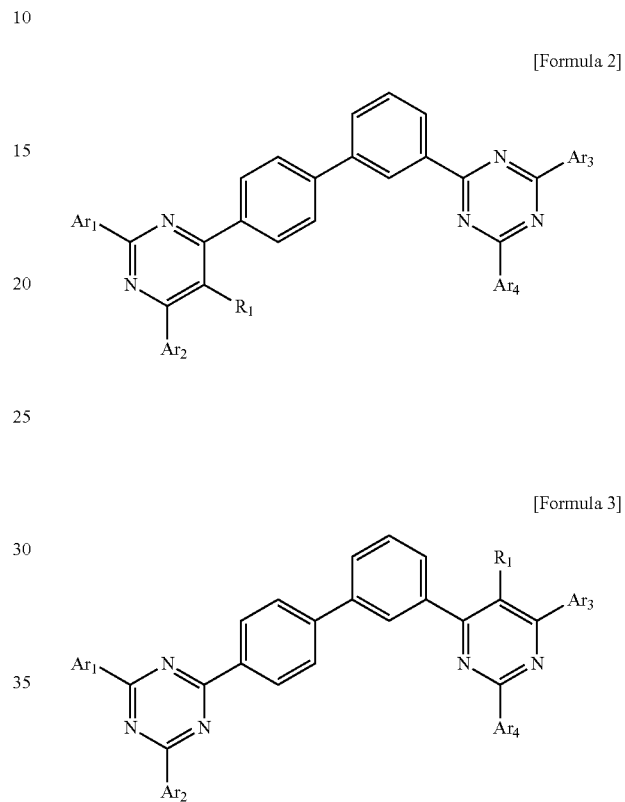

[Formula 2]

[Formula 3]

In Chemical Formulas 2 and 3, $R_1$ and $Ar_1$ to $Ar_4$ are as defined in Chemical Formula 1, respectively.

For a preferred example of the compound represented by any one of Chemical Formulas 2 and 3, $R_1$ may be selected from the group consisting of hydrogen, deuterium, a halogen group, a cyano group, a $C_1$ to $C_{40}$ alkyl group, a $C_6$ to $C_{60}$ aryl group and a heteroaryl group having 5 to 60 nuclear atoms, and more preferably, may be hydrogen.

$Ar_1$ to $Ar_4$ may each independently be selected from the group consisting of a $C_1$ to $C_{40}$ alkyl group, a $C_6$ to $C_{60}$ aryl group, a heteroaryl group having 5 to 60 nuclear atoms, a $C_6$ to $C_{60}$ aryloxy group, a $C_6$ to $C_{60}$ arylphosphine oxide group and a $C_6$ to $C_{60}$ arylamine group, and more preferably, may be selected from a $C_6$ to $C_{60}$ aryl group and a heteroaryl group having 5 to 60 nuclear atoms. However, the case where all of $Ar_1$ to $Ar_4$ are the same as each other may be excluded.

The compound represented by Chemical Formula 1 according to the present invention described above may further be embodied as any one of compounds represented by Compounds 1 to 190 exemplified below. However, the compound represented by Chemical Formula 1 of the present invention is not limited by those exemplified below.

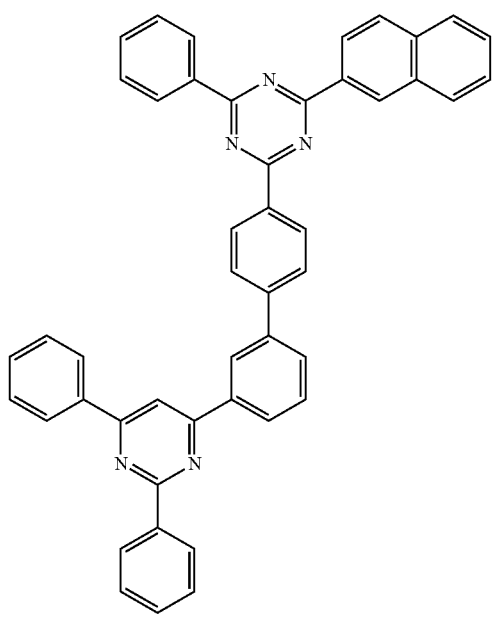
1
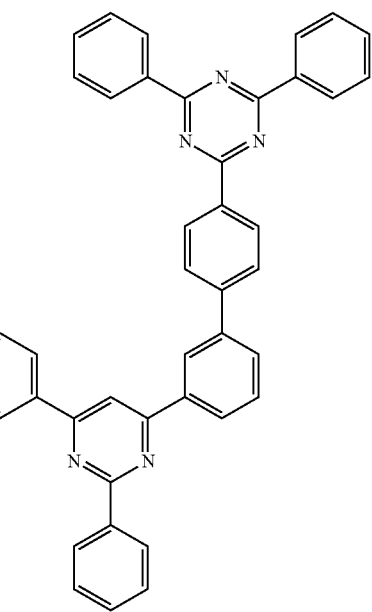
2
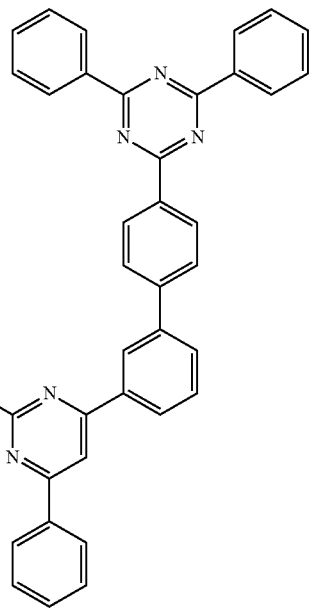
3
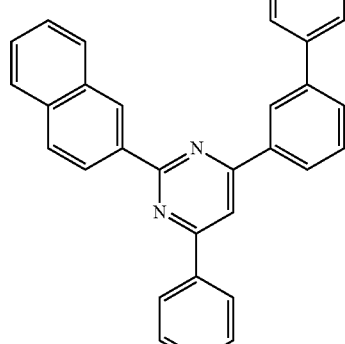
4
-continued

5
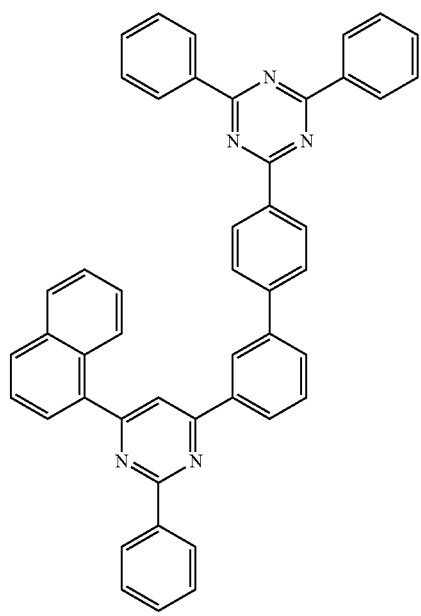
6
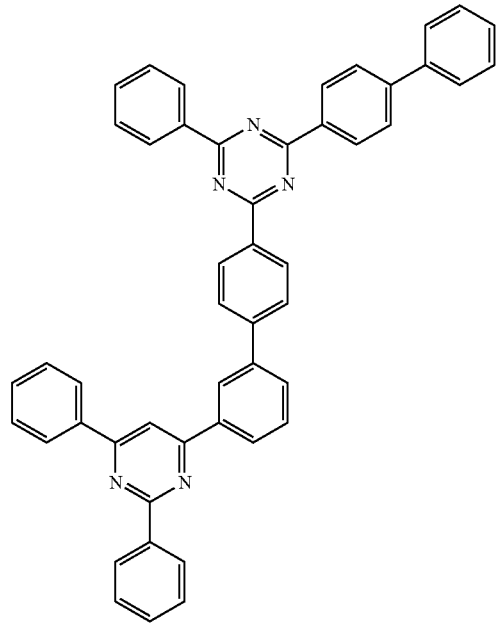
7
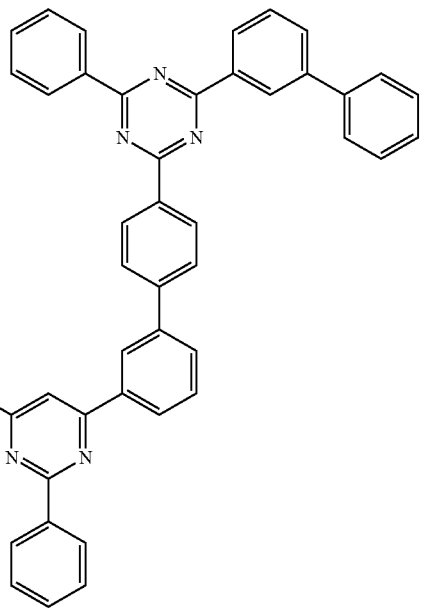
8
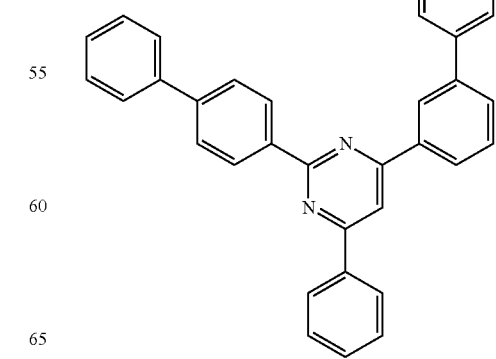

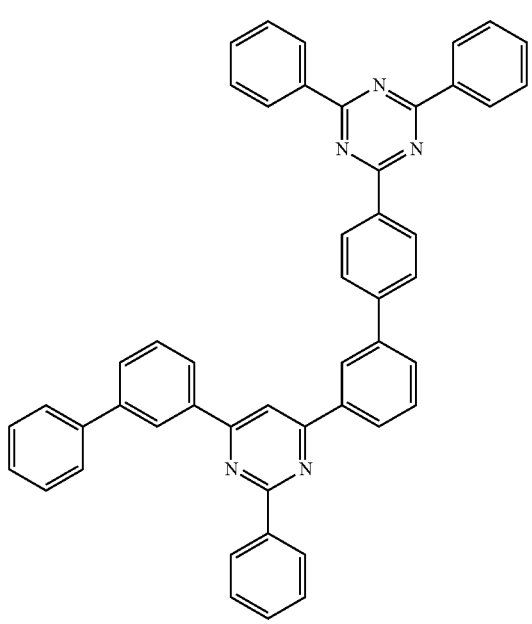
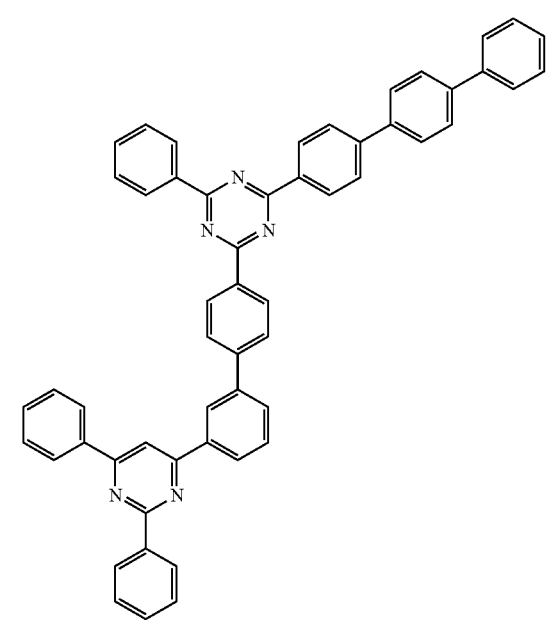

-continued
13
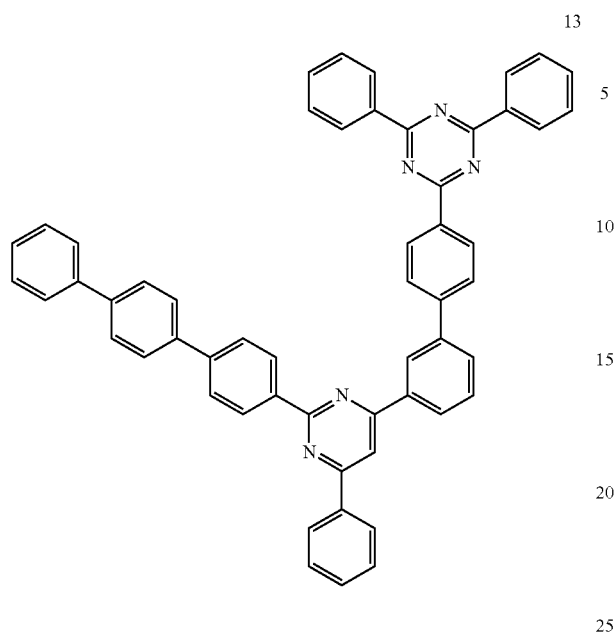
15
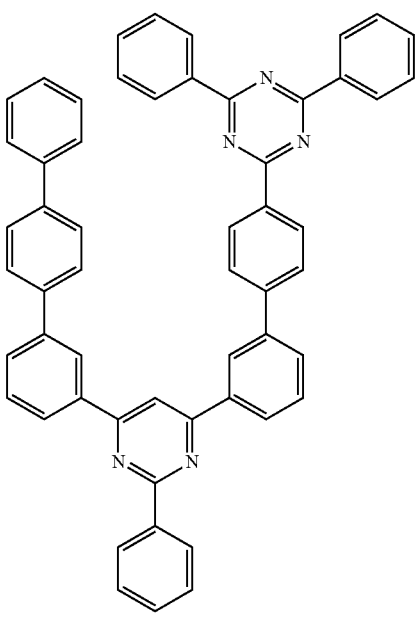
14
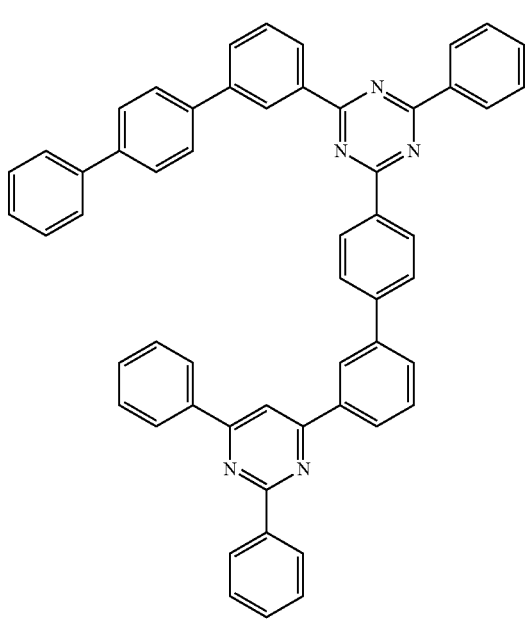
16
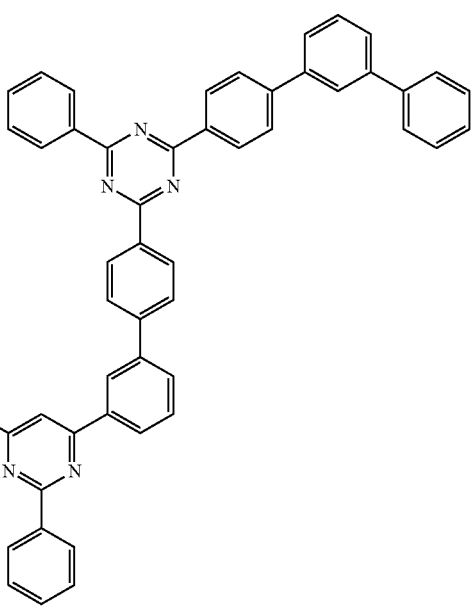

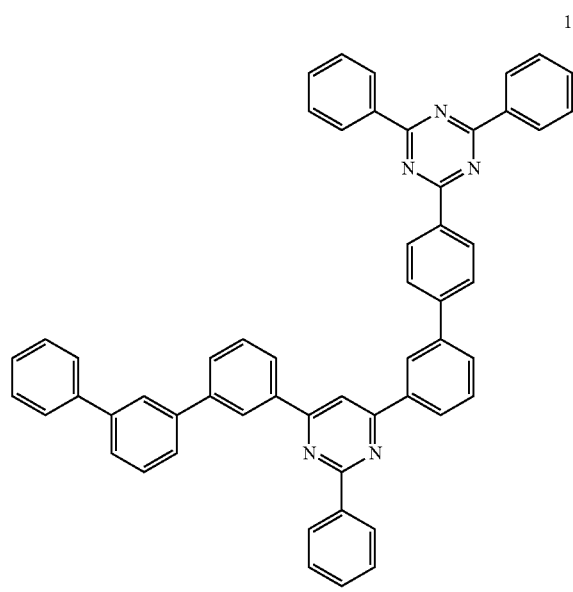
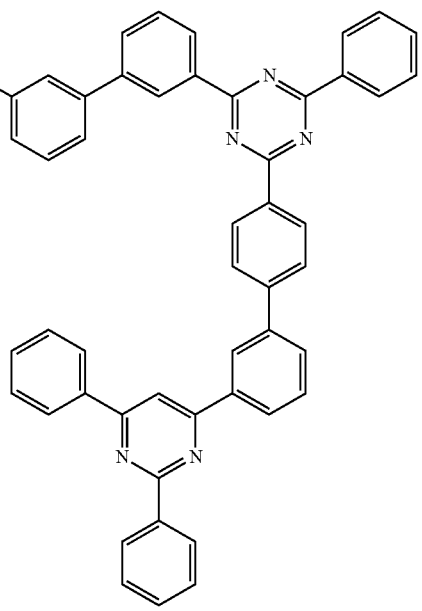
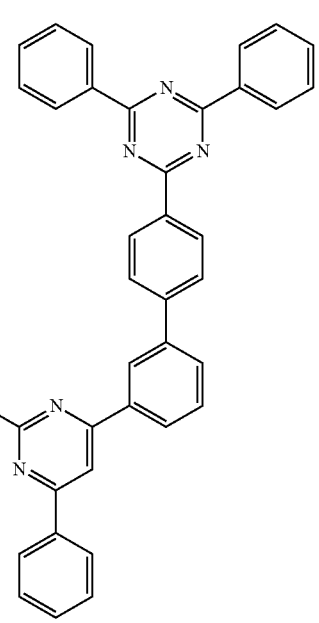

21
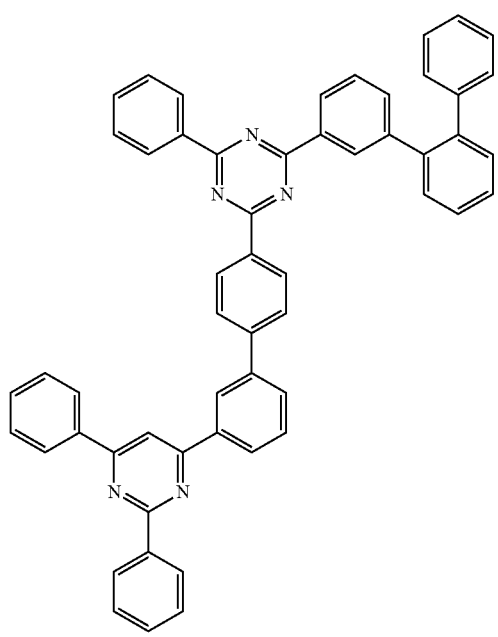
22
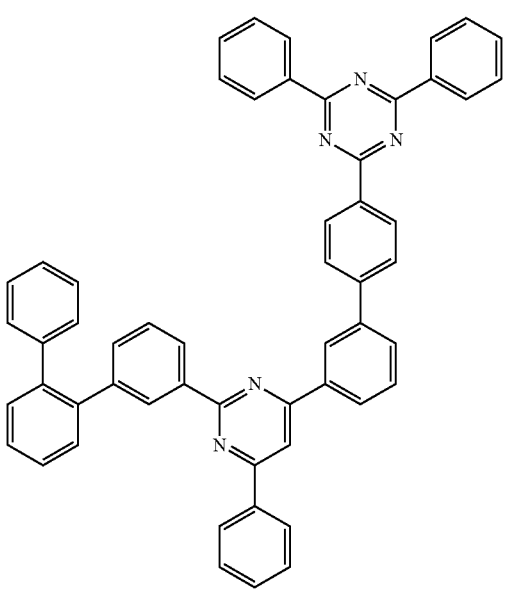
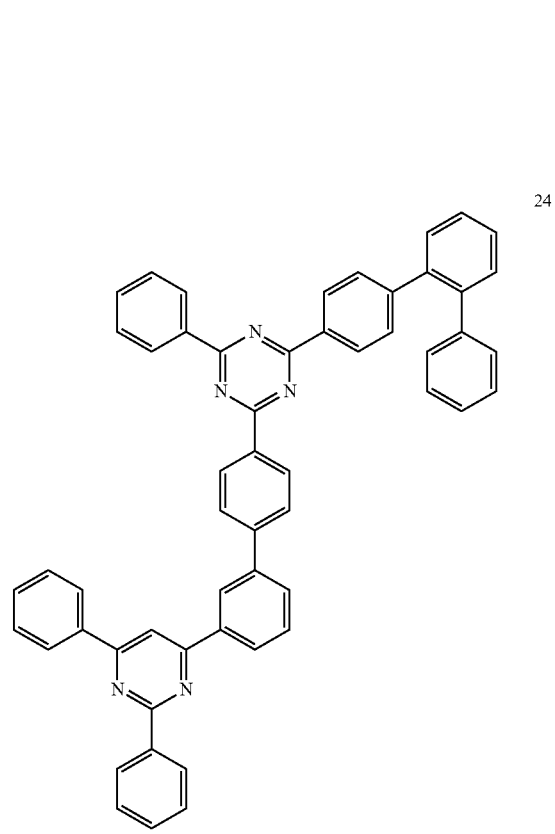 [SMILES: c1ccc(-c2cc(-c3cccc(-c4ccc(-c5nc(-c6ccccc6)nc(-c6ccc(-c7ccncc7)cc6)n5)cc4)c3)nc(-c3ccccc3)n2)cc1]

-continued
25
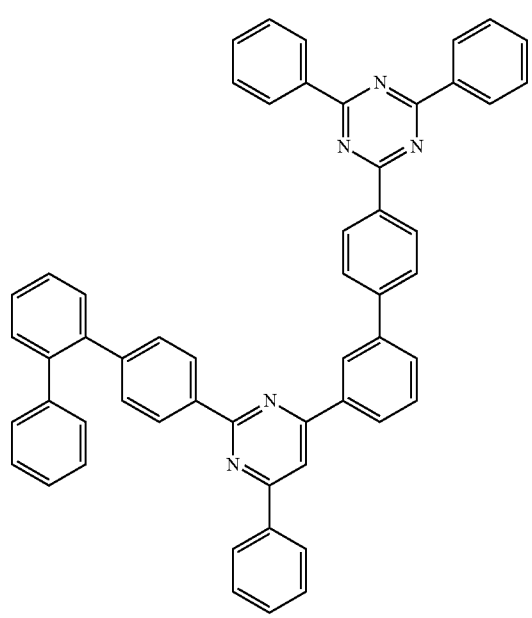
26
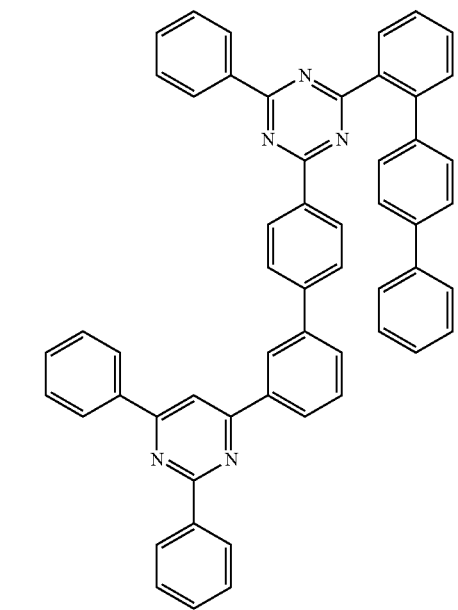
27
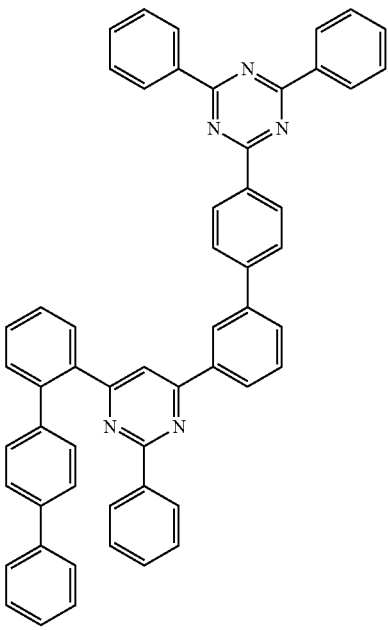
28
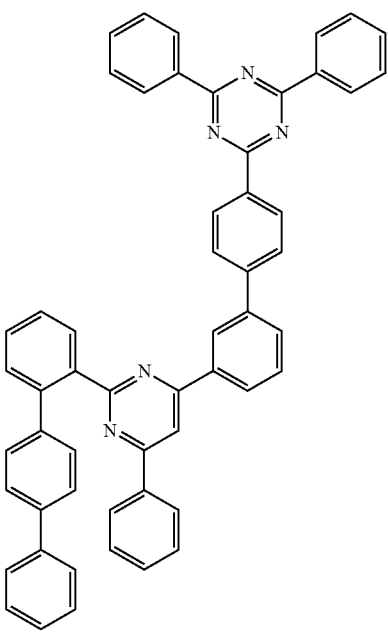

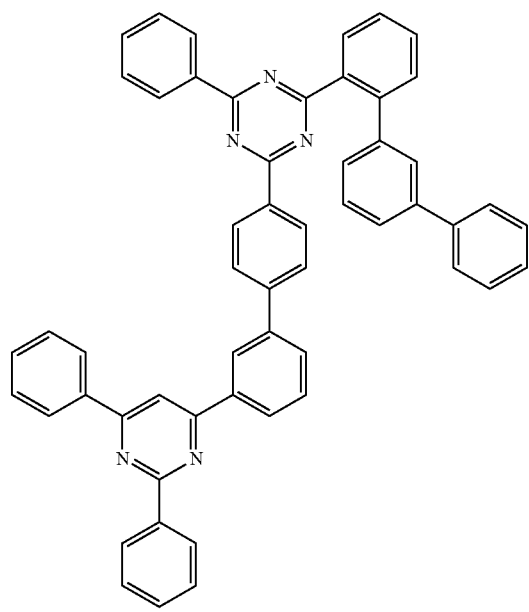
29
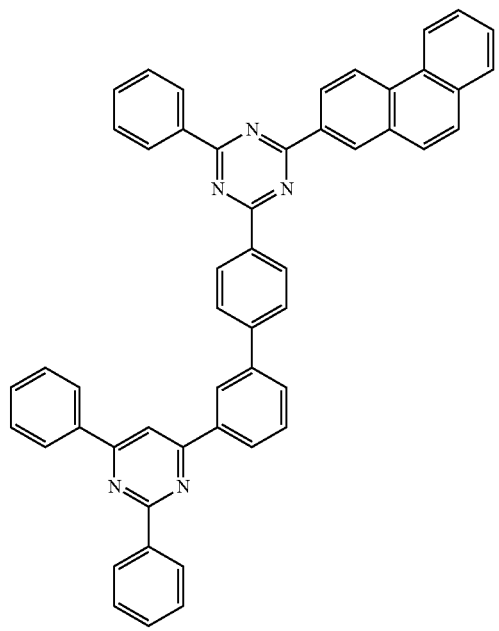
31
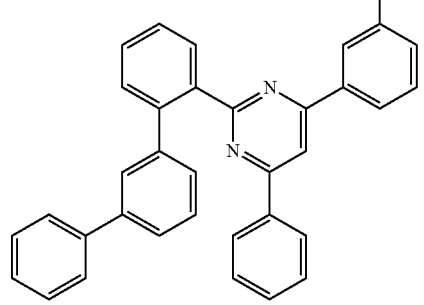
30
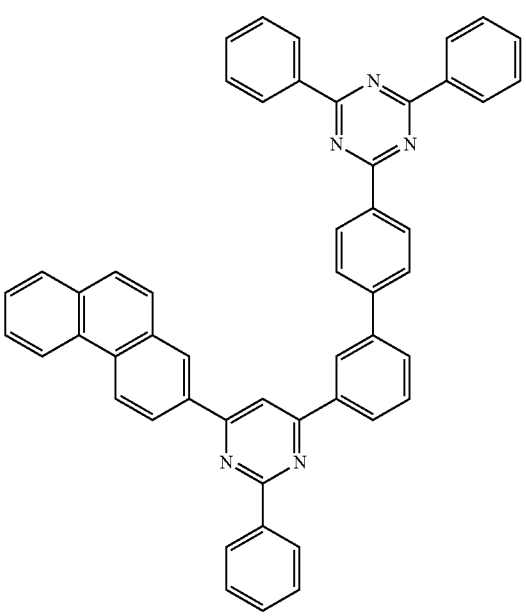
32

33
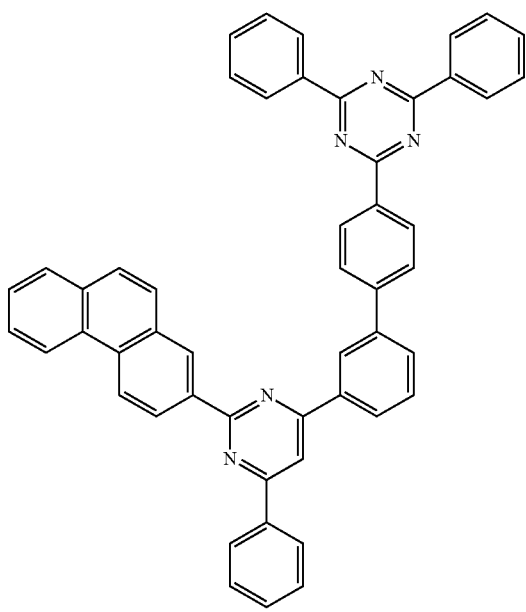
35
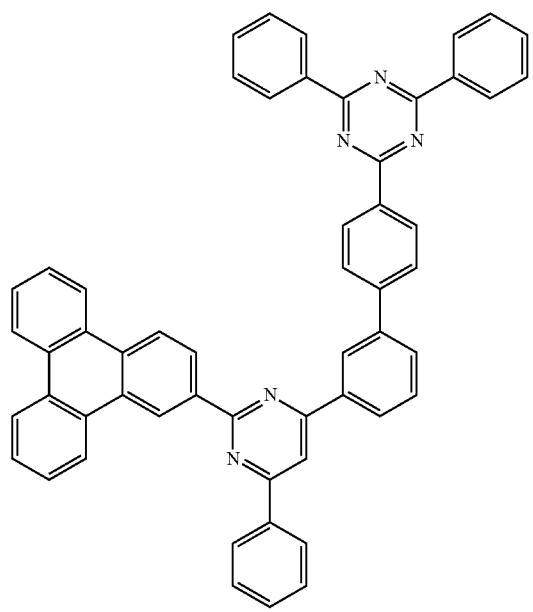
34
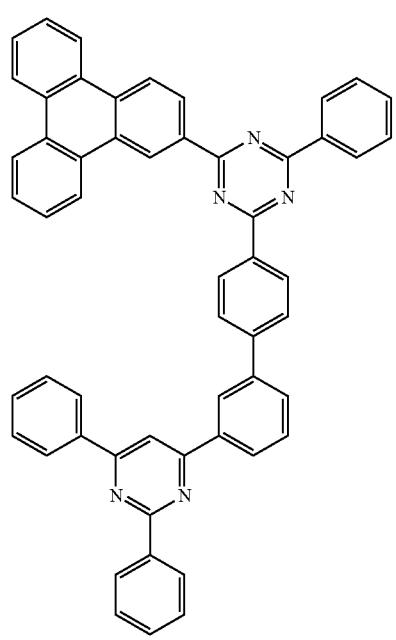
36
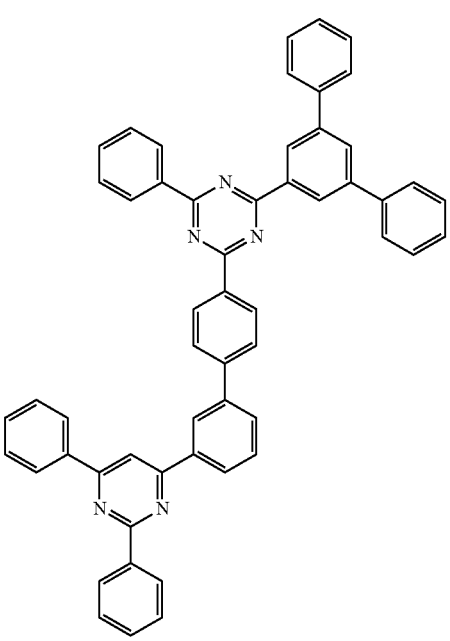

37
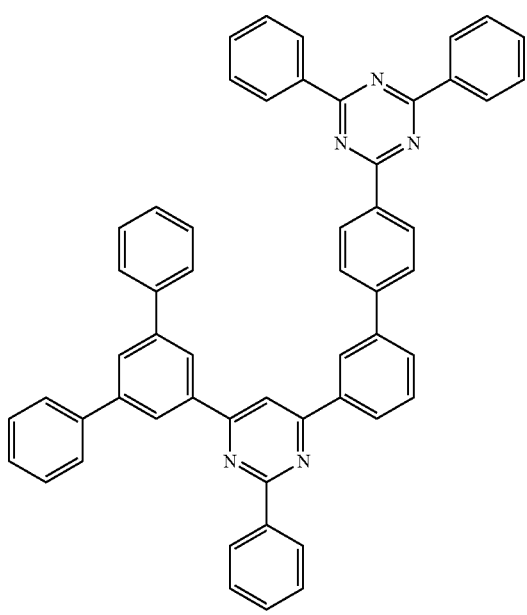
38
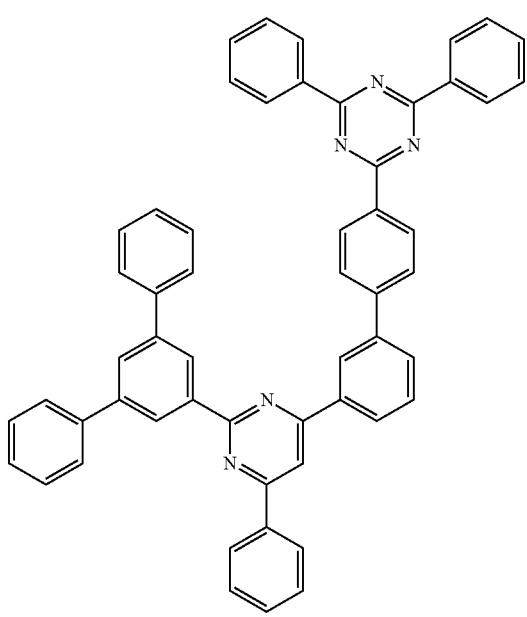
39
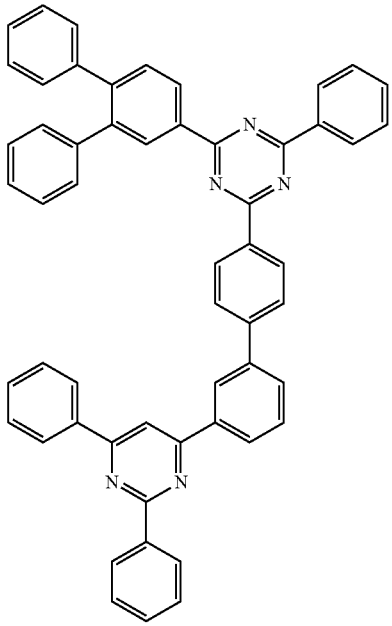
40
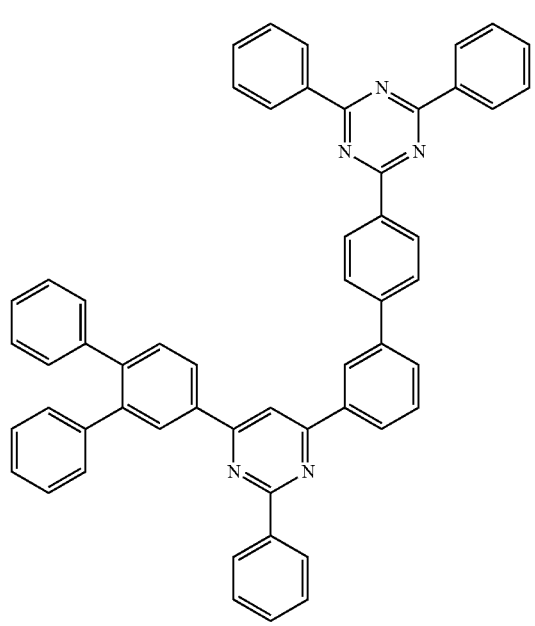

41
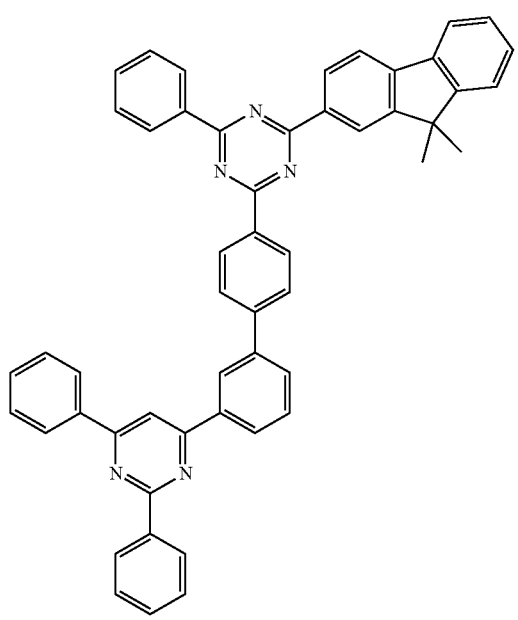
43
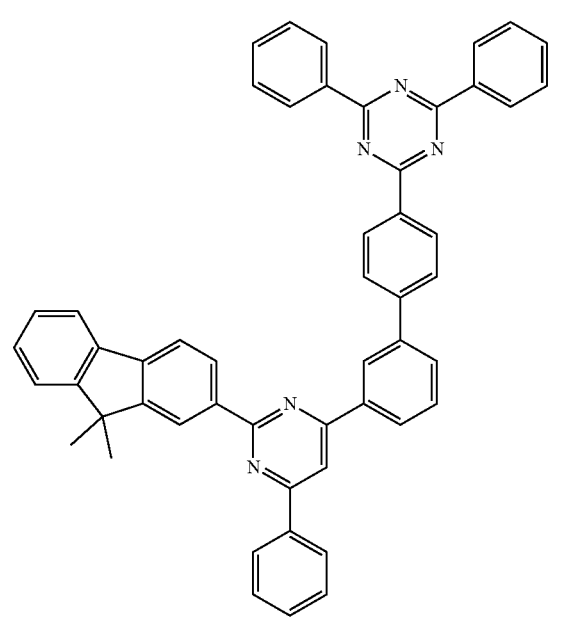
42
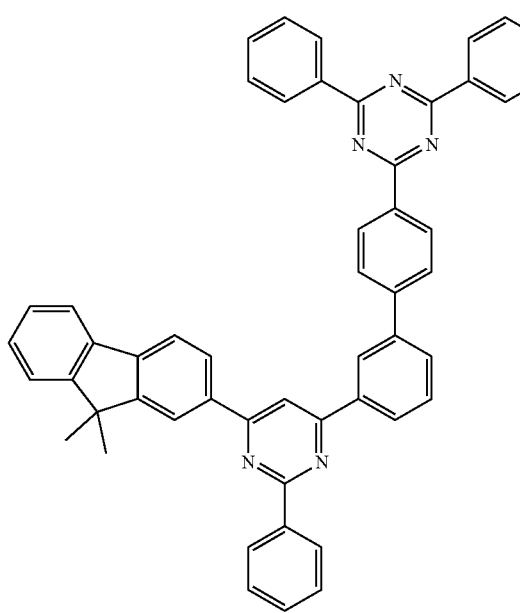
44
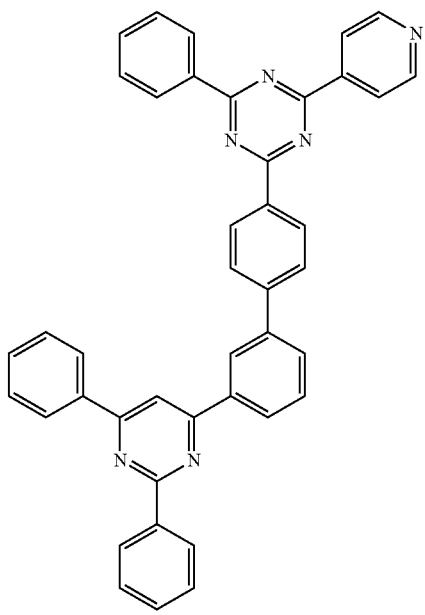

33
-continued
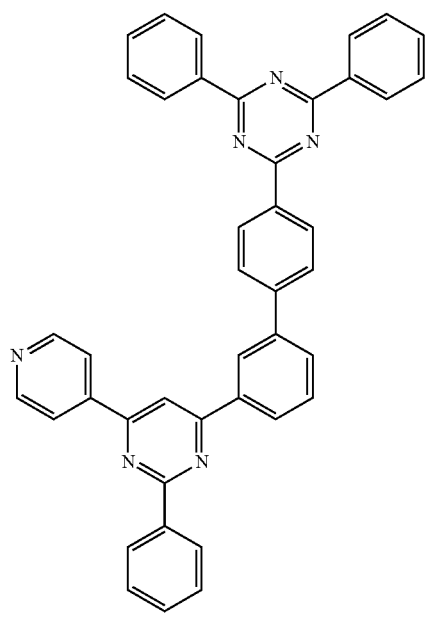
45
34
-continued
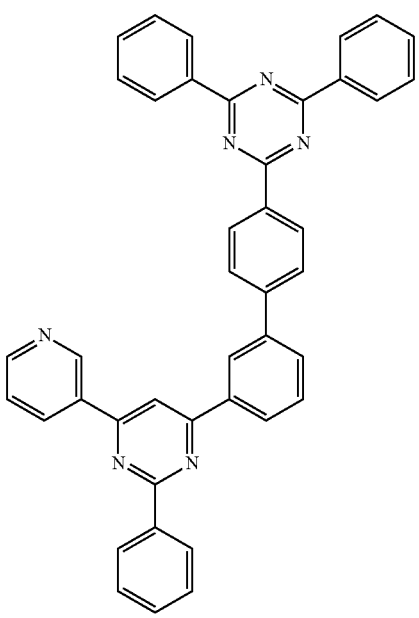
47
46
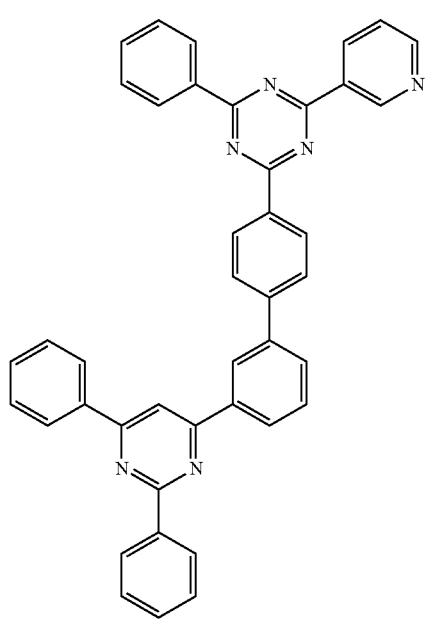
48
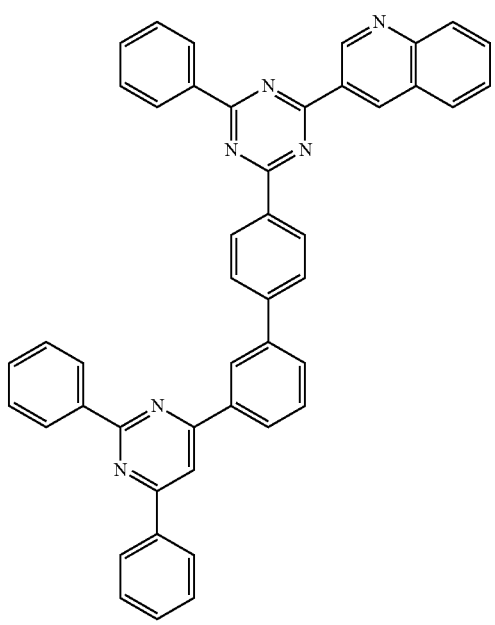

49
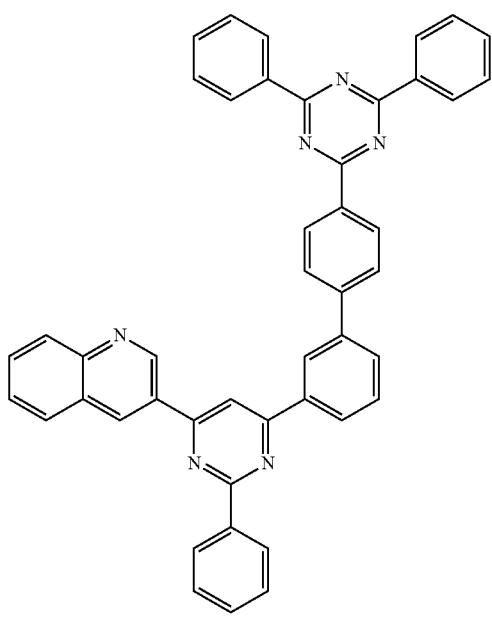
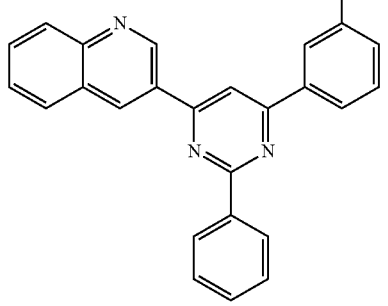
51
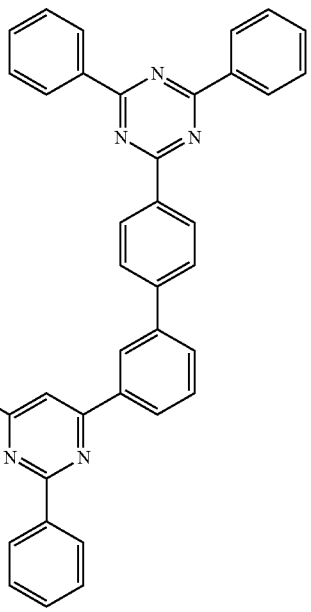
50
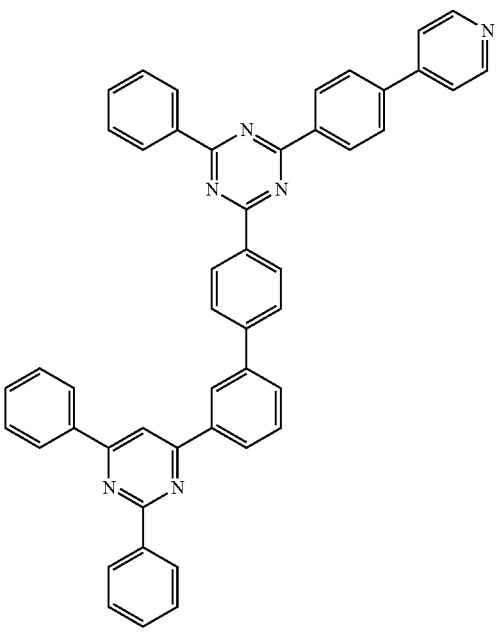
52
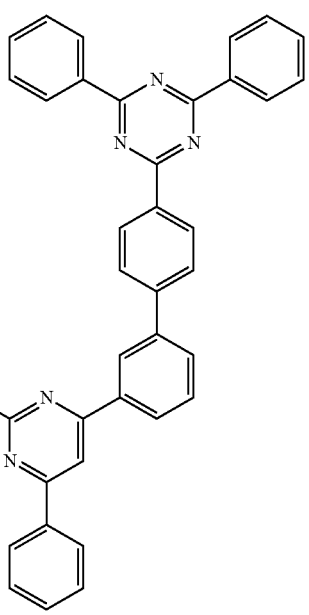

53
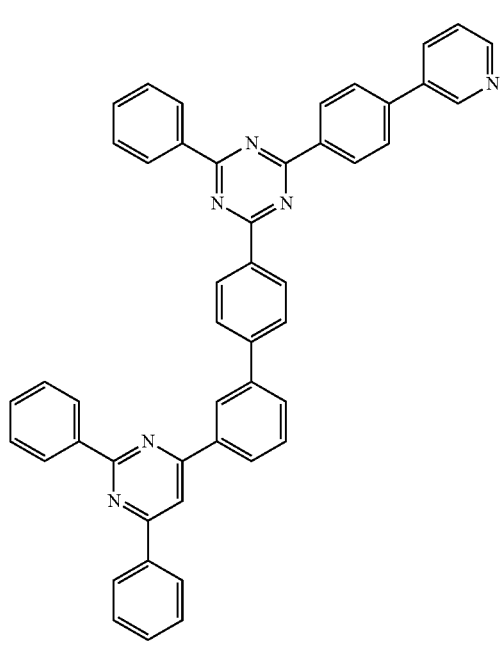
54
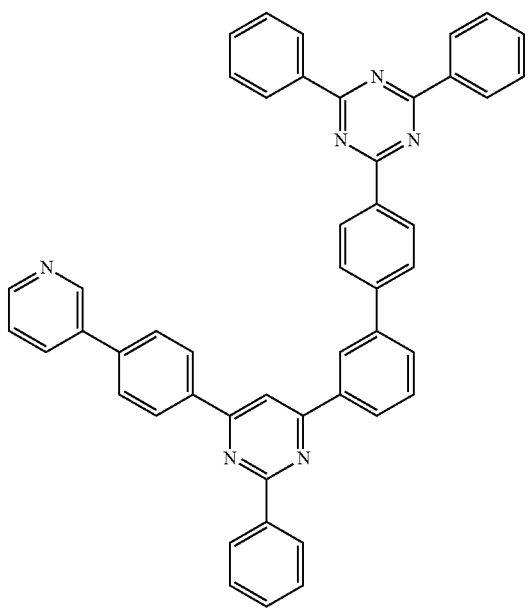
55
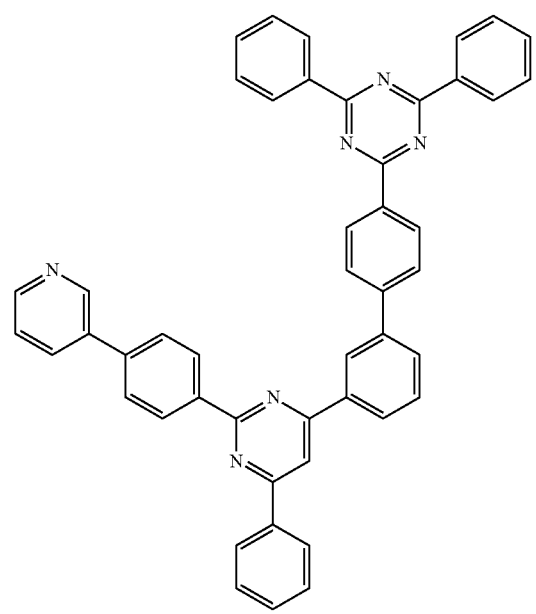
56
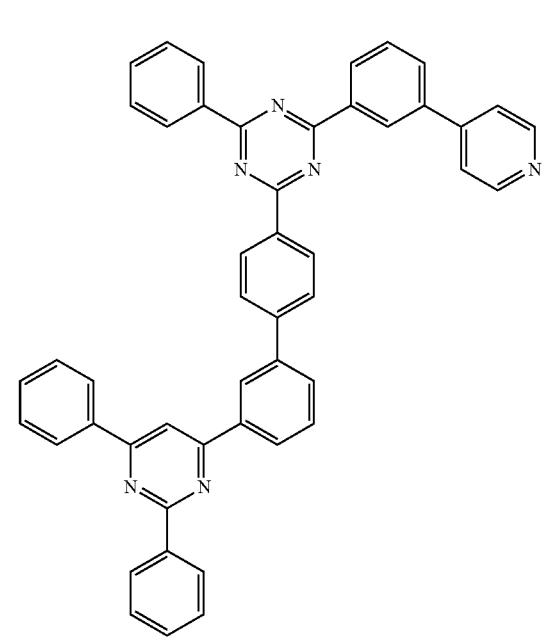

57
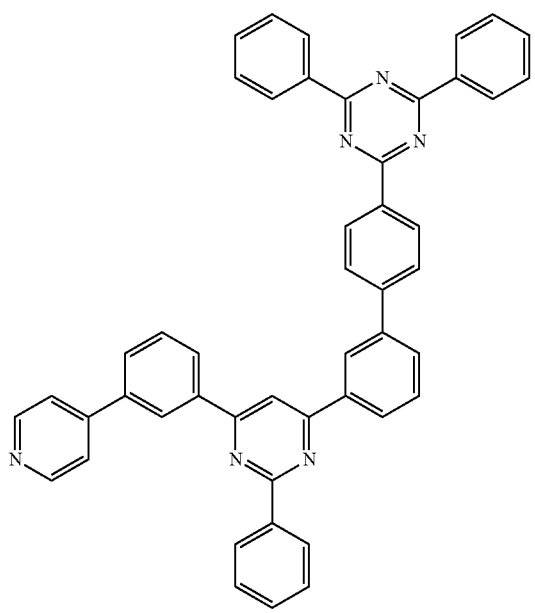
58
59
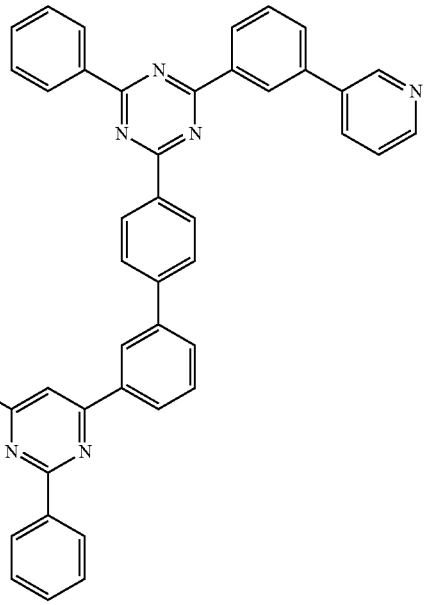
60

-continued
61
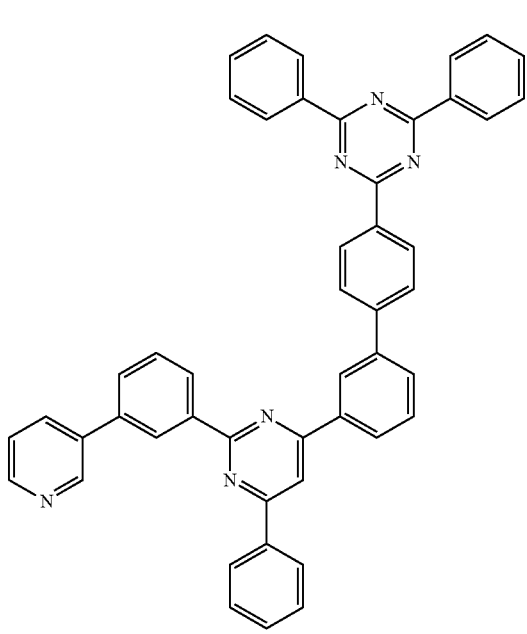
62
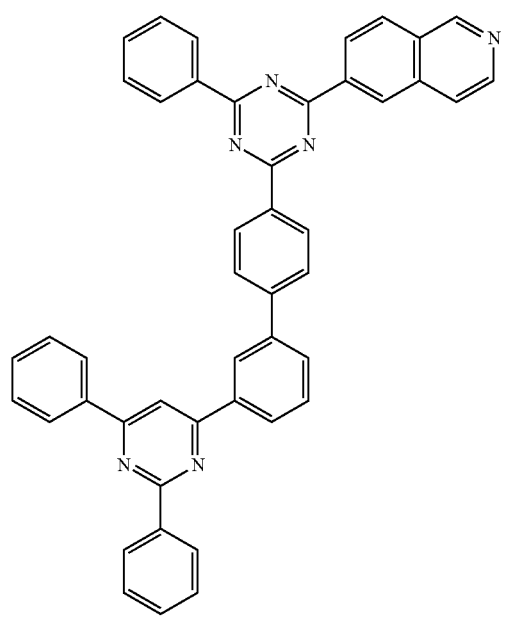
63
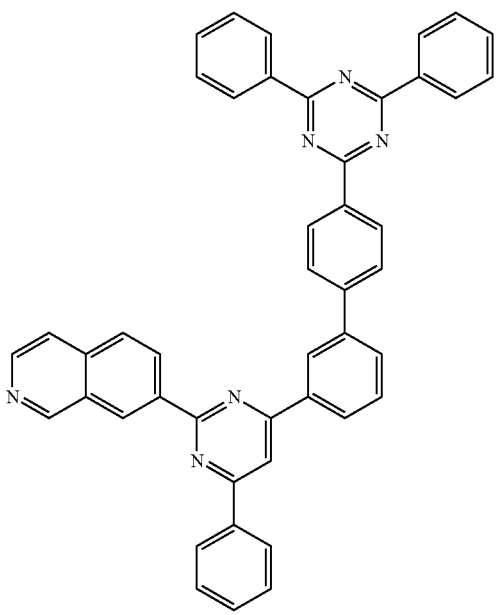
64
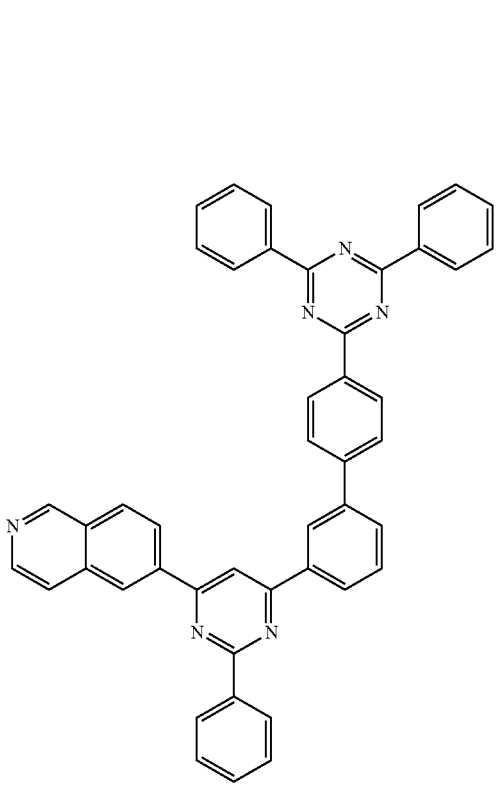

65
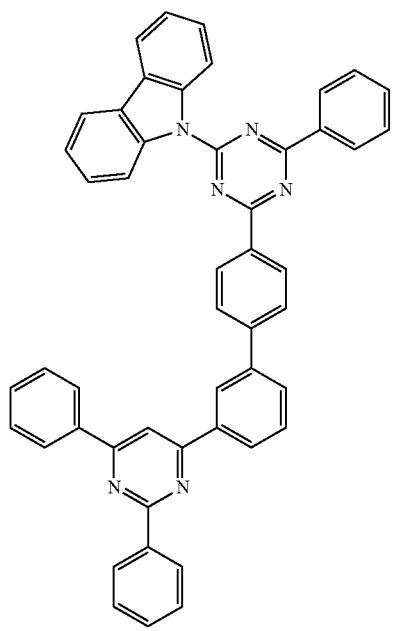
66
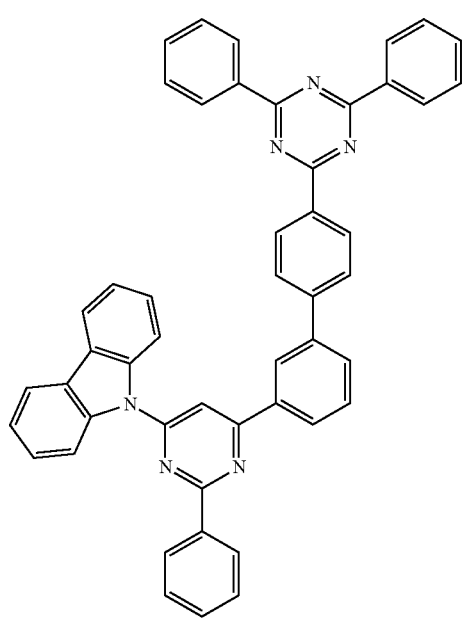
67
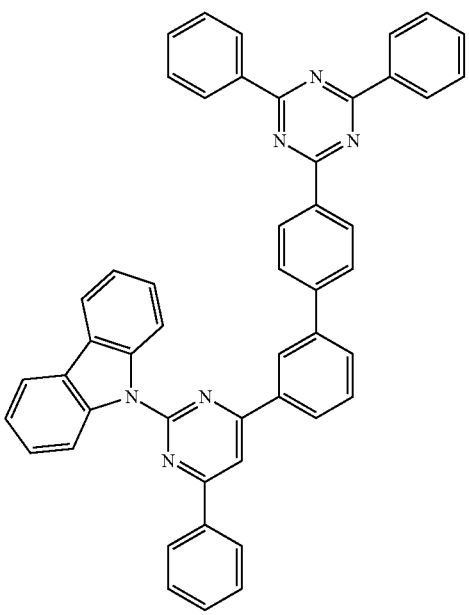
68
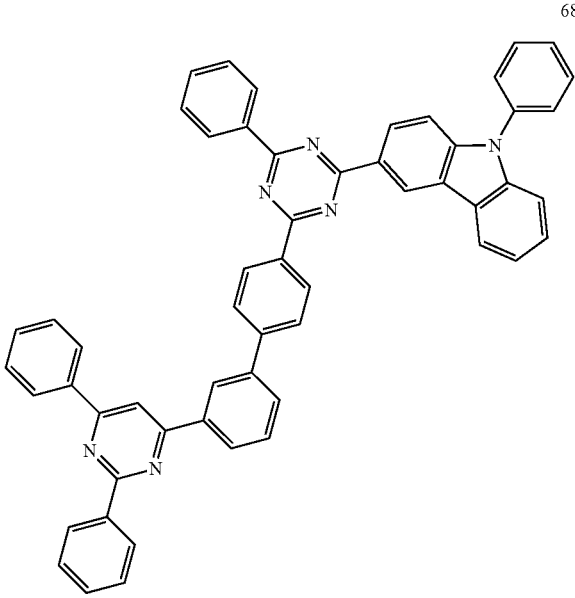

69
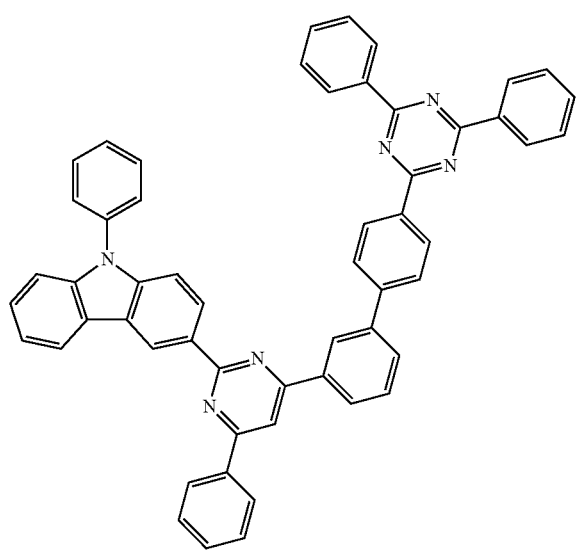
70
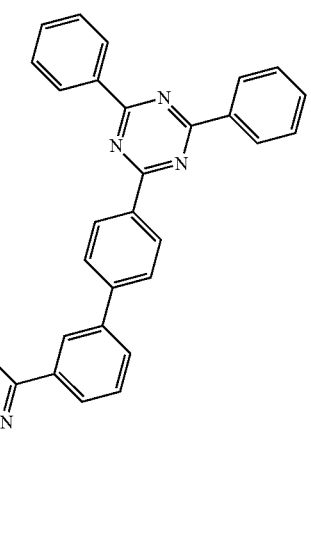
71
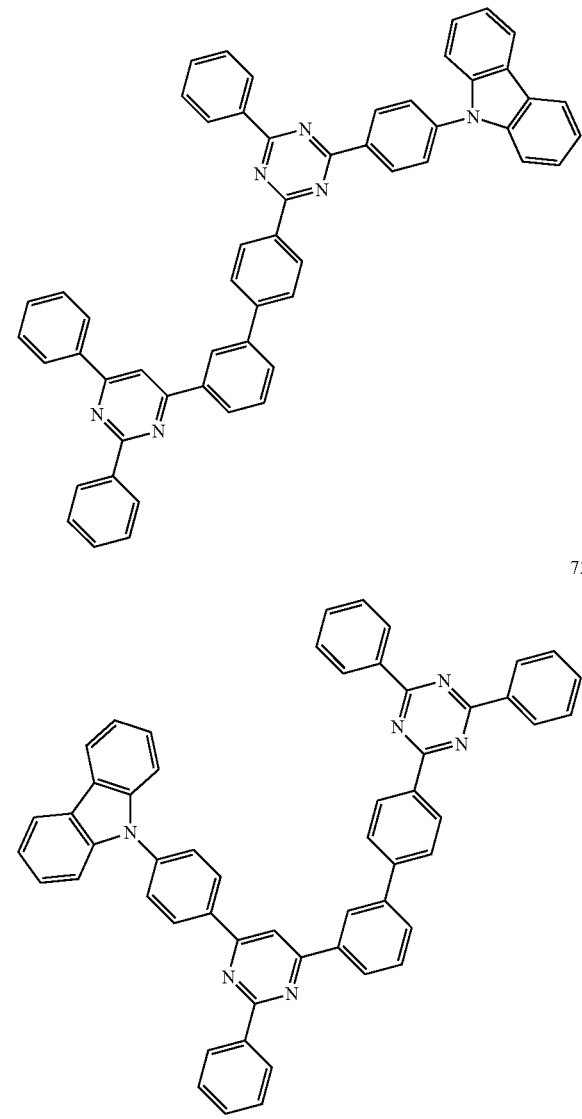
72
73
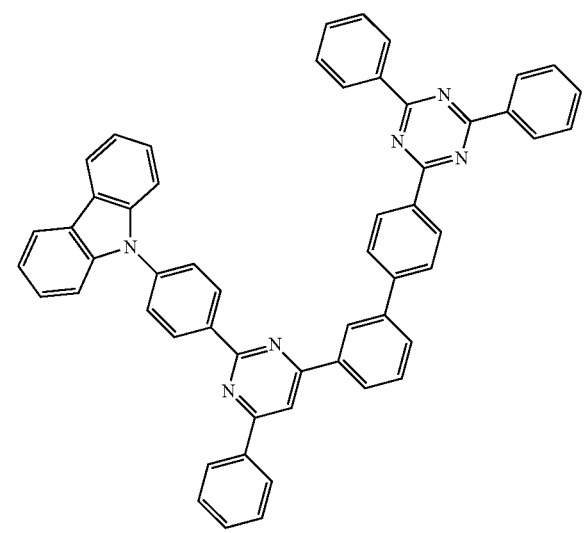

-continued
74
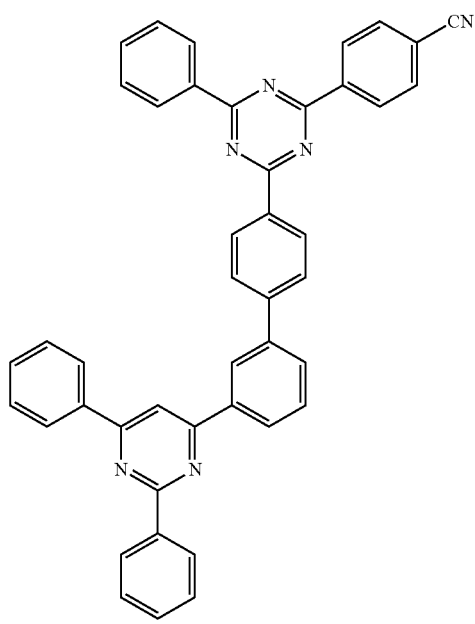
75
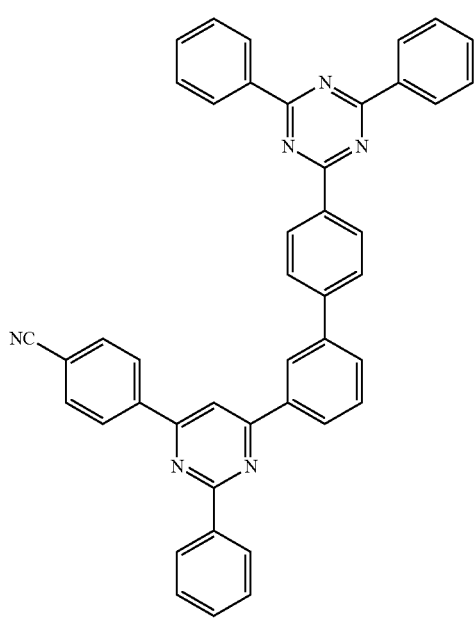
76
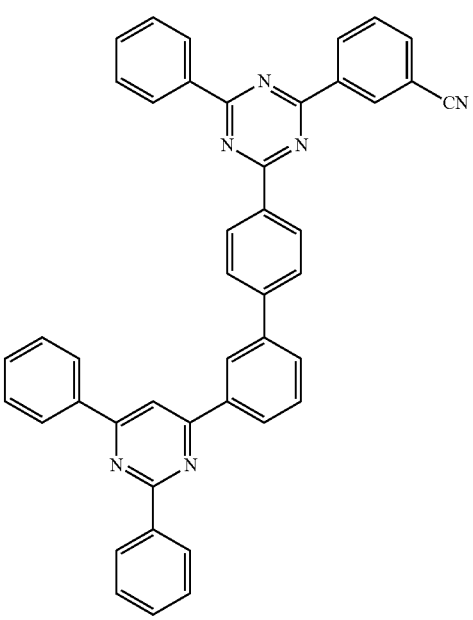
77
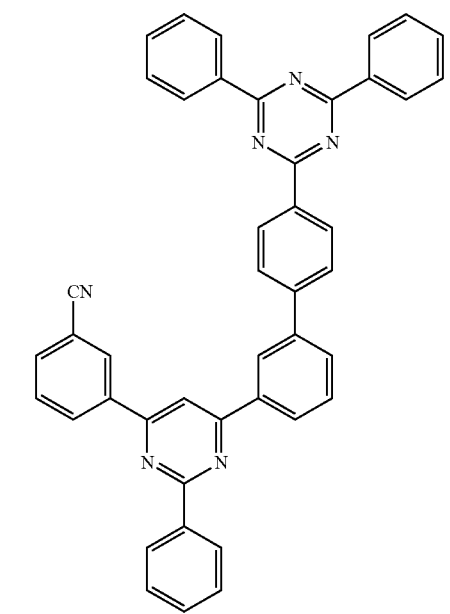

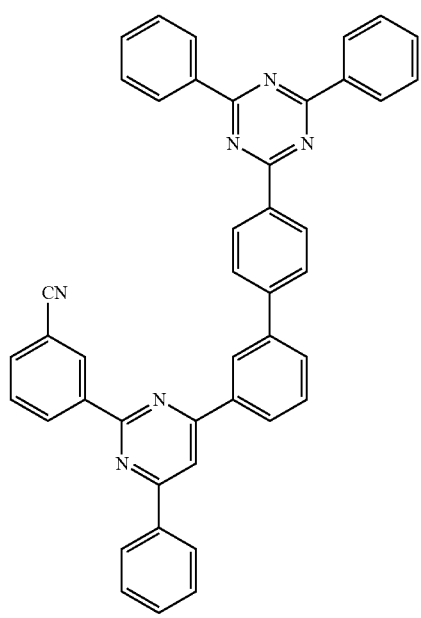
78
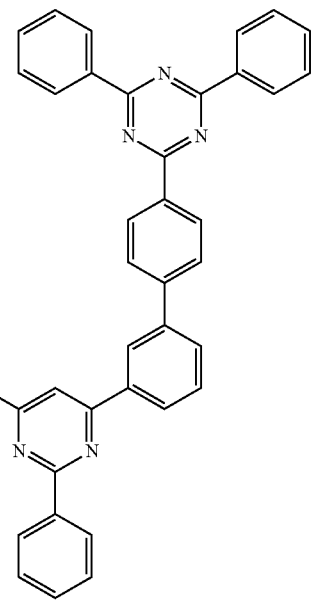
80
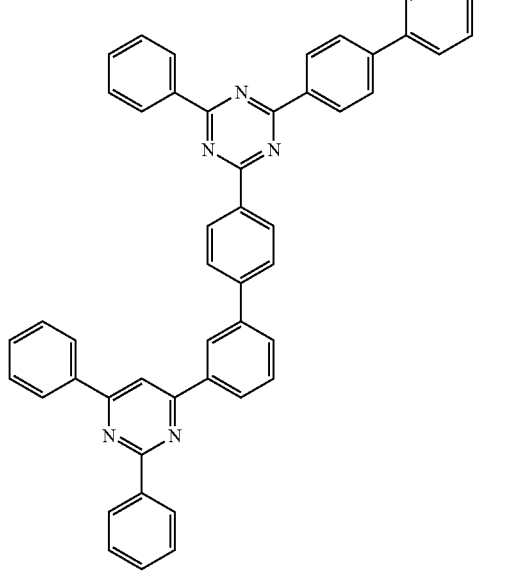
79
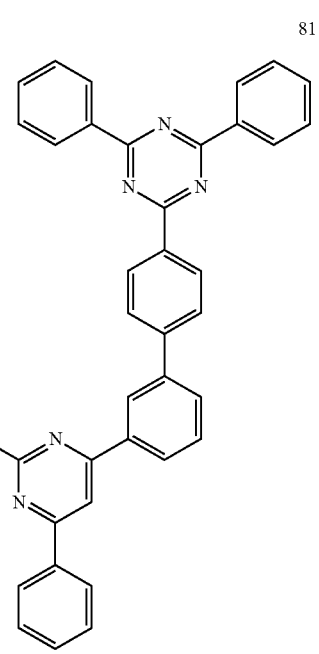
81

82
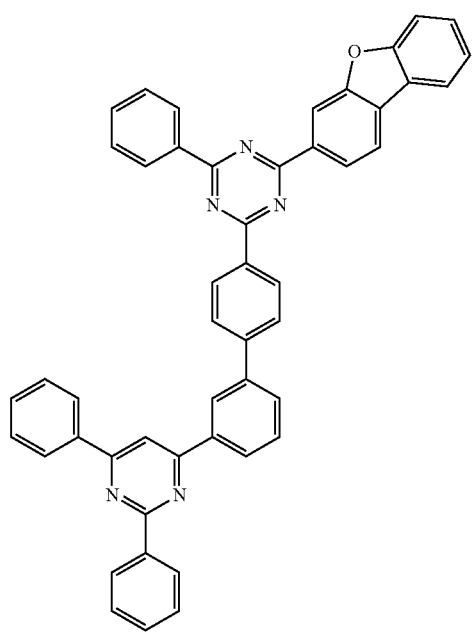
83
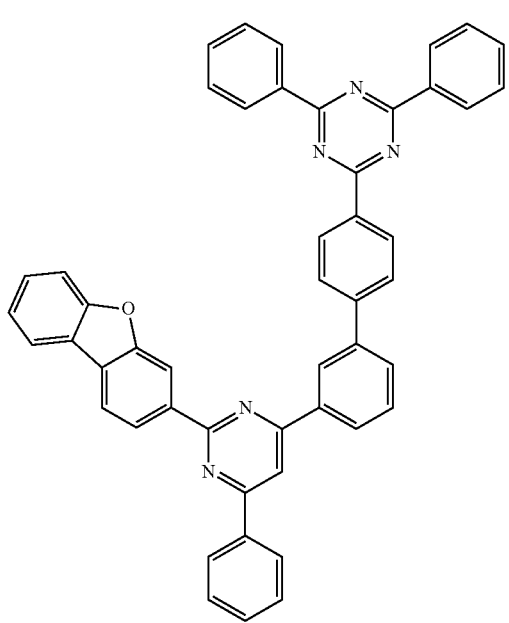
84
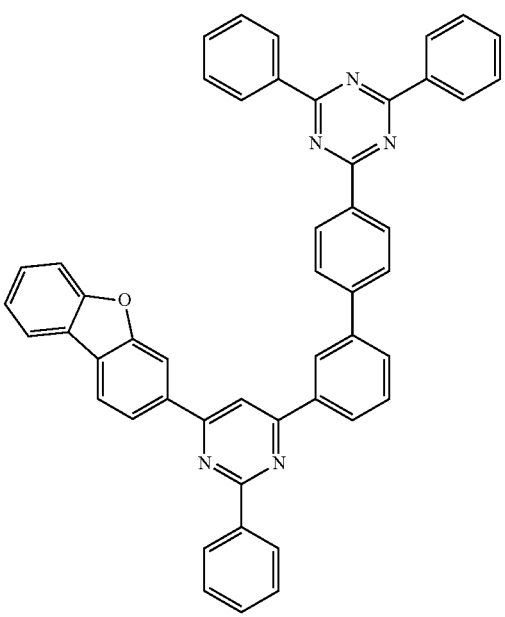
85
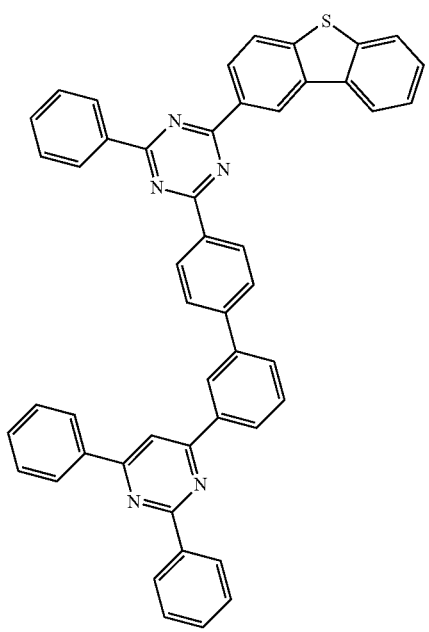

86
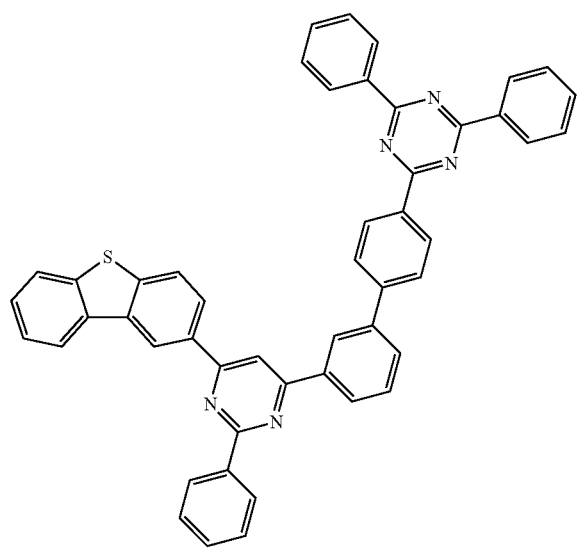
87
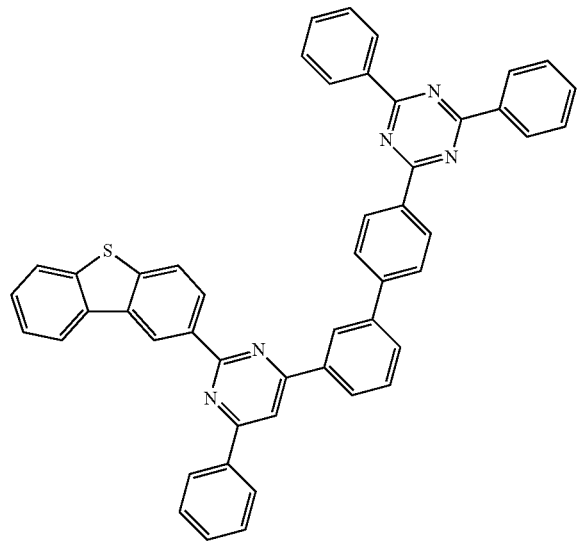
88
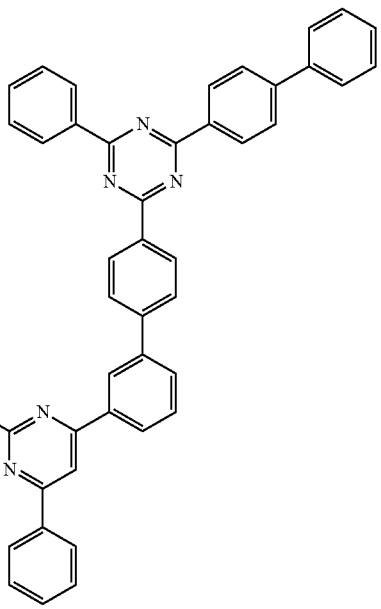
89
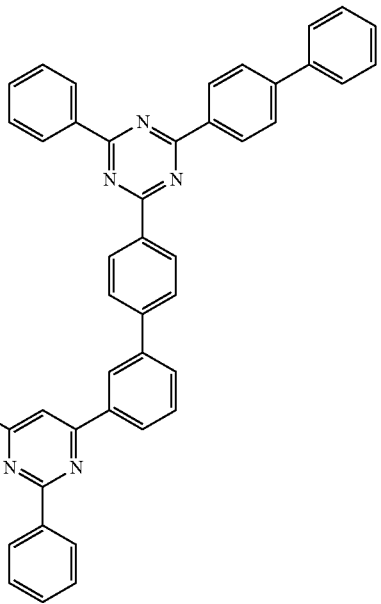

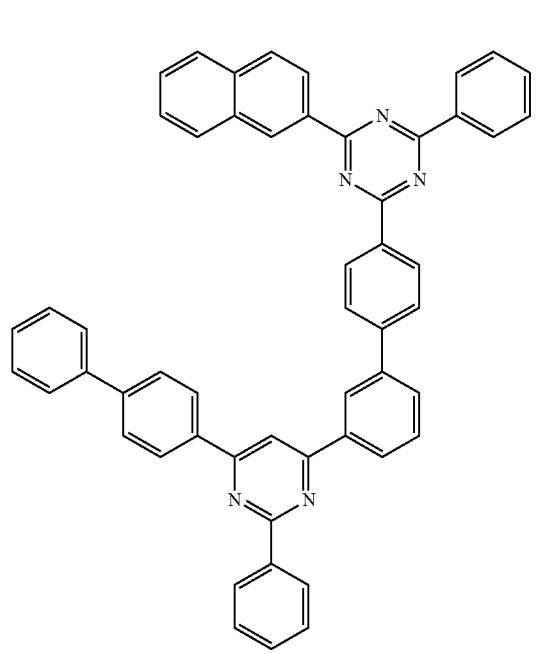
90
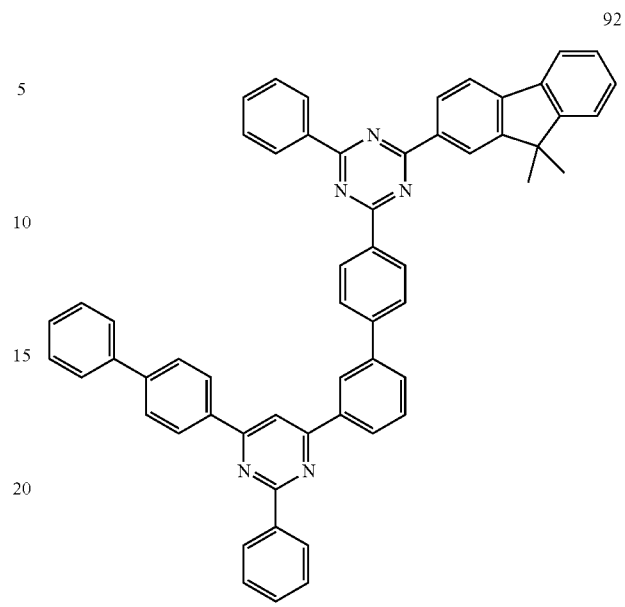
92
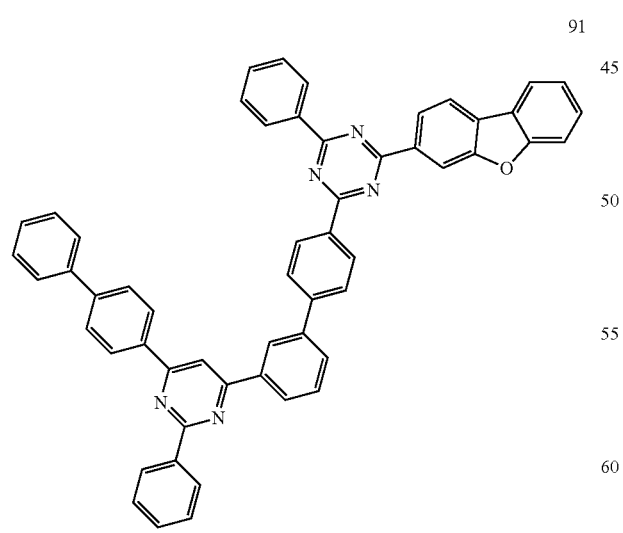
91
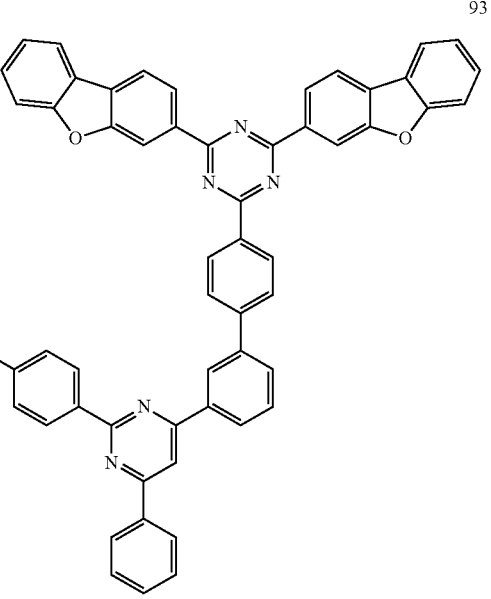
93

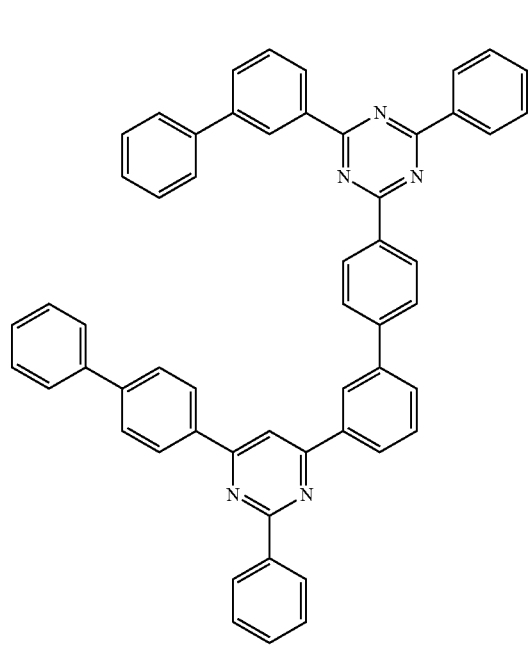
94
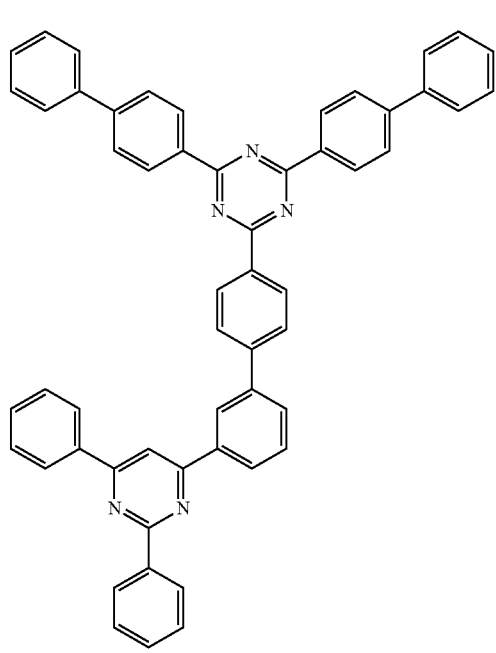
96
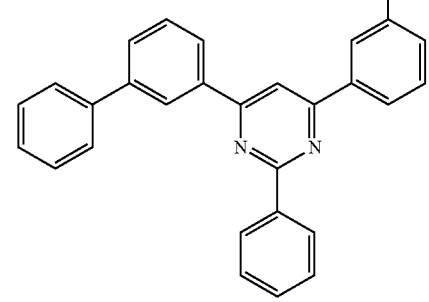
95
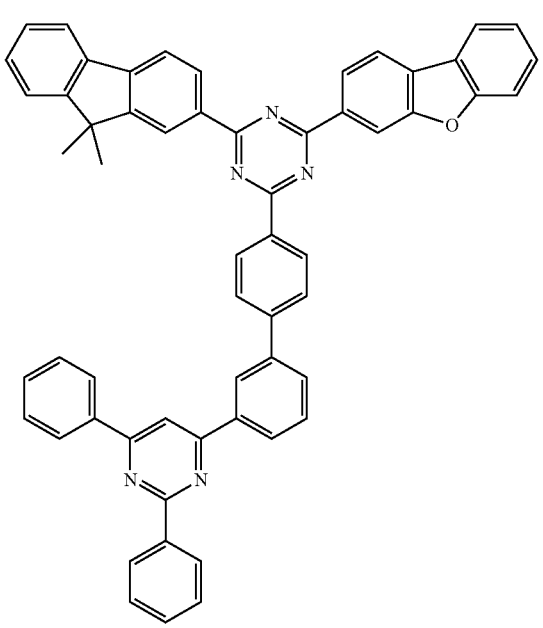
97

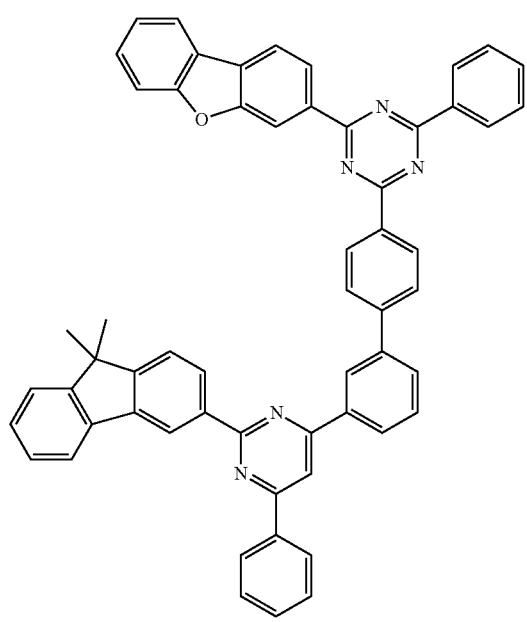
98
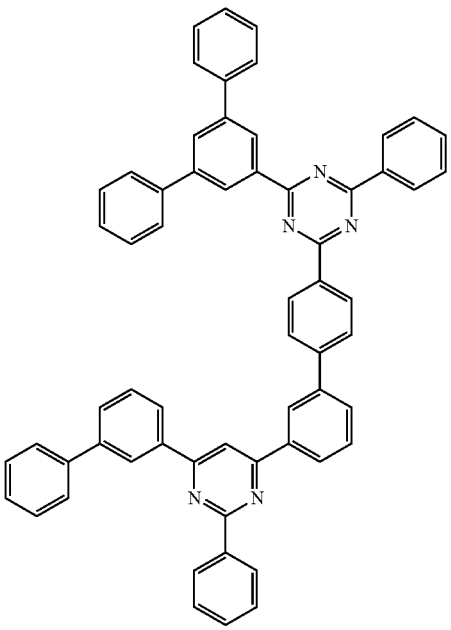
100
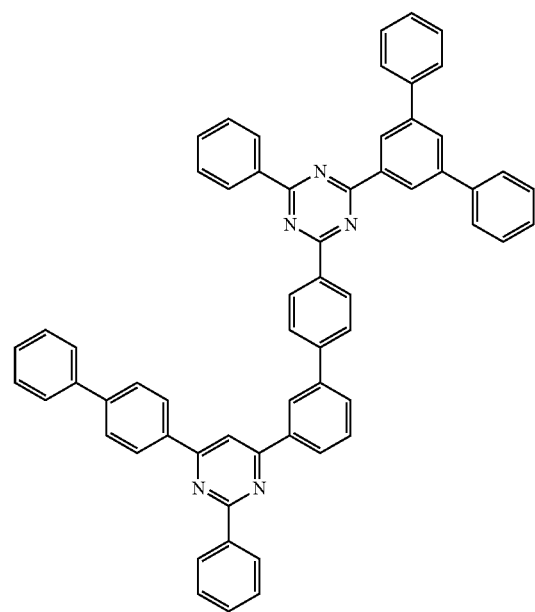
99
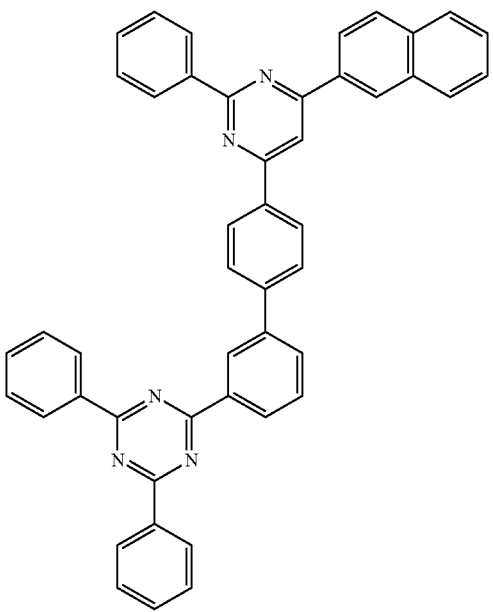
101

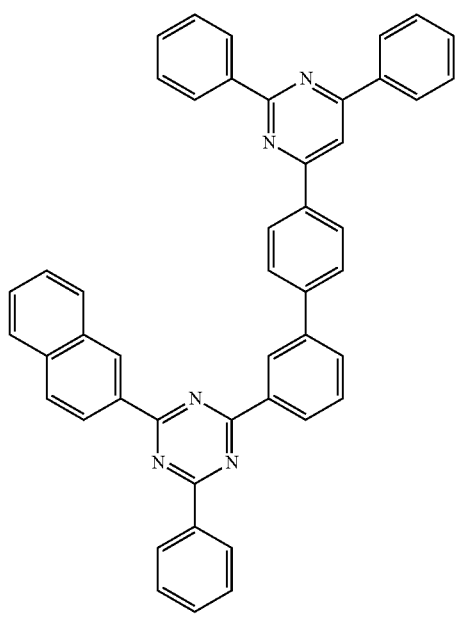
102
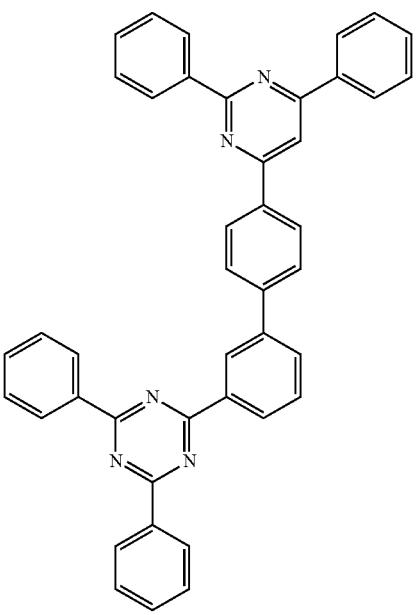
104
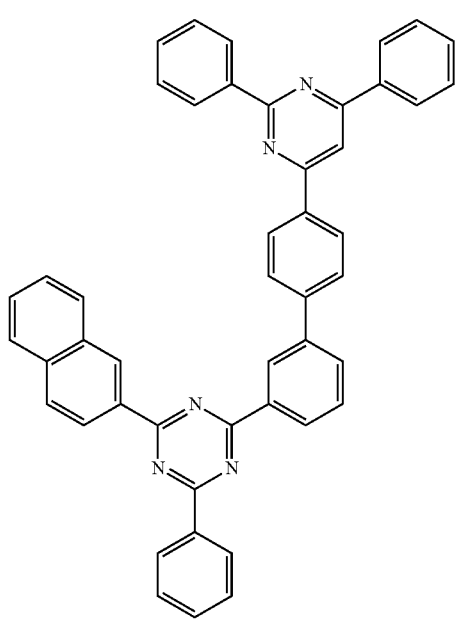
103
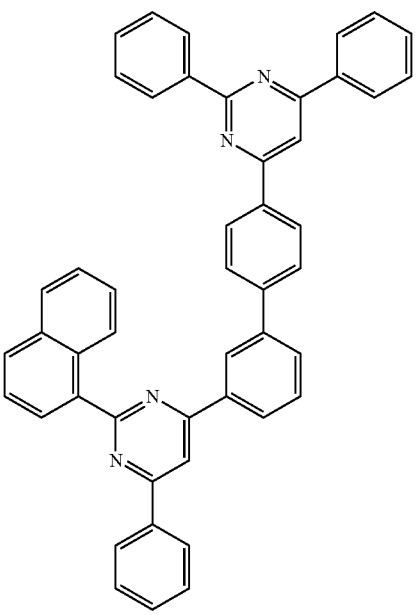
105

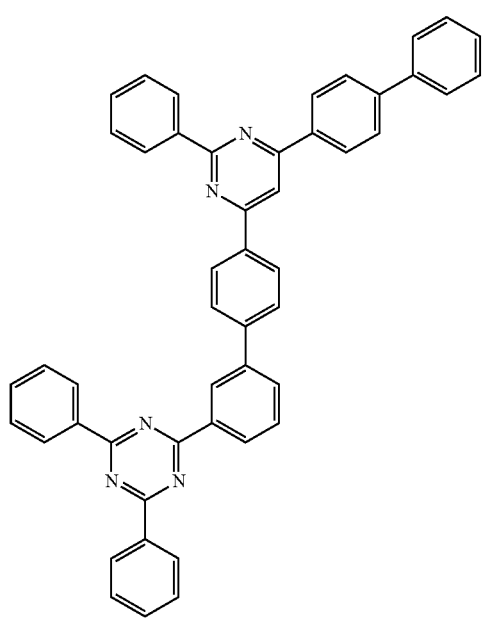
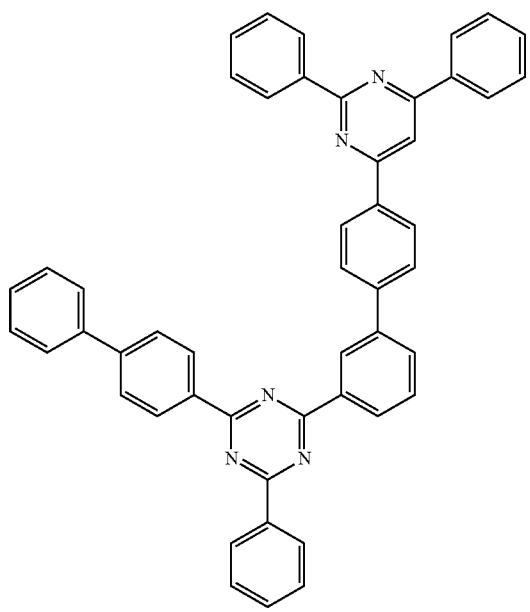

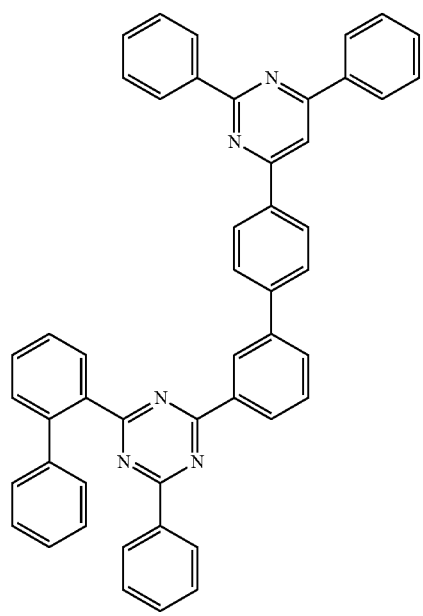
110
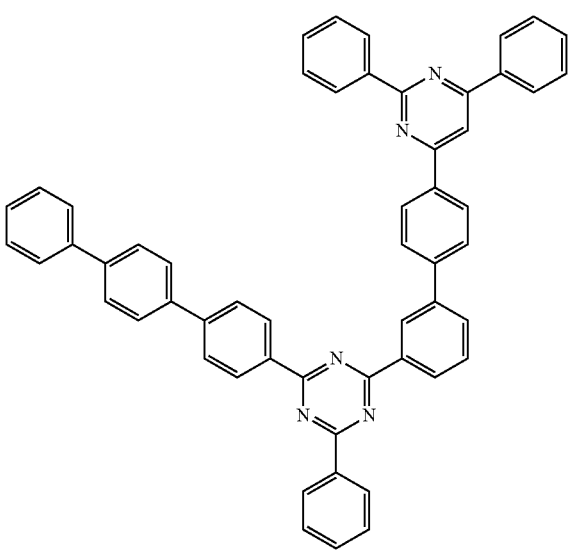
112
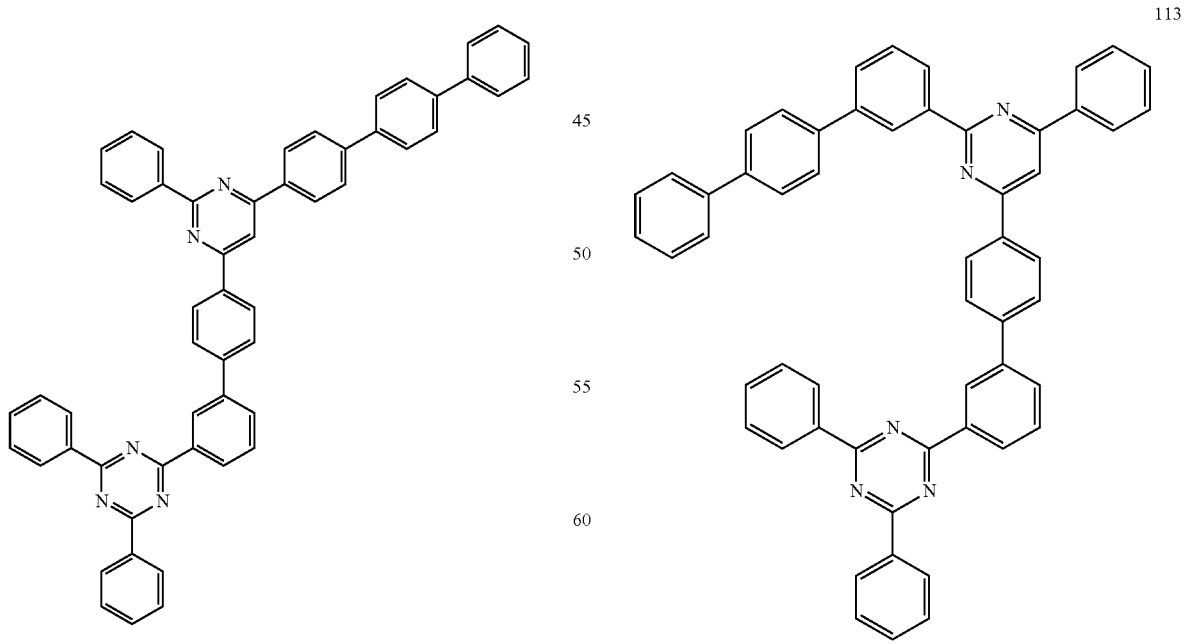
111
113

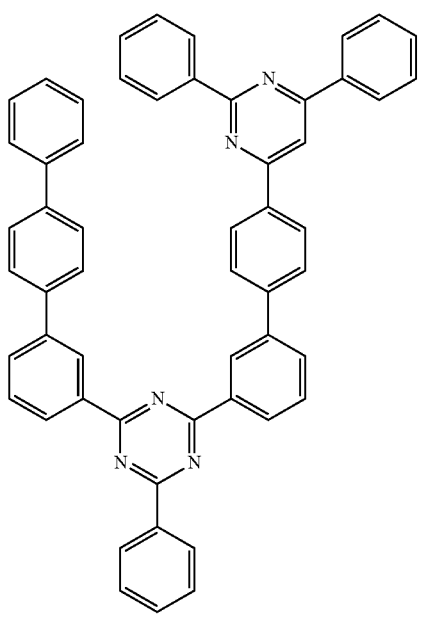
114
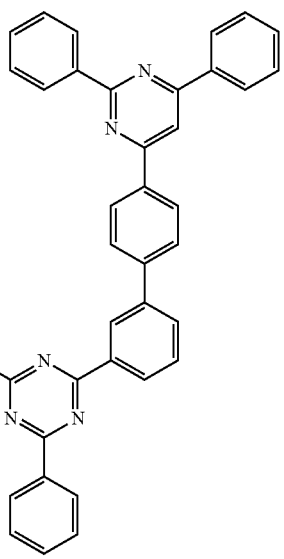
116
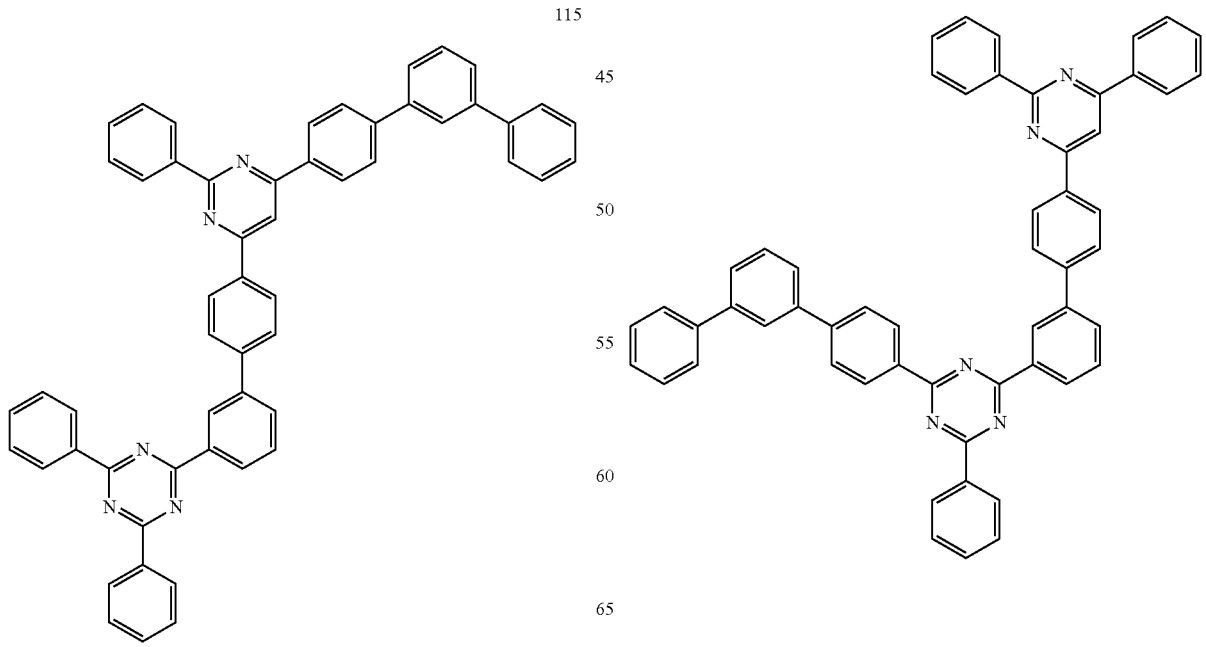
115
117

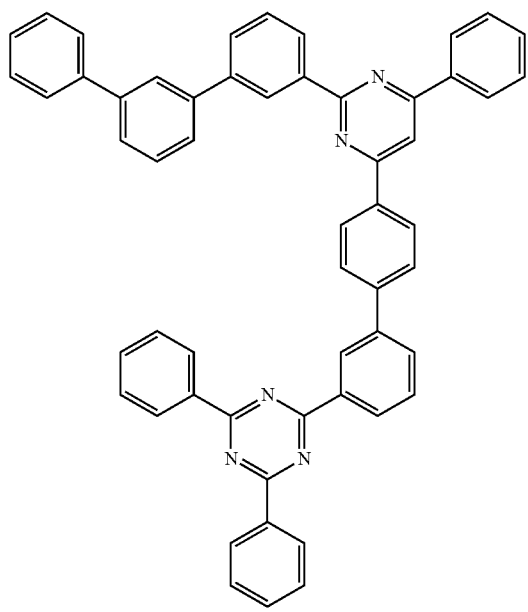
118
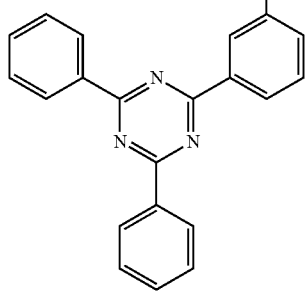
119
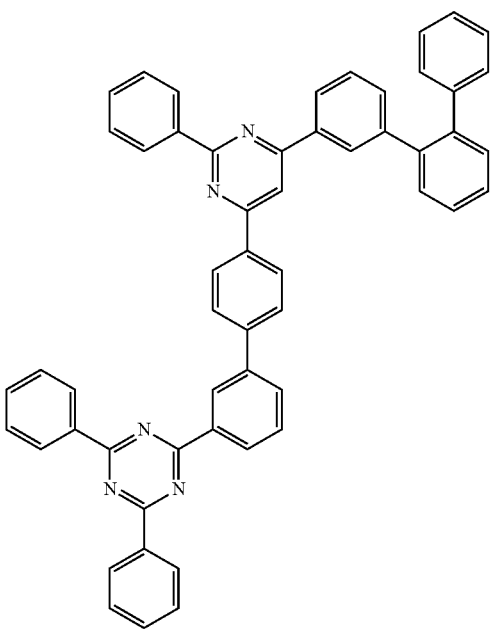
120
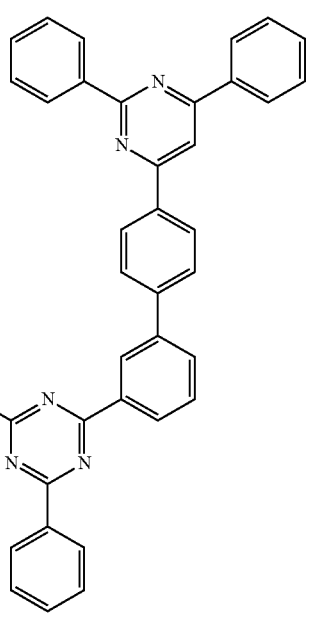
121

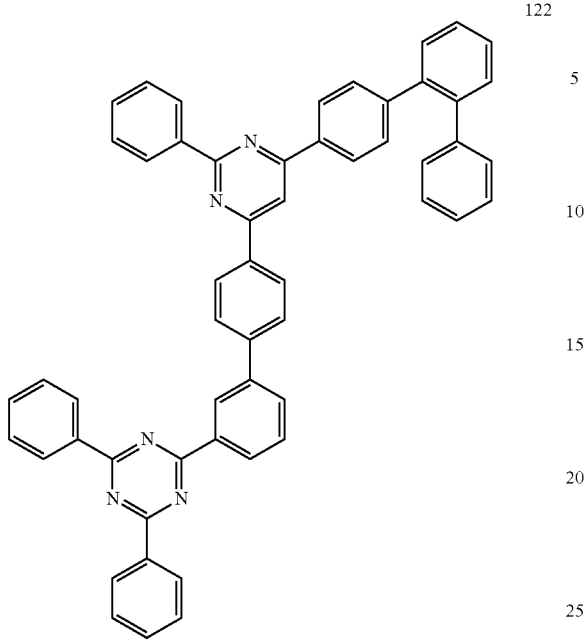
122
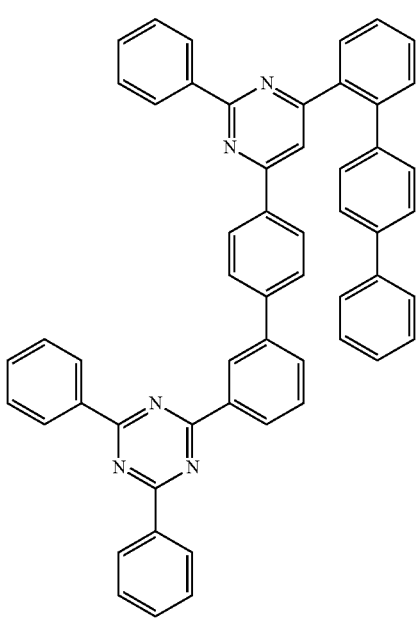
124
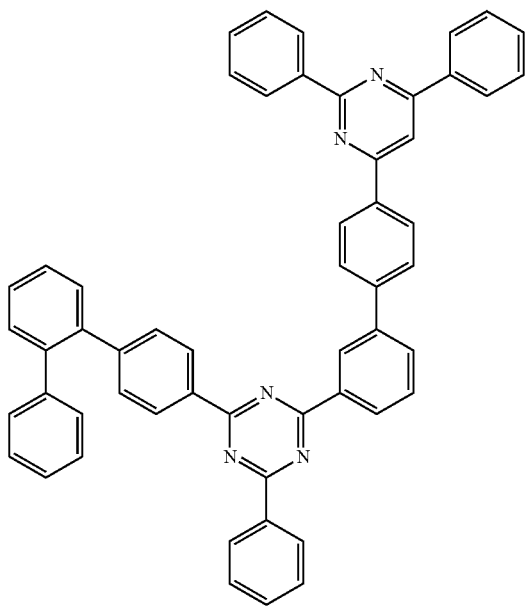
123
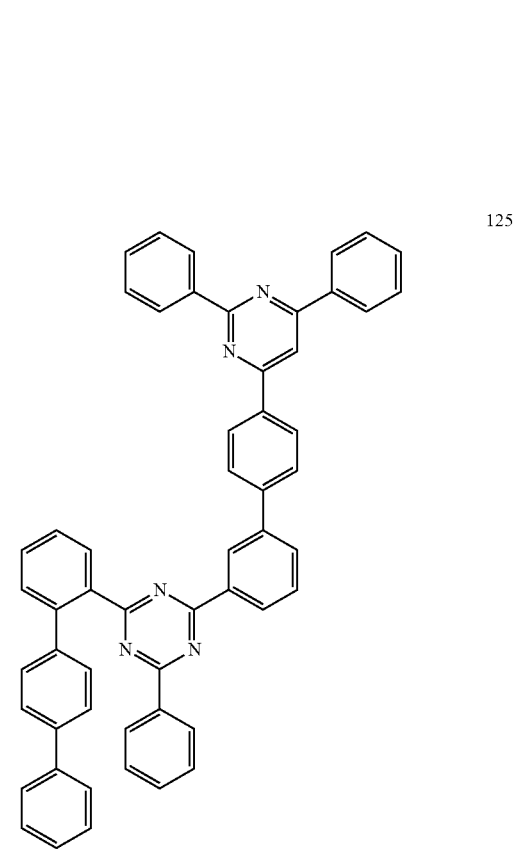 [SMILES: c1ccc(-c2ccc(-c3ccccc3-c3nc(-c4ccccc4)nc(-c4cccc(-c5ccc(-c6cc(-c7ccccc7)nc(-c7ccccc7)n6)cc5)c4)n3)cc2)cc1]
125

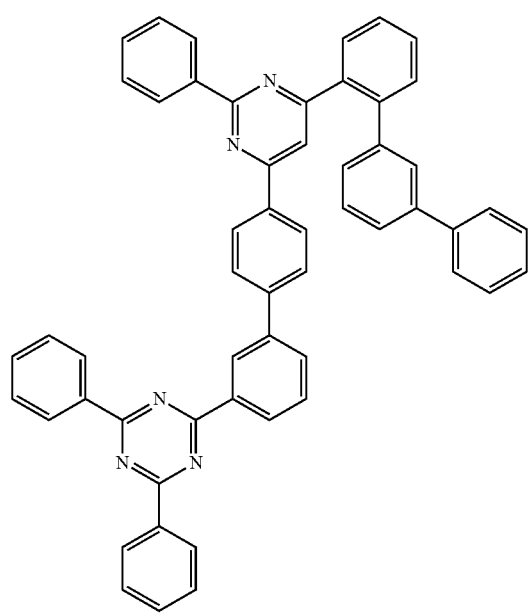
126
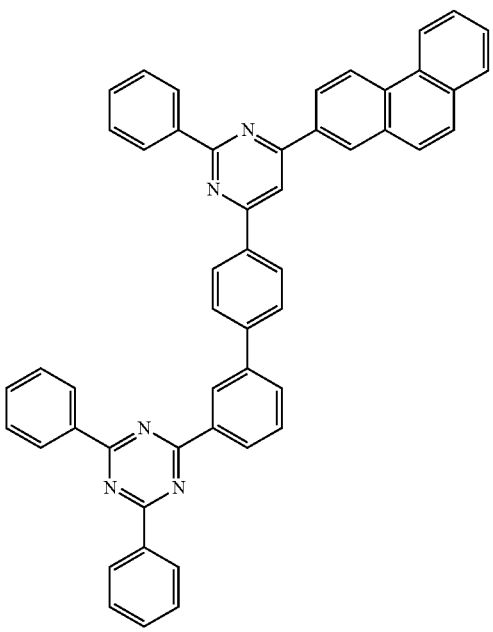
128
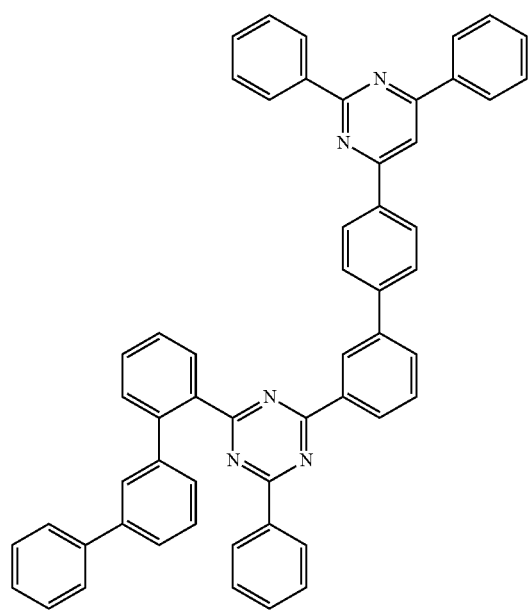
127
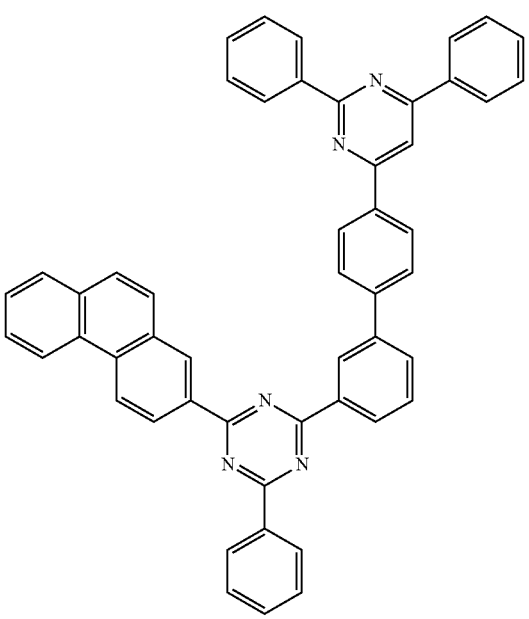
129

-continued
130
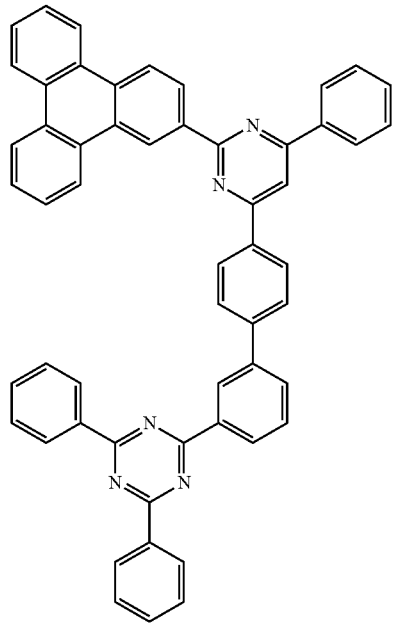
131
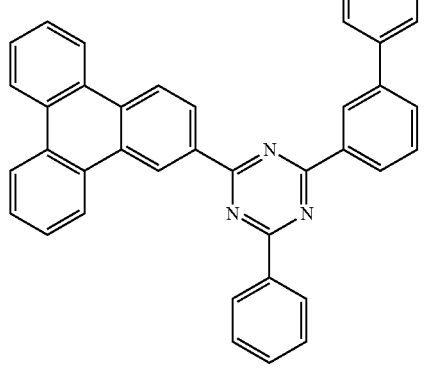
-continued
132
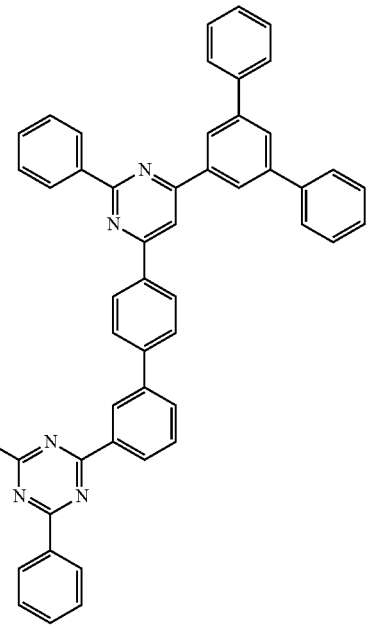
133
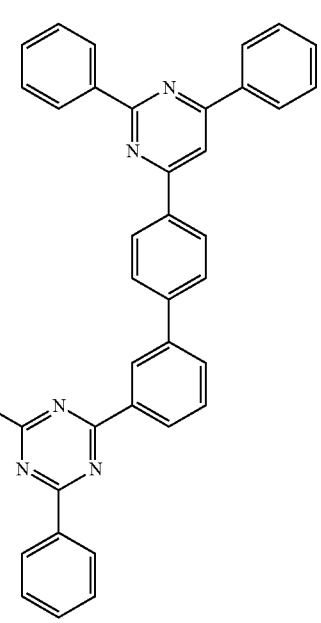

134
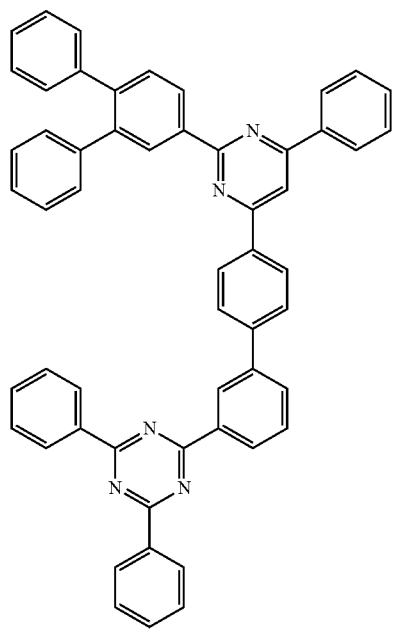
135
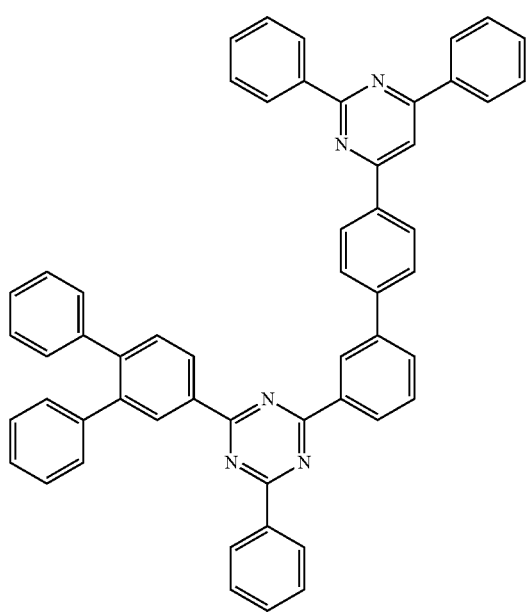
136
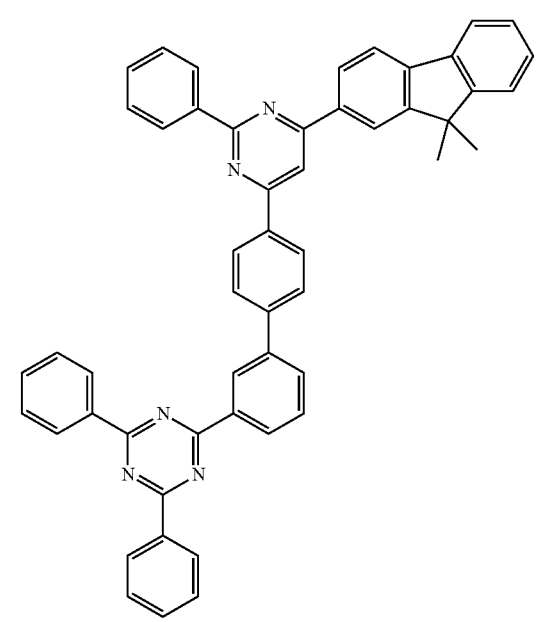
137
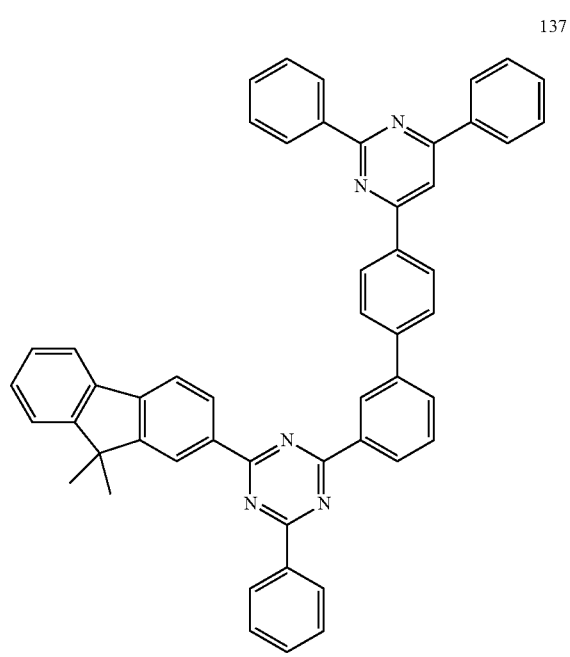

138
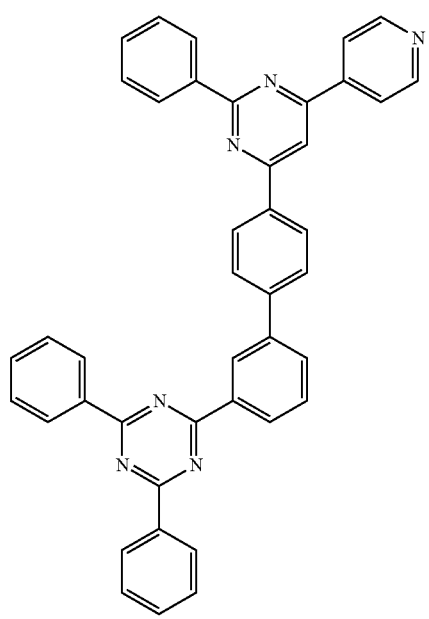
140
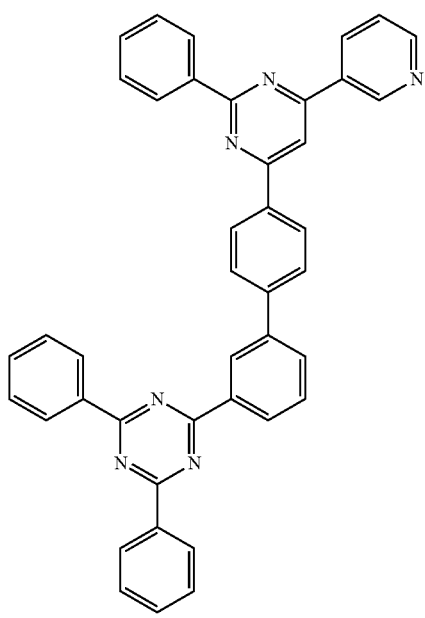
139
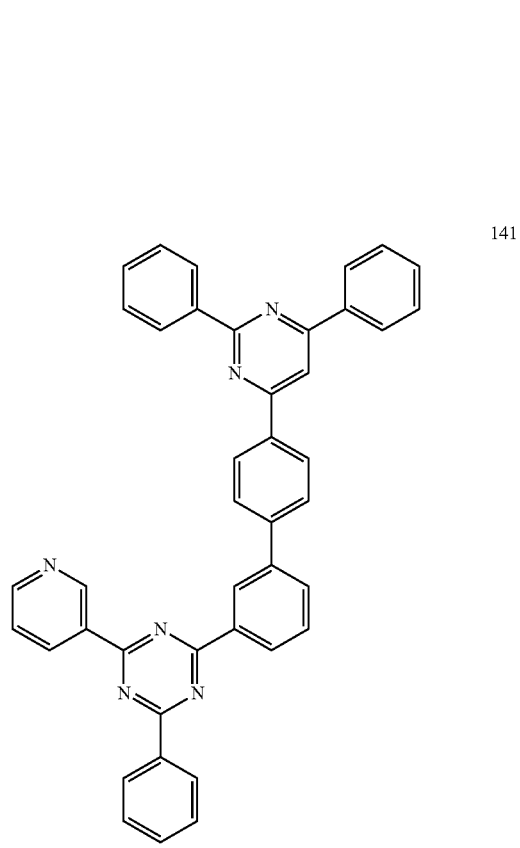 [SMILES: c1ccc(-c2nc(-c3ccc(-c4cccc(-c5nc(-c6ccccc6)nc(-c6ccccc6)n5)c4)cc3)cc(-c3cccnc3)n2)cc1]
141

142
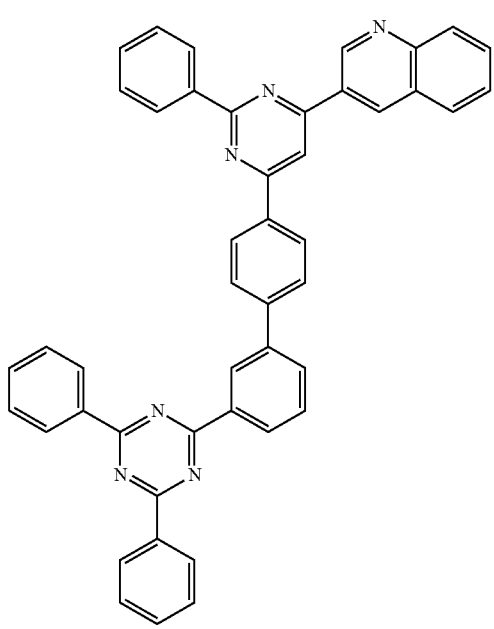
143
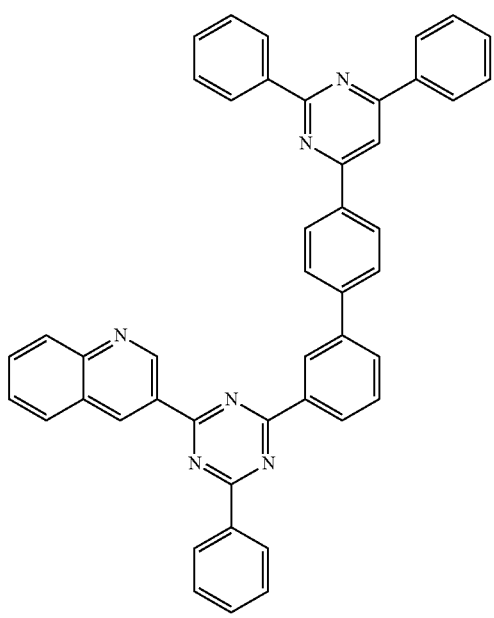
144
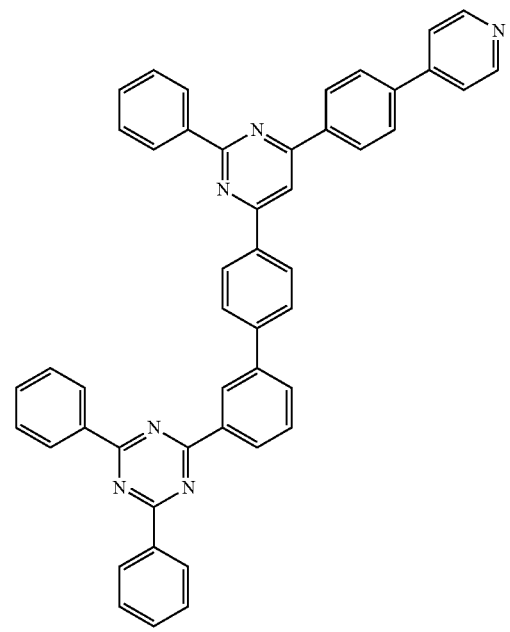
145
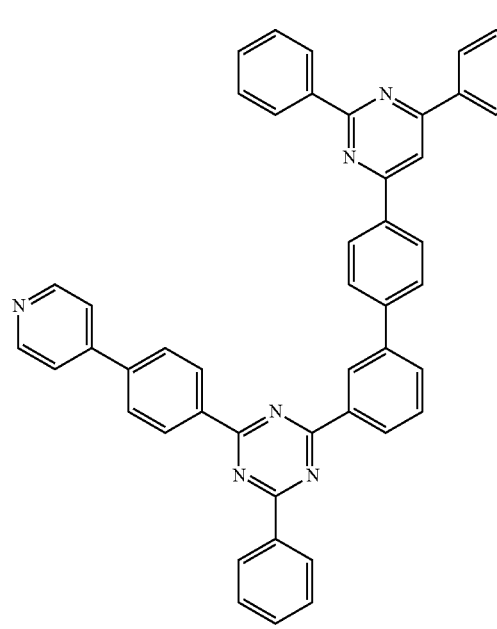

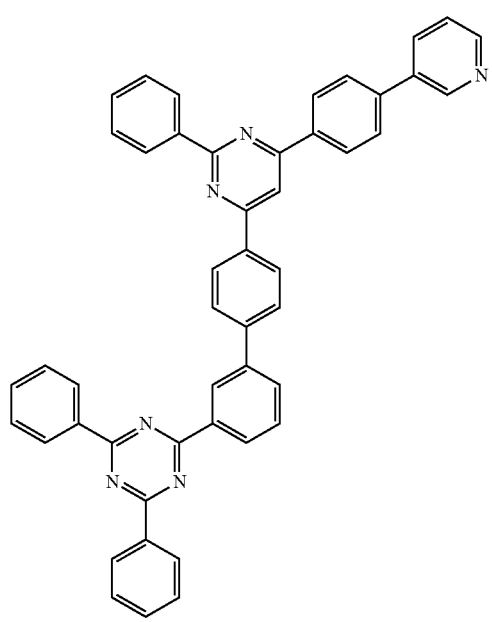
146
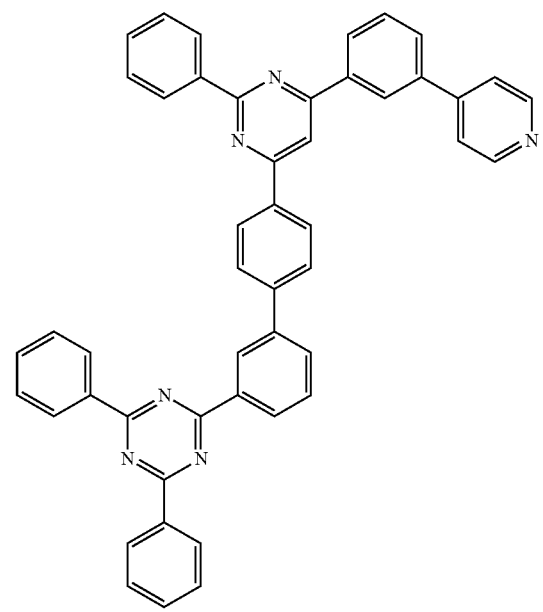
148
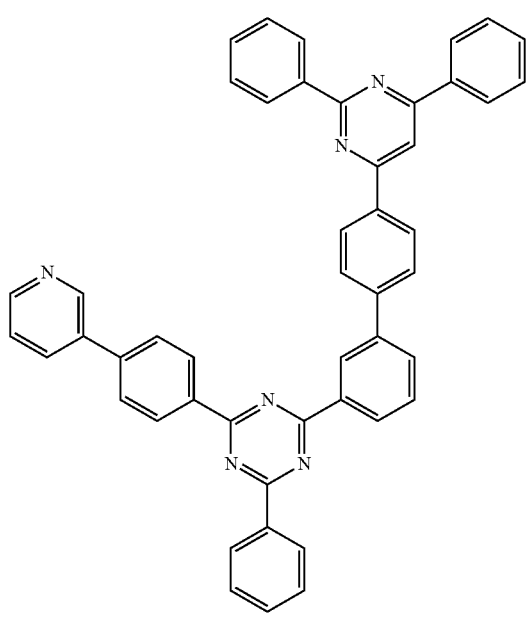
147

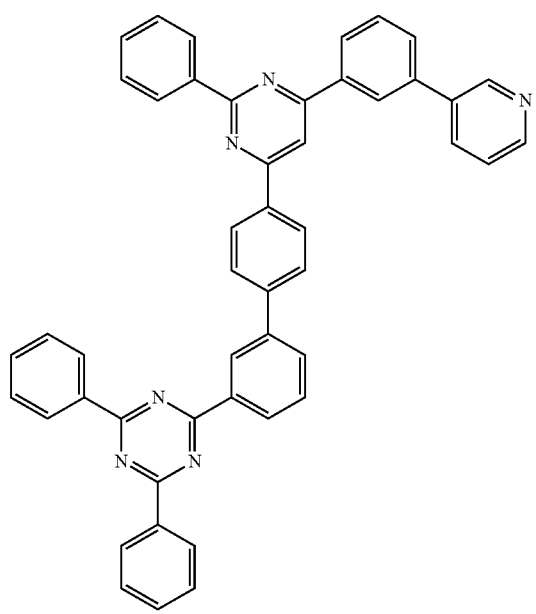
150
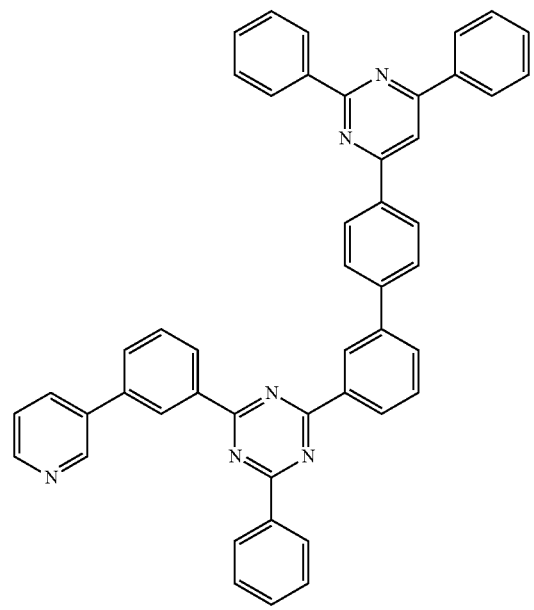
151
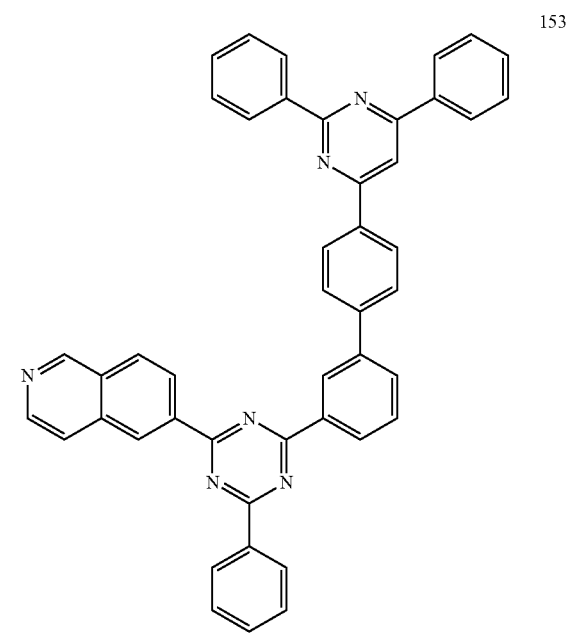
152
153

154
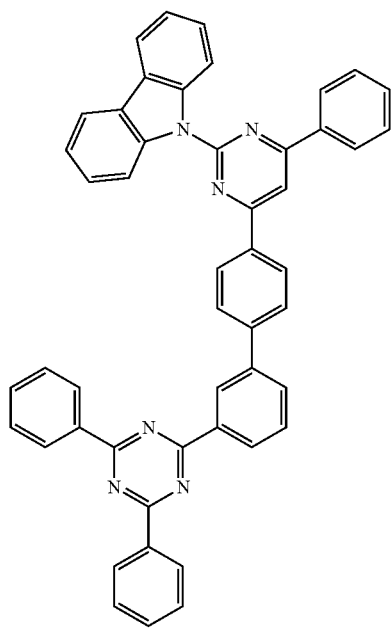
156
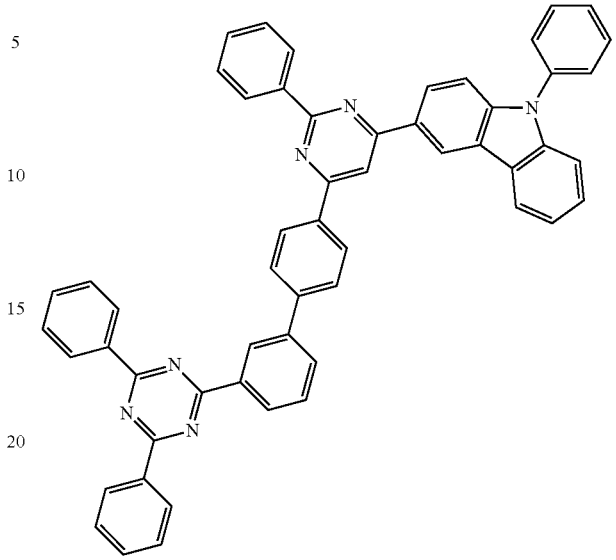
155
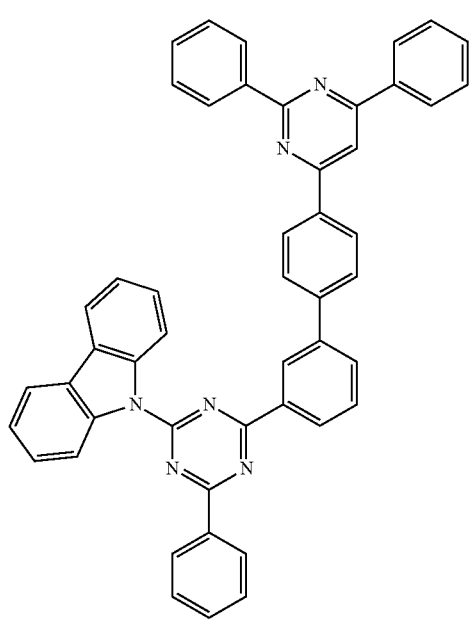
157
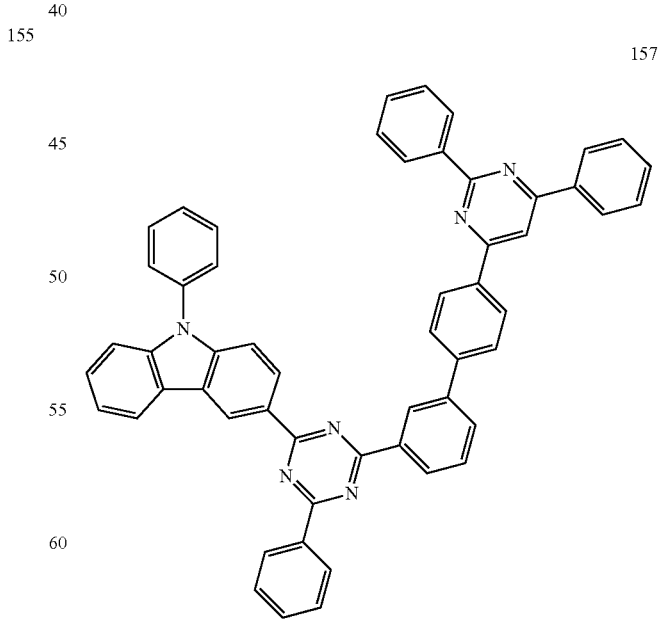

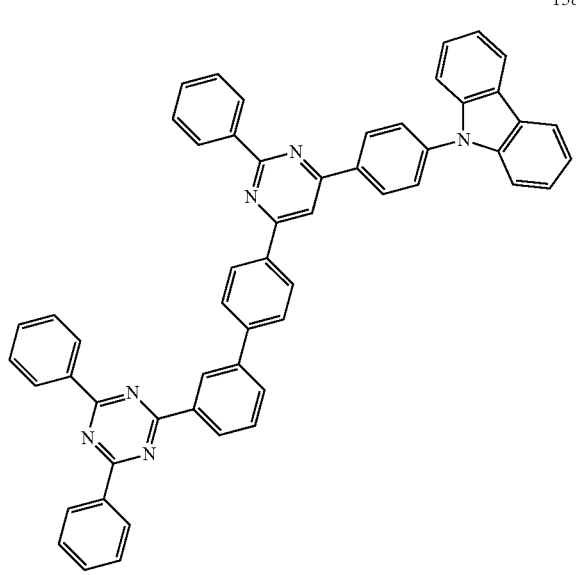
158
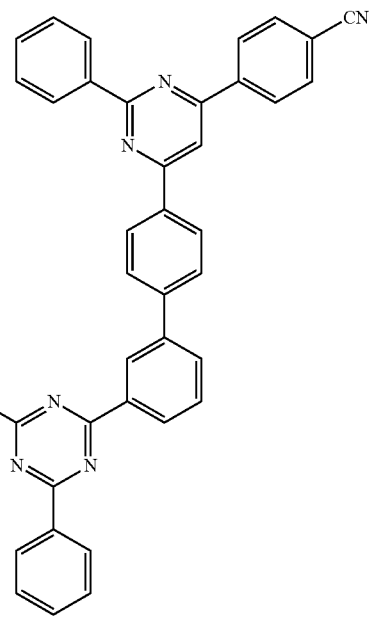
160
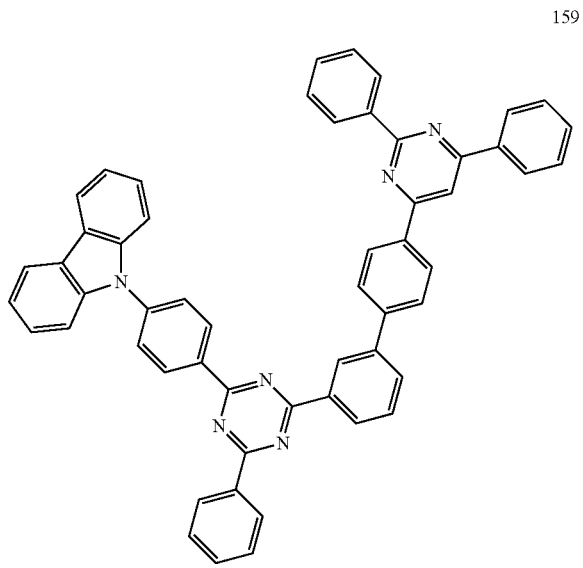
159
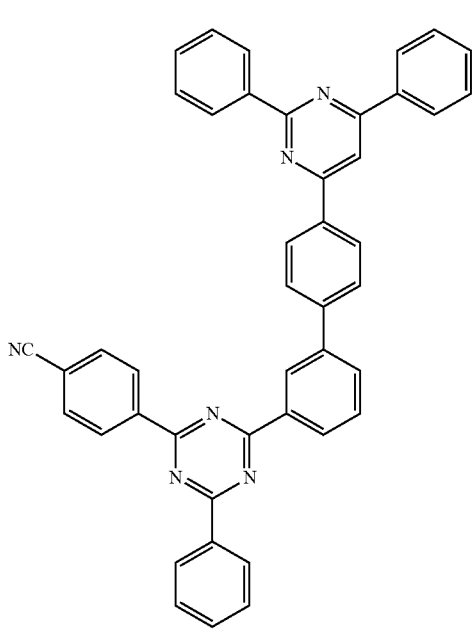
161

-continued
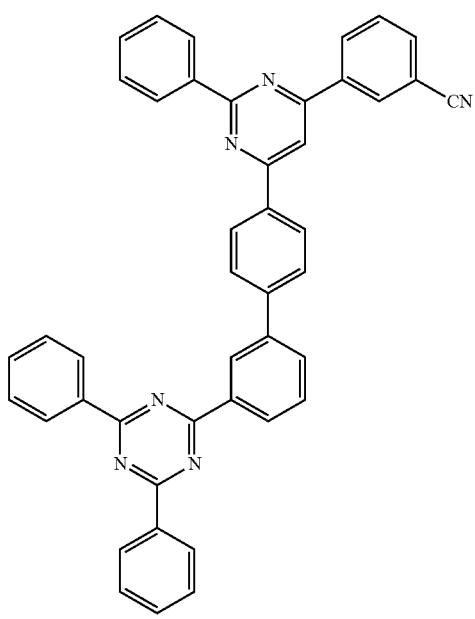
162
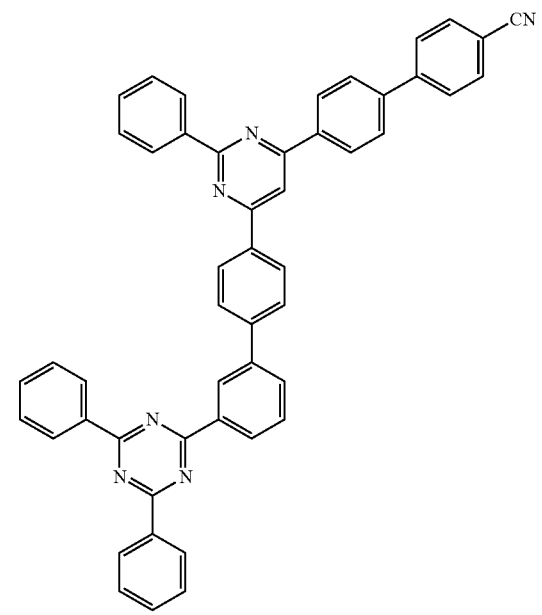
164
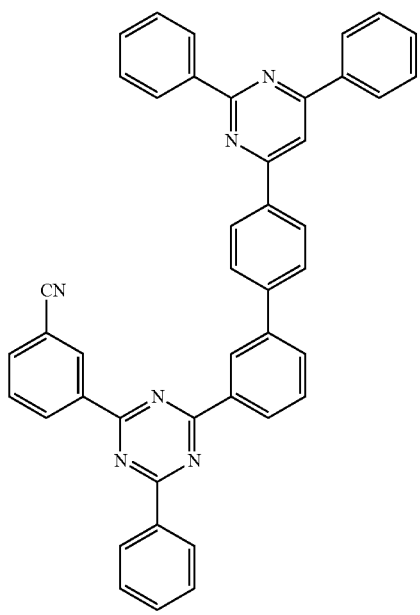
163
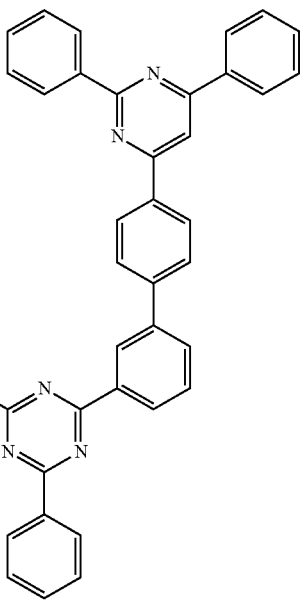
165

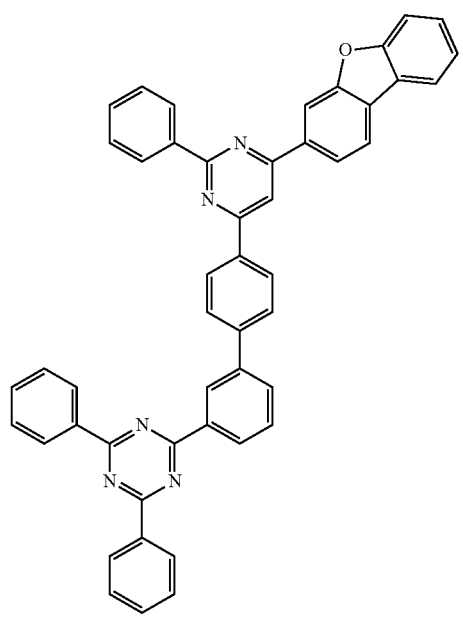
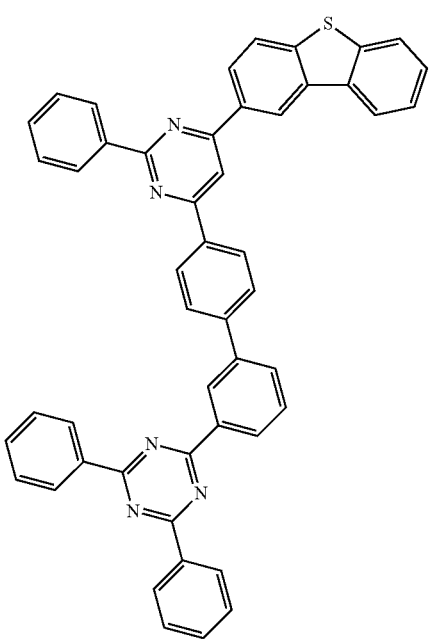

95
-continued
170
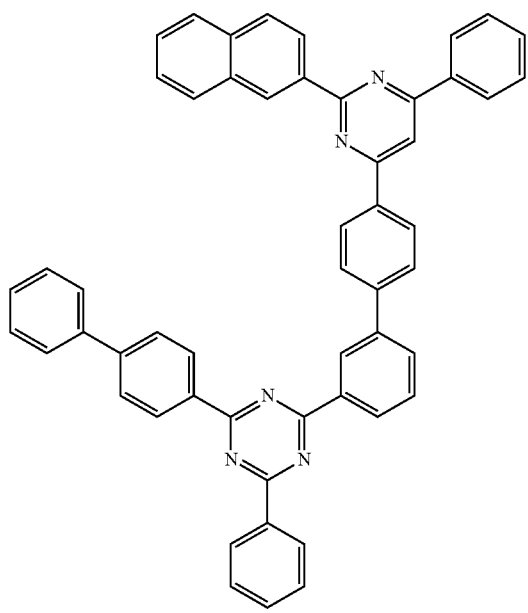
96
-continued
172
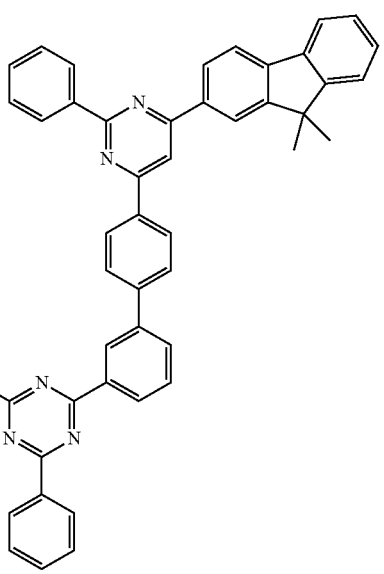
171
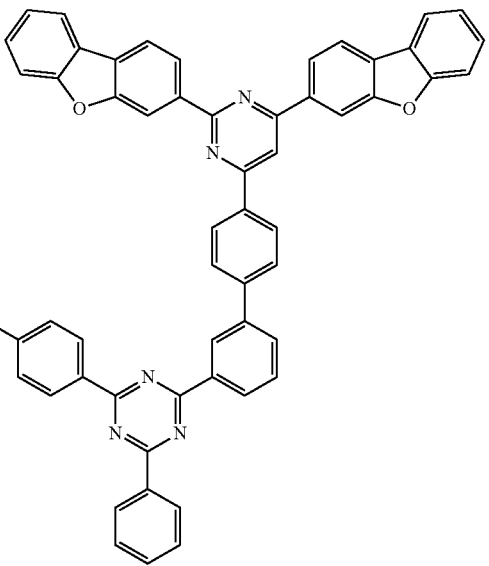
173

97
-continued
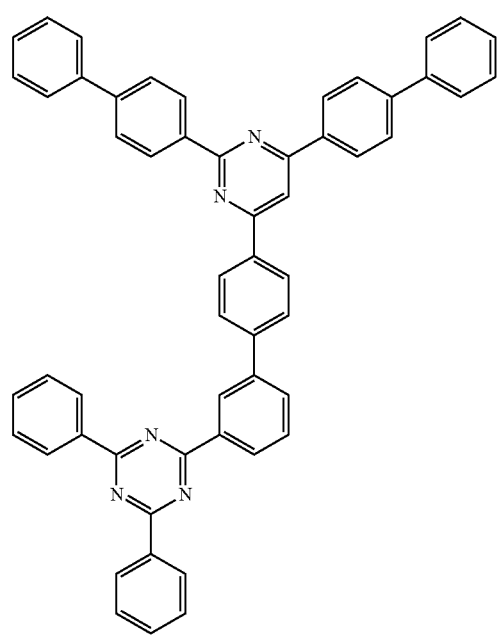
174
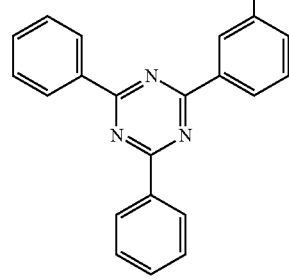
98
-continued
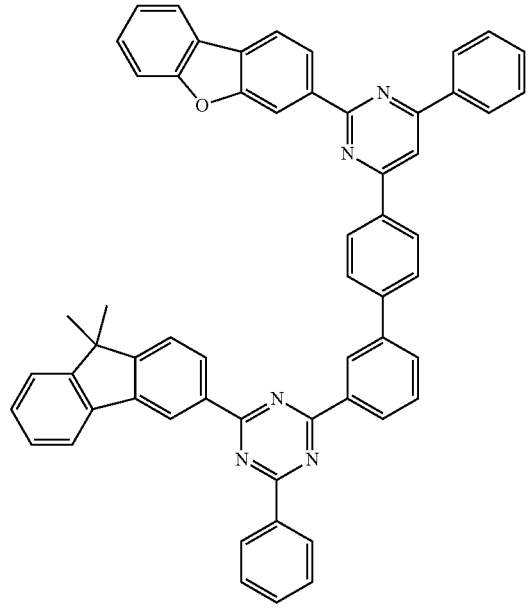
176
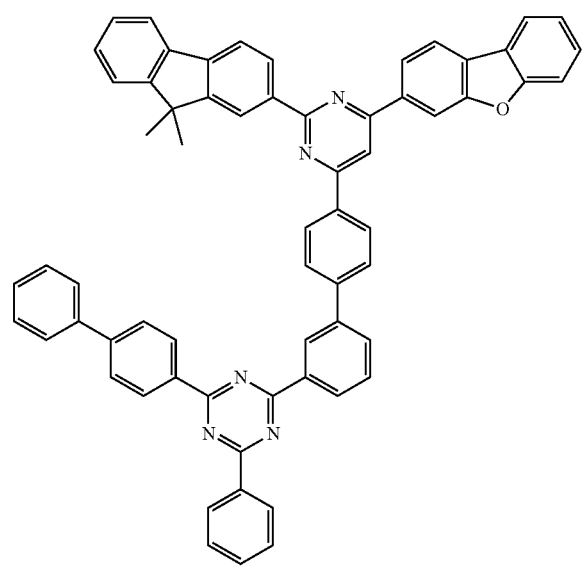
175
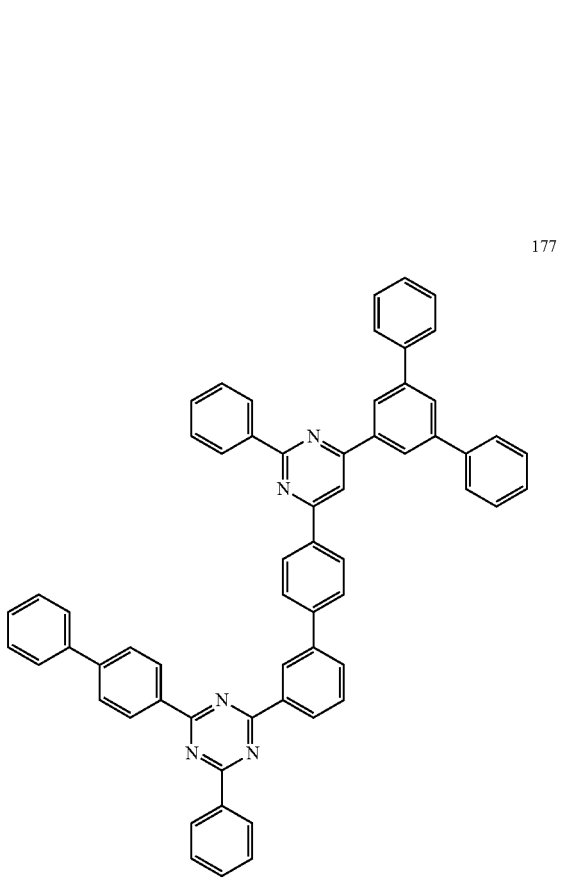
177

178
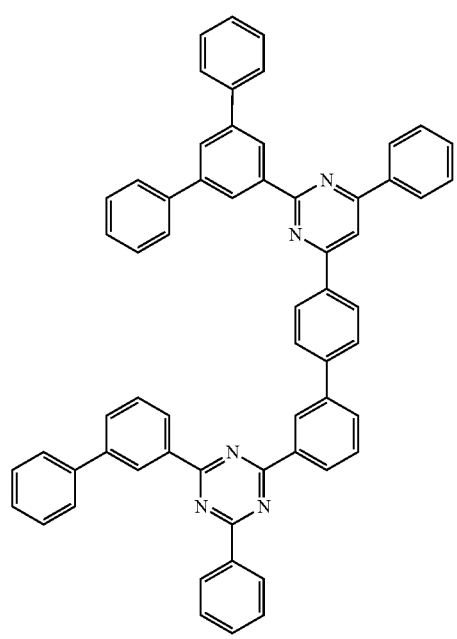
180
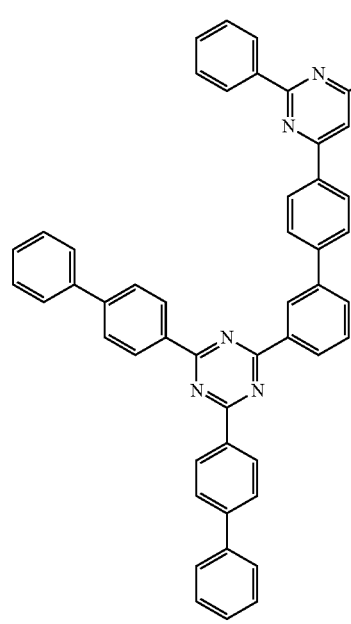
179
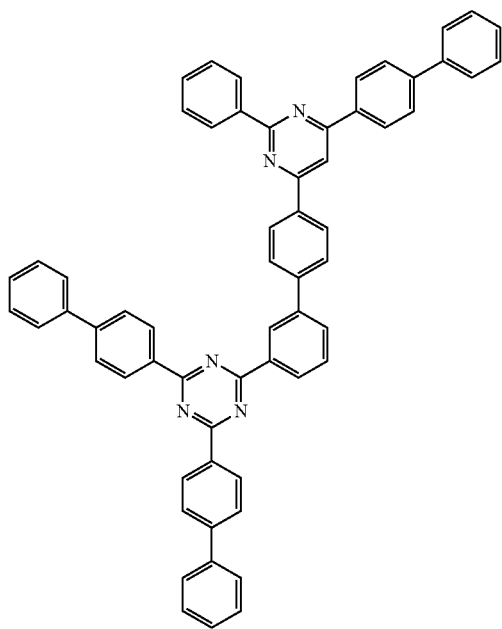
181
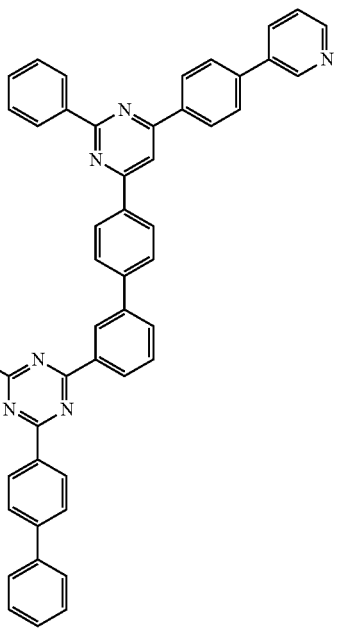

101
-continued
182
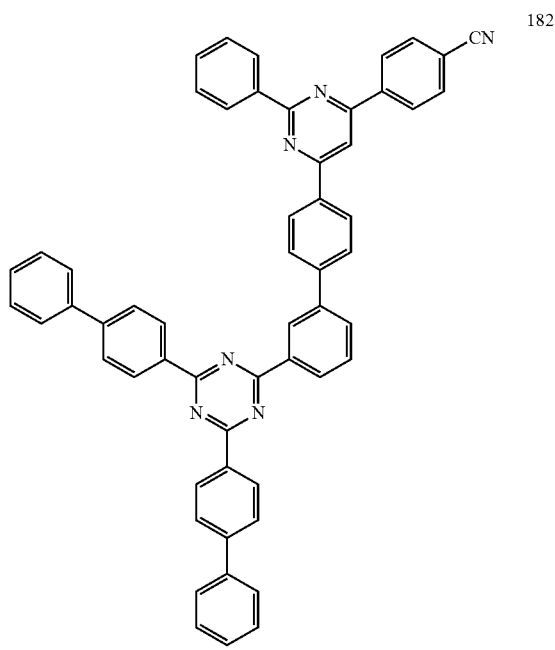
183
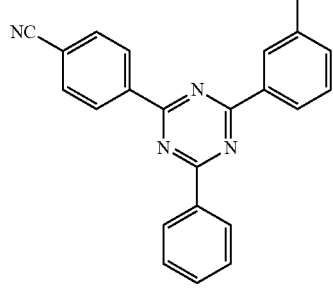
102
-continued
184
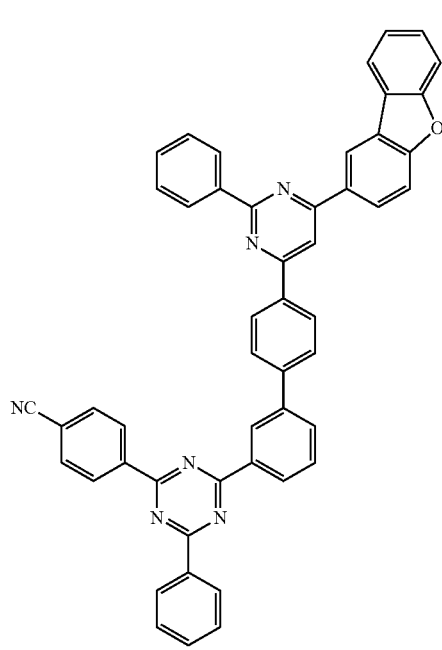
185
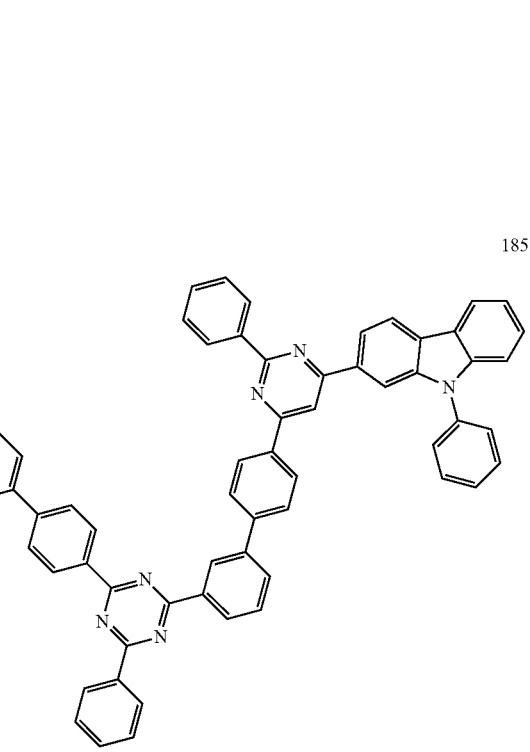

-continued
186
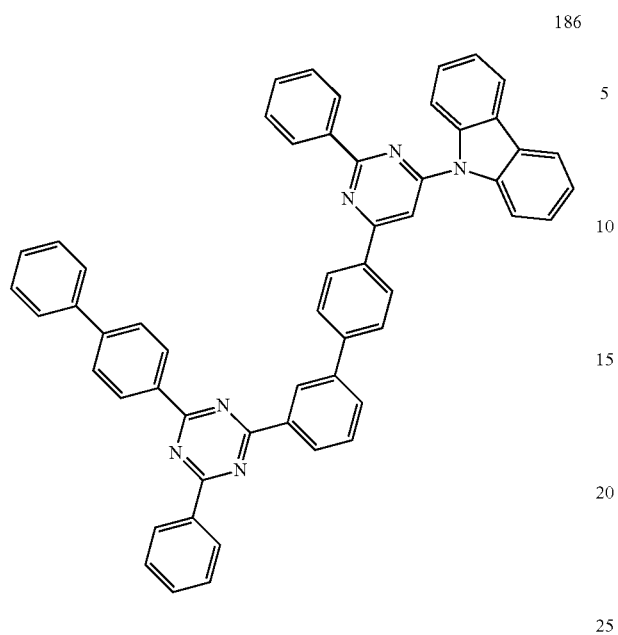
187
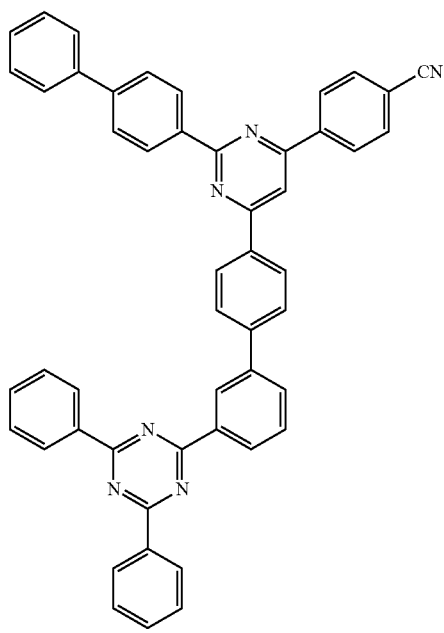
-continued
188
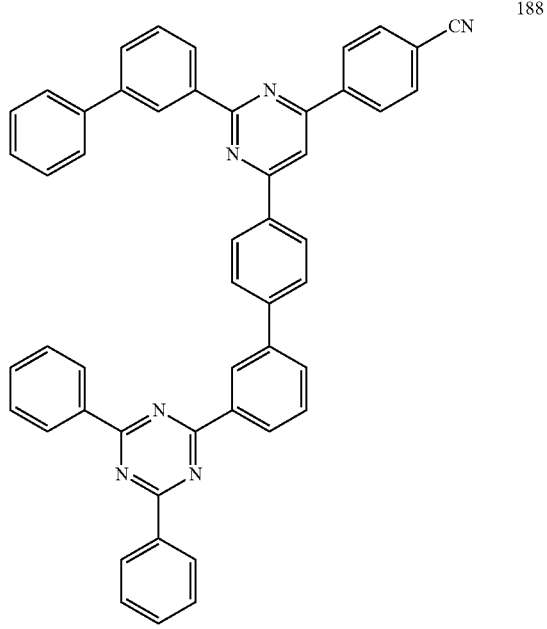
189
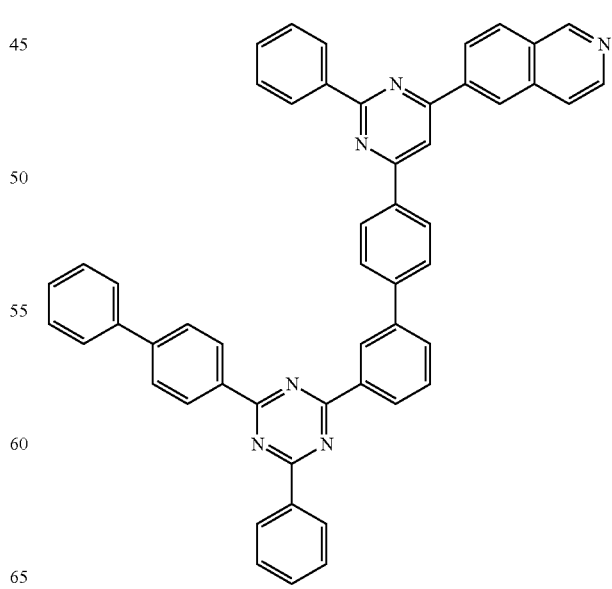

-continued

190

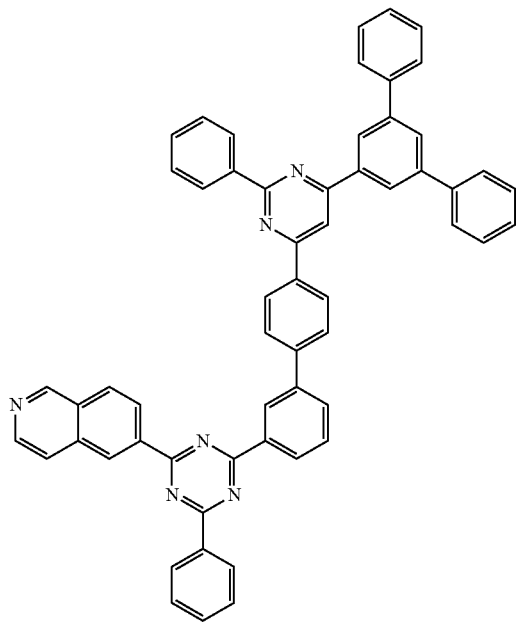

As used herein, "alkyl" refers to a monovalent substituent derived from a linear or branched chain saturated hydrocarbon having 1 to 40 carbon atoms. Examples of such alkyl may include, but are not limited to, methyl, ethyl, propyl, isobutyl, sec-butyl, pentyl, iso-amyl, hexyl or the like.

As used herein, "alkenyl" refers to a monovalent substituent derived from a linear or branched chain unsaturated hydrocarbon having 2 to 40 carbon atoms, having at least one carbon-carbon double bond. Examples of such alkenyl may include, but are not limited to, vinyl, allyl, isopropenyl, 2-butenyl or the like.

As used herein, "alkynyl" refers to a monovalent substituent derived from a linear or branched chain unsaturated hydrocarbon having 2 to 40 carbon atoms, having at least one carbon-carbon triple bond. Examples of such alkynyl may include, but are not limited to, ethynyl, 2-propynyl or the like.

As used herein, "aryl" refers to a monovalent substituent derived from a $C_6$ to $C_{40}$ aromatic hydrocarbon which is in a structure with a single ring or two or more rings combined with each other. In addition, a form in which two or more rings are pendant (e.g., simply attached) to or fused with each other may also be included. Examples of such aryl may include, but are not limited to, phenyl, naphthyl, phenanthryl, anthryl or the like.

As used herein, "heteroaryl" refers to a monovalent substituent derived from a monoheterocyclic or polyheterocyclic aromatic hydrocarbon having 5 to 60 nuclear atoms. In such an embodiment, one or more carbons in the ring, preferably one to three carbons, are substituted with a heteroatom such as N, O, S or Se. In addition, a form in which two or more rings are pendant to or fused with each other may be included and a form fused with an aryl group may be included. Examples of such heteroaryl may include, but are not limited to, a 6-membered monocyclic ring including, for example, pyridyl, pyrazinyl, pyrimidinyl, pyridazinyl and triazinyl; a polycyclic ring including, for example, phenoxathienyl, indolinzinyl, indolyl purinyl, quinolyl, benzothiazole, and carbazolyl; 2-furanyl; N-imidazolyl; 2-isoxazolyl; 2-pyridinyl; 2-pyrimidinyl or the like.

As used herein, "aryloxy" is a monovalent substituent represented by RO—, where R refers to aryl having 5 to 40 carbon atoms. Examples of such aryloxy may include, but are not limited to, phenyloxy, naphthyloxy, diphenyloxy or the like.

As used herein, "alkyloxy" refers to a monovalent substituent represented by R'O—, where R' refers to alkyl having 1 to 40 carbon atoms. Such alkyloxy may include a linear, branched or cyclic structure. Examples of such alkyloxy may include, but are not limited to, methoxy, ethoxy, n-propoxy, 1-propoxy, t-butoxy, n-butoxy, pentoxy or the like.

As used herein, "arylamine" refers to amine substituted with aryl having 6 to 40 carbon atoms.

As used herein, "cycloalkyl" refers to a monovalent substituent derived from a monocyclic or polycyclic non-aromatic hydrocarbon having 3 to 40 carbon atoms. Examples of such cycloalkyl may include, but are not limited to, cyclopropyl, cyclopentyl, cyclohexyl, norbornyl, adamantine or the like.

As used herein, "heterocycloalkyl" refers to a monovalent substituent derived from a non-aromatic hydrocarbon having 3 to 40 nuclear atoms, where one or more carbons in the ring, preferably one to three carbons, are substituted with a heteroatom such as N, O, S or Se. Examples of such heterocycloalkyl may include, but are not limited to, morpholine, piperazine or the like.

As used herein, "alkylsilyl" refers to silyl in which substitution with alkyl having 1 to 40 carbon atoms has been made, and "arylsilyl" refers to silyl in which substitution with aryl having 5 to 40 carbon atoms has been made.

As used herein, the term "fused ring (e.g., condensed ring)" refers to a fused aliphatic ring, a fused aromatic ring, a fused heteroaliphatic ring, a fused heteroaromatic ring, or a combination thereof.

<Electron Transport Layer Material>

The present invention provides an electron transport layer including the compound represented by Chemical Formula 1.

The electron transport layer (ETL) serves to move electrons injected from the cathode to an adjacent layer, specifically a light emitting layer.

The compound represented by Chemical Formula 1 may be used solely as an electron transport layer (ETL) material, or may be used in combination with an electron transport layer material known in the art. It may preferably be used solely.

The electron transport layer material that may be used in combination with the compound of Chemical Formula 1 includes an electron transport material commonly known in the art. Non-limiting examples of applicable electron transport materials may include oxazole-based compounds, isoxazole-based compounds, triazole-based compounds, isothiazole-based compounds, oxadiazole-based compounds, thiadiazole-based compounds, perylene-based compounds, aluminum complexes (e.g., tris(8-quinolinolato)-aluminium ($Alq_3$), BAlq, SAlq, $Almq_3$), gallium complexes (e.g., Gaq'2OPiv, Gaq'2OAc, 2(Gaq'2)), etc. These may be used solely or two or more types may be used in combination.

In the present invention, when the compound of Chemical Formula 1 and the material for the electron transport layer are used in combination, a mixing ratio thereof is not particularly limited, and may be appropriately adjusted within a range known in the art.

<Electron Transport Auxiliary Layer Material>

In addition, the present invention provides an auxiliary electron transport layer including the compound represented by Chemical Formula 1.

The electron transport auxiliary layer is disposed between the light emitting layer and the electron transport layer and serves to substantially prevent diffusion of excitons or holes generated in the light emitting layer into the electron transport layer.

The compound represented by Chemical Formula 1 may be used solely as an electron transport auxiliary layer material, or may be combined with an electron transport layer material known in the art. It may preferably be used solely.

The electron transport auxiliary layer material that may be used in combination with the compound of Chemical Formula 1 includes an electron transport material commonly known in the art. For example, the electron transport auxiliary layer may include an oxadiazole derivative, a triazole derivative, a phenanthroline derivative (e.g., BCP), a heterocyclic derivative containing nitrogen, and the like.

In the present invention, when the compound of Chemical Formula 1 and the material for the electron transport auxiliary layer are used in combination, a mixing ratio thereof is not particularly limited, and may be appropriately adjusted within a range known in the art.

<Organic Electroluminescent Device>

The present invention provides an organic EL device including the compound represented by Chemical Formula 1.

More specifically, the organic EL device according to the present invention includes an anode (e.g., a positive electrode), a cathode (e.g., a negative electrode), and one or more organic layers disposed between the anode and the cathode, and at least one of the one or more organic layers includes the compound represented by Chemical Formula 1. In such an embodiment, the compound may be used solely or as a combination of two or more kinds thereof.

The one or more organic layers may be any one or more of a hole injection layer, a hole transport layer, a light emitting layer, a light emitting auxiliary layer, an electron transport layer, an electron transport auxiliary layer, and an electron injection layer, and at least one of the organic layers may include the compound represented by Chemical Formula 1. Specifically, the organic layer including the compound represented by Chemical Formula 1 preferably is a phosphorescent host material for the light emitting layer or an electron transport material for an electron transport layer or an electron transport auxiliary layer.

The light emitting layer of the organic EL device according to the present invention may include a host material and a dopant material, and in such a case, may include the compound of Chemical Formula 1 as the host material. In addition, the light emitting layer of the present invention may include a compound known in the art other than the compound represented by Chemical Formula 1 as a host.

When the compound represented by Chemical Formula 1 is included as a material for the light emitting layer of the organic EL device, preferably a phosphorescent host material of blue, green, and red colors, a binding force between holes and electrons in the light emitting layer increases, so the efficiency (luminous efficiency and power efficiency), lifespan, luminance and driving voltage of the organic EL device may be improved. Specifically, the compound represented by Chemical Formula 1 may preferably be included in the organic EL device as a green and/or red phosphorescent host, a fluorescent host, or a dopant material.

The structure of the organic EL device of the present invention is not particularly limited, but a non-limiting example thereof may be a structure in which a substrate, an anode, a hole injection layer, a hole transport layer, a light emitting auxiliary layer, a light emitting layer, an electron transport auxiliary layer, an electron transport layer, an electron transport layer and a cathode are sequentially stacked. In such an embodiment, at least one of the hole injection layer, the hole transport layer, the light emitting auxiliary layer, the light emitting layer, the electron transport auxiliary layer, the electron transport layer and the electron transport layer may include the compound represented by Chemical Formula 1. Preferably, the light emitting layer, and more preferably, the phosphorescent host may include the compound represented by Chemical Formula 1. In such an embodiment, an electron injection layer may be further stacked on the electron transport layer.

In addition, the structure of the organic EL device of the present invention may have a structure in which an insulating layer or an adhesive layer is inserted at an interface between the electrode and the organic layer.

The organic EL device of the present invention may be prepared by materials and methods known in the art, except that the one or more organic layers include the compound represented by Chemical Formula 1.

The organic layer may be formed by a vacuum deposition (evaporation) method or a solution coating method. Examples of the solution coating method may include, but are not limited to, spin coating, dip coating, doctor blading, inkjet printing, thermal transfer or the like.

The substrate used in Preparation the organic EL device of the present invention is not particularly limited, but silicon wafers, quartz, glass plates, metal plates, plastic films, sheets or the like may be used.

In addition, any anode material known in the art may be used as a material of the anode without limitation. For example, examples thereof may include, but is not limited to, a metal such as vanadium, chromium, copper, zinc, and gold or an alloy thereof; metal oxides such as zinc oxide, indium oxide, indium tin oxide (ITO), or indium zinc oxide (IZO); combination of oxide with metal such as ZnO:Al or $SnO_2$:Sb; conductive polymers such as polythiophene, poly(3-methylthiophene), poly [3,4-(ethylene-1,2-dioxy) thiophene] (PEDT), polypyrrole or polyaniline; and carbon black or the like.

In addition, any cathode material known in the art may be used as a material of the cathode without limitation. For example, examples thereof may include, but is not limited to, a metal such as magnesium, calcium, sodium, potassium, titanium, indium, yttrium, lithium, gadolinium, aluminum, silver, tin, or lead or an alloy thereof; a multi-layered material such as LiF/Al or $LiO_2$/Al or the like.

In addition, a material of the hole injection layer, the hole transport layer, the electron injection layer, and the electron transport layer is not particularly limited and conventional materials known in the art may be used without limitation.

Hereinafter, the present invention will be described in detail with reference to the following embodiments. However, the following embodiments are merely to illustrate the invention, and the present invention is not limited to the following embodiments.

Preparation Example

[Preparation Example 1] Synthesis of Tz-1

<Step 1> Synthesis of 2-chloro-4-(naphthalen-2-yl)-6-phenyl-1,3,5-triazine

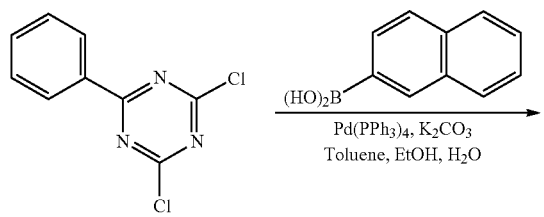

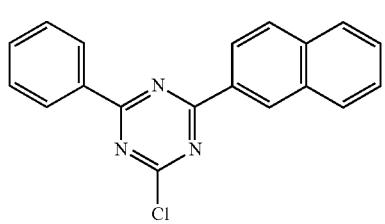

50.0 g of 2,4-dichloro-6-phenyl-1,3,5-triazine, 40.0 g of naphthalen-2-yl boronic acid, 6.0 g of tetrakisphenylphosphine palladium (0), and 45 g of $K_2CO_3$ were added to 1000 ml of toluene, 250 ml of ethanol, and 250 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 48 g of 2-chloro-4-(naphthalene-2yl)-6-phenyl-1,3,5-triazine was obtained (yield 68%).

1H-NMR: δ 8.49 (d, 2H), 8.33 (d, 2H), 8.12-8.00 (m, 3H), 7.61-7.45 (m, 5H)

Mass [(M+H)$^+$]: 319

<Step 2> Synthesis of Tz-1

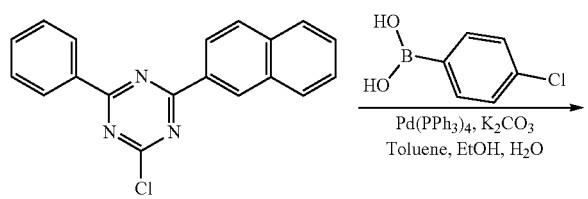

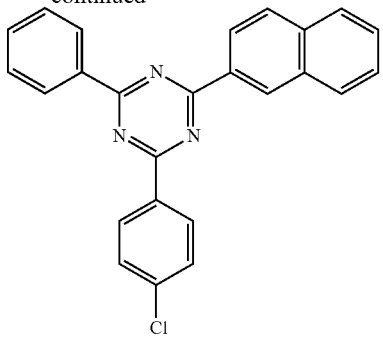

15.0 g of 2-chloro-4-(naphthalen-2-yl)-6-phenyl-1,3,5-triazine, 6.0 g of (4-chlorophenyl) boronic acid, 0.9 g of tetrakisphenylphosphine palladium (0), and 7.0 g of $K_2CO_3$ were added to 350 ml of toluene, 60 ml of ethanol, and 60 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 12.0 g of Tz-1 was obtained (yield 60%).

1H-NMR: 8.49 (d, 2H), 8.33 (d, 2H), 8.25 (d, 2H), 8.12-8.00 (m, 3H), 7.61-7.45 (m, 7H)

Mass: [(M+H)$^+$]: 395

[Preparation Example 2] Synthesis of Tz-2

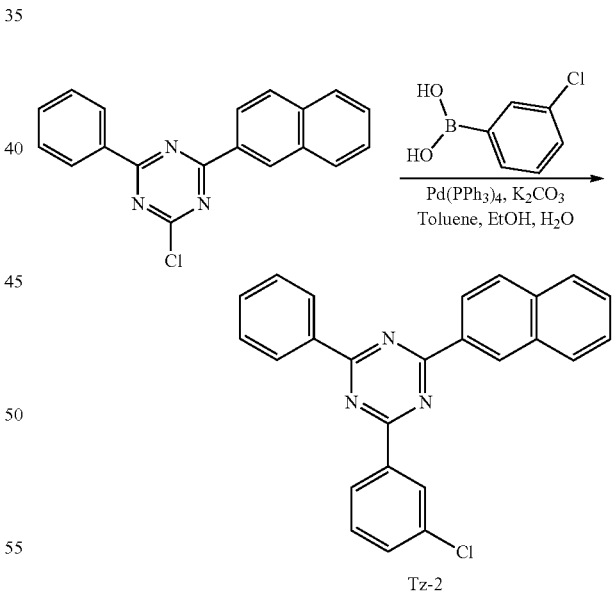

15.0 g of 2-chloro-4-(naphthalen-2-yl)-6-phenyl-1,3,5-triazine, 6.0 g of (3-chlorophenyl) boronic acid, 0.9 g of tetrakisphenylphosphine palladium (0), and 7.0 g of $K_2CO_3$ were added to 350 ml of toluene, 60 ml of ethanol, and 60 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 11.6 g of Tz-2 was obtained (yield 58%).

1H-NMR: 8.49 (d, 2H), 8.33 (d, 2H), 8.16-8.00 (m, 4H), 7.61-7.45 (m, 10H)

Mass: [(M+H)⁺]: 395

[Preparation Example 3] Synthesis of Tz-3

<Step 1> Synthesis of 2-([1,1'-biphenyl]-4-yl)-4-chloro-6-phenyl-1,3,5-triazine

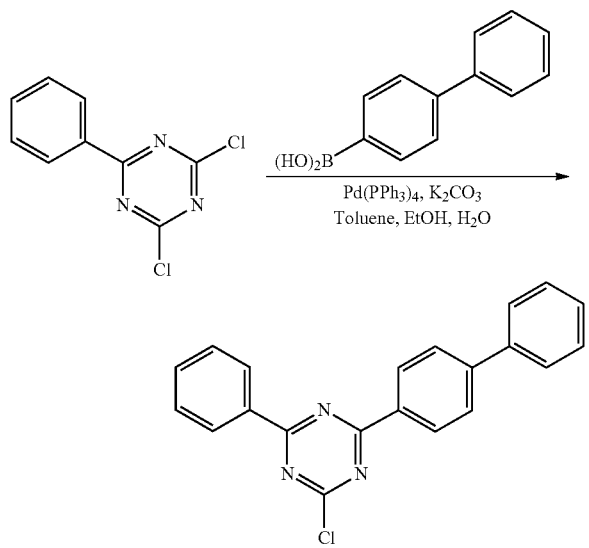

50.0 g of 2,4-dichloro-6-phenyl-1,3,5-triazine, 40.0 g of [1,1'-biphenyl]-4-yl boronic acid, 6.0 g of tetrakisphenylphosphine palladium (0), and 45 g of K₂CO₃ were added to 1000 ml of toluene, 250 ml of ethanol, and 250 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 52 g of 2-([1,1'-biphenyl]-4-yl)-4-chloro-6-phenyl-1,3,5-triazine was obtained (yield 70%).

1H-NMR: δ 8.38 (d, 2H), 8.00 (d, 2H), 7.75 (d, 2H), 7.50-7.41 (m, 6H), 7.25 (d, 2H)

Mass [(M+H)⁺]: 345

<Step 2> Synthesis of Tz-3

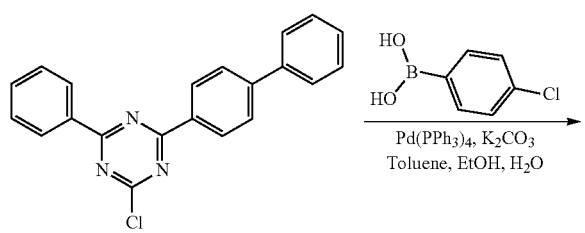

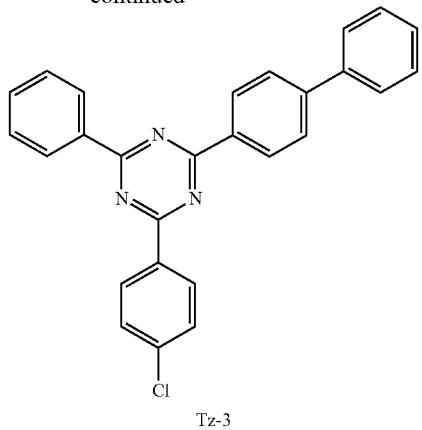

Tz-3

15.0 g of 2-([1,1'-biphenyl]-4-yl)-4-chloro-6-phenyl-1,3,5-triazine, 6.0 g of (4-chlorophenyl) boronic acid, 0.9 g of tetrakisphenylphosphine palladium (0), and 7.0 g of K₂CO₃ were added to 350 ml of toluene, 60 ml of ethanol, and 60 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 10.8 g of Tz-3 was obtained (yield 55%).

1H-NMR: 8.40 (d, 2H), 8.25 (d, 2H), 8.00-7.75 (m, 4H), 7.51-7.40 (m, 8H), 7.25 (d, 2H)

Mass: [(M+H)⁺]: 421

[Preparation Example 4] Synthesis of Tz-4

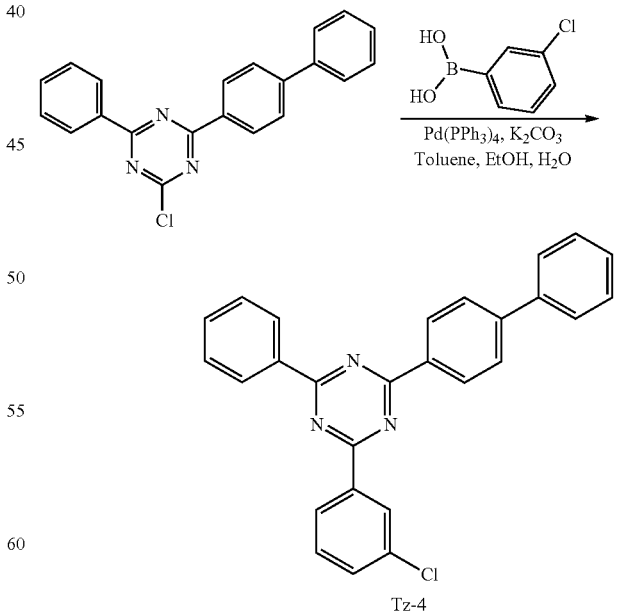

Tz-4

15.0 g of 2-([1,1'-biphenyl]-4-yl)-4-chloro-6-phenyl-1,3, 5-triazine, 6.0 g of (3-chlorophenyl) boronic acid, 0.9 g of tetrakisphenylphosphine palladium (0), and 7.0 g of K₂CO₃ were added to 350 ml of toluene, 60 ml of ethanol, and 60 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 11.5 g of Tz-4 was obtained (yield 58%).

1H-NMR: 8.40 (d, 2H), 8.15 (d, 1H), 8.00-7.75 (m, 5H), 7.51-7.40 (m, 8H), 7.25 (d, 2H)

Mass, [(M+H)+]: 421

[Preparation Example 5] Synthesis of Py-1

<Step 1> Synthesis of 4-([1,1'-biphenyl]-4-yl)-6-chloro-2-phenylpyrimidine

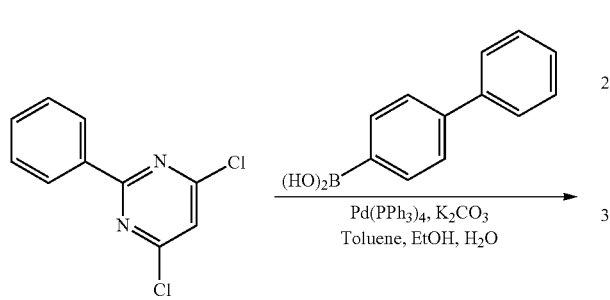

50.0 g of 4,6-dichloro-2-phenylpyrimidine, 40.0 g of [1,1'-biphenyl]-4-yl boronic acid, 6.0 g of tetrakisphenylphosphine palladium (0), and 40 g of K₂CO₃ were added to 1000 ml of toluene, 250 ml of ethanol, and 250 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 50.2 g of 4-([1,1'-biphenyl]-4-yl)-6-chloro-2-phenylpyrimidine was obtained (yield 75%).

1H-NMR: δ 8.36-8.30 (m, 4H), 7.85-7.50 (m, 4H), 7.55-7.49 (d, 6H) 7.03 (s, 1H)

Mass [(M+H)+]: 344

<Step 2> Synthesis of Py-1

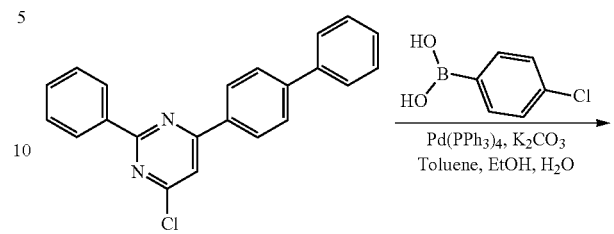

Py-1

15.0 g of 4-([1,1'-biphenyl]-4-yl)-6-chloro-2-phenylpyrimidine, 6.0 g of (4-chlorophenyl) boronic acid, 0.9 g of tetrakisphenylphosphine palladium (0), and 7.0 g of K₂CO₃ were added to 350 ml of toluene, 60 ml of ethanol, and 60 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 11.5 g of Py-1 was obtained (yield 57%).

1H-NMR: δ 8.36-8.30 (m, 4H), 7.97 (d, 2H) 7.85-7.50 (m, 2H), 7.55-7.49 (d, 6H) 7.03 (s, 1H). Mass: [(M+H)+]: 420

[Preparation Example 6] Synthesis of Py-2

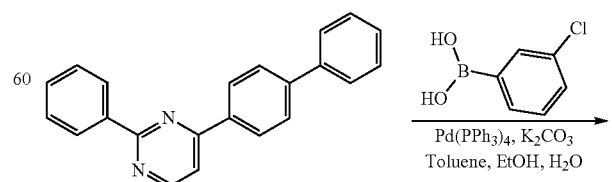

-continued

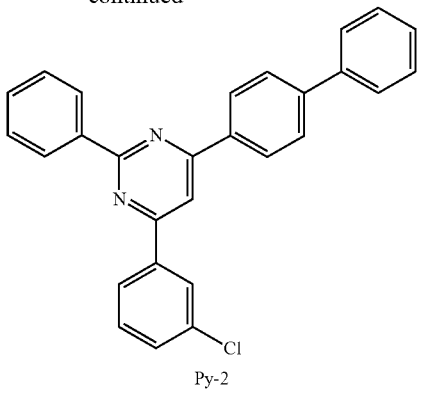
Py-2

15.0 g of 4-([1,1'-biphenyl]-4-yl)-6-chloro-2-phenylpyrimidine, 6.0 g of (3-chlorophenyl) boronic acid, 0.9 g of tetrakisphenylphosphine palladium (0), and 7.0 g of $K_2CO_3$ were added to 350 ml of toluene, 60 ml of ethanol, and 60 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 10.9 g of Py-2 was obtained (yield 55%).

1H-NMR: δ 8.36-8.30 (m, 4H), 7.85-7.50 (m, 3H), 7.55-7.49 (d, 7H) 7.03 (s, 1H)

Mass [(M+H)$^+$]: 420

[Preparation Example 7] Synthesis of Tz-5

<Step 1> Synthesis of 2-chloro-4-phenyl-6-(triphenyl-2-yl)-1,3,5-triazine

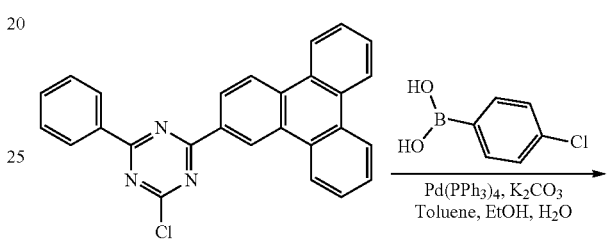

50.0 g of 2,4-dichloro-6-phenyl-1,3,5-triazine, 40.0 g of triphenylen-2-yl boronic acid, 6.0 g of tetrakisphenylphosphine palladium (0), and 45 g of $K_2CO_3$ were added to 1000 ml of toluene, 250 ml of ethanol, and 250 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 48 g of 2-chloro-4-phenyl-6-(triphenyl-2-yl)-1,3,5-triazine was obtained (yield 66%).

1H-NMR: δ 9.60 (d, 1H), 9.25 (s, 1H), 8.38-8.15 (m, 5H), 7.70-7.45 (m, 9H)

Mass [(M+H)$^+$]: 419

<Step 2> Synthesis of Tz-5

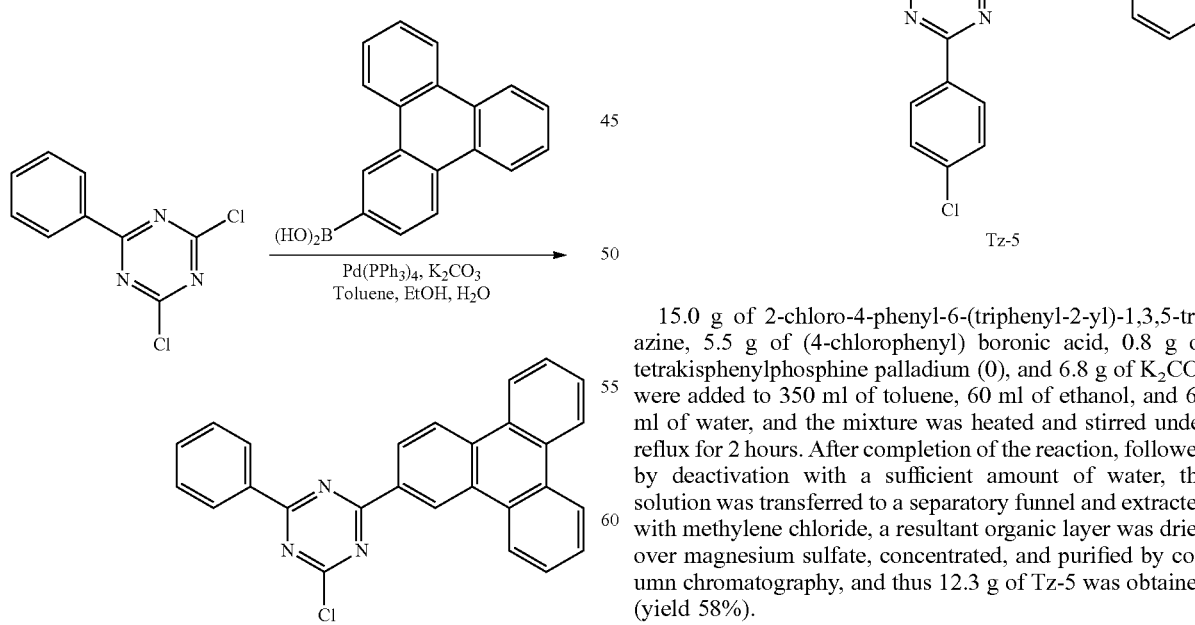
Tz-5

15.0 g of 2-chloro-4-phenyl-6-(triphenyl-2-yl)-1,3,5-triazine, 5.5 g of (4-chlorophenyl) boronic acid, 0.8 g of tetrakisphenylphosphine palladium (0), and 6.8 g of $K_2CO_3$ were added to 350 ml of toluene, 60 ml of ethanol, and 60 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 12.3 g of Tz-5 was obtained (yield 58%).

1H-NMR: δ 9.60 (d, 1H), 9.25 (s, 1H), 8.38-8.15 (m, 5H), 7.80 (d, 2H), 7.70-7.45 (m, 11H)

Mass: [(M+H)$^+$]: 495

117

[Preparation Example 8] Synthesis of Tz-6

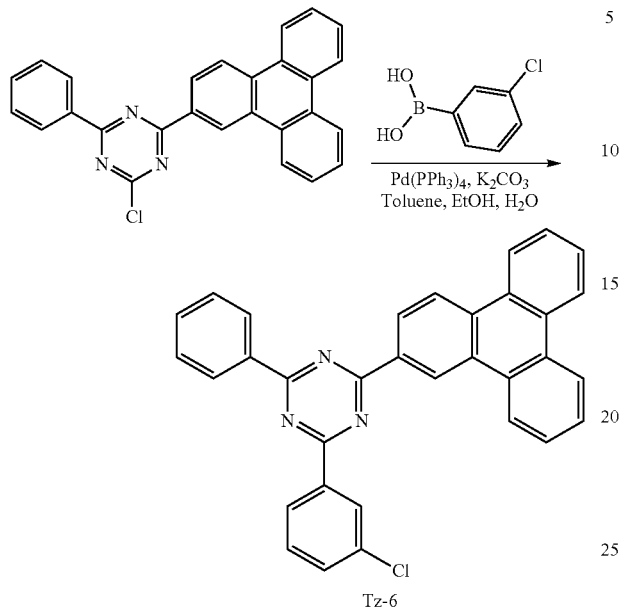

Tz-6

15.0 g of 2-chloro-4-phenyl-6-(triphenyl-2-yl)-1,3,5-triazine, 5.5 g of (3-chlorophenyl) boronic acid, 0.8 g of tetrakisphenylphosphine palladium (0), and 6.8 g of $K_2CO_3$ were added to 350 ml of toluene, 60 ml of ethanol, and 60 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 12.1 g of Tz-6 was obtained (yield 57%).

1H-NMR: δ 9.60 (d, 1H), 9.25 (s, 1H), 8.38-8.15 (m, 5H), 7.74 (d, 1H), 7.70-7.45 (m, 12H)

Mass: [(M+H)+]: 495

[Preparation Example 9] Synthesis of Py-3

\<Step 1\> Synthesis of 4-([1,1':3',1''-terphenyl]-5'-yl)-6-chloro-2-phenylpyrimidine

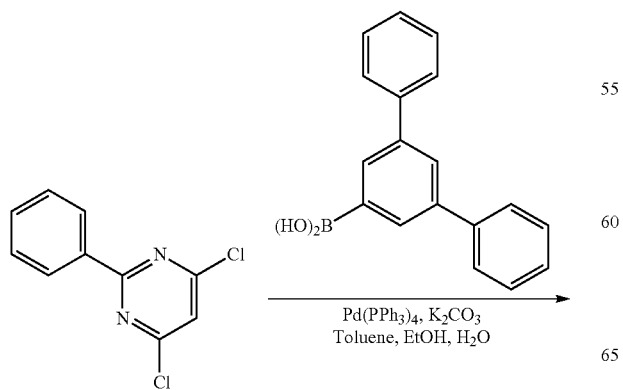

118

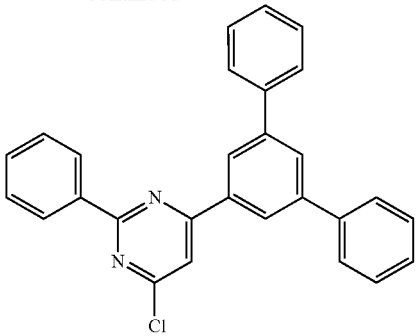

15.0 g of 4-([1,1'-biphenyl]-4-yl)-6-chloro-2-phenylpyrimidine, 6.0 g of [1,1':3',1''-terphenyl]-5'-yl boronic acid, 0.9 g of tetrakisphenylphosphine palladium (0), and 7.0 g of $K_2CO_3$ were added to 350 ml of toluene, 60 ml of ethanol, and 60 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 11.2 g of 4-([1,1':3',1''-terphenyl]-5'-yl)-6-chloro-2-phenylpyrimidine was obtained (yield 56%).

1H-NMR: δ 8.36 (d, 2H), 8.04 (s, 3H), 7.75 (d, 4H), 7.55-7.49 (m, 9H) 7.03 (s, 1H)

Mass [(M+H)+]: 420

\<Step 2\> Synthesis of Py-3

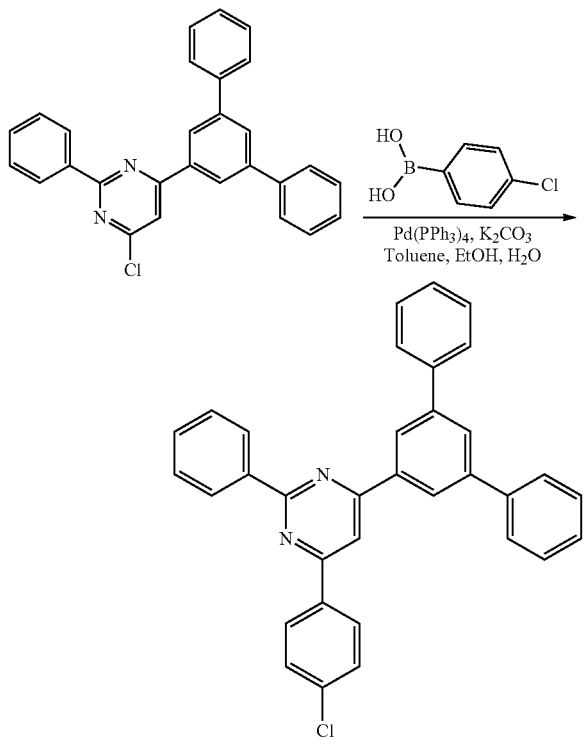

Py-3

15.0 g of 4-([1,1':3',1''-terphenyl]-5'-yl)-6-chloro-2-phenylpyrimidine, 5.5 g of (4-chlorophenyl) boronic acid, 0.8 g of tetrakisphenylphosphine palladium (0), and 6.8 g of K$_2$CO$_3$ were added to 350 ml of toluene, 60 ml of ethanol, and 60 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 10.2 g of Py-3 was obtained (yield 53%).

1H-NMR: δ 8.36 (d, 2H), 8.04 (s, 3H), 7.80-7.75 (m, 6H), 7.55-7.49 (m, 11H) 7.03 (s, 1H)

Mass: [(M+H)$^+$]: 496

[Preparation Example 10] Synthesis of Py-4

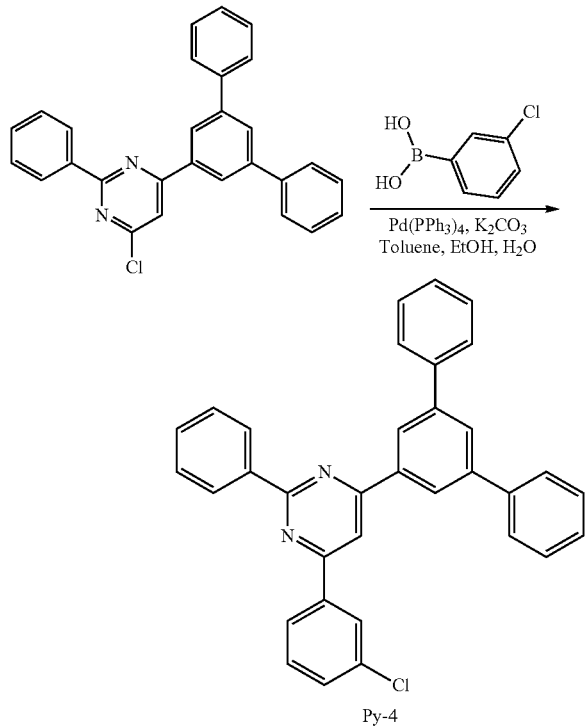

Py-4

15.0 g of 4-([1,1':3',1''-terphenyl]-5'-yl)-6-chloro-2-phenylpyrimidine, 5.5 g of (3-chlorophenyl) boronic acid, 0.8 g of tetrakisphenylphosphine palladium (0), and 6.8 g of K$_2$CO$_3$ were added to 350 ml of toluene, 60 ml of ethanol, and 60 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 11.0 g of Py-4 was obtained (yield 55%).

1H-NMR: δ 8.36 (d, 2H), 8.04 (s, 3H), 7.88 (s, 1H), 7.75 (d, 4H), 7.55-7.49 (m, 12H) 7.03 (s, 1H)

Mass: [(M+H)$^+$]: 496

[Preparation Example 11] Synthesis of Tz-7

<Step 1> Synthesis of 2-chloro-4-(9,9-dimethyl-9H-fluoren-2-yl)-6-phenyl-1,3,5-triazine

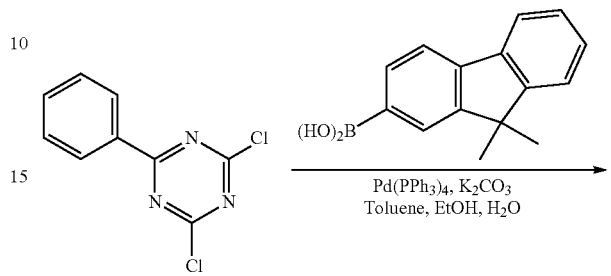

50.0 g of 2,4-dichloro-6-phenyl-1,3,5-triazine, 40.0 g of (9,9-dimethyl-9H-fluoren-2-yl) boronic acid, 6.0 g of tetrakisphenylphosphine palladium (0), and 45 g of K$_2$CO$_3$ were added to 1000 ml of toluene, 250 ml of ethanol, and 250 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 51 g of 2-chloro-4-(9,9-dimethyl-9H-fluoren-2-yl)-6-phenyl-1,3,5-triazine was obtained (yield 70%).

1H-NMR: δ 8.38 (d, 2H), 8.00 (d, 2H), 7.75 (d, 2H), 7.50-7.41 (m, 4H), 7.25 (d, 2H), 1.69 (s, 6H)

Mass [(M+H)$^+$]: 385ss

<Step 2> Synthesis of Tz-7

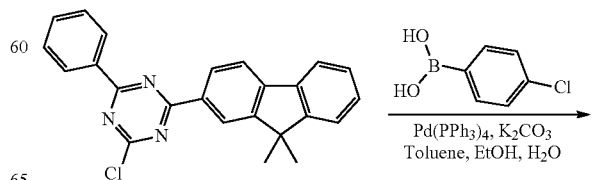

-continued

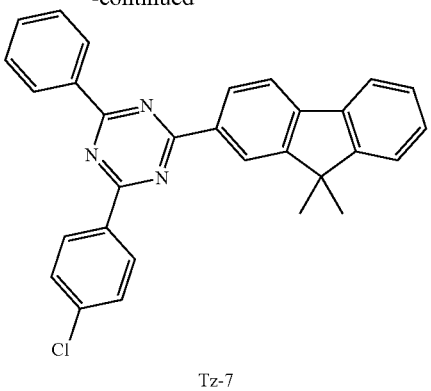

Tz-7

15.0 g of 2-chloro-4-(9,9-dimethyl-9H-fluoren-2-yl)-6-phenyl-1,3,5-triazine, 5.5 g of (4-chlorophenyl) boronic acid, 0.8 g of tetrakisphenylphosphine palladium (0), and 6.8 g of K₂CO₃ were added to 350 ml of toluene, 60 ml of ethanol, and 60 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 10.5 g of Tz-7 was obtained (yield 53%).

1H-NMR: δ 8.38 (d, 2H), 8.00 (d, 2H), 7.75 (d, 4H), 7.50-7.41 (m, 6H), 7.25 (d, 2H), 1.69 (s, 6H)
Mass: [(M+H)⁺]: 461

[Preparation Example 12] Synthesis of Tz-8

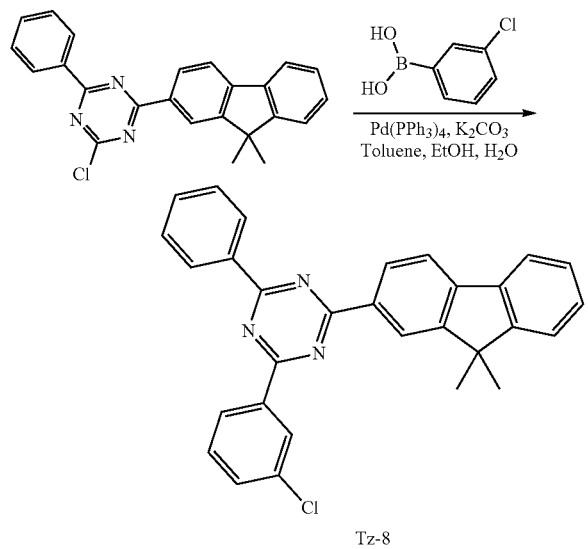

Tz-8

15.0 g of 2-chloro-4-(9,9-dimethyl-9H-fluoren-2-yl)-6-phenyl-1,3,5-triazine, 5.5 g of (3-chlorophenyl) boronic acid, 0.8 g of tetrakisphenylphosphine palladium (0), and 6.8 g of K₂CO₃ were added to 350 ml of toluene, 60 ml of ethanol, and 60 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 11.2 g of Tz-8 was obtained (yield 55%).

1H-NMR: δ 8.38 (d, 2H), 8.00 (d, 2H), 7.82 (s, 1H), 7.75 (d, 2H), 7.50-7.41 (m, 7H), 7.25 (d, 2H), 1.69 (s, 6H)
Mass: [(M+H)⁺]: 461

[Preparation Example 13] Synthesis of Py-5

<Step 1> Synthesis of 4-chloro-2-phenyl-6-(4-(pyridin-3-yl)phenyl)pyrimidine

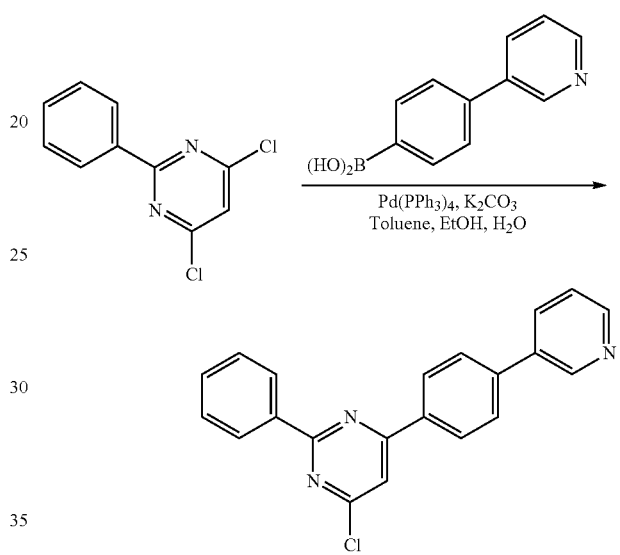

45.0 g of 4,6-dichloro-2-phenylpyrimidine, 40.0 g of (4-(pyridin-3-yl)phenyl) boronic acid, 6.0 g of tetrakisphenylphosphine palladium (0), and 42 g of K₂CO₃ were added to 800 ml of toluene, 200 ml of ethanol, and 200 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 39.8 g of 4-chloro-2-phenyl-6-(4-(pyridin-3-yl)phenyl)pyrimidine was obtained (yield 58%).

1H-NMR: δ 9.24 (s, 1H), 8.70 (d, 1H), 8.42-8.30 (m, 5H), 7.57-7.50 (m, 4H), 7.25 (d, 2H) 7.03 (s, 1H)
Mass [(M+H)⁺]: 344

<Step 2> Synthesis of Py-5

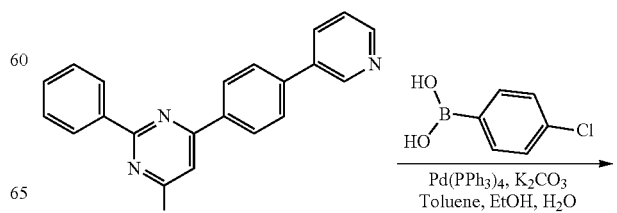

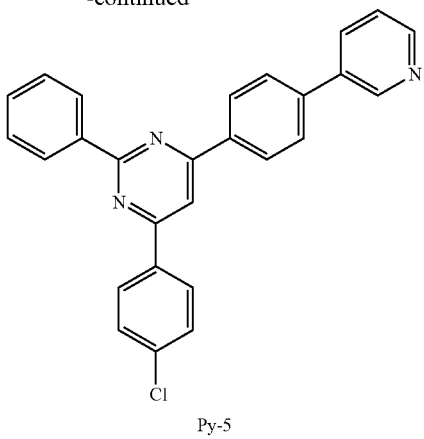

Py-5

15.0 g of 4-chloro-2-phenyl-6-(4-(pyridin-3-yl)phenyl) pyrimidine, 5.5 g of (4-chlorophenyl) boronic acid, 0.8 g of tetrakisphenylphosphine palladium (0), and 6.8 g of $K_2CO_3$ were added to 350 ml of toluene, 60 ml of ethanol, and 60 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 9.8 g of Py-5 was obtained (yield 43%).

1H-NMR: δ 9.21 (s, 1H), 8.70 (d, 1H), 8.42-8.30 (m, 6H), 7.76 (d, 2H), 7.59-7.55 (m, 6H), 7.25 (d, 2H)

Mass: [(M+H)$^+$]: 421

[Preparation Example 14] Synthesis of Py-6

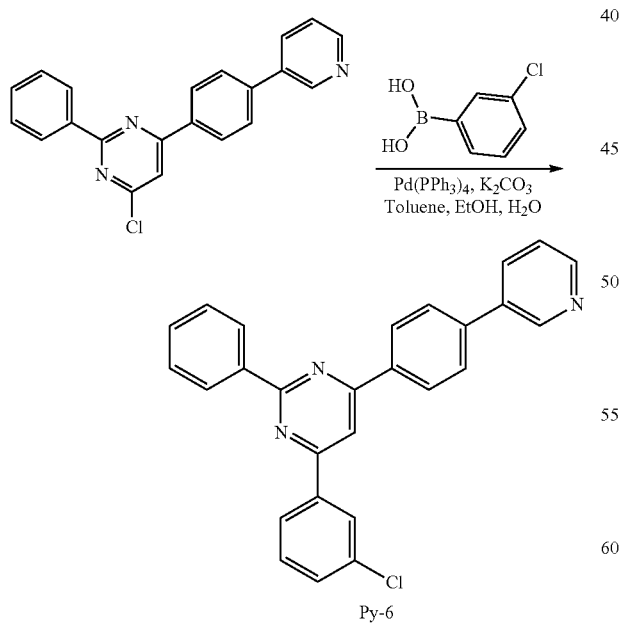

Py-6

15.0 g of 4-chloro-2-phenyl-6-(4-(pyridin-3-yl)phenyl) pyrimidine, 5.5 g of (3-chlorophenyl) boronic acid, 0.8 g of tetrakisphenylphosphine palladium (0), and 6.8 g of $K_2CO_3$ were added to 350 ml of toluene, 60 ml of ethanol, and 60 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 10.2 g of Py-6 was obtained (yield 44%).

1H-NMR: δ 9.24 (s, 1H), 8.70 (d, 1H), 8.42-8.30 (m, 6H), 7.78 (d, 1H), 7.67 (d, 1H) 7.50-7.43 (m, 6H), 7.25 (d, 2H)

Mass: [(M+H)$^+$]: 421

[Preparation Example 15] Synthesis of Tz-9

<Step 1> Synthesis of 3-(4-chloro-6-phenyl-1,3,5-triazine-2-yl)-9-phenyl-9H-carbazole

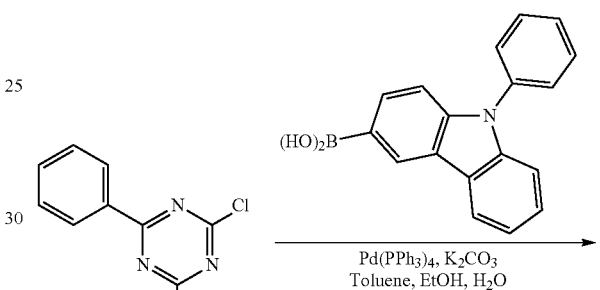

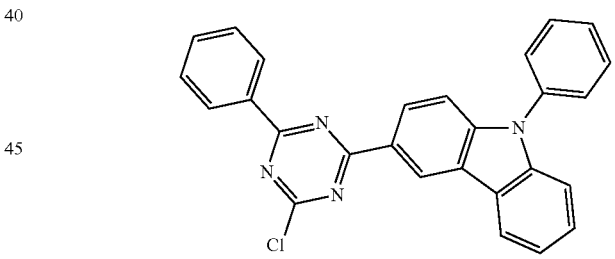

50.0 g of 2,4-dichloro-6-phenyl-1,3,5-triazine, 40.0 g of (9-phenyl-9H-carbazol-3-yl) boronic acid, 6.0 g of tetrakisphenylphosphine palladium (0), and 45 g of $K_2CO_3$ were added to 1000 ml of toluene, 250 ml of ethanol, and 250 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 55 g of 3-(4-chloro-6-phenyl-1,3,5-triazine-2-yl)-9-phenyl-9H-carbazole was obtained (yield 71%).

1H-NMR: δ 8.65 (d, 1H), 8.35 (d, 2H), 7.95-7.89 (m, 3H), 7.75 (d, 1H), 7.65-7.50 (m, 8H), 7.35 (t, 2H)

Mass [(M+H)$^+$]: 434

\<Step 2\> Synthesis of Tz-9

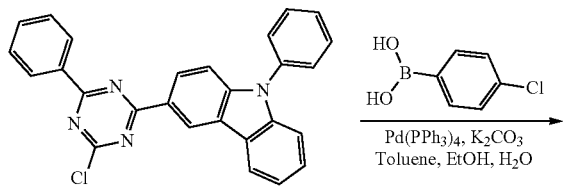

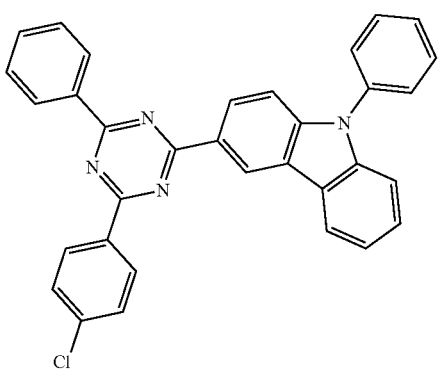

Tz-9

15.0 g of 3-(4-chloro-6-phenyl-1,3,5-triazine-2-yl)-9-phenyl-9H-carbazole, 5.0 g of (4-chlorophenyl) boronic acid, 0.6 g of tetrakisphenylphosphine palladium (0), and 6.0 g of K₂CO₃ were added to 300 ml of toluene, 50 ml of ethanol, and 50 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 8.8 g of Tz-9 was obtained (yield 38%).

1H-NMR: δ 8.65 (d, 1H), 8.35 (d, 2H), 7.95-7.89 (m, 5H), 7.75 (d, 1H), 7.65-7.50 (m, 10H), 7.35 (t, 2H)

Mass [(M+H)⁺]: 510

[Preparation Example 16] Synthesis of Tz-10

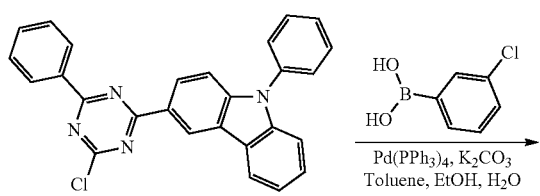

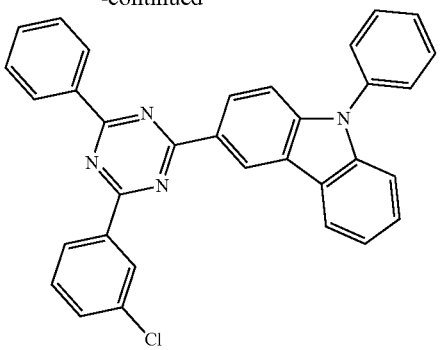

Tz-10

15.0 g of 3-(4-chloro-6-phenyl-1,3,5-triazine-2-yl)-9-phenyl-9H-carbazole, 5.0 g of (3-chlorophenyl) boronic acid, 0.6 g of tetrakisphenylphosphine palladium (0), and 6.0 g of K₂CO₃ were added to 300 ml of toluene, 50 ml of ethanol, and 50 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 9.6 g of Tz-10 was obtained (yield 41%).

1H-NMR: δ 8.65 (d, 1H), 8.35 (d, 2H), 7.95-7.89 (m, 3H), 7.75 (d, 1H), 7.70 (s, 1H), 7.65-7.50 (m, 11H), 7.35 (t, 2H)

Mass [(M+H)⁺]: 510

[Preparation Example 17] Synthesis of Tz-11

\<Step 1\> Synthesis of 4-(4-chloro-6-phenyl-1,3,5-triazin-2-yl)benzonitrile

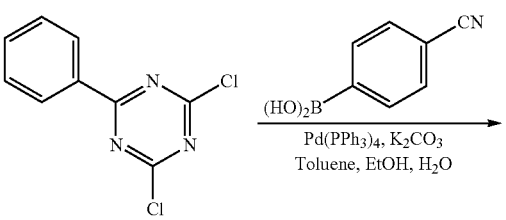

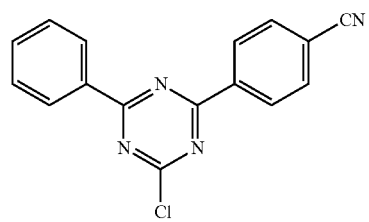

50.0 g of 2,4-dichloro-6-phenyl-1,3,5-triazine, 25.0 g of (4-cyanophenyl) boronic acid, 6.0 g of tetrakisphenylphosphine palladium (0), and 45 g of K₂CO₃ were added to 1000 ml of toluene, 250 ml of ethanol, and 250 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 42 g of 4-(4-chloro-6-phenyl-1,3,5-triazine-2-yl) benzonitrile was obtained (yield 67%).

1H-NMR: δ 8.36 (d, 2H), 7.95 (d, 2H), 7.75 (d, 2H), 7.50 (t, 3H)

Mass [(M+H)$^+$]: 294

<Step 2> Synthesis of Tz-11

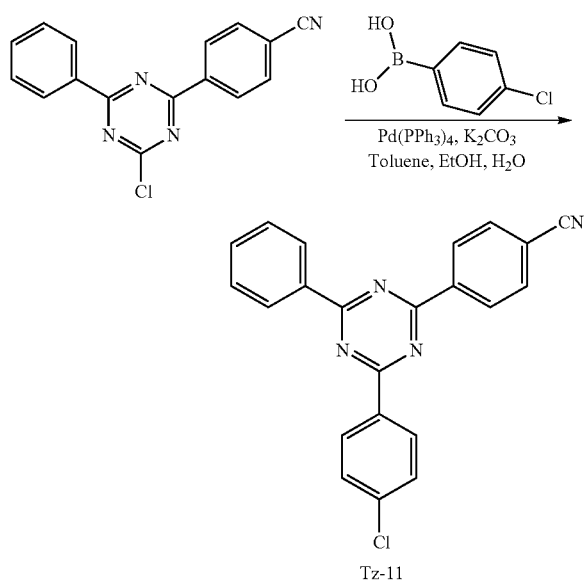

Tz-11

15.0 g of 4-(4-chloro-6-phenyl-1,3,5-triazin-2-yl)benzonitrile, 7.0 g of (4-chlorophenyl) boronic acid, 0.6 g of tetrakisphenylphosphine palladium (0), and 6.0 g of $K_2CO_3$ were added to 300 ml of toluene, 50 ml of ethanol, and 50 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 10.2 g of Tz-11 was obtained (yield 48%).

1H-NMR: δ 8.36 (d, 2H), 7.95 (d, 2H), 7.80 (d, 2H), 7.75-7.70 (m, 4H), 7.50 (t, 3H)

Mass: [(M+H)$^+$]: 370

[Preparation Example 18] Synthesis of Tz-12

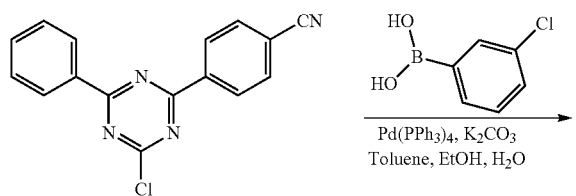

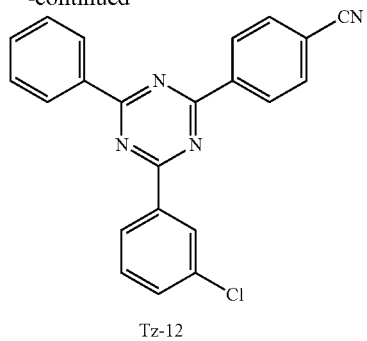

Tz-12

15.0 g of 4-(4-chloro-6-phenyl-1,3,5-triazin-2-yl)benzonitrile, 7.0 g of (3-chlorophenyl) boronic acid, 0.6 g of tetrakisphenylphosphine palladium (0), and 6.0 g of $K_2CO_3$ were added to 300 ml of toluene, 50 ml of ethanol, and 50 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 9.8 g of Tz-12 was obtained (yield 47%).

1H-NMR: δ 8.36 (d, 2H), 7.95 (d, 2H), 7.85 (s, 1H), 7.75-7.65 (m, 5H), 7.50 (t, 3H)

Mass: [(M+H)$^+$]: 370

[Preparation Example 19] Synthesis of Tz-13

<Step 1> Synthesis of 2-chloro-4-(dibenzo[b,d]furan-3-yl)-6-phenyl-1,3,5-triazine

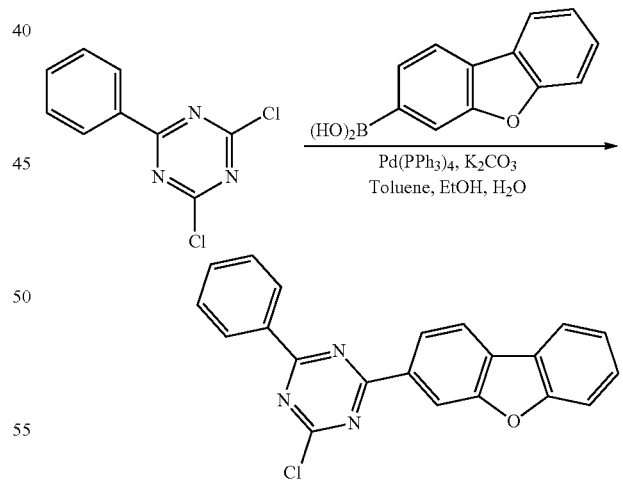

50.0 g of 2,4-dichloro-6-phenyl-1,3,5-triazine, 35.0 g of dibenzo[b,d] furan-3-yl boronic acid, 6.0 g of tetrakisphenylphosphine palladium (0), and 45 g of $K_2CO_3$ were added to 1000 ml of toluene, 250 ml of ethanol, and 250 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 50 g of 2-chloro-4-(dibenzo[b,d]furan-3-yl)-6-phenyl-1,3,5-triazine was obtained (yield 72%).

1H-NMR: δ 8.36 (d, 2H), 8.05-7.80 (m, 4H), 7.50-7.30 (m, 6H)

Mass: [(M+H)⁺]: 359

<Step 2> Synthesis of Tz-13

[Preparation Example 20] Synthesis of Tz-14

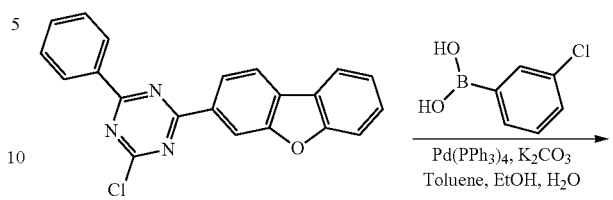

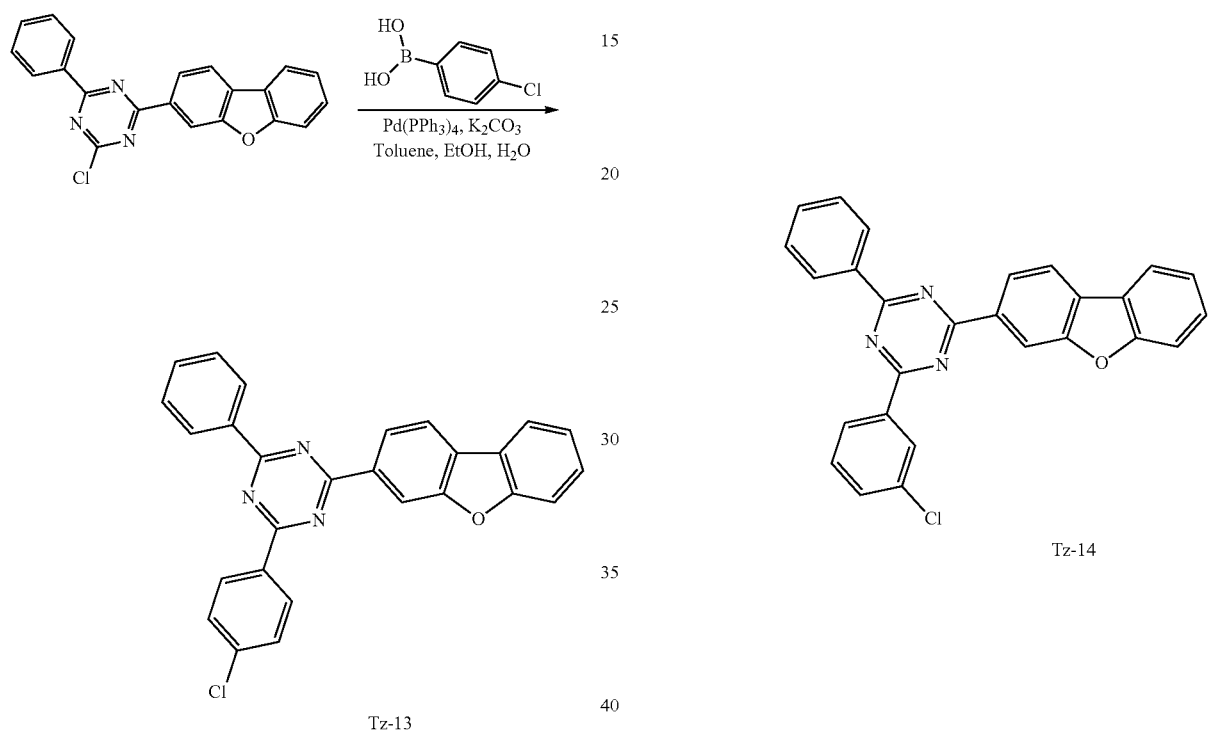

15.0 g of 2-chloro-4-(dibenzo[b,d] furan-3-yl)-6-phenyl-1,3,5-triazine, 7.0 g of (4-chlorophenyl) boronic acid, 0.6 g of tetrakisphenylphosphine palladium (0), and 6.0 g of K₂CO₃ were added to 300 ml of toluene, 50 ml of ethanol, and 50 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 9.2 g of Tz-13 was obtained (yield 42%).

1H-NMR: δ 8.36 (d, 2H), 8.05-7.80 (m, 6H), 7.50-7.30 (m, 8H)

Mass: [(M+H)⁺]: 435

15.0 g of 2-chloro-4-(dibenzo[b,d] furan-3-yl)-6-phenyl-1,3,5-triazine, 7.0 g of (3-chlorophenyl) boronic acid, 0.6 g of tetrakisphenylphosphine palladium (0), and 6.0 g of K₂CO₃ were added to 300 ml of toluene, 50 ml of ethanol, and 50 ml of water, and the mixture was heated and stirred under reflux for 2 hours. After completion of the reaction, followed by deactivation with a sufficient amount of water, the solution was transferred to a separatory funnel and extracted with methylene chloride, a resultant organic layer was dried over magnesium sulfate, concentrated, and purified by column chromatography, and thus 9.5 g of Tz-14 was obtained (yield 43%).

1H-NMR: δ 8.36 (d, 2H), 8.05-7.80 (m, 5H), 7.50-7.30 (m, 9H)

Mass: [(M+H)⁺]: 435

[Synthesis Example 1] Synthesis of Compound 1
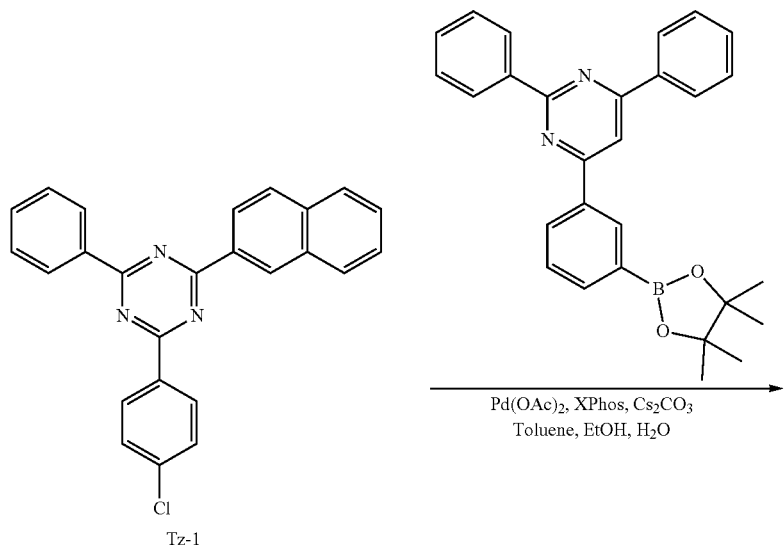
Tz-1
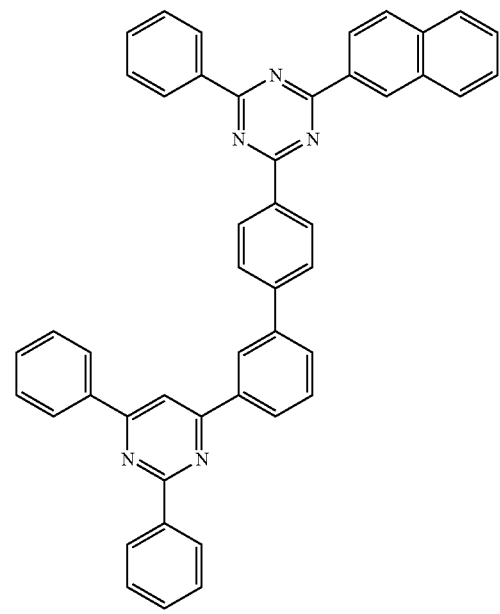

After mixing 3.0 g of Tz-1, 3.5 g of 2,4-diphenyl-6-(3-(4,4,5,5-tetramethyl-1,3,2-dioxaborolan-2-yl)phenyl)pyrimidine, and 3.0 g of Cs₂CO₃, 60 ml of toluene, 12 ml of ethanol, and 12 ml of water were added thereto, and then 55 mg of Pd(OAc)₂ and 250 mg of Xphos were further added thereto, followed by heating and stirring for 4 hours. After the reaction was completed, the temperature was lowered to room temperature and filtered. The filtrate was poured into water, extracted with methylene chloride, and a resultant organic layer was dried over MgSO₄. The dried organic layer was concentrated under reduced pressure and then columned with THF: Hex=1: 3, and thus Compound 1 (2.4 g, yield 58%) was prepared.
Mass: [(M+H)⁺] 667

[Synthesis Example 2] Synthesis of Compound 4

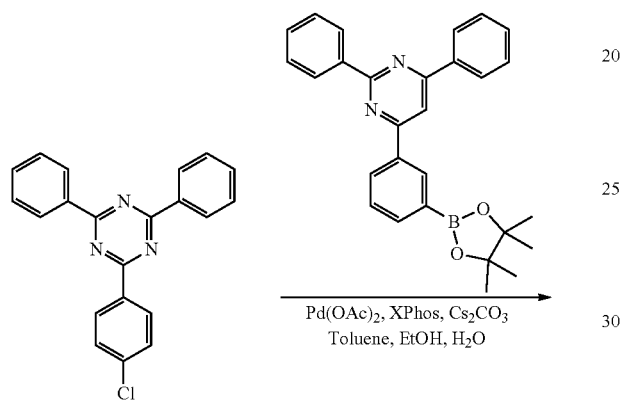

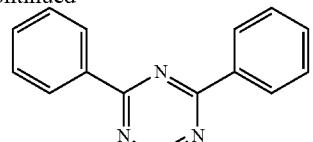

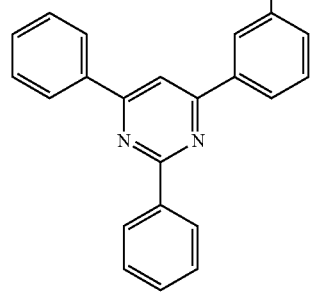

4

Compound 4 (3.1 g, yield 59%) was prepared in the same manner as in Synthesis Example 1, except that 2-(4-chlorophenyl)-4,6-diphenyl-1,3,5-triazine was used instead of Tz-1.
Mass: [(M+H)⁺]: 617

[Synthesis Example 3] Synthesis of Compound 6

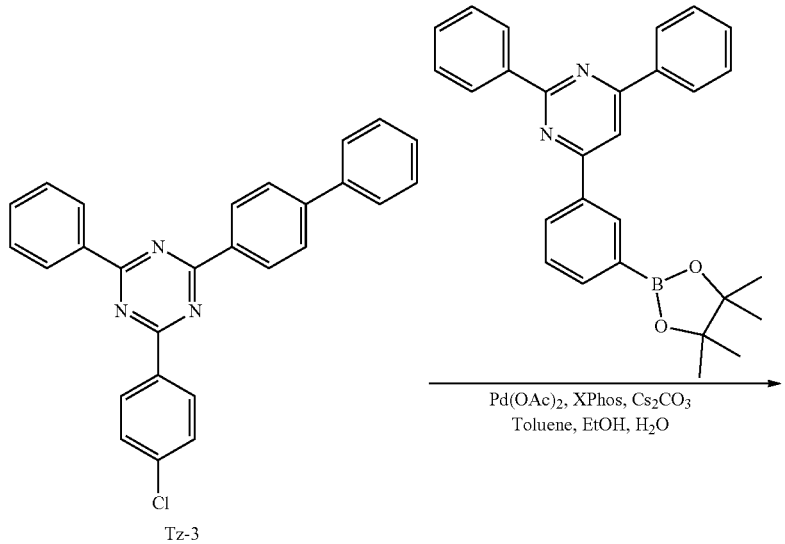

Tz-3

-continued
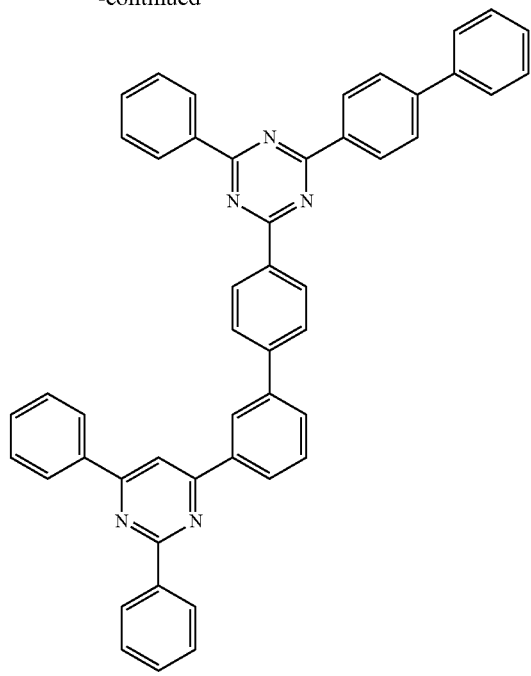
6
Compound 6 (3.5 g, yield 56%) was prepared in the same manner as in Synthesis Example 1, except that Tz-3 was used instead of Tz-1.
Mass: [(M+H)$^+$]: 693
[Synthesis Example 4] Synthesis of Compound 8
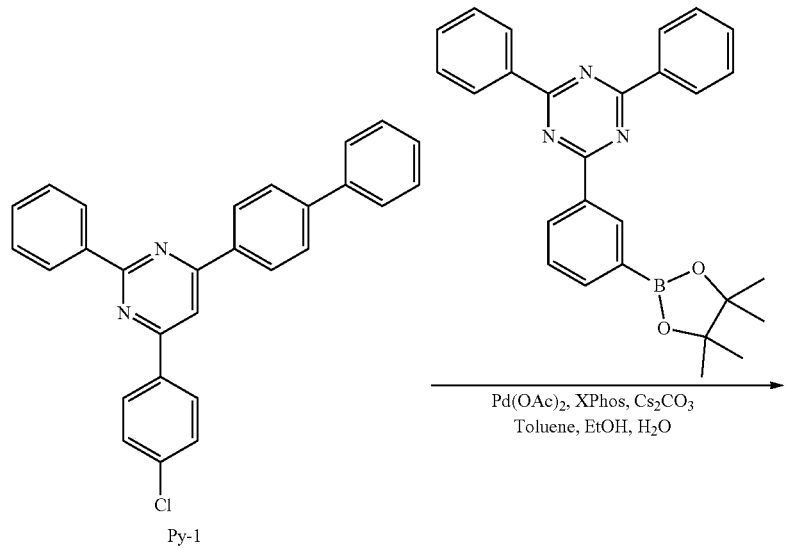
Py-1

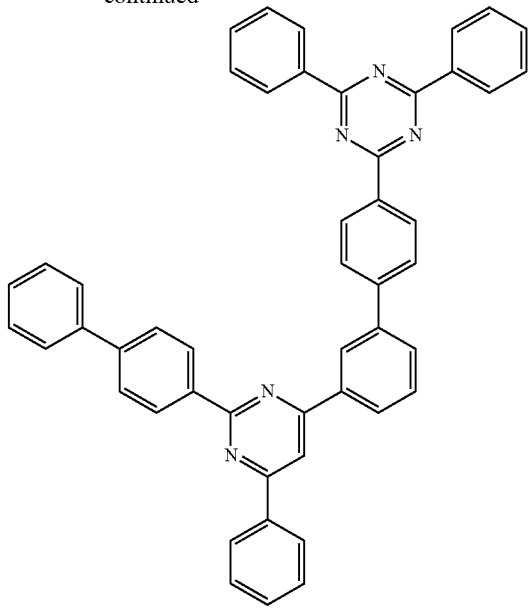

8

After mixing 3.0 g of Py-1, 3.2 g of 2,4-diphenyl-6-(3-(4,4,5,5-tetramethyl-1,3,2-dioxaborolan-2-yl)phenyl)-1,3,5-triazine, and 3.0 g of $Cs_2CO_3$, 60 ml of toluene, 12 ml of ethanol, and 12 ml of water were added thereto, and then 55 mg of $Pd(OAc)_2$ and 250 mg of Xphos were further added thereto, followed by heating and stirring for 4 hours. After the reaction was completed, the temperature was lowered to room temperature and filtered. The filtrate was poured into water, extracted with methylene chloride, and a resultant organic layer was dried over $MgSO_4$. The dried organic layer was concentrated under reduced pressure and then columned with THF: Hex=1: 3, and thus Compound 8 (2.8 g, yield 59%) was prepared.

Mass: $[(M+H)^+]$ 693

[Synthesis Example 5] Synthesis of Compound 34

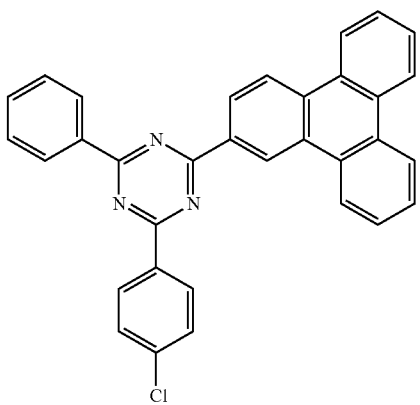

Tz-5

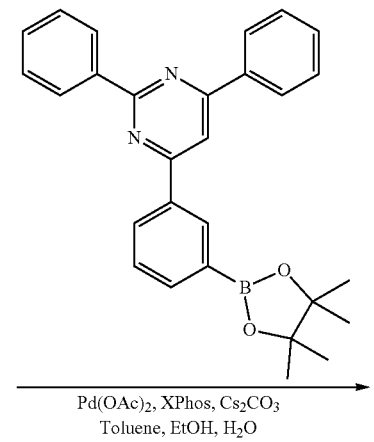

$\xrightarrow{Pd(OAc)_2, XPhos, Cs_2CO_3}{Toluene, EtOH, H_2O}$

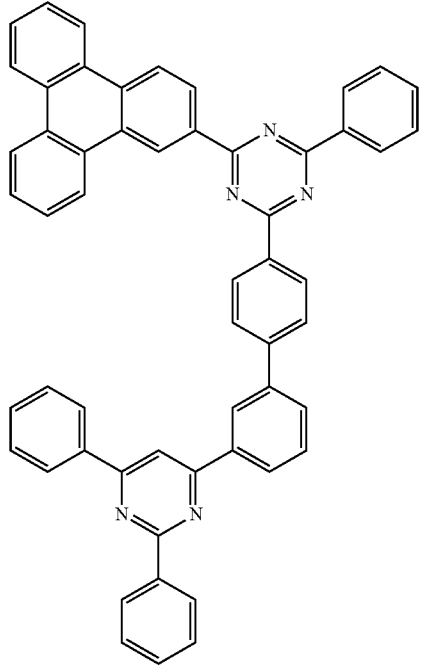
34
Compound 34 (3.5 g, yield 62%) was prepared in the same manner as in Synthesis Example 1, except that Tz-5 was used instead of Tz-1.
Mass [(M+H)⁺]: 767
[Synthesis Example 6] Synthesis of Compound 37
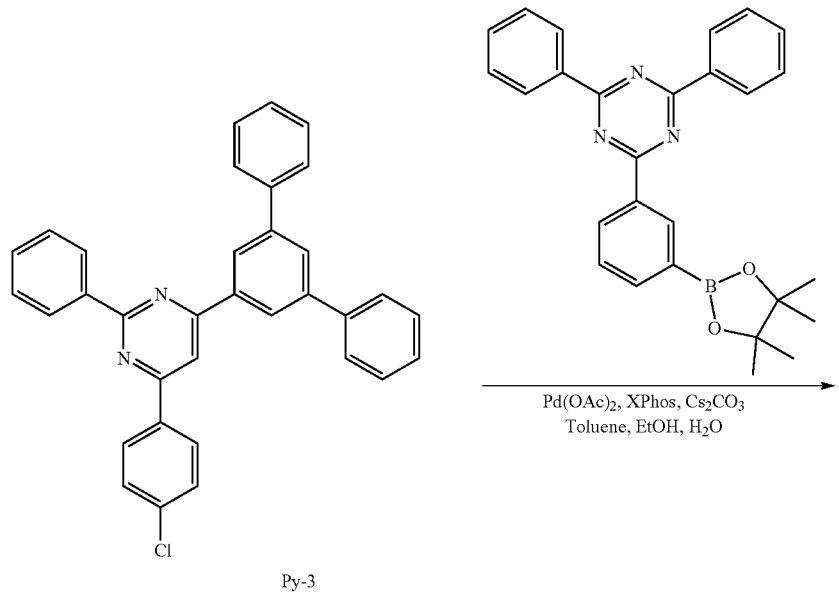

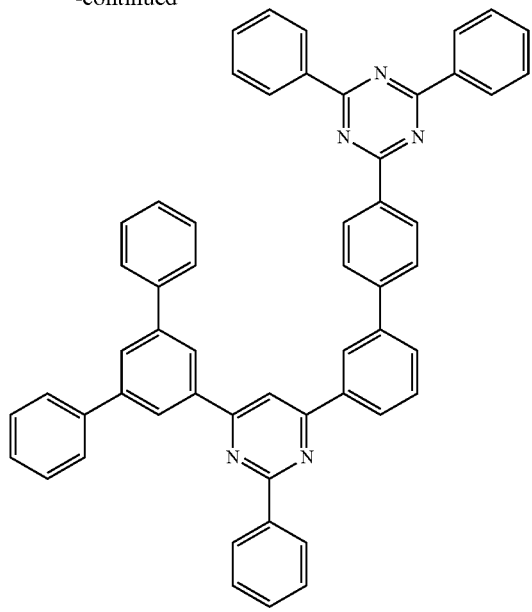
37
Compound 37 (3.2 g, yield 59%) was prepared in the same manner as in Synthesis Example 4, except that Py-3 was used instead of Py-1.
Mass: [(M+H)⁺]: 769
[Synthesis Example 7] Synthesis of Compound 41
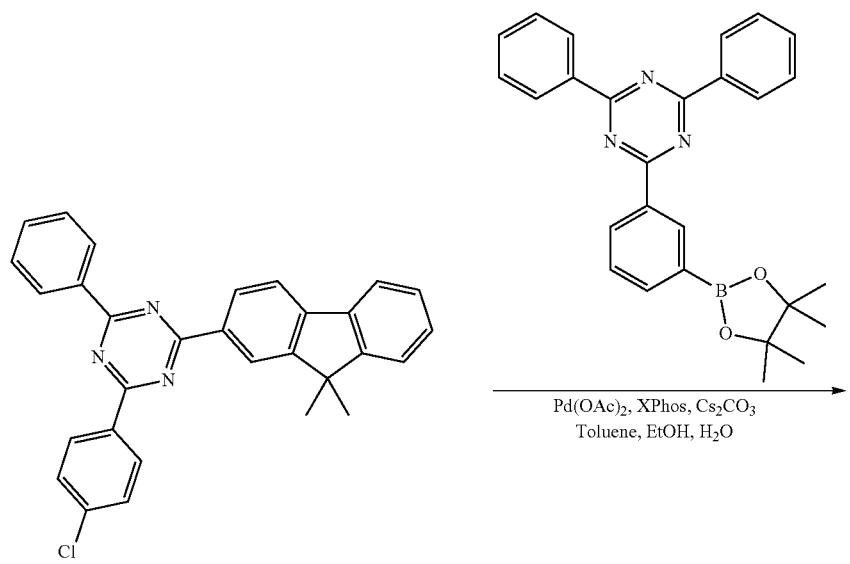

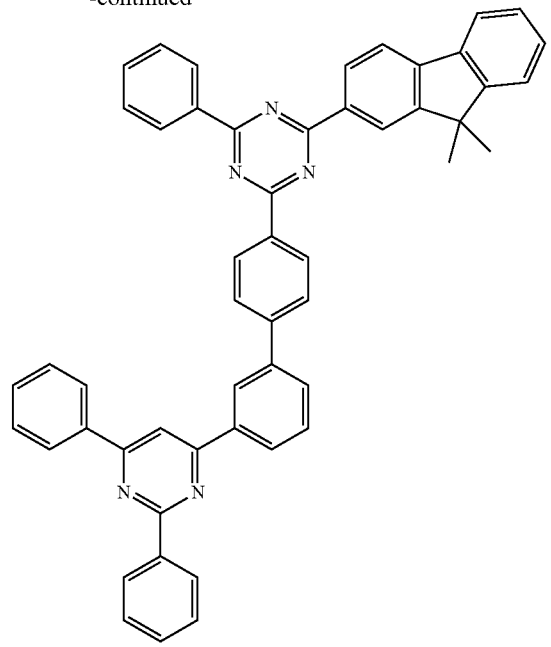
41
Compound 41 (2.3 g, yield 48%) was prepared in the same manner as in Synthesis Example 1, except that Tz-7 was used instead of Tz-1.
Mass [(M+H)$^+$]: 733
[Synthesis Example 8] Synthesis of Compound 54
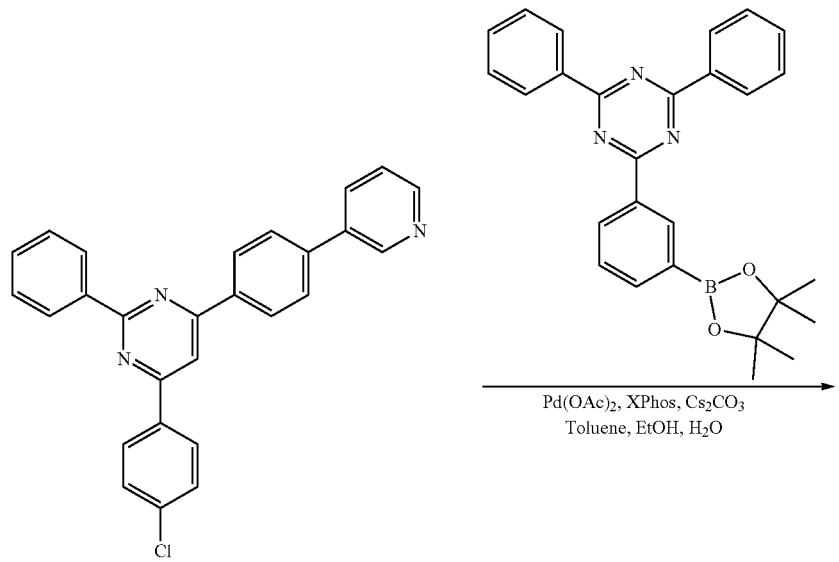

-continued
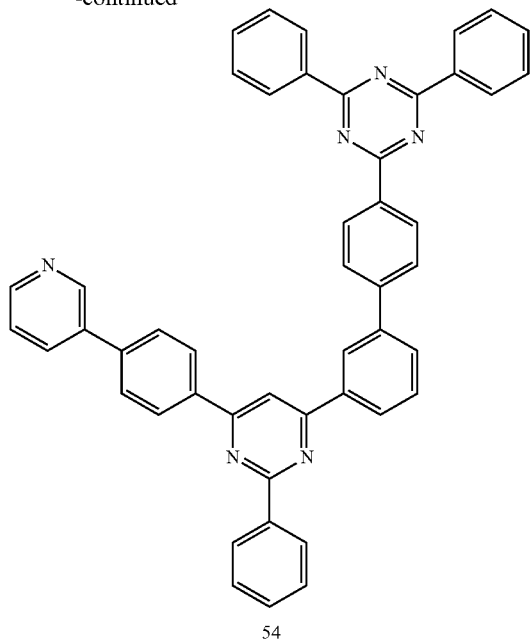
54
Compound 54 (2.2 g, yield 44%) was prepared in the same manner as in Synthesis Example 4, except that Py-5 was used instead of Py-1.
Mass: [(M+H)⁺]: 694
[Synthesis Example 9] Synthesis of Compound 68
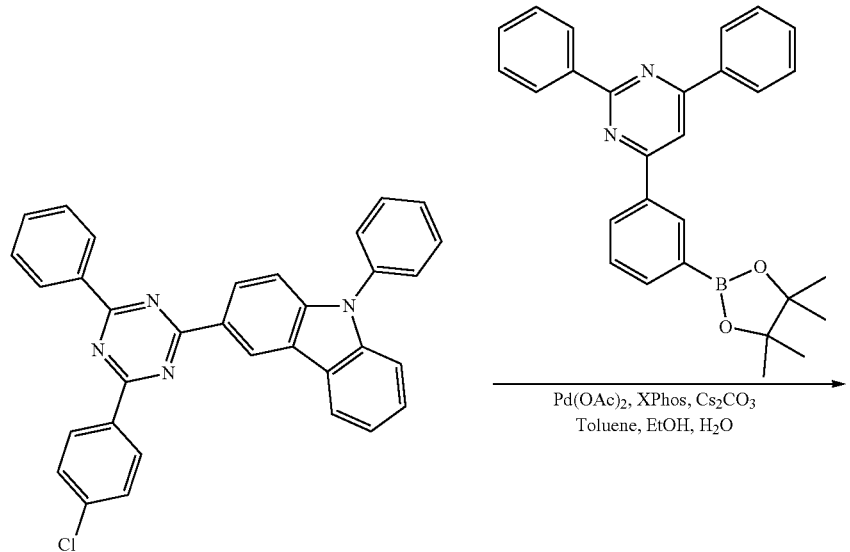
Tz-9

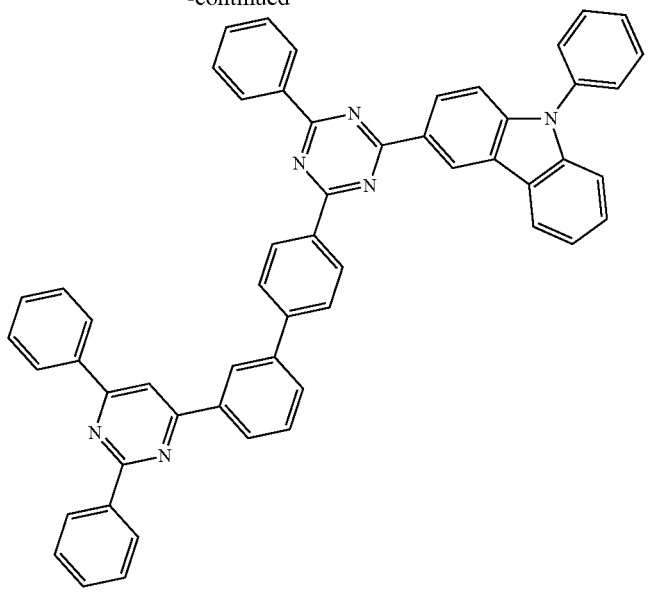
68
Compound 68 (2.3 g, yield 47%) was prepare in the same manner as in Synthesis Example 1, except that Tz-9 was used instead of Tz-1.
Mass [(M+H)$^+$]: 782
[Synthesis Example 10] Synthesis of Compound 74
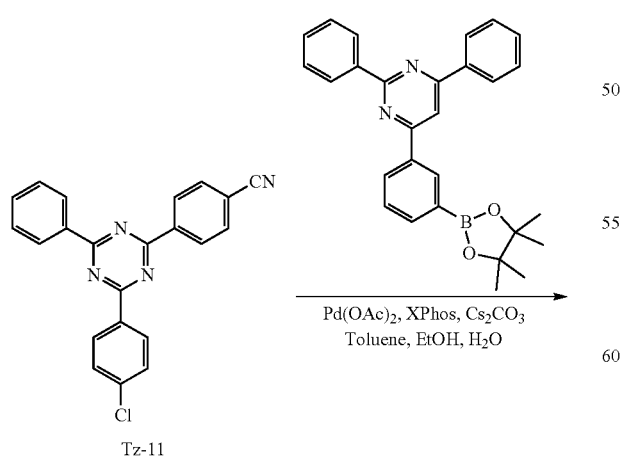
Tz-11
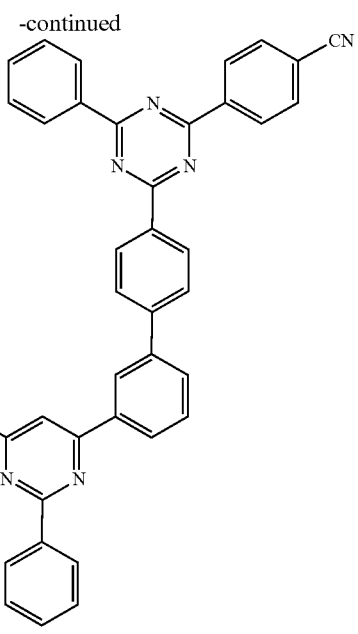
74
Compound 74 (3.2 g, yield 58%) was prepared in the same manner as in Synthesis Example 1, except that Tz-11 was used instead of Tz-1.
Mass: [(M+H)$^+$]: 642

[Synthesis Example 11] Synthesis of Compound 82
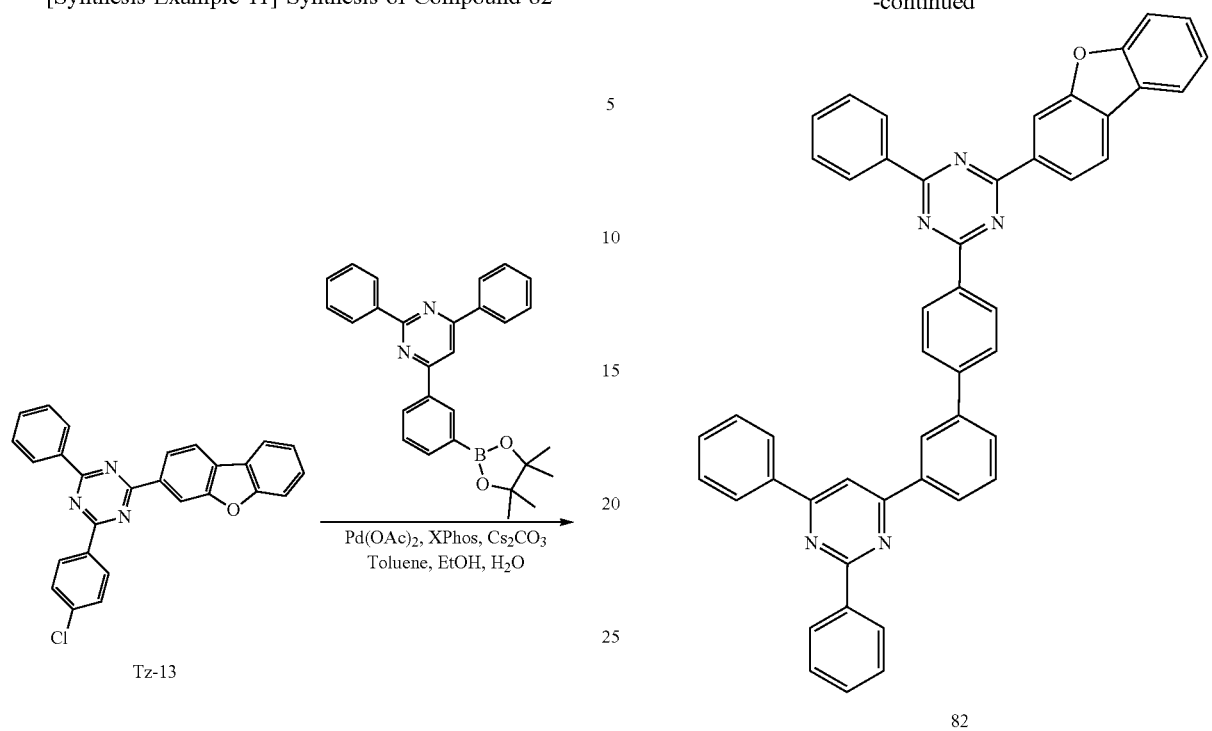
Compound 82 (2.4 g, yield 42%) was prepared in the same manner as in Synthesis Example 1, except that Tz-13 was used instead of Tz-1.
Mass: [(M+H)$^+$]: 707
[Synthesis Example 12] Synthesis of Compound 102
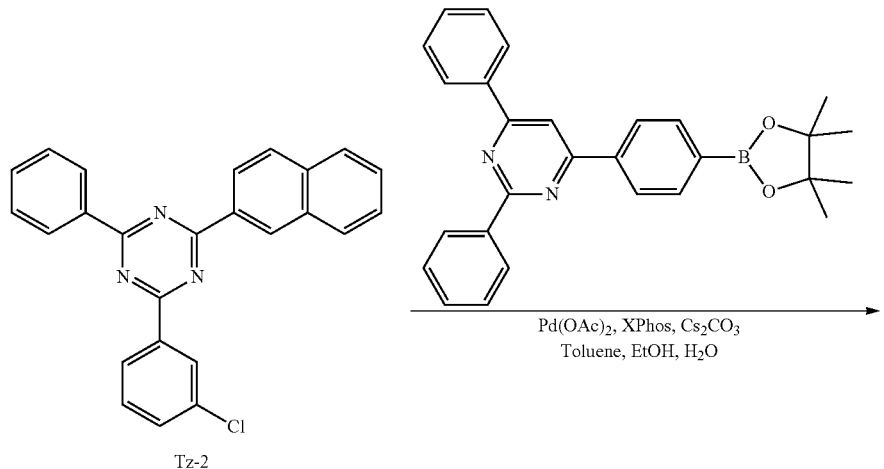

-continued

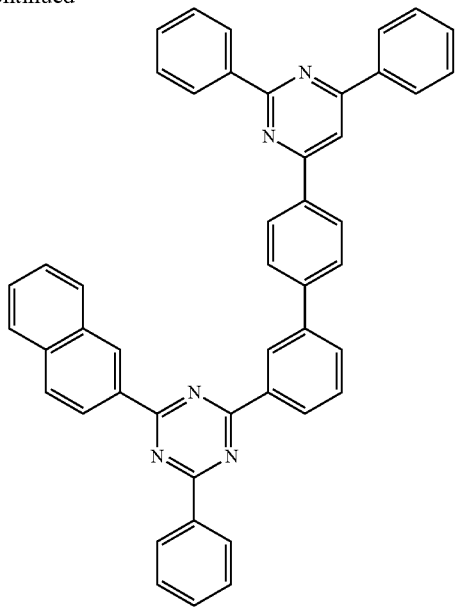
102

After mixing 3.0 g of Tz-2, 3.5 g of 2,4-diphenyl-6-(4-(4,4,5,5-tetramethyl-1,3,2-dioxaborolan-2-yl) phenyl)pyrimidine, and 3.0 g of $Cs_2CO_3$, 60 ml of toluene, 12 ml of ethanol, and 12 ml of water were added thereto, and then 55 mg of $Pd(OAc)_2$ and 250 mg of Xphos were further added thereto, followed by heating and stirring for 4 hours. After the reaction was completed, the temperature was lowered to room temperature and filtered. The filtrate was poured into water, extracted with methylene chloride, and a resultant organic layer was dried over $MgSO_4$. The dried organic layer was concentrated under reduced pressure and then columned with THF: Hex=1: 3, and thus Compound 102 (2.2 g, yield 48%) was prepared.

Mass: $[(M+H)^+]$ 667

[Synthesis Example 13] Synthesis of Compound 104

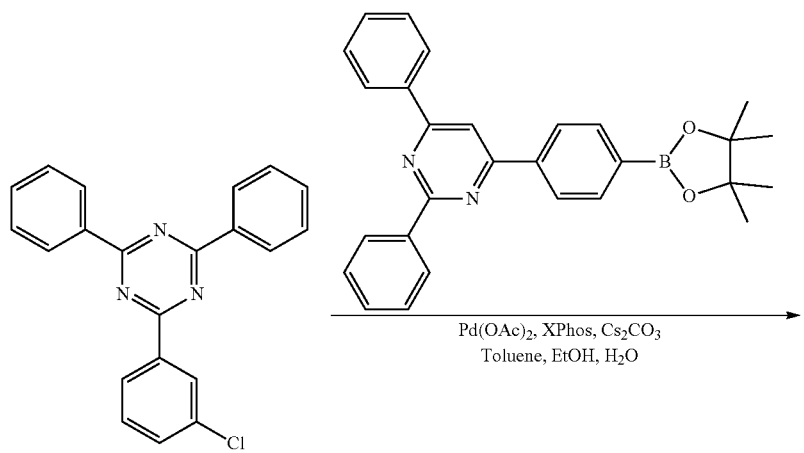

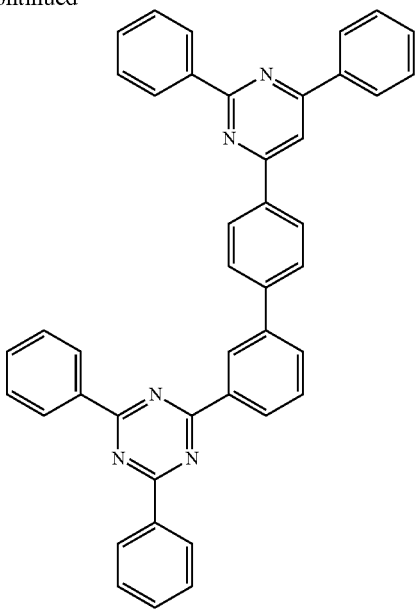
104
Compound 104 (2.6 g, yield 46%) was prepared in the same manner as in Synthesis Example 12, except that 2(3-chlorophenyl)-4,6-diphenyl-1,3,5-triazine was used instead of Tz-2.
Mass: [(M+H)$^+$]: 617
[Synthesis Example 14] Synthesis of Compound 106
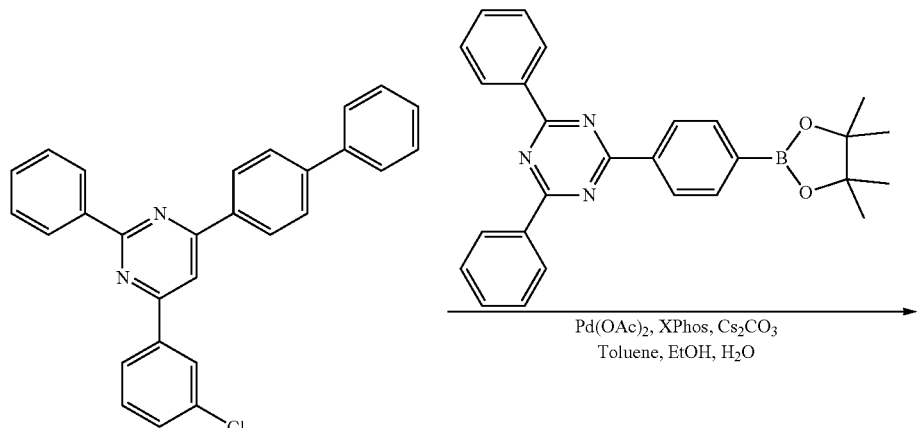
Py-2

-continued

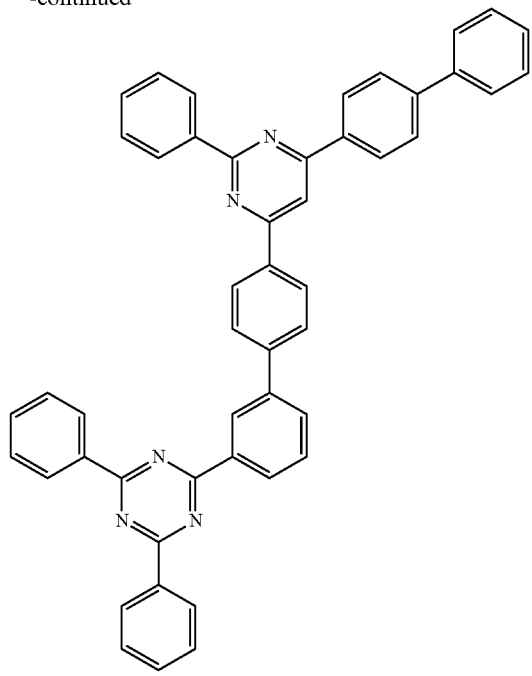

106

After mixing 3.0 g of Py-2, 3.2 g of 2,4-diphenyl-6-(4-(4,4,5,5-tetramethyl-1,3,2-dioxaborolan-2-yl)phenyl)-1,3,5-triazine, and 3.0 g of $Cs_2CO_3$, 60 ml of toluene, 12 ml of ethanol, and 12 ml of water were added thereto, and then 55 mg of $Pd(OAc)_2$ and 250 mg of Xphos were further added thereto, followed by heating and stirring for 4 hours. After the reaction was completed, the temperature was lowered to room temperature and filtered. The filtrate was poured into water, extracted with methylene chloride, and a resultant organic layer was dried over $MgSO_4$. The dried organic layer was concentrated under reduced pressure and then columned with THF: Hex=1: 3, and thus Compound 106 (2.1 g, yield 49%) was prepared.

Mass: $[(M+H)^+]$ 693

[Synthesis Example 15] Synthesis of Compound 108

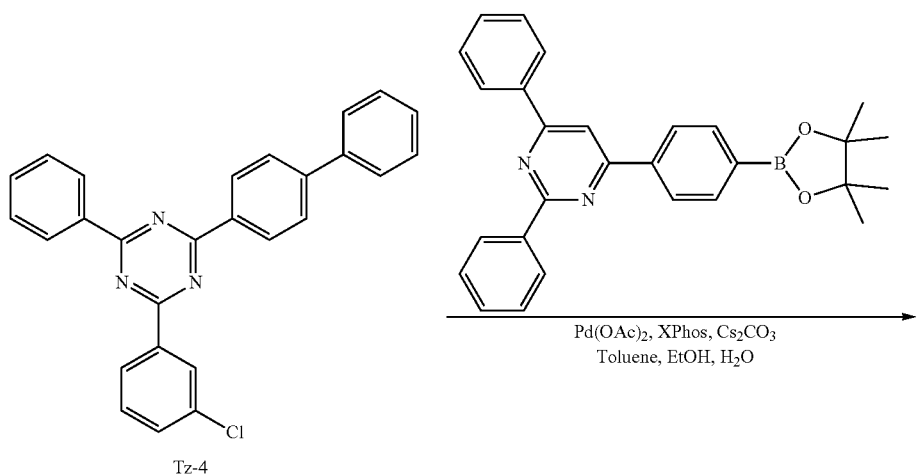

Tz-4

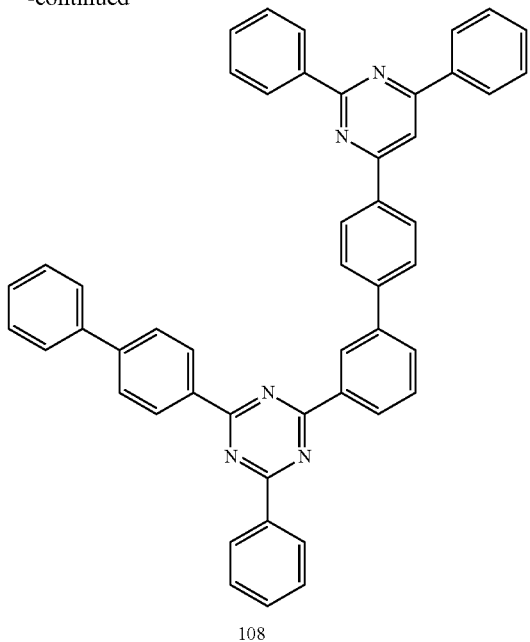
108
Compound 108 (2.4 g, yield 47%) was prepared in the same manner as in Synthesis Example 12, except that Tz-4 was used instead of Tz-2.
Mass: [(M+H)⁺]: 693
[Synthesis Example 16] Synthesis of Compound 131
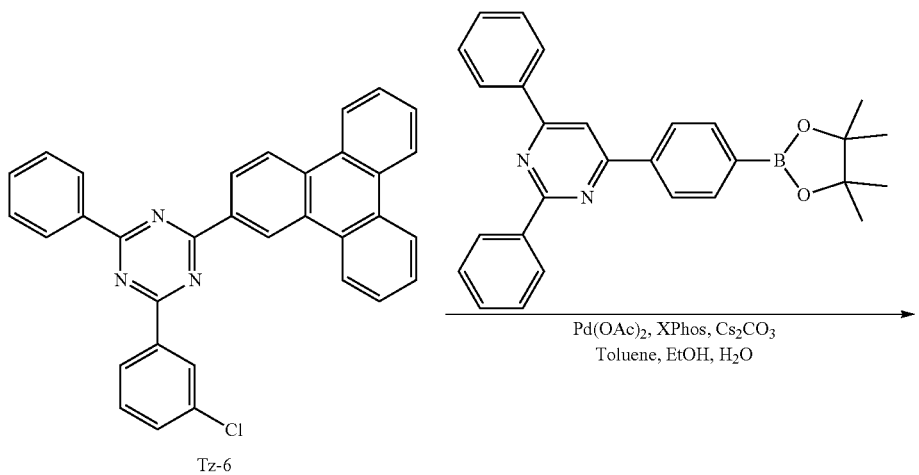

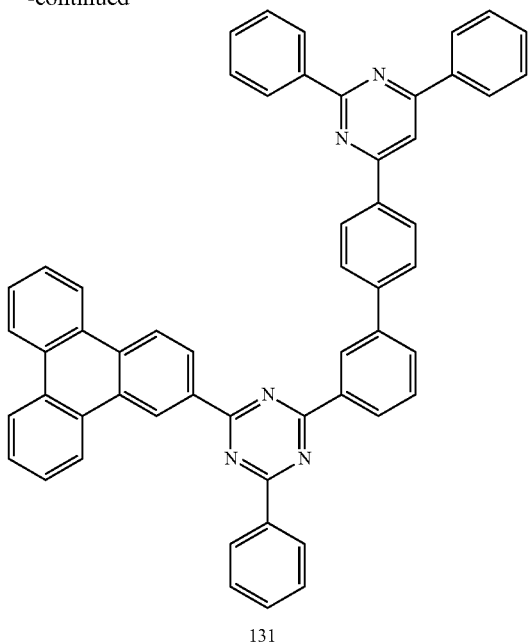
131
Compound 131 (2.1 g, yield 46%) was prepared in the same manner as in Synthesis Example 12, except that Tz-6 was used instead of Tz-2.
Mass: [(M+H)⁺]: 767
[Synthesis Example 17] Synthesis of Compound 132
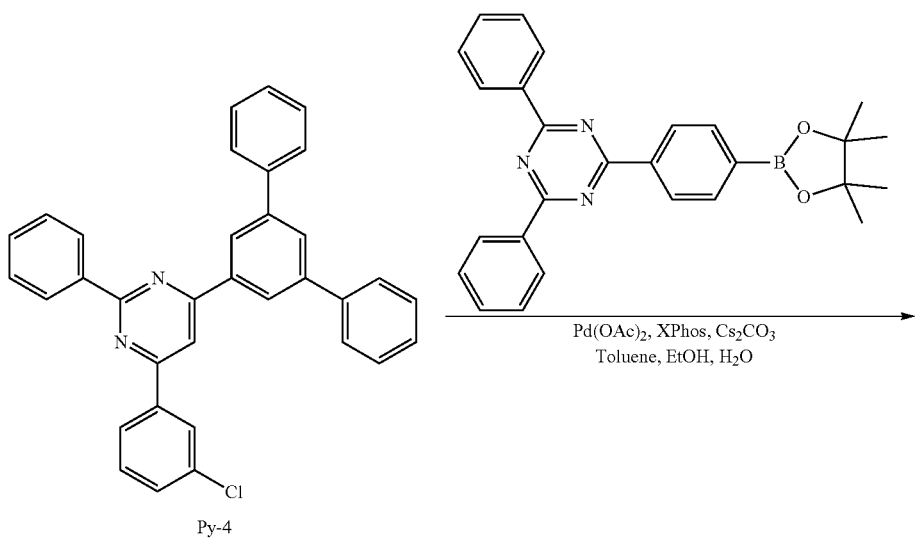
Py-4

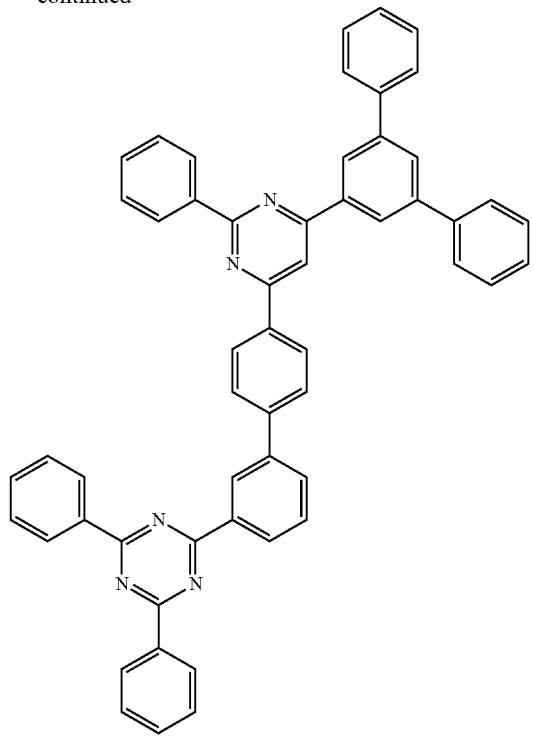
132
Compound 132 (2.6 g, yield 51%) was prepared in the same manner as in Synthesis Example 14, except that Py-4 was used instead of Py-2.
Mass: [(M+H)$^+$]: 769
[Synthesis Example 18] Synthesis of Compound 137
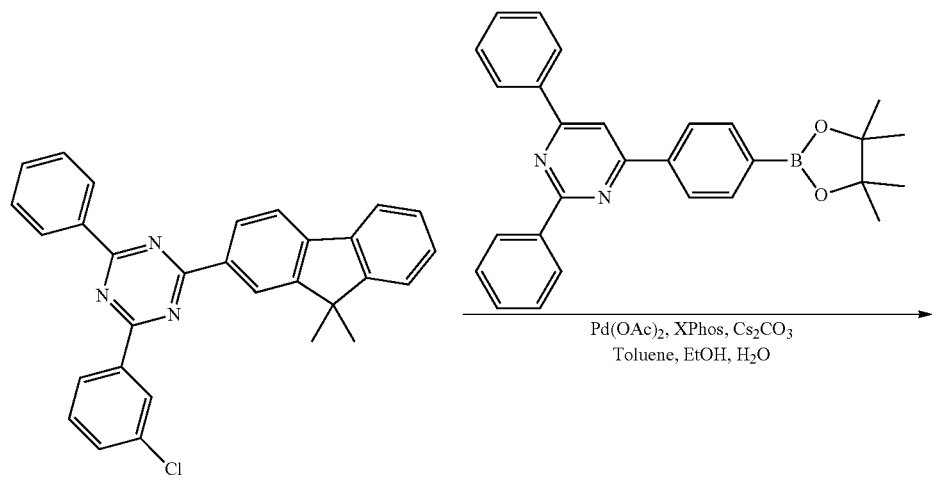

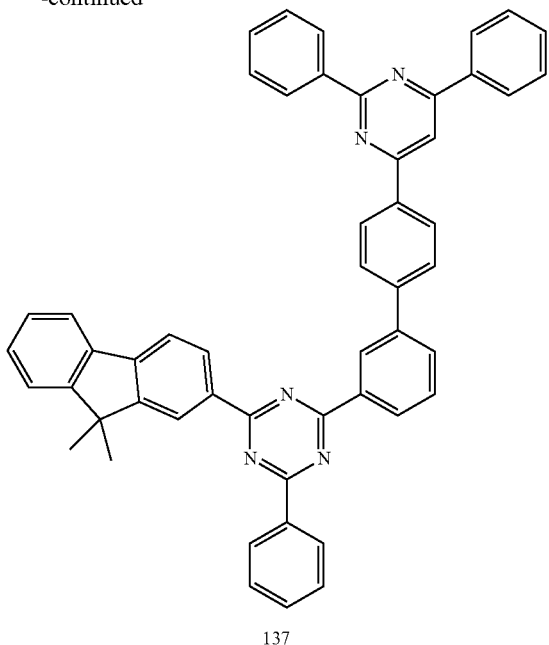
137
Compound 137 (2.3 g, yield 46%) was prepared in the same manner as in Synthesis Example 12, except that Tz-8 was used instead of Tz-2.
Mass: [(M+H)⁺]: 733
[Synthesis Example 19] Synthesis of Compound 146
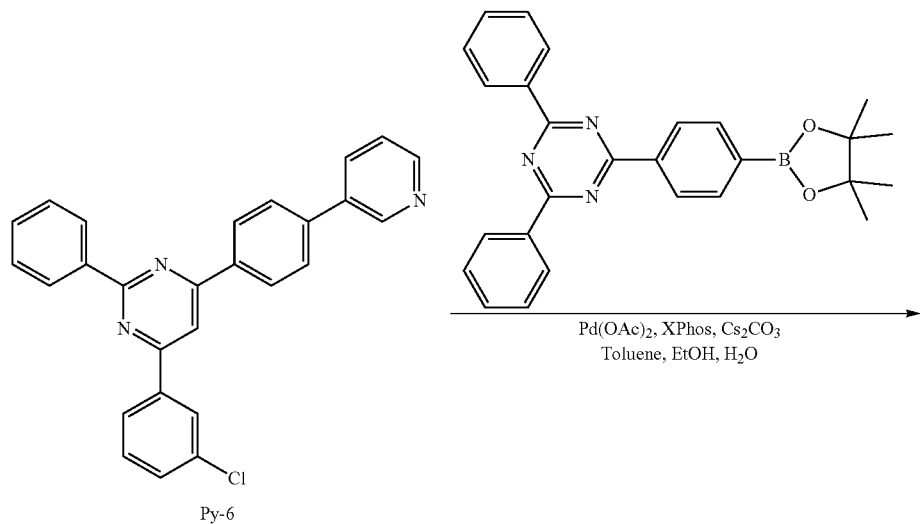

-continued
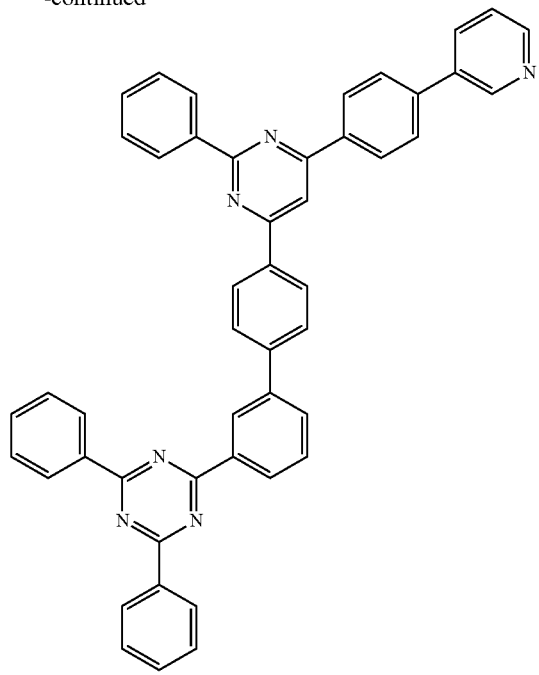
146
Compound 146 (2.8 g, yield 53%) was prepared in the same manner as in Synthesis Example 14, except that Py-6 was used instead of Py-2.
Mass: [(M+H)$^+$]: 694
[Synthesis Example 20] Synthesis of Compound 157
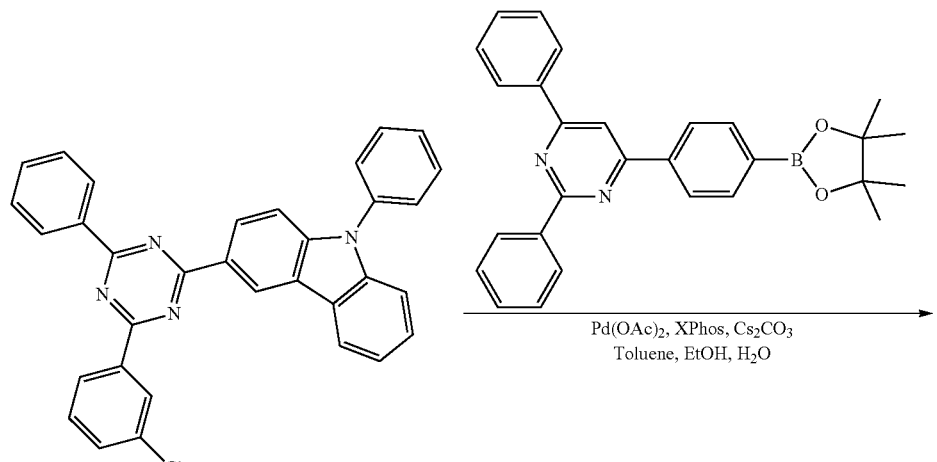
Tz-10

-continued
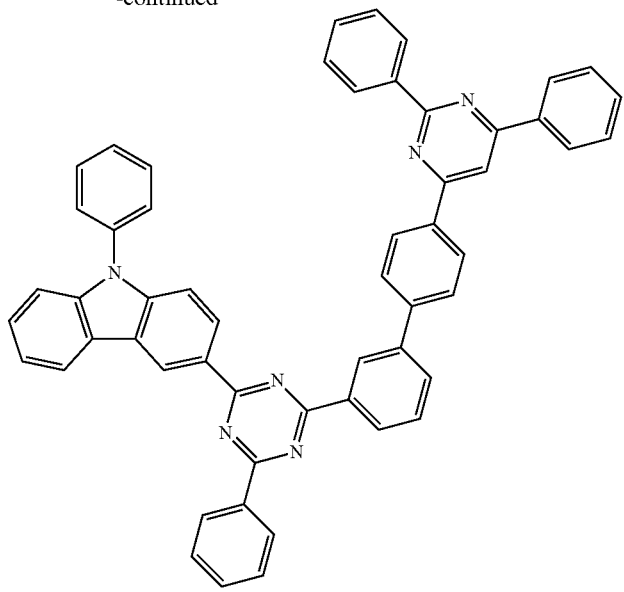
157
Compound 157 (2.1 g, yield 43%) was prepared in the same manner as in Synthesis Example 12, except that Tz-10 was used instead of Tz-2.
Mass: $[(M+H)^+]$: 783
[Synthesis Example 21] Synthesis of Compound 161
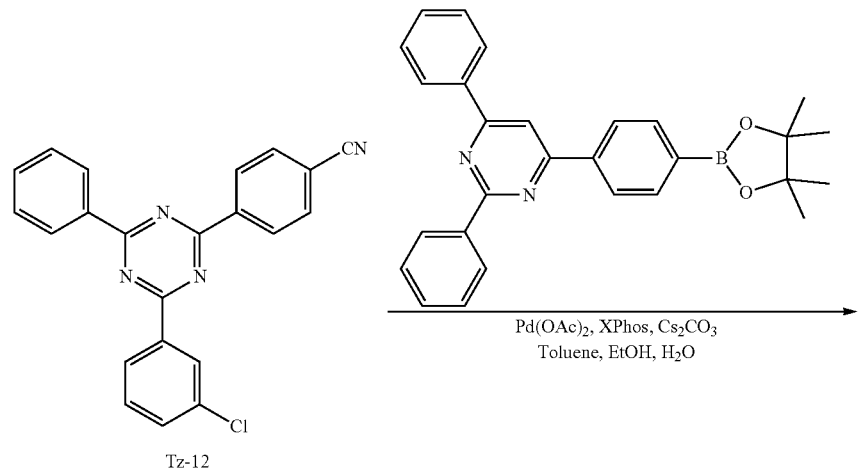
Tz-12

-continued
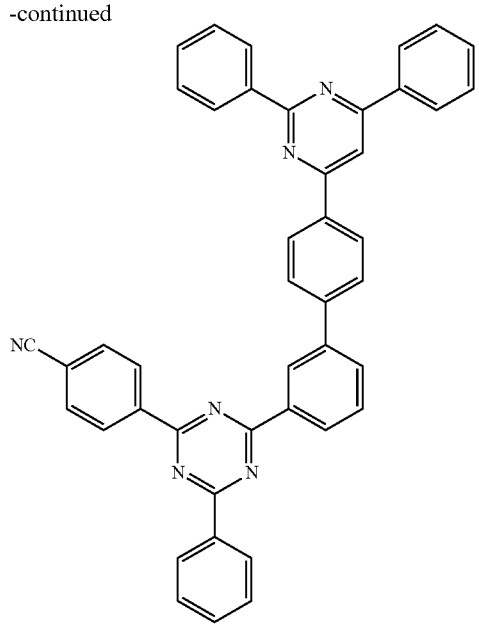
161
Compound 161 (2.4 g, yield 46%) was prepared in the same manner as in Synthesis Example 12, except that Tz-12 was used instead of Tz-2.
Mass: [(M+H)$^+$]: 642
[Synthesis Example 22] Synthesis of Compound 167
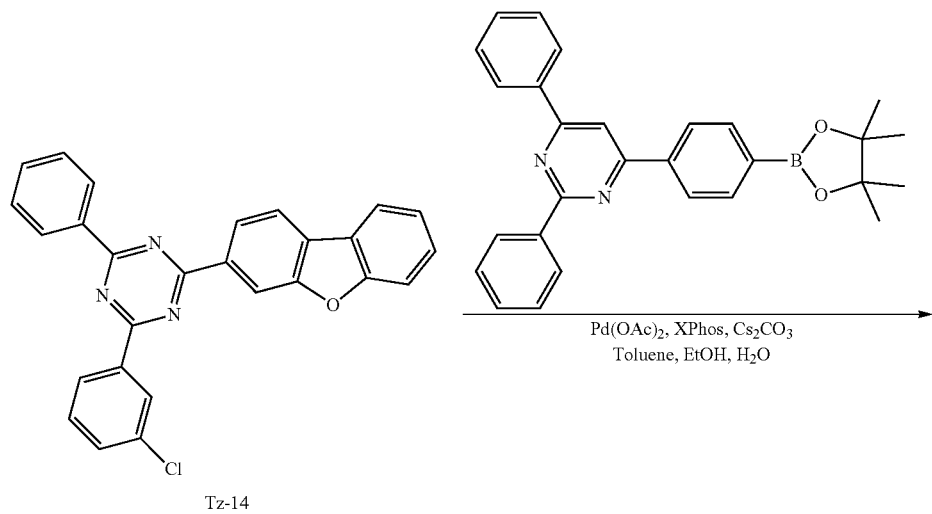

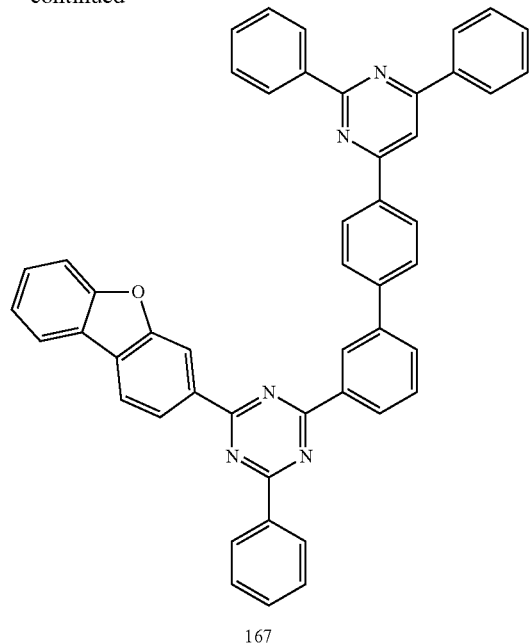

167

Compound 167 (2.0 g, yield 41%) was prepared in the same manner as in Synthesis Example 12, except that Tz-14 was used instead of Tz-2.

Mass [(M+H)⁺]: 707

[Embodiments 1 to 11] Preparation of Blue Organic EL Devices

Compounds 1, 4, 6, 8, 34, 37, 41, 54, 68, 74, and 82 synthesized in Synthesis Examples were subjected to high-purity sublimation purification in a conventionally known method, and then blue organic EL devices were prepared as follows.

First, a glass substrate thin-film-coated with indium tin oxide (ITO) to a thickness of 1500 Å was washed with distilled water ultrasonically. After washing with distilled water was completed, the glass substrate was ultrasonically cleaned with a solvent, such as isopropyl alcohol, acetone and methanol, dried, transferred to a UV OZONE cleaner (Power sonic 405, Hwasin Tech) cleaned for 5 minutes using UV, and then transferred to a vacuum evaporator.

On the ITO transparent electrode prepared as above, DS-205 (Doosan Electronics Co., Ltd., 80 nm)/NPB (15 nm)/ADN+5% DS-405 (Doosan Electronics Co., Ltd., 30 nm)/respective Compounds 1, 4, 6, 8, 34, 37, 41, 54, 68, 74, and 82 (30 nm)/LiF (1 nm)/Al (200 nm) were stacked in the order, so that organic EL devices were prepared (see the following Table 1).

TABLE 1

|  | Compound | Thickness (nm) |
|---|---|---|
| Hole injection layer | DS-205 | 80 |
| Hole transport layer | NPB | 15 |
| Light emitting layer | ADN + 5% DS-405 | 30 |

TABLE 1-continued

|  | Compound | Thickness (nm) |
|---|---|---|
| Electron transport layer | Compound 1, 4, 6, 8, 34, 37, 41, 54, 68, 74, 82 | 30 |
| Electron injection layer | LiF | 1 |
| Cathode | Al | 200 |

[Comparative Example 1] Preparation of Blue Organic EL Device

A blue organic EL device was prepared in the same manner as in Embodiment 1, except that Alq₃ was used as an electron transport layer material instead of Compound 1.

[Comparative Example 2] Preparation of Blue Organic EL Device

A blue organic EL device was prepared in the same manner as in Embodiment 1, except that Compound 1 was not used as an electron transport layer material.

[Comparative Example 3] Preparation of Blue Organic EL Device

A blue organic EL device was prepared in the same manner as in Embodiment 1, except that Compound T-1 was used as an electron transport layer material instead of Compound 1.

[Comparative Example 4] Preparation of Blue Organic EL Device

A blue organic EL device was prepared in the same manner as in Embodiment 1, except that Compound T-2 was used as an electron transport layer material instead of Compound 1.

[Comparative Example 5] Preparation of Blue Organic EL Device

A blue organic EL device was prepared in the same manner as in Embodiment 1, except that Compound T-3 was used as an electron transport layer material instead of Compound 1.

For example, structures of NPB, ADN, Alq$_3$, Compounds Ti to T3 used in Embodiments 1 to 11 and Comparative Examples 1 to 3 are as follows.

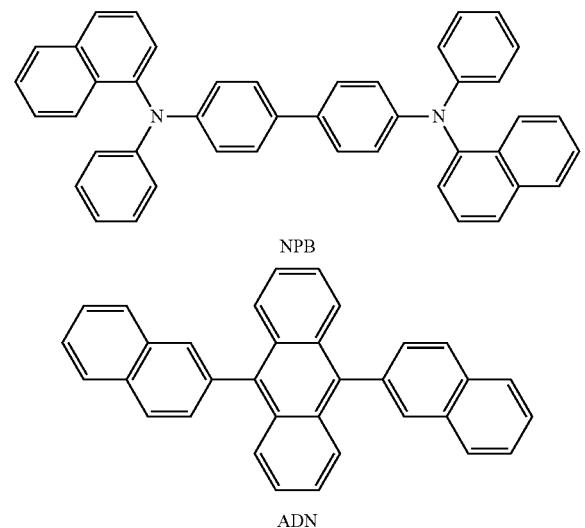

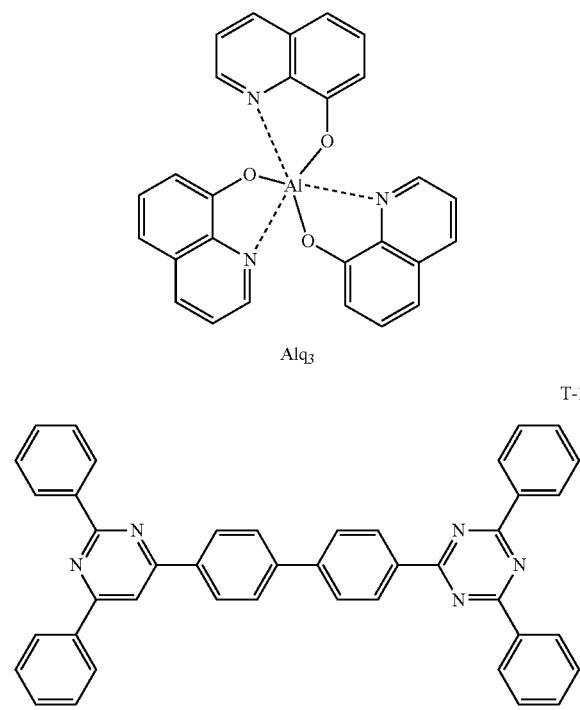

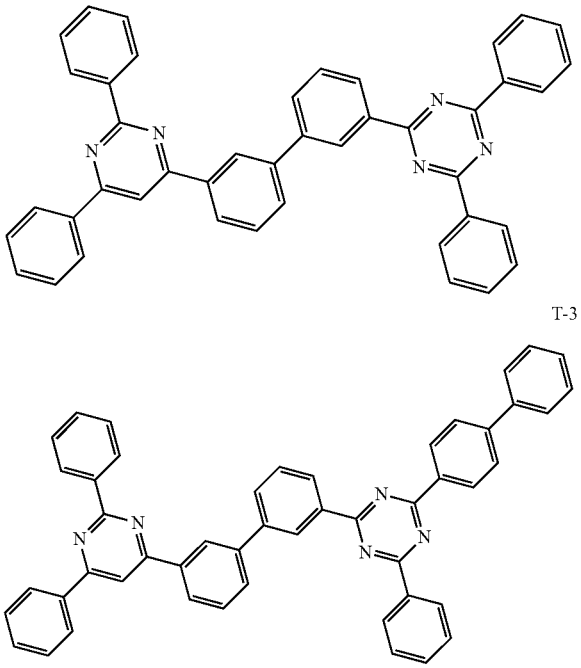

[Experimental Example 1]

For each of the blue organic EL devices prepared in Embodiments 1 to 11 and Comparative Examples 1 to 4, a driving voltage, a current efficiency and an emission peak at a current density of 10 mA/cm$^2$ were measured and the results are shown in Table 2 below.

TABLE 2

| Sample | Electron transport layer | Driving voltage (V) | Luminous efficiency (nm) | Current efficiency (cd/A) |
|---|---|---|---|---|
| Embodiment 1 | Compound 1 | 3.2 | 454 | 8.0 |
| Embodiment 2 | Compound 4 | 3.0 | 455 | 8.2 |
| Embodiment 3 | Compound 6 | 3.1 | 454 | 8.3 |
| Embodiment 4 | Compound8 | 3.1 | 453 | 8.6 |
| Embodiment 5 | Compound 34 | 3.2 | 455 | 8.2 |
| Embodiment 6 | Compound 37 | 3.1 | 456 | 8.5 |
| Embodiment 7 | Compound 41 | 3.1 | 455 | 9.1 |
| Embodiment 8 | Compound 54 | 3.2 | 454 | 7.7 |
| Embodiment 9 | Compound 68 | 3.1 | 455 | 7.6 |
| Embodiment 10 | Compound 74 | 3.1 | 454 | 7.6 |
| Embodiment 11 | Compound 82 | 3.2 | 455 | 7.8 |
| Comp. Example 1 | Alq$_3$ | 4.8 | 457 | 5.6 |
| Comp. Example 2 | — | 4.7 | 459 | 6.1 |
| Comp. Example 3 | T-1 | 4.5 | 459 | 5.9 |
| Comp. Example 4 | T-2 | 3.8 | 456 | 7.2 |
| Comp. Example 5 | T-3 | 3.7 | 455 | 7.0 |

As shown in Table 2, it was appreciated that the blue organic EL devices of Embodiments 1 to 11 in which the compounds of the present invention were used in the electron transport layer exhibited excellent performance in terms of the driving voltage, the emission peak and the current efficiency, as compared to the blue organic EL device in Comparative Example 1 in which conventional Alq$_3$ was used in the electron transport layer and the blue organic EL device in Comparative Example 2 in which the electron transport layer is not included.

Specifically, it was appreciated that the blue organic EL devices of Embodiments 1 to 11 including the electron transport layer material according to the present invention having a biphenylene linking group bonded in a para-meta position between triazine and pyrimidine exhibited superior performance in terms of driving voltage, emission peak, and current efficiency, as compared to Comparative Examples 3 and 4 including an electron transport layer having a para-para bonded biphenylene linking group (Compound T-1) and an electron transport layer having a meta-meta bonded biphenylene linking group (Compound T-2), respectively, while having the same base skeleton structure. In particular, it was confirmed that the driving voltage of the device has a remarkable improvement in a range of about 0.8 to 1.5 V.

[Embodiments 12 to 22] Preparation of Blue Organic EL Devices

Compounds 102, 104, 108, 106, 131, 132, 137, 146, 157, 161, and 167 synthesized in Synthesis Examples were subjected to high-purity sublimation purification in a conventionally known method, and then blue organic EL devices were prepared as follows.

First, a glass substrate thin-film-coated with indium tin oxide (ITO) to a thickness of 1500 Å was washed with distilled water ultrasonically. After washing with distilled water was completed, the glass substrate was ultrasonically cleaned with a solvent, such as isopropyl alcohol, acetone and methanol, dried, transferred to a UV OZONE cleaner (Power sonic 405, Hwasin Tech) cleaned for 5 minutes using UV, and then transferred to a vacuum evaporator.

On the ITO transparent electrode prepared as above, DS-205 (Doosan Electronics Co., Ltd., 80 nm)/NPB (15 nm)/ADN+5% DS-405 (Doosan Electronics Co., Ltd., 30 nm)/respective Compounds 102, 104, 108, 106, 131, 132, 137, 146, 157, 161, and 167 (5 nm)/Alq$_3$ (25 nm)/LiF (1 nm)/Al (200 nm) were stacked in the order, so that organic EL devices were prepared (see the following Table 3).

TABLE 3

|  | Compound | Thickness (nm) |
| --- | --- | --- |
| Hole injection layer | DS-205 | 80 |
| Hole transport layer | NPB | 15 |
| Light emitting layer | ADN + 5% DS-405 | 30 |
| Electron transport auxiliary layer | Compound 102, 104, 108, 106, 131, 132, 137, 146, 157, 161, 167 | 5 |
| Electron transport layer | Alq$_3$ | 25 |
| Electron injection layer | LiF | 1 |
| Cathode | Al | 200 |

[Comparative Example 6] Preparation of Blue Organic EL Device

A blue organic EL device was prepared in the same manner as in Embodiment 12, except that Compound 102 was not used as the electron transport auxiliary layer material, and Alq3, which is an electron transport layer material, was deposited to 30 nm instead of 25 nm.

[Comparative Example 7] Preparation of a Blue Organic EL Device

A blue organic EL device was prepared in the same manner as in Embodiment 12, except that Compound T-1 was used instead of Compound 102 as the electron transport auxiliary layer material.

[Comparative Example 8] Preparation of a Blue Organic EL Device

A blue organic EL device was prepared in the same manner as in Embodiment 12, except that Compound T-2 was used instead of Compound 102 as the electron transport auxiliary layer material.

[Comparative Example 9] Preparation of a Blue Organic EL Device

A blue organic EL device was prepared in the same manner as in Embodiment 12, except that Compound T-3 was used instead of Compound 102 as the electron transport auxiliary layer material.

[Evaluation Example 2]

For each of the blue organic EL devices prepared in Embodiments 12 to 22 and Comparative Examples 5 to 7, a driving voltage, a current efficiency and an emission peak at a current density of 10 mA/cm$^2$ were measured and the results are shown in Table 4 below.

TABLE 4

| Sample | Electron transport auxiliary layer | Driving voltage (V) | Luminous efficiency (nm) | Current efficiency (cd/A) |
| --- | --- | --- | --- | --- |
| Embodiment 12 | Compound 102 | 3.3 | 455 | 8.9 |
| Embodiment 13 | Compound 104 | 3.8 | 453 | 8.2 |
| Embodiment 14 | Compound 106 | 3.3 | 454 | 8.5 |
| Embodiment 15 | Compound 108 | 3.0 | 455 | 9.2 |
| Embodiment 16 | Compound 131 | 3.2 | 454 | 8.4 |
| Embodiment 17 | Compound 132 | 3.1 | 455 | 8.3 |
| Embodiment 18 | Compound 137 | 3.2 | 454 | 9.0 |
| Embodiment 19 | Compound 146 | 3.3 | 455 | 8.2 |
| Embodiment 20 | Compound 157 | 3.2 | 456 | 8.3 |
| Embodiment 21 | Compound 161 | 3.3 | 454 | 8.2 |
| Embodiment 22 | Compound 167 | 3.2 | 455 | 8.4 |
| Comp. Example 6 | — | 4.7 | 459 | 6.1 |
| Comp. Example 7 | T-1 | 4.5 | 459 | 5.9 |
| Comp. Example 8 | T-2 | 3.9 | 455 | 7.8 |
| Comp. Example 9 | T-3 | 3.8 | 454 | 7.6 |

As shown in Table 4, it was appreciated that the blue organic EL devices of Embodiments 12 to 22 in which the compounds of the present invention were used in the electron transport auxiliary layer exhibited excellent performance in terms of the current efficiency and the emission peak, particularly showing remarkable improvement in the driving voltage, as compared to the conventional blue organic EL device in Comparative Example 5 which does not include an electron transport auxiliary layer.

Specifically, it was appreciated that the blue organic EL devices of Embodiments 12 to 22 including the electron transport auxiliary layer according to the present invention having a biphenylene linking group bonded in a para-meta position between triazine and pyrimidine exhibited superior performance in terms of driving voltage, emission peak, and current efficiency of the device, as compared to Comparative Examples 6 and 7 including an electron transport auxiliary layer having a para-para bonded biphenylene linking group (Compound T-1) and an electron transport auxiliary layer having a meta-meta bonded biphenylene linking group (Compound T-2), respectively, while having the same base skeleton structure. In particular, it was confirmed that the driving voltage of the device has a remarkable improvement in a range of about 0.7 to 1.3 V.

The invention claimed is:

1. A compound of the following Chemical Formula 1:

Chemical Formula 1

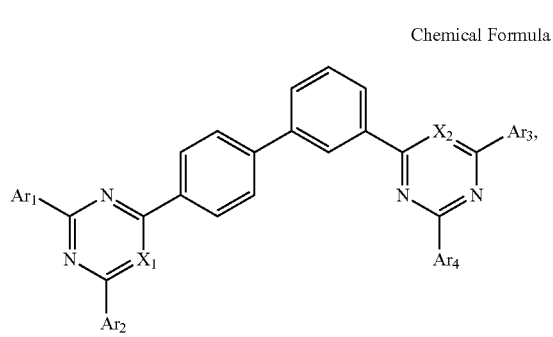

wherein in Chemical Formula 1,
one of $X_1$ and $X_2$ is $CR_1$ and the other is N;
$R_1$ is selected from the group consisting of: hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_1$ to $C_{40}$ phosphine group, a $C_1$ to $C_{40}$ phosphine oxide group and a $C_6$ to $C_{60}$ arylamine group,
$Ar_1$ to $Ar_4$ are each independently selected from the group consisting of: a $C_6$ to $C_{60}$ aryl group, and a heteroaryl group having 5 to 60 nuclear atoms,
with the proviso that:
(i) the compound in which $Ar_1$ and $Ar_2$ are both naphthyl groups is excluded;
(ii) the compound in which $Ar_1$ and $Ar_4$ are both naphthyl groups is excluded; and
(iii) the compound in which $Ar_1$ to $Ar_4$ are all naphthyl groups is excluded; and
the alkenyl group, the alkynyl group, the cycloalkyl group, the heterocycloalkyl group, the alkyl group, the aryl group, the heteroaryl group, the alkyloxy group, the aryloxy group, the alkylsilyl group, the arylsilyl group, the alkylboron group, the arylboron group, the arylphosphine group, the arylphosphine oxide group and the arylamine group of $R_1$ and $Ar_1$ to $Ar_4$ are each independently substituted or unsubstituted with one or more kinds of substituents selected from the group consisting of deuterium, a halogen group, a cyano group, a nitro group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_1$ to $C_{40}$ alkyl group, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, and when the substituents are plural in number, the substituents are the same as or different from each other.

2. The compound of claim 1, wherein the compound represented by Chemical Formula 1 is a compound of the following Chemical Formula 2 or Chemical Formula 3:

Chemical Formula 2

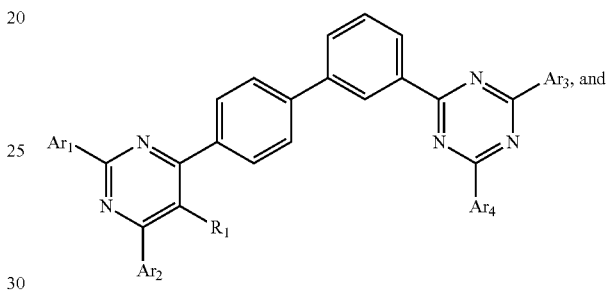

Chemical Formula 3

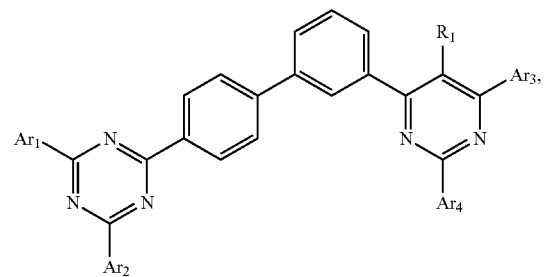

wherein in Chemical Formulas 2 and 3,
$R_1$, and $Ar_1$ to $Ar_4$ are as defined in claim 1, respectively.

3. The compound of claim 1,
wherein $R_1$ is selected from the group consisting of hydrogen, deuterium, a halogen group, a cyano group, a $C_1$ to $C_{40}$ alkyl group, a $C_6$ to $C_{60}$ aryl group and a heteroaryl group having 5 to 60 nuclear atoms, and
the alkyl group, the aryl group, and the heteroaryl group of $R_1$ are each independently substituted or unsubstituted with one or more kinds of substituents selected from the group consisting of deuterium, a halogen group, a cyano group, a nitro group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, and when the substituents are plural in number, the substituents are the same as or different from each other.

4. The compound of claim 1, wherein $Ar_1$ to $Ar_4$ are each independently selected from the group consisting of a $C_6$ to $C_{60}$ aryl group, and a heteroaryl group having 5 to 60 nuclear atoms, except the case where all of $Ar_1$ to $Ar_4$ are the same as each other, and the aryl group, and the heteroaryl group of $Ar_1$ to $Ar_4$ are each independently substituted or unsubstituted with one or more kinds of substituents selected from the group consisting of deuterium, a halogen group, a cyano group, a nitro group, a $C_1$ to $C_{40}$ alkyl group, a $C_6$ to $C_{60}$ aryl group, a heteroaryl group having 5 to 60 nuclear atoms, a $C_6$ to $C_{60}$ aryloxy group, a $C_6$ to $C_{60}$ arylphosphine oxide group and a $C_6$ to $C_{60}$ arylamine group, and when the substituents are plural in number, the substituents are the same as or different from each other.

5. The compound of claim 1, wherein each of $Ar_1$ to $Ar_4$ is elected from the following structural formulas:

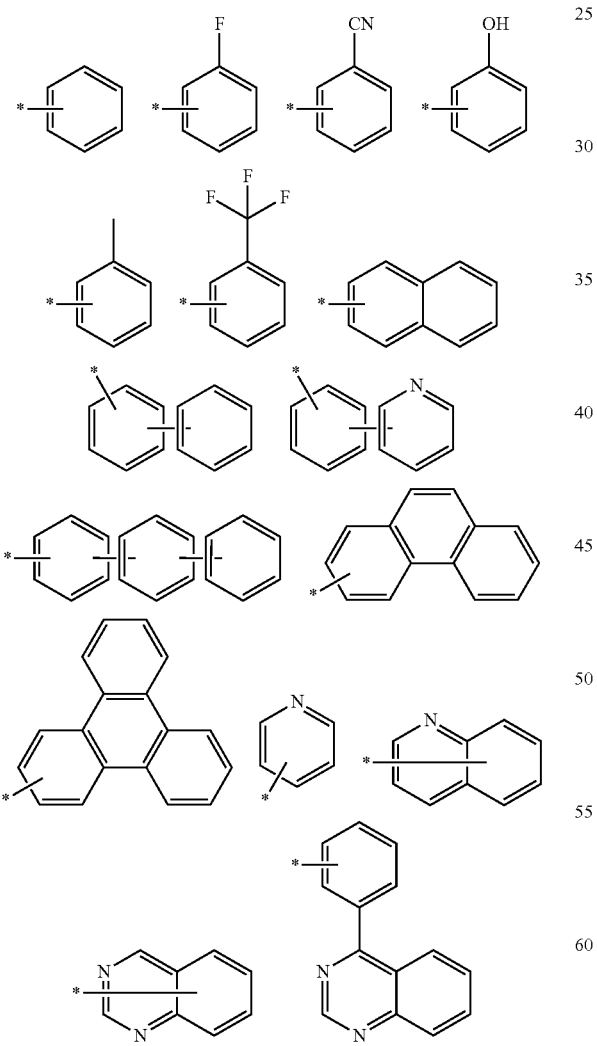

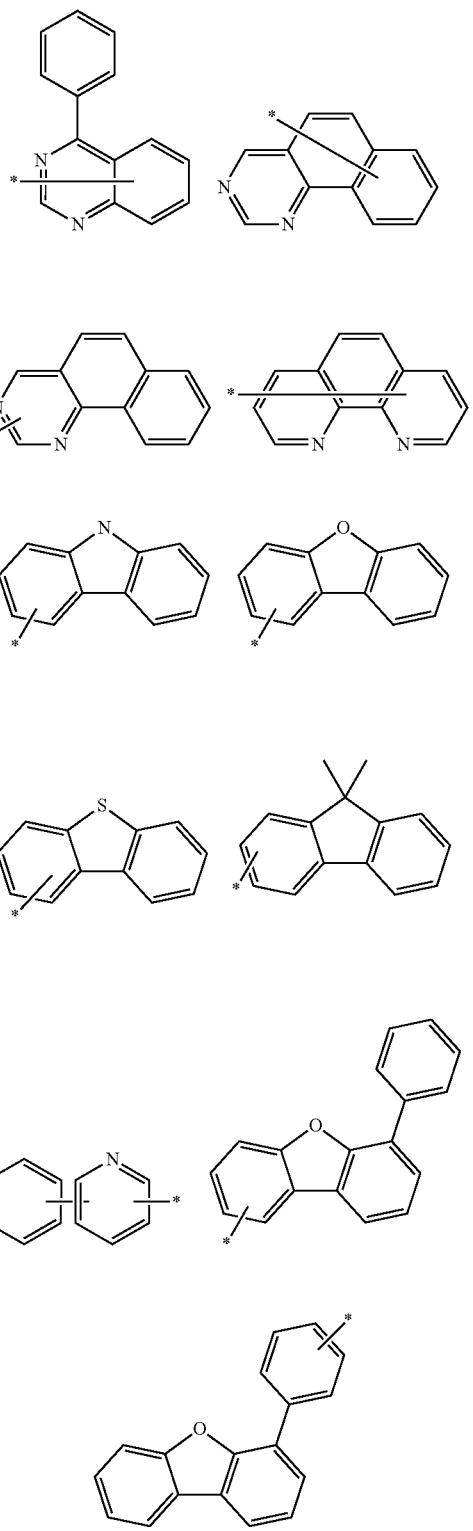

wherein in the above structural formula, * means a site where a bond is made with the compound of Chemical Formula 1.

6. The compound of claim 1, wherein the compound of Chemical Formula 1 is represented by any one of the following Chemical Formulas 1 to 190:

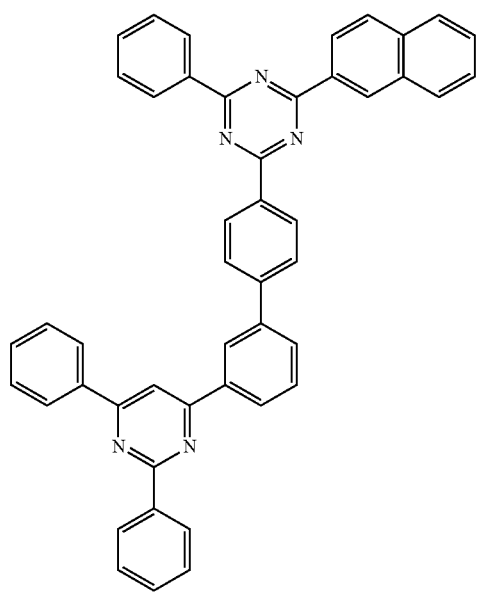
1
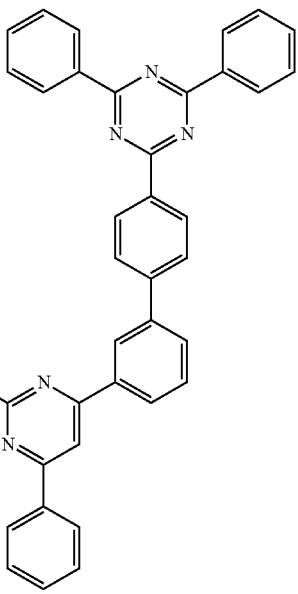
2
-continued
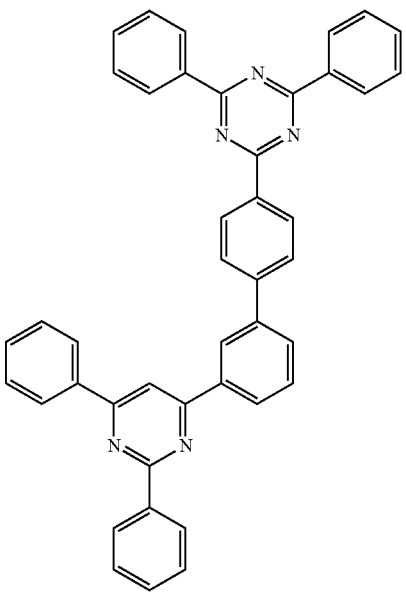
3
4

-continued
5
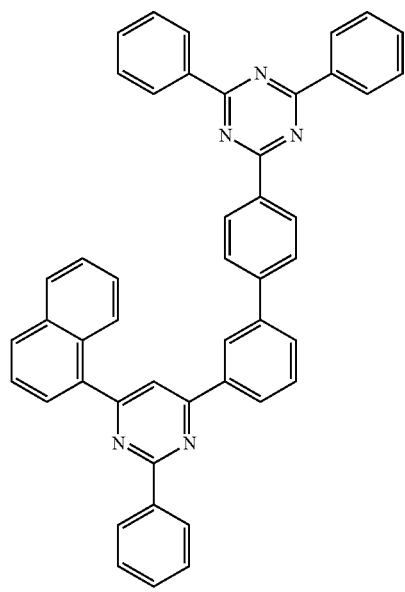
6
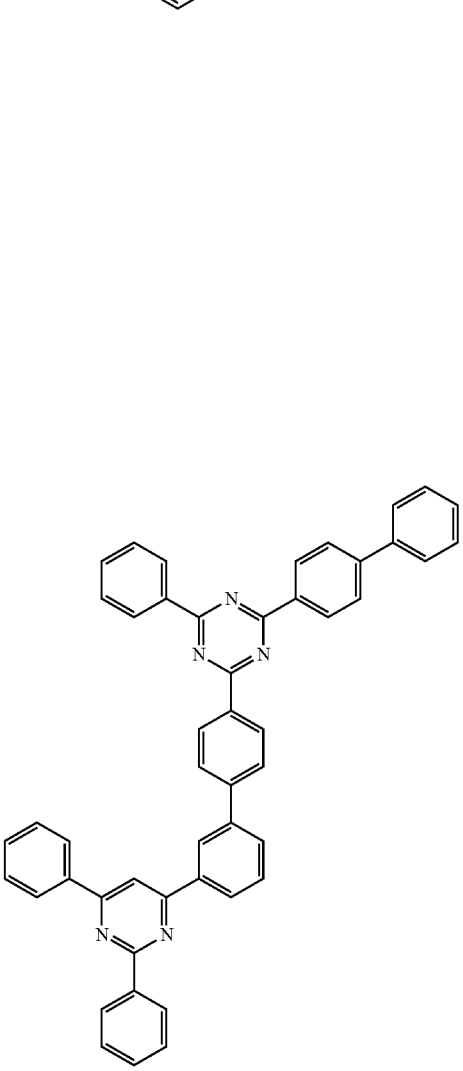
-continued
7
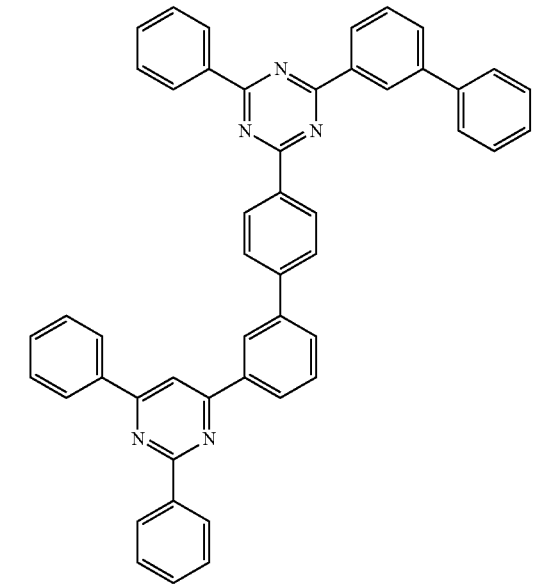
8

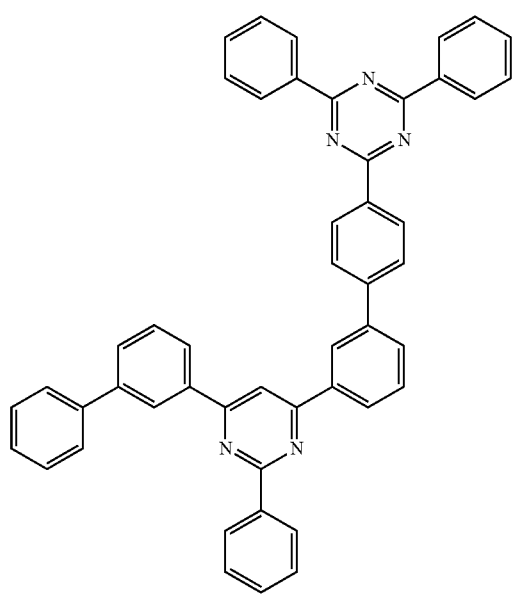
9
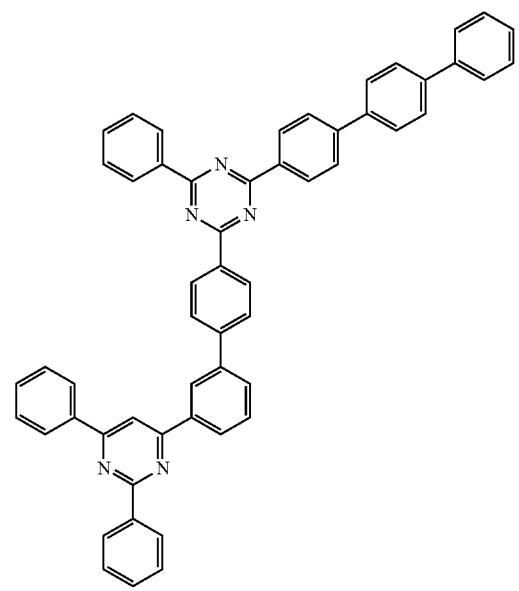
11
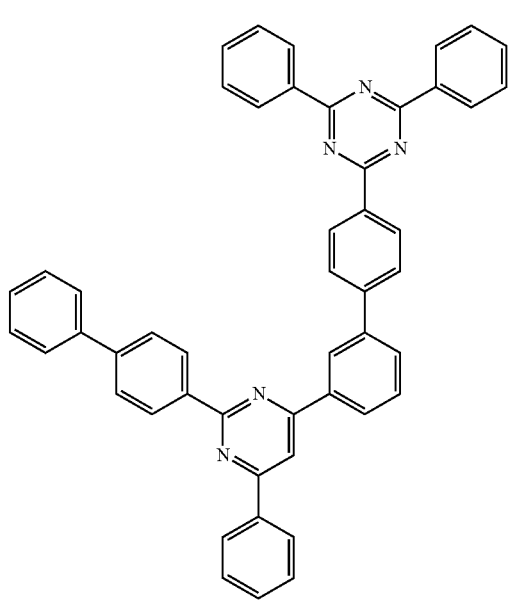
10
12

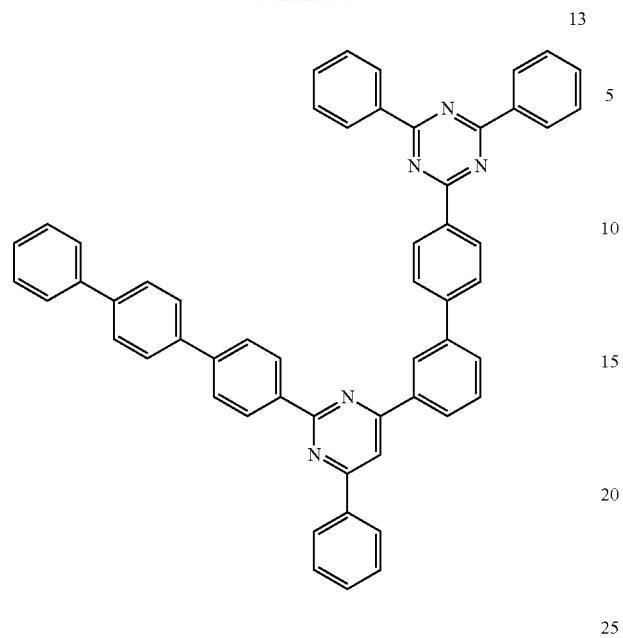
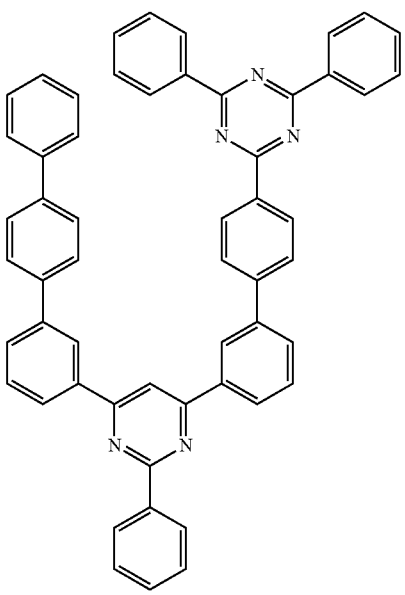
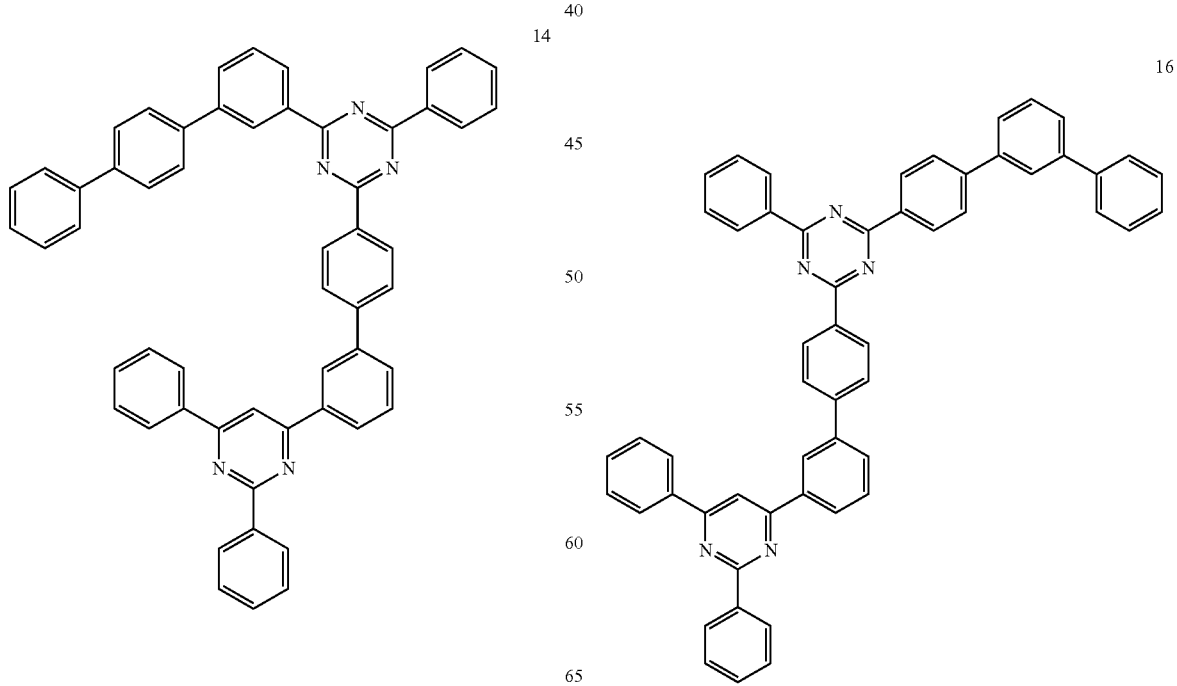

17
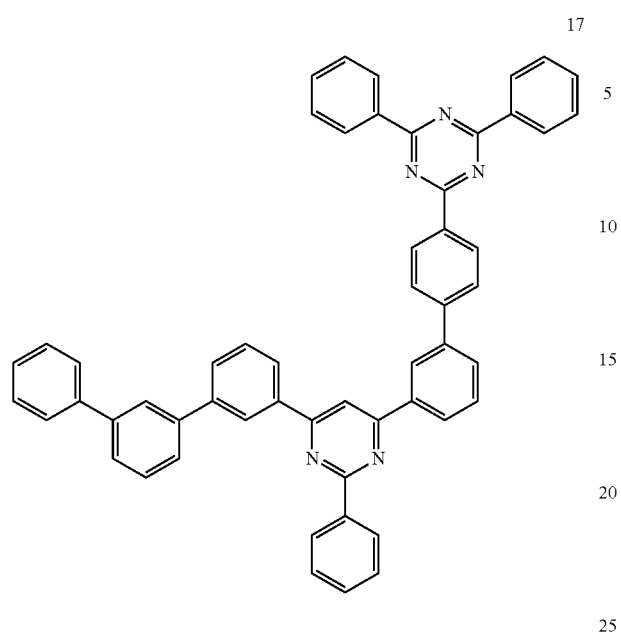
18
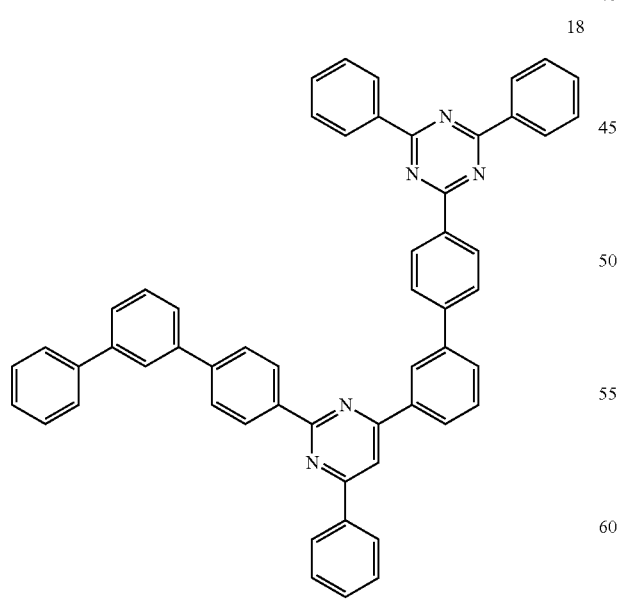
19
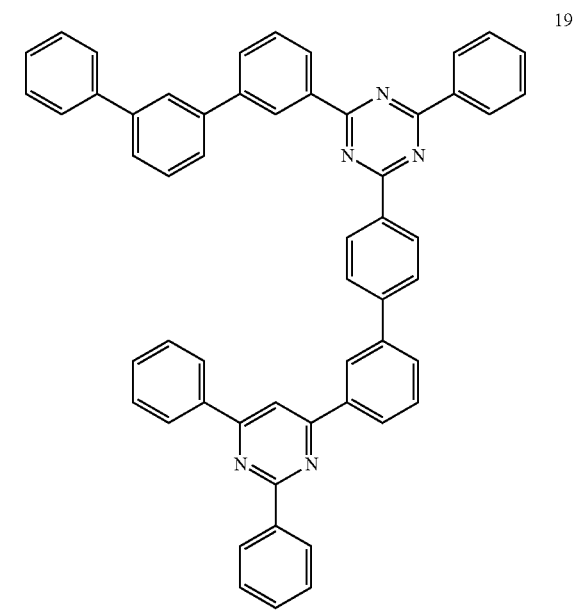
20
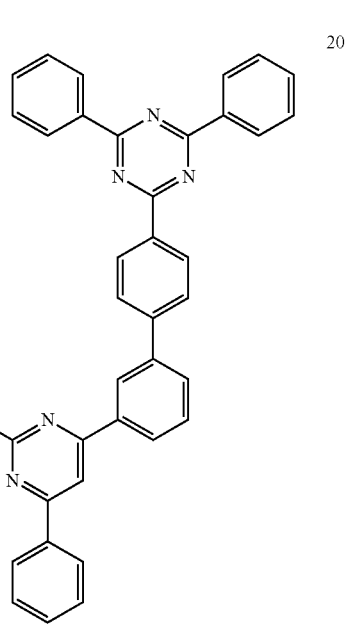

-continued
21
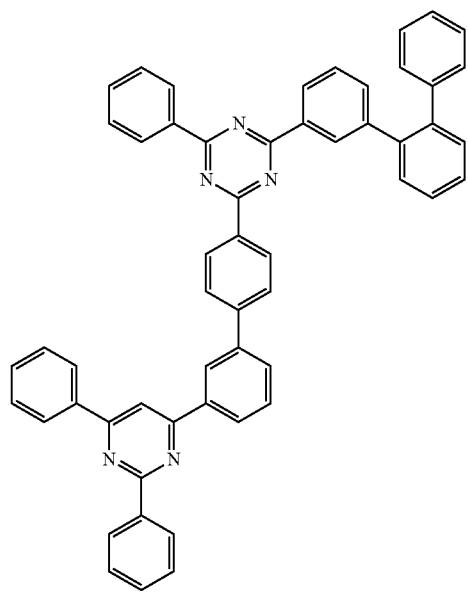
22
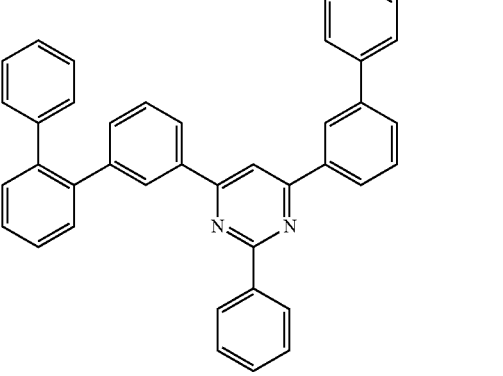
23
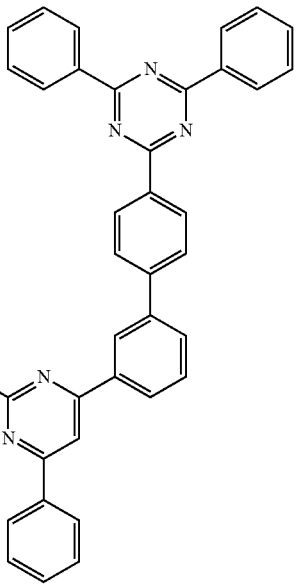
24
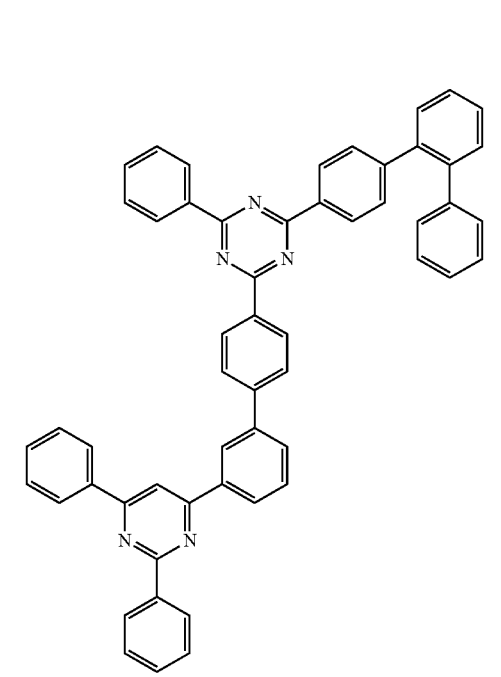

193
-continued
194
-continued
25
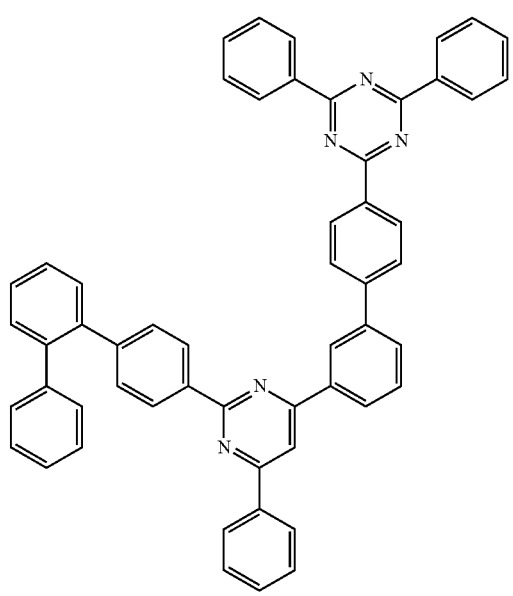
27
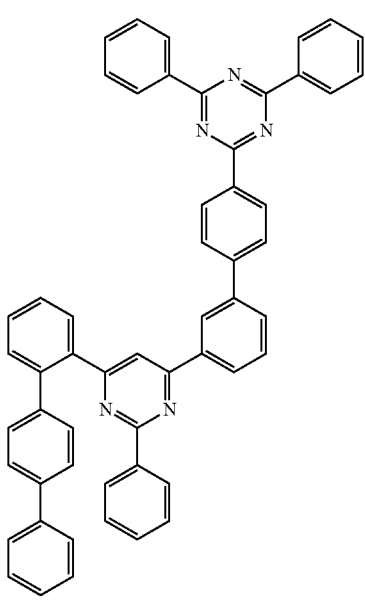
26
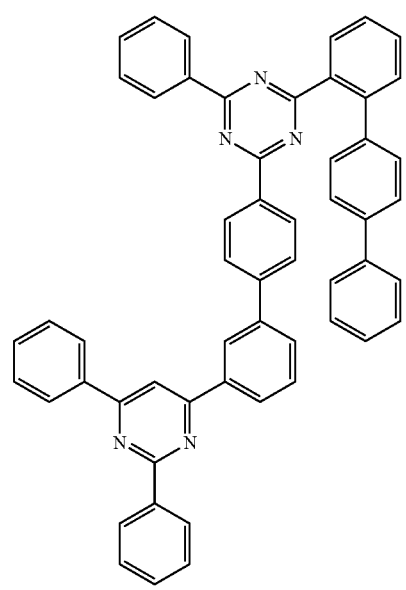
28

29
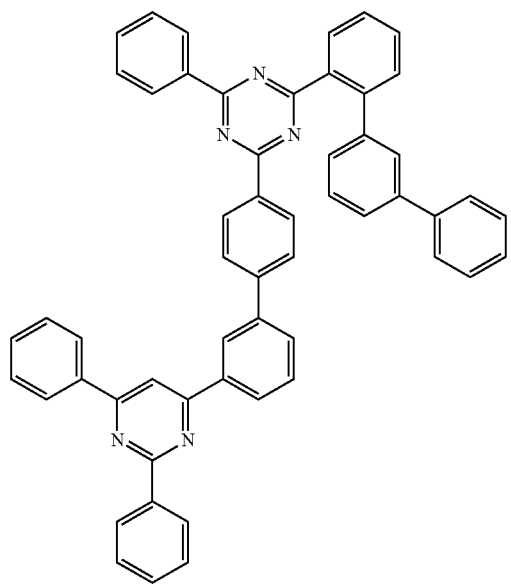
30
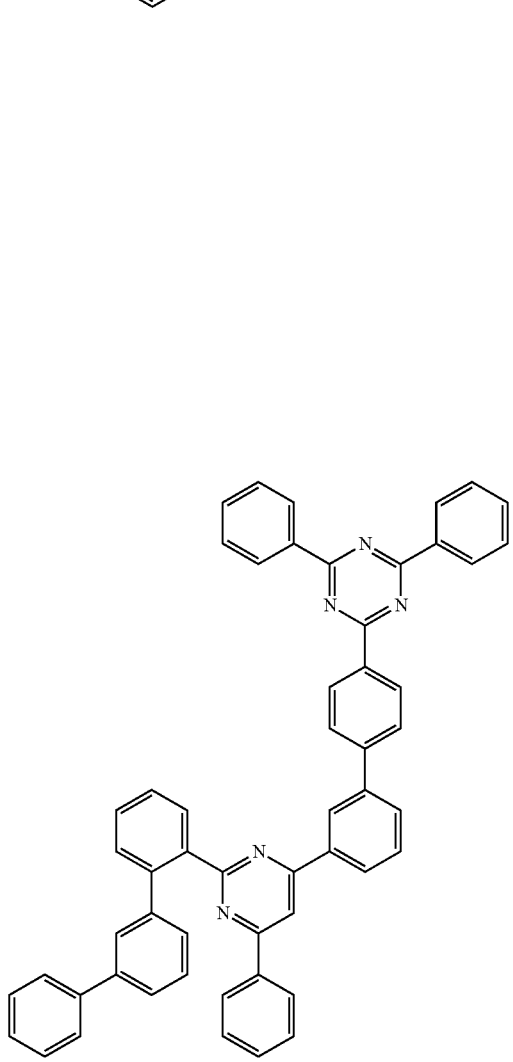
31
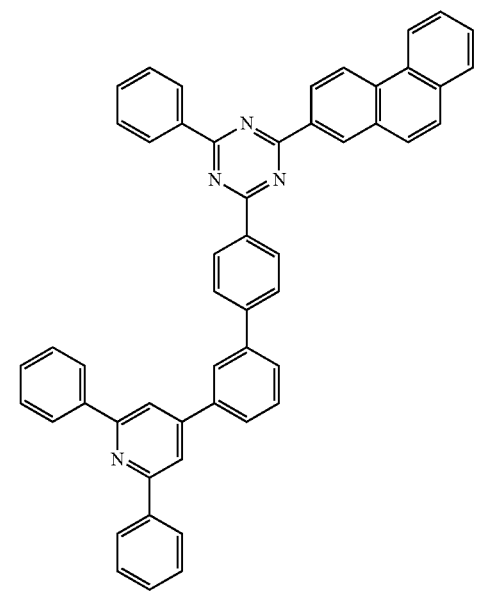
32
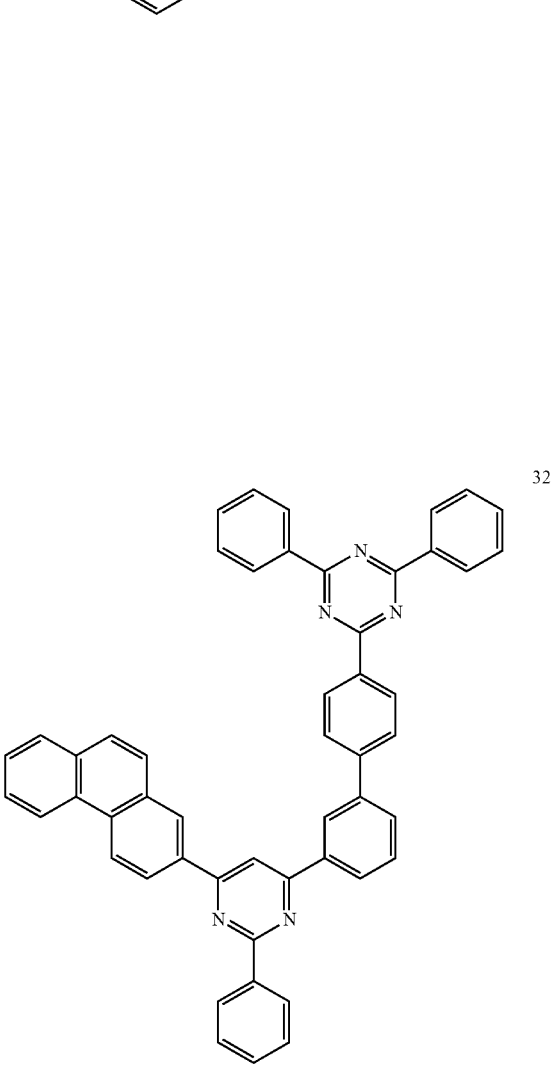

33
197
-continued
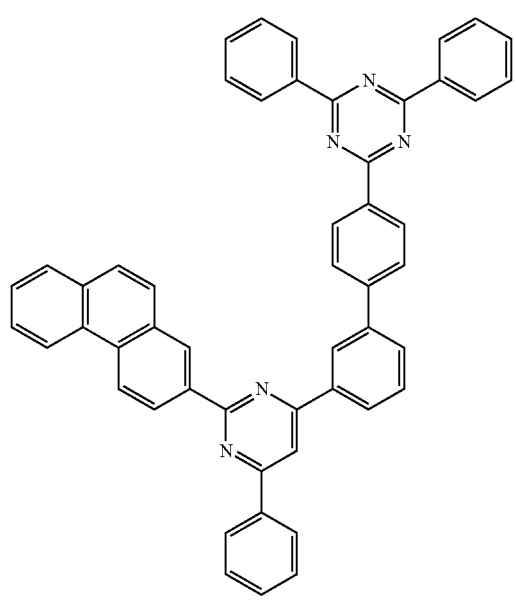
34
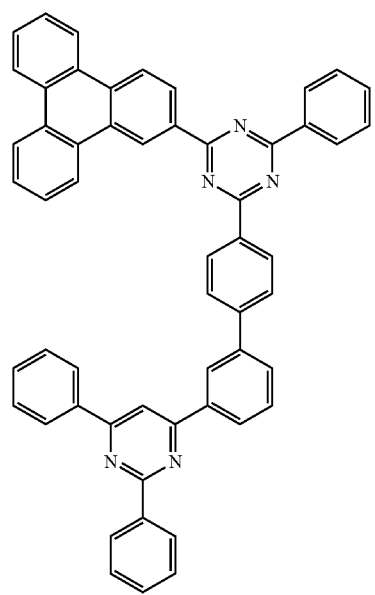
35
198
-continued
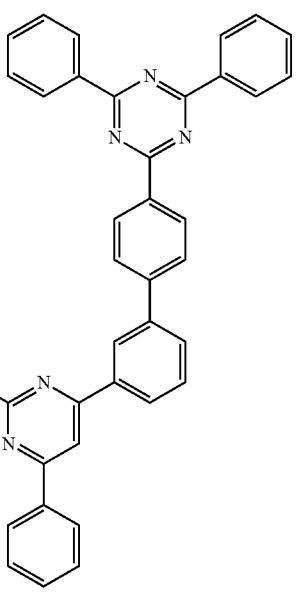
36
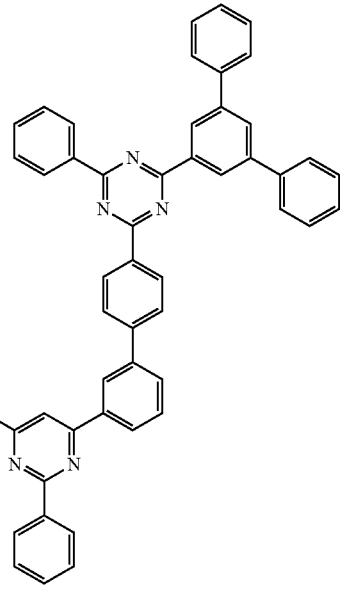

37
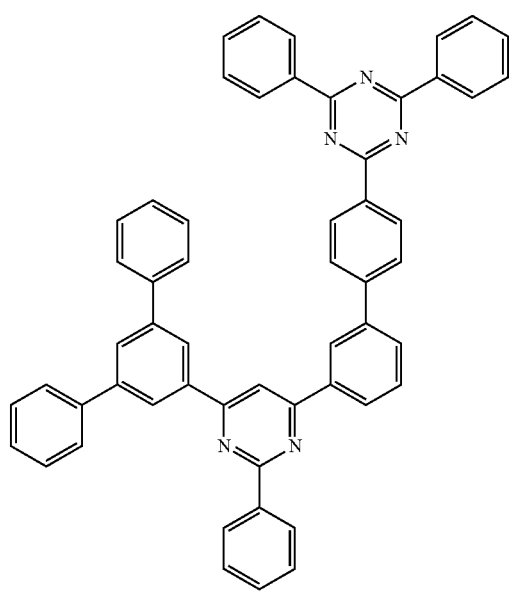
38
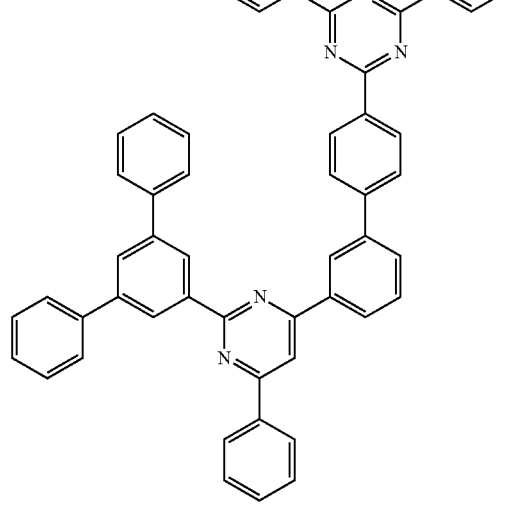
39
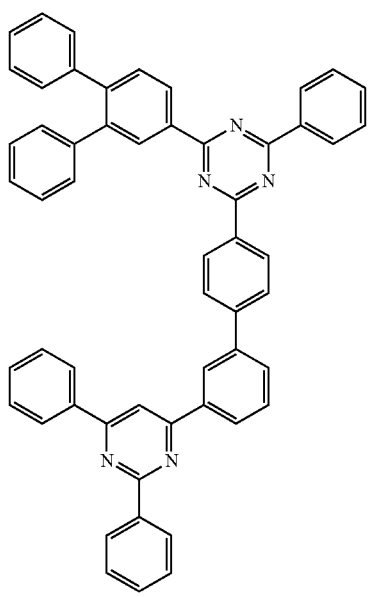
40
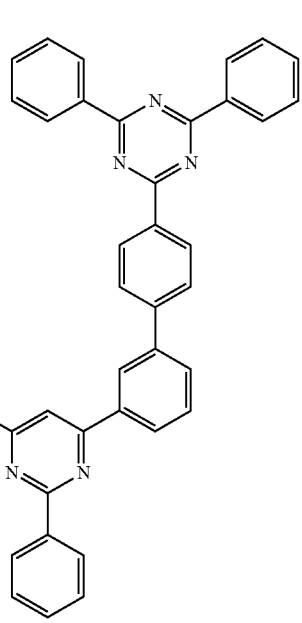

201
-continued
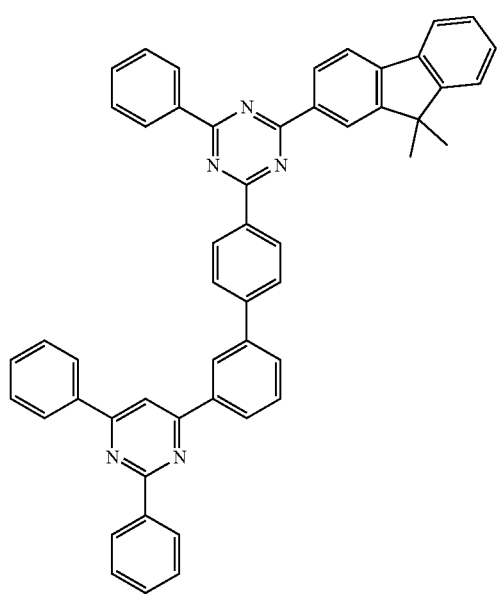
41
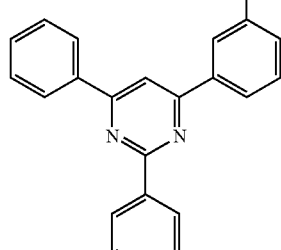
202
-continued
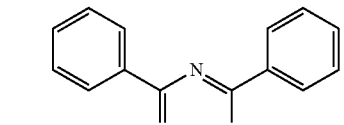
43
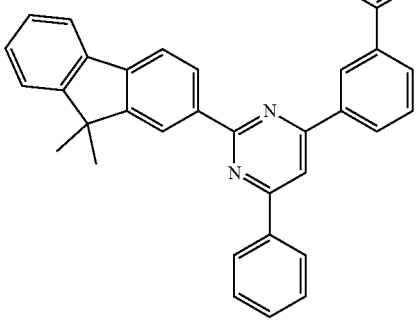
42
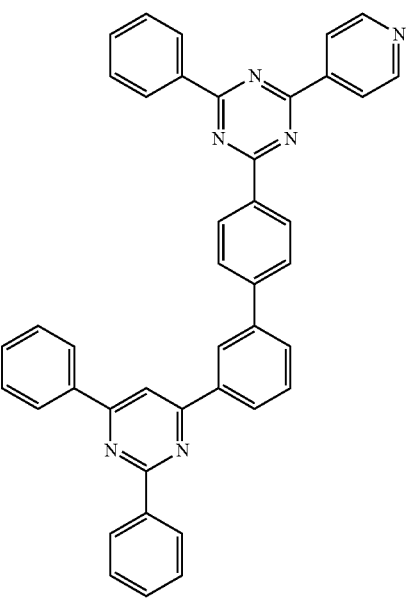
44

203
-continued
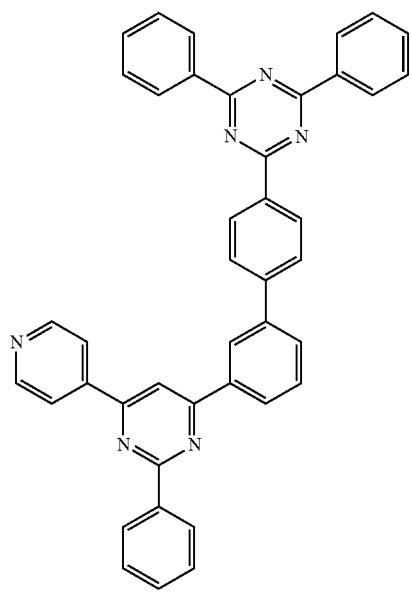
45
204
-continued
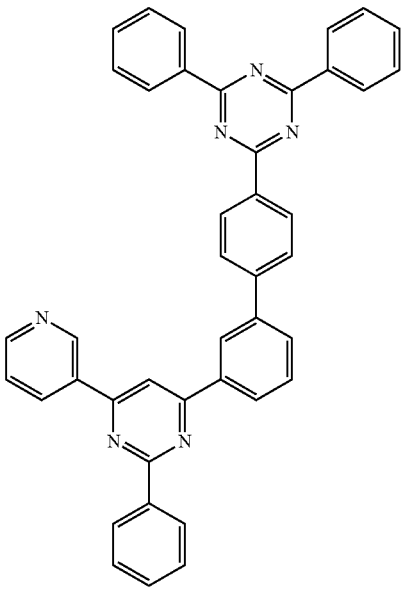
47
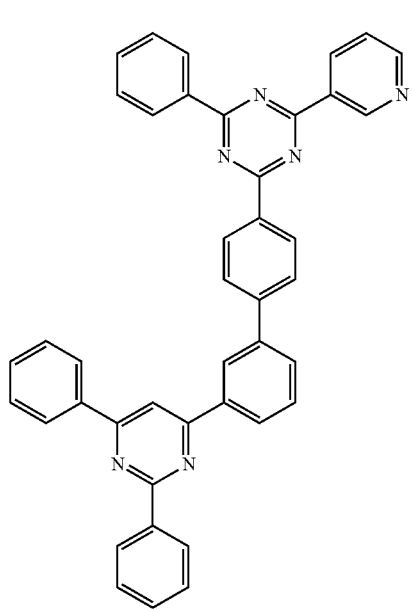
46
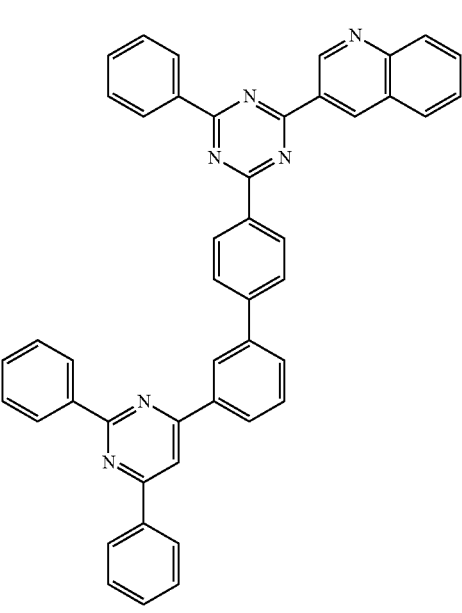
48

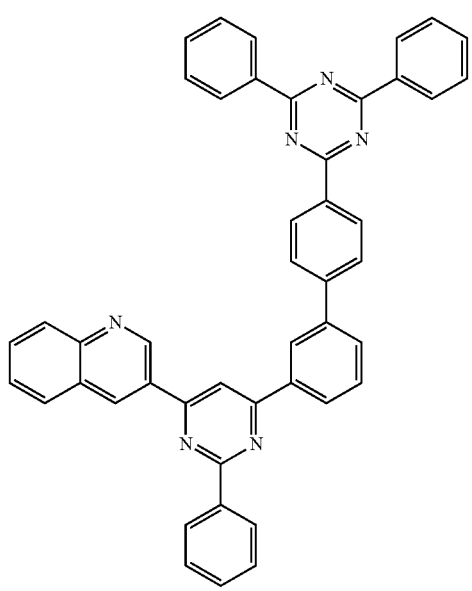
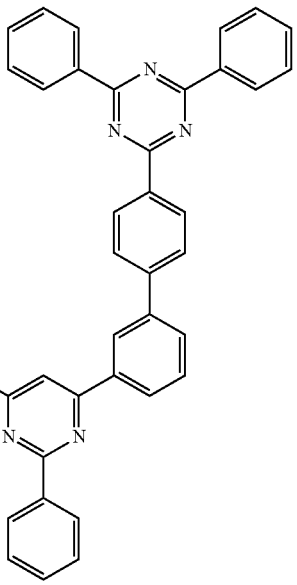

207
-continued
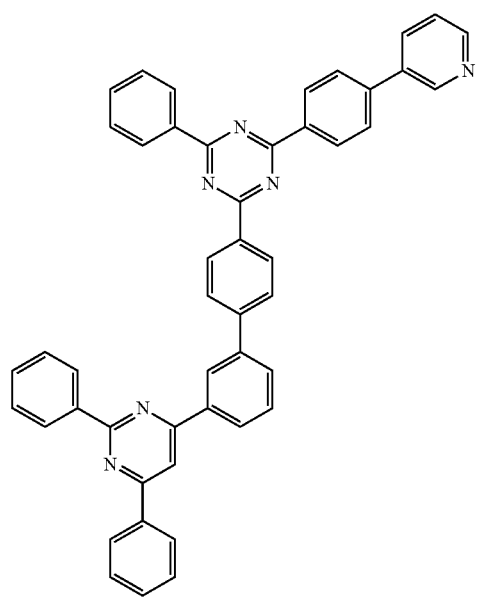
53
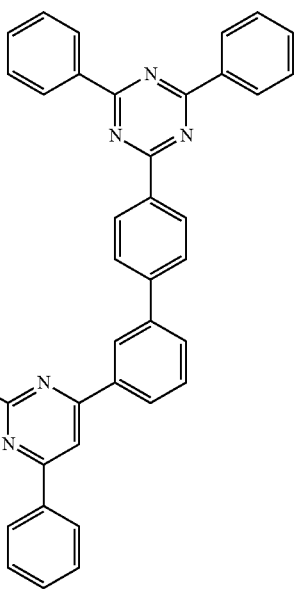
55
54
56

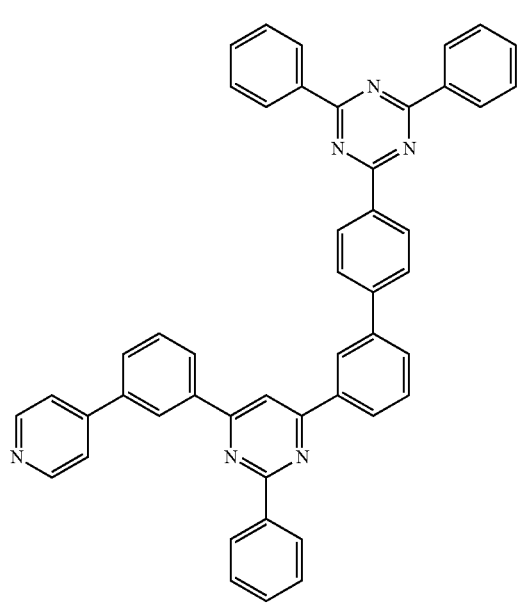
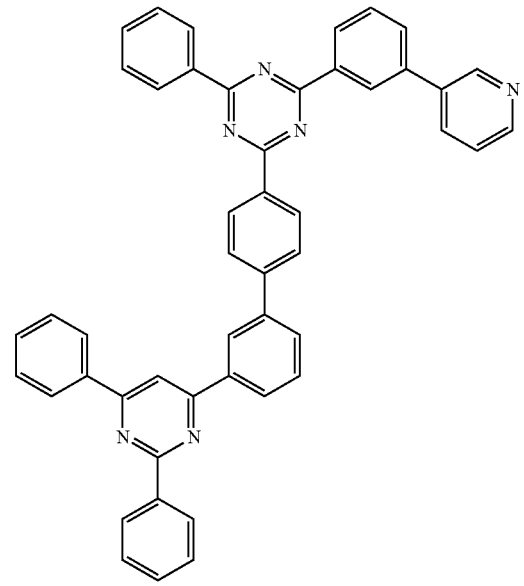

211
-continued
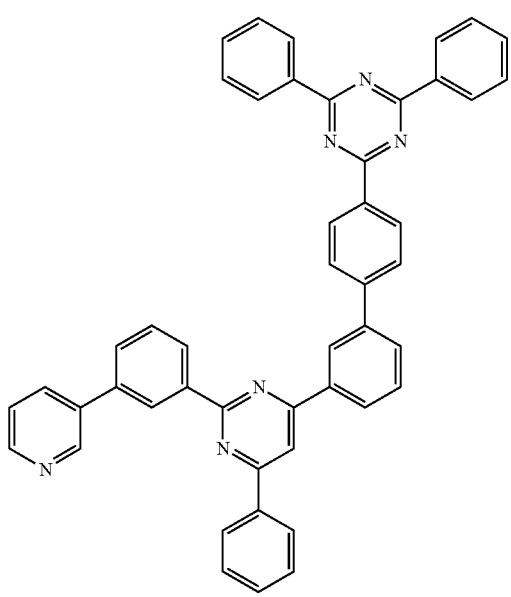
61
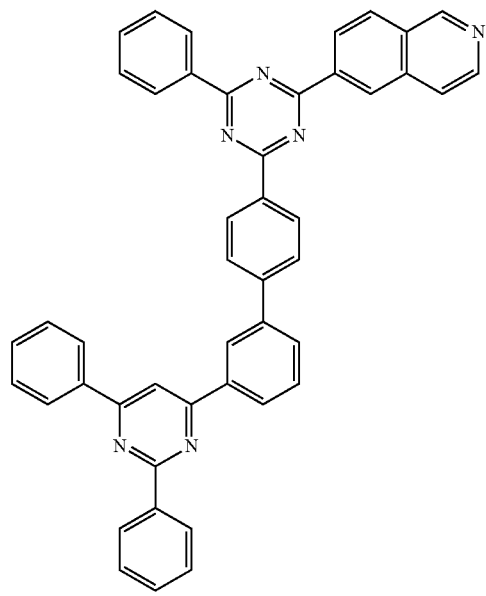
62
212
-continued
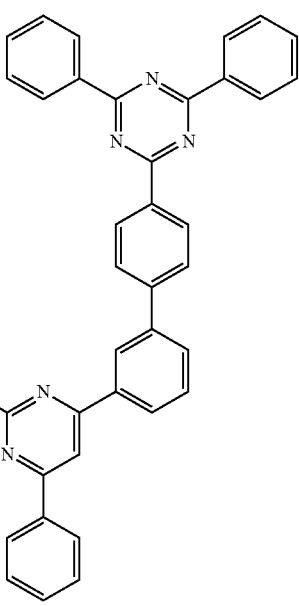
63
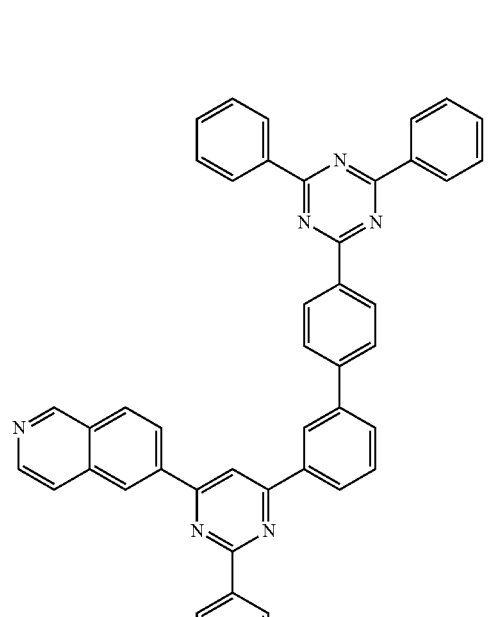
64

213
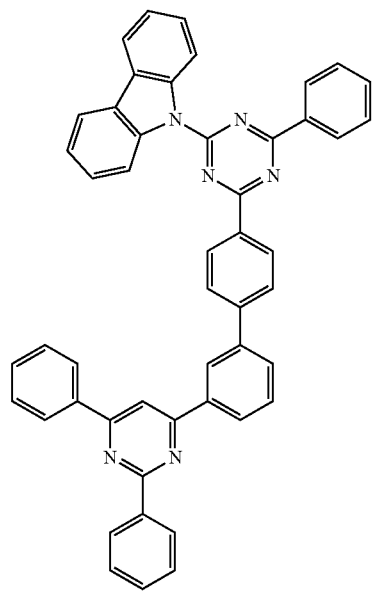
214
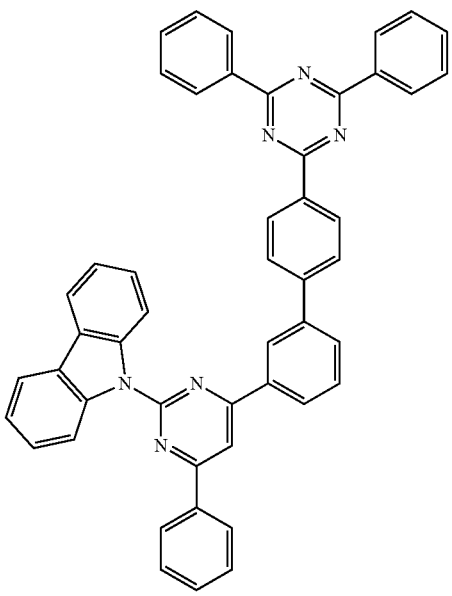
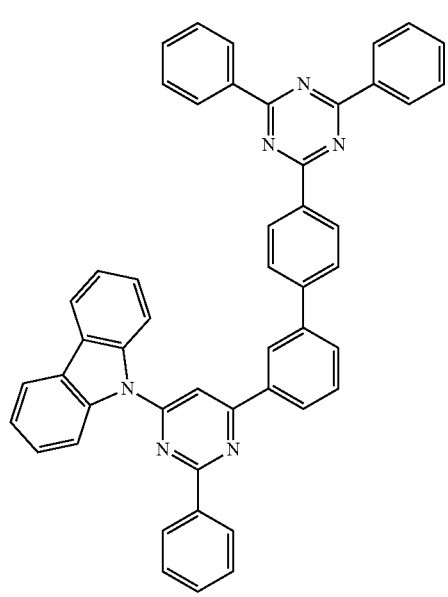
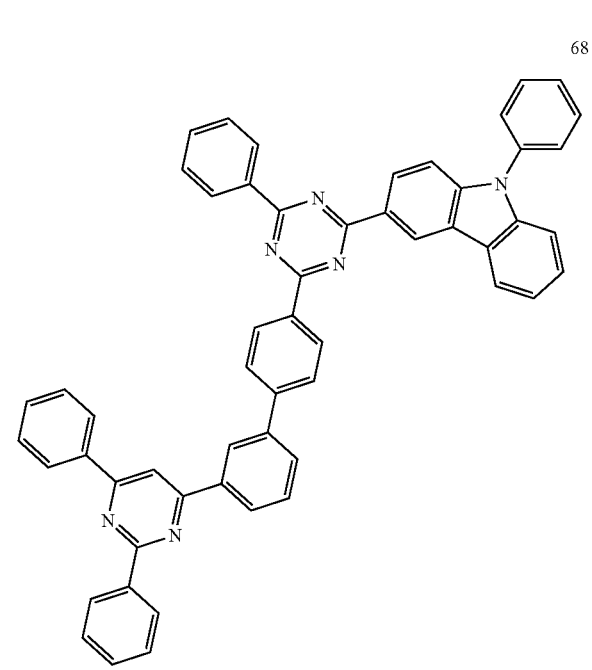

215
-continued
69
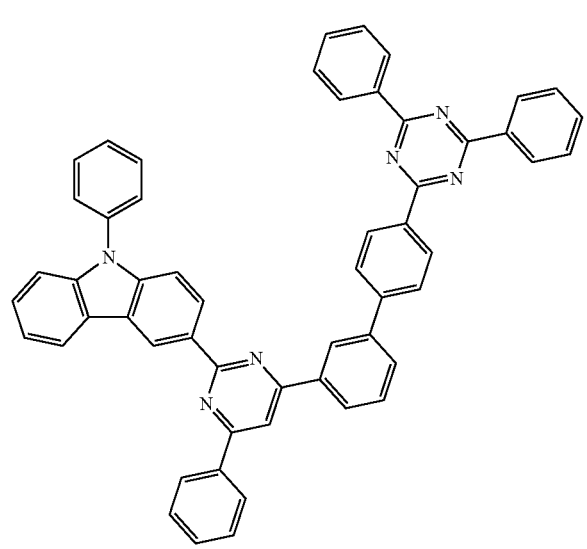
70
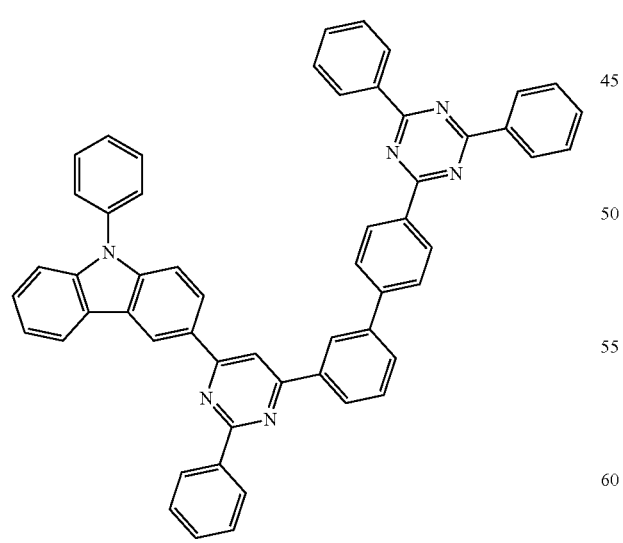
216
-continued
71
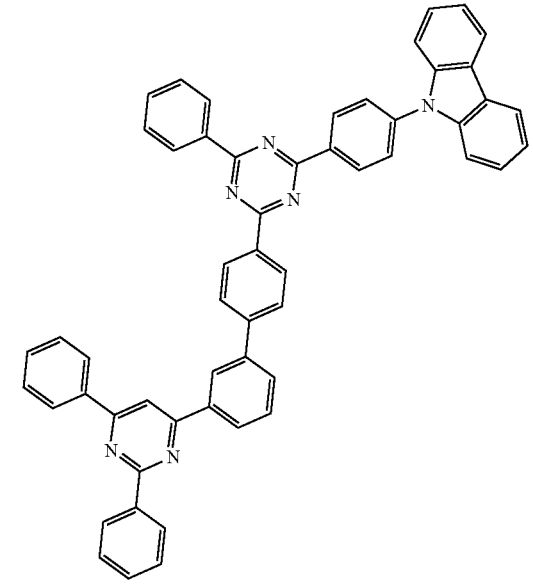
72

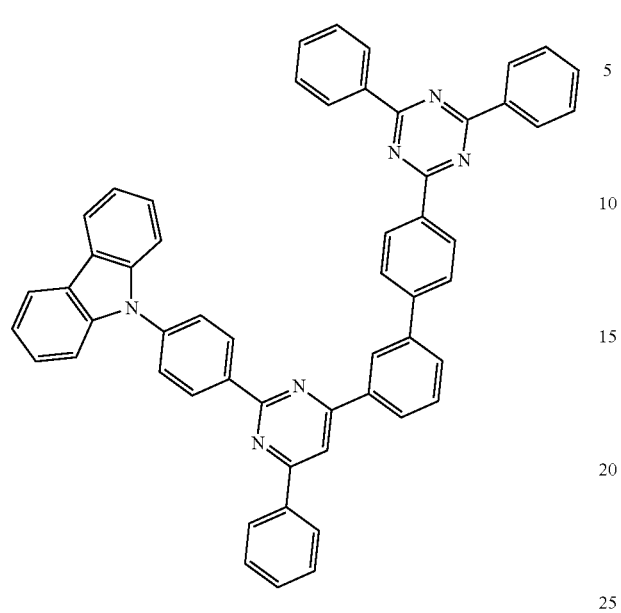
73
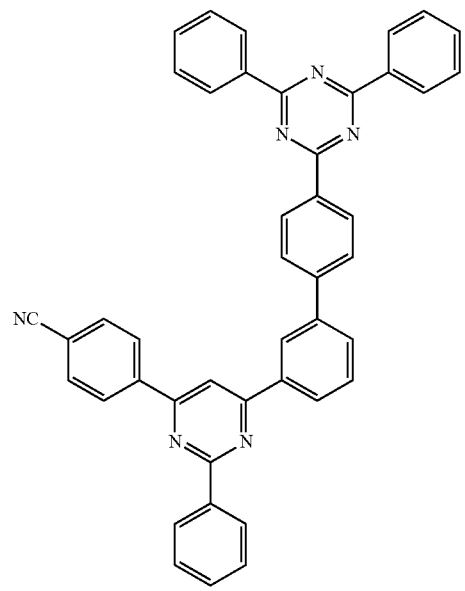
75
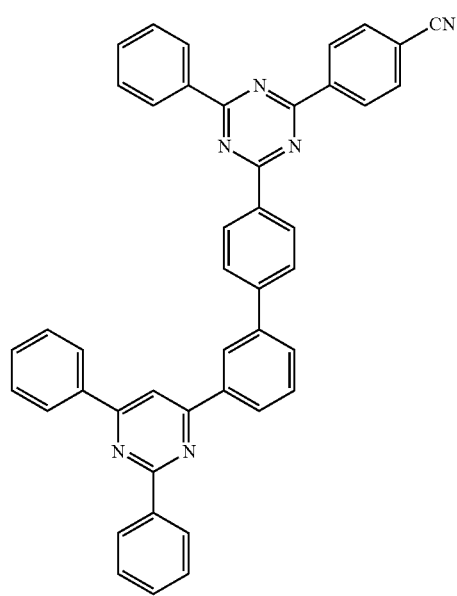
74
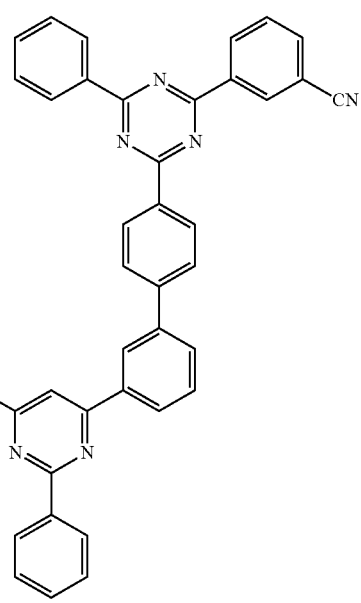
76

77
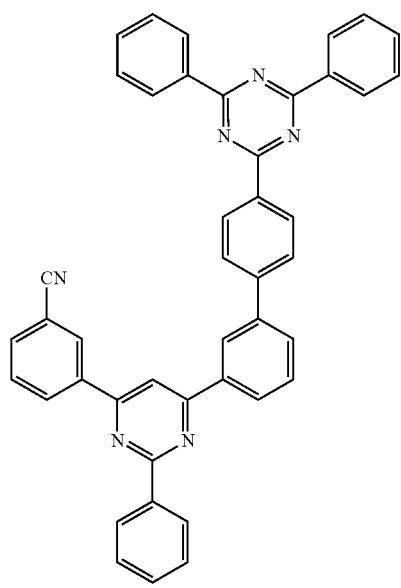
78
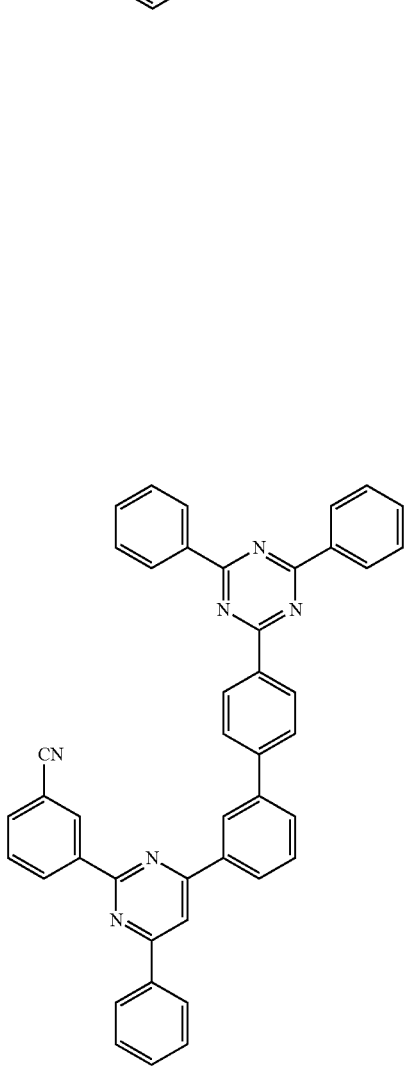
79
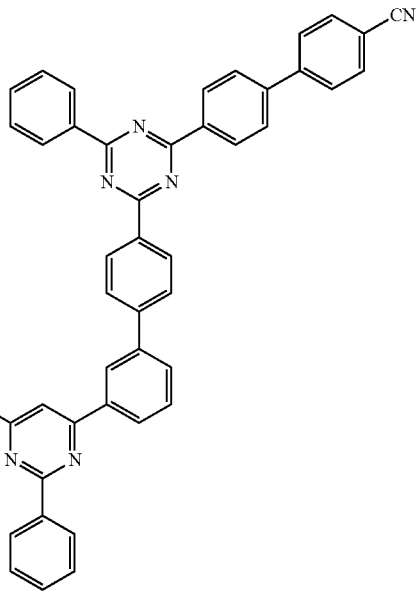
80
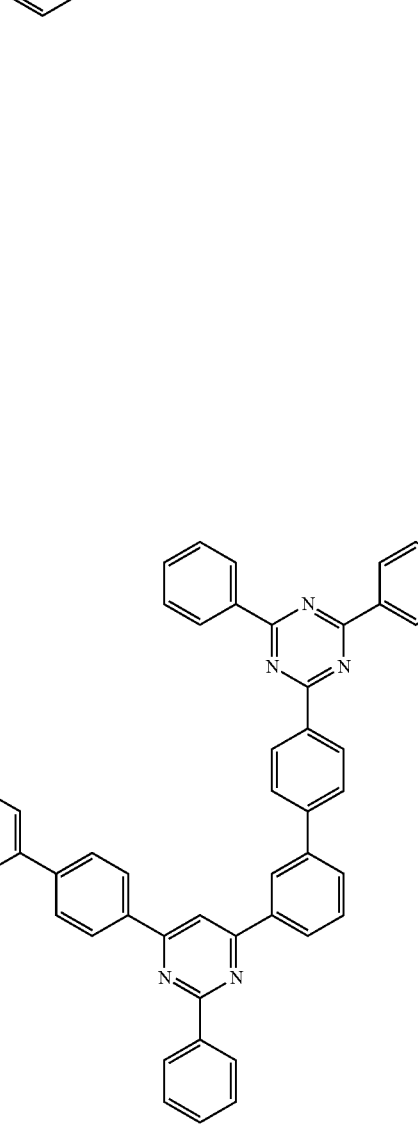

81
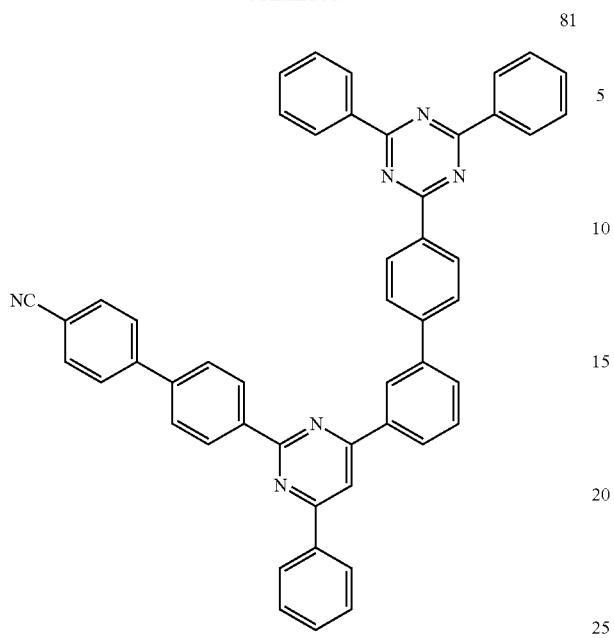
82
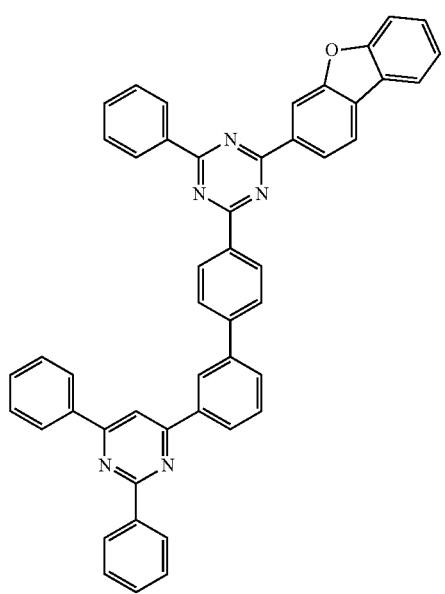
83
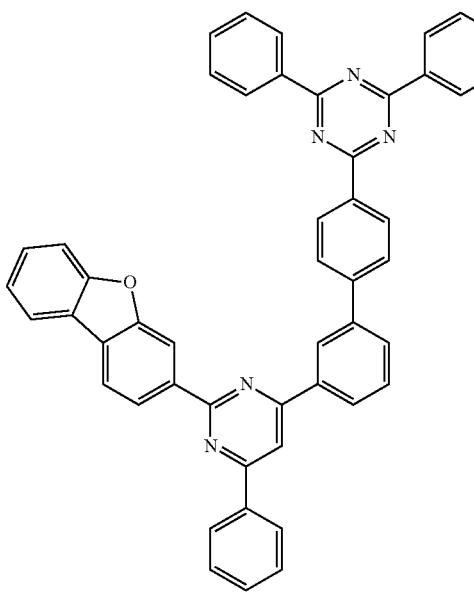
84
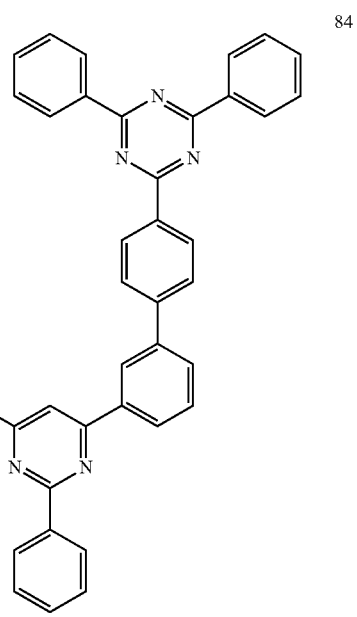

223
-continued
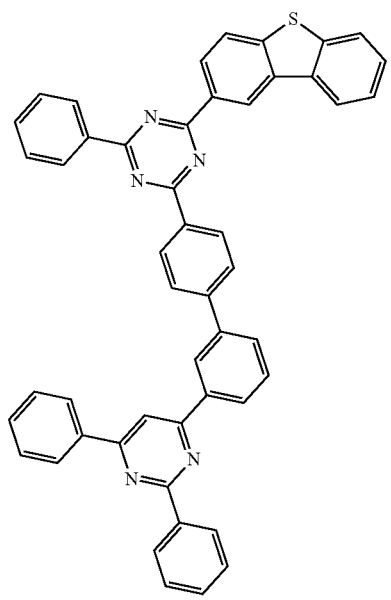
85
224
-continued
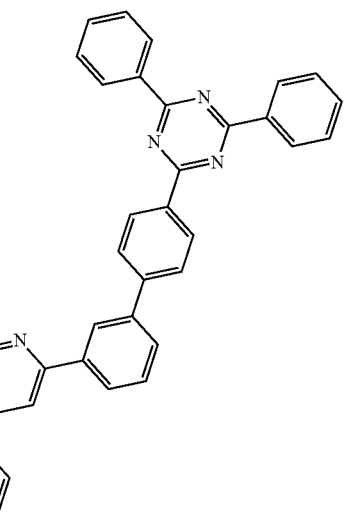
87
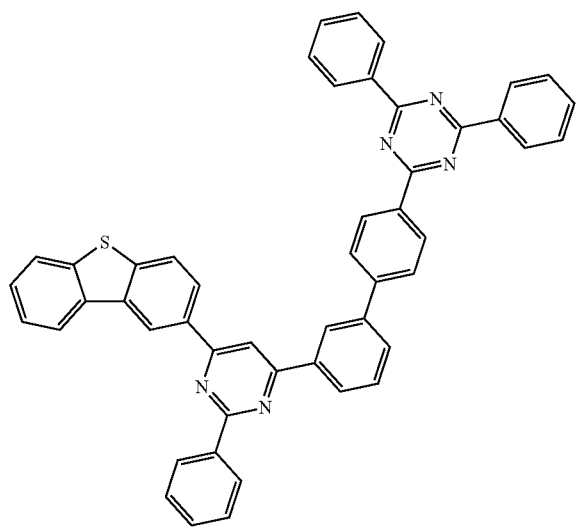
86
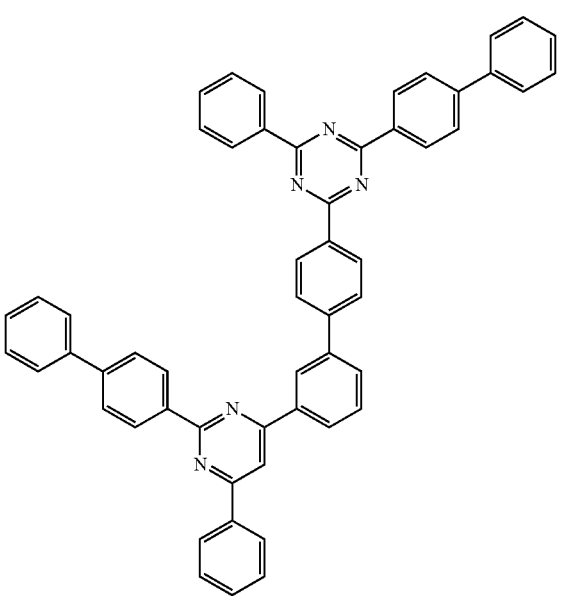
88

89
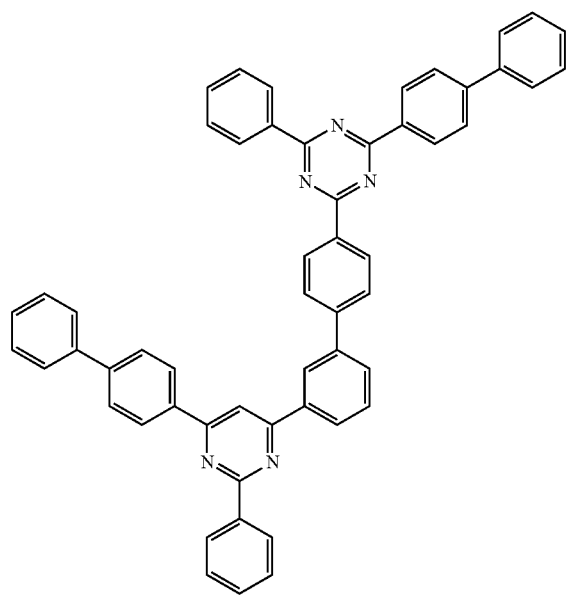
90
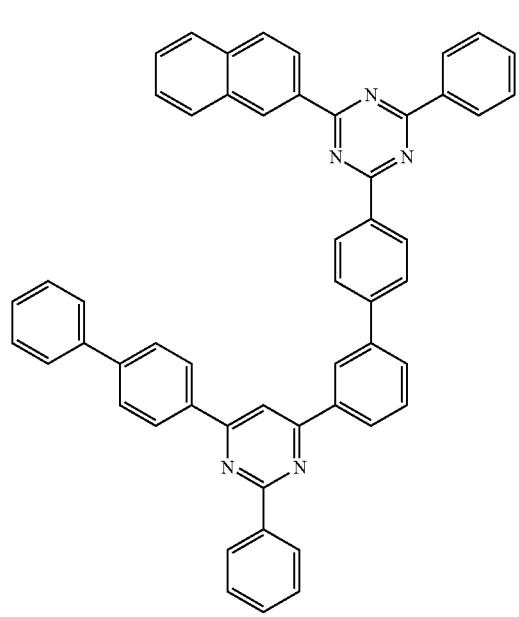
91
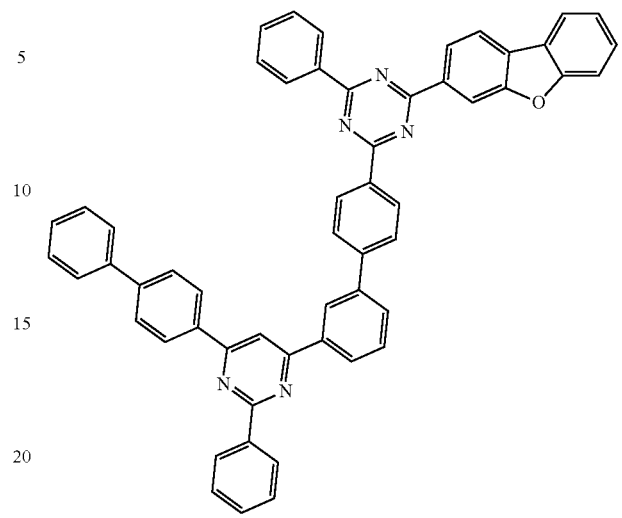
92
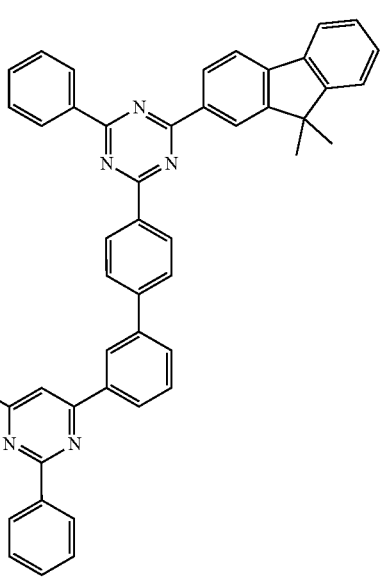

227
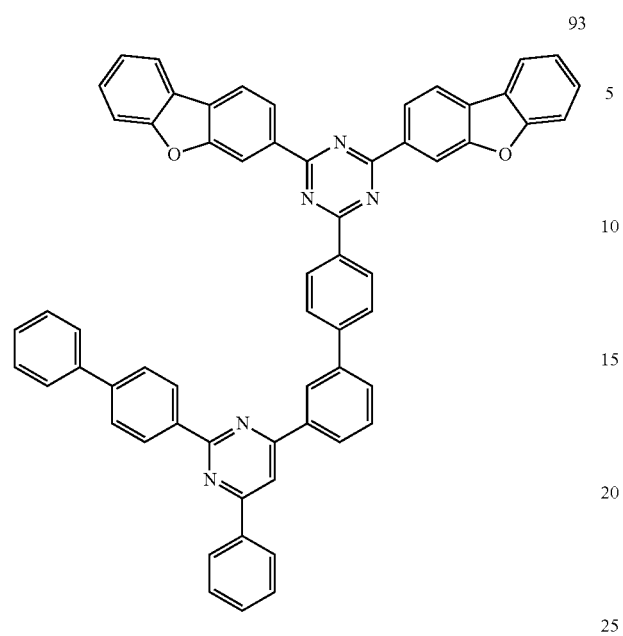
228
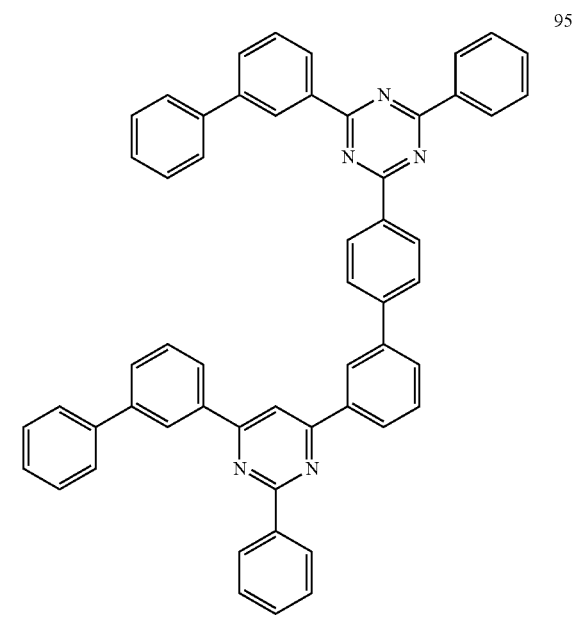
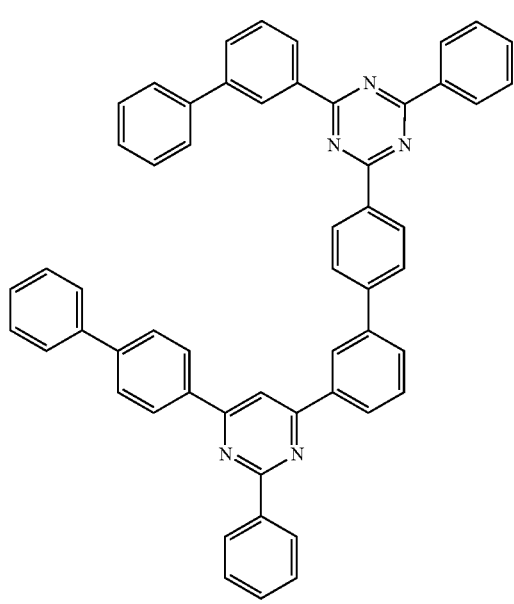
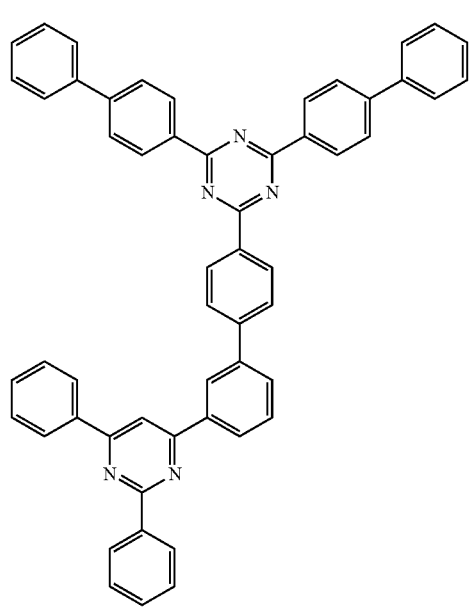

229
-continued
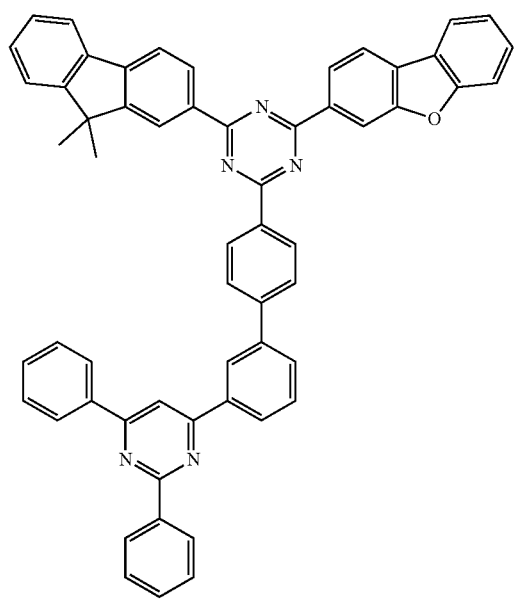
97
230
-continued
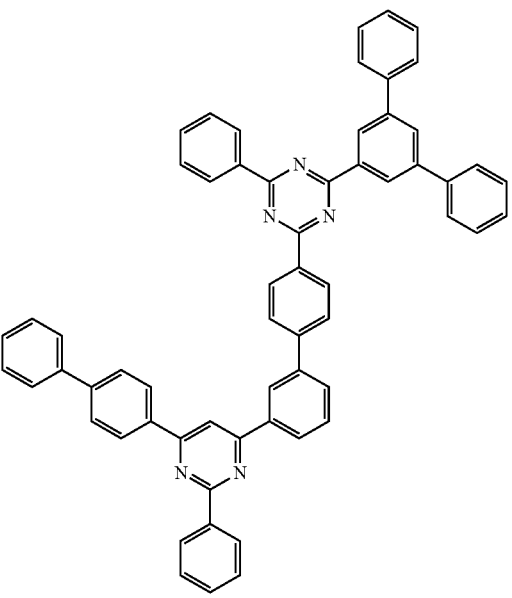
99
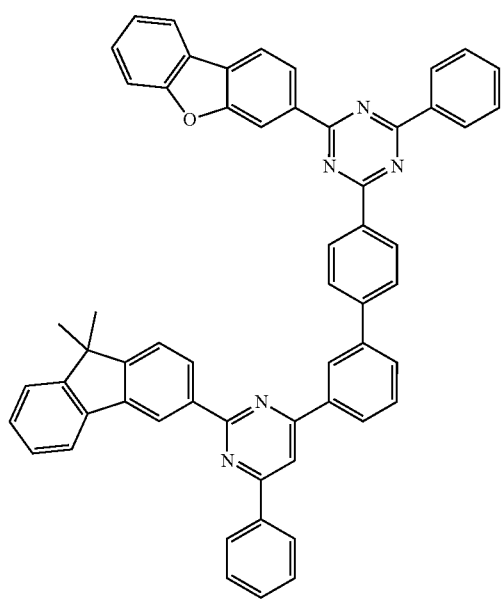
98
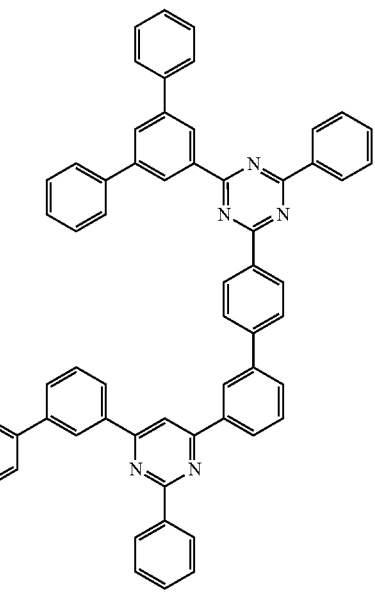
100

231
-continued
232
-continued
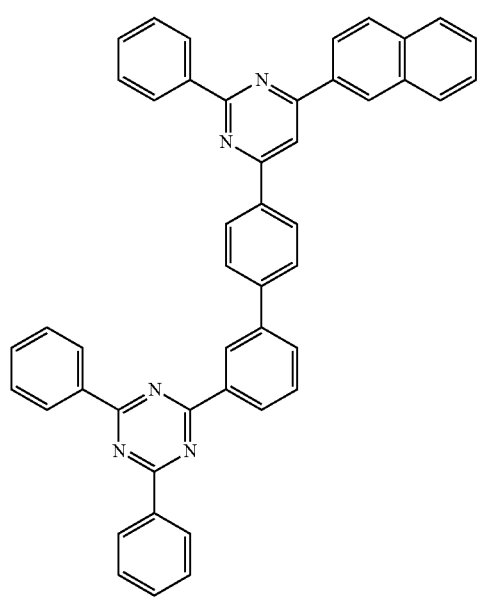
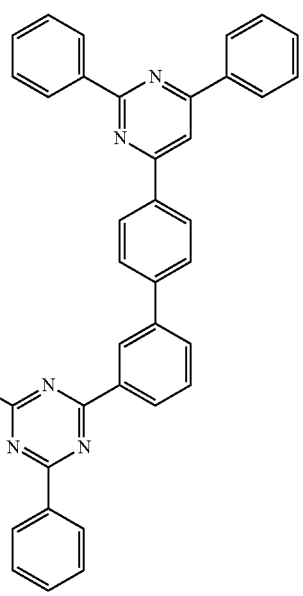
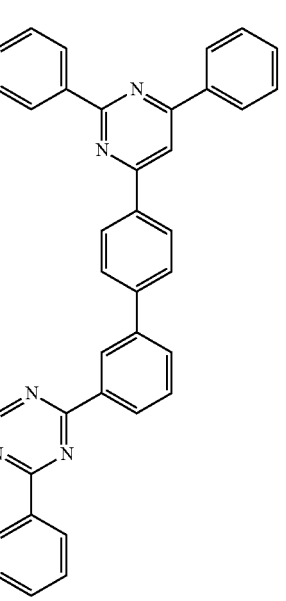

233
-continued
105
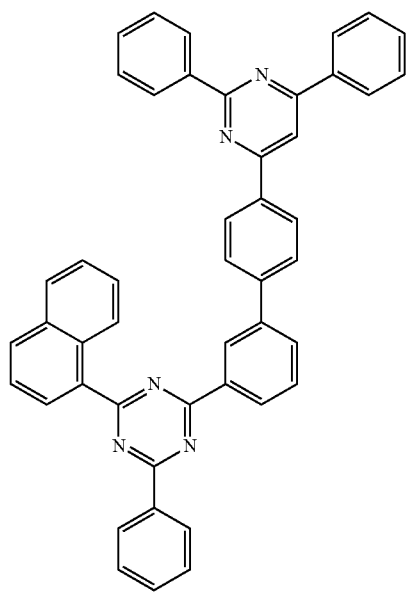
234
-continued
107
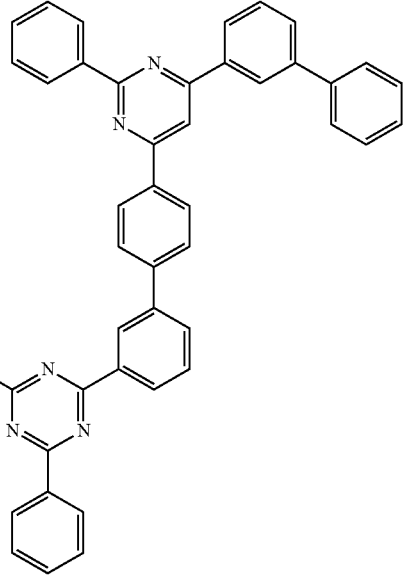
106
108

235
-continued
109
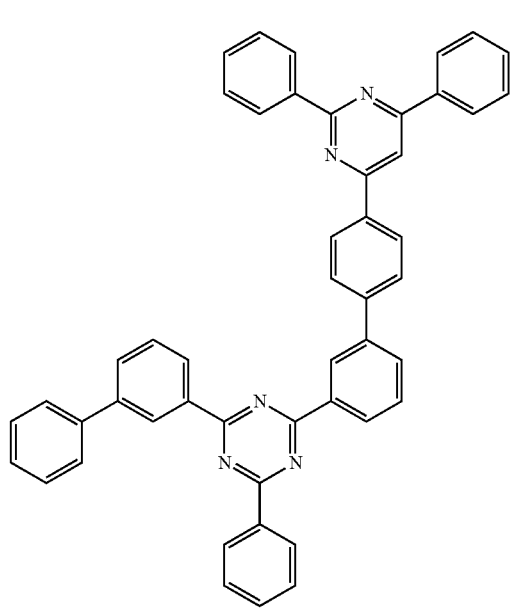
111
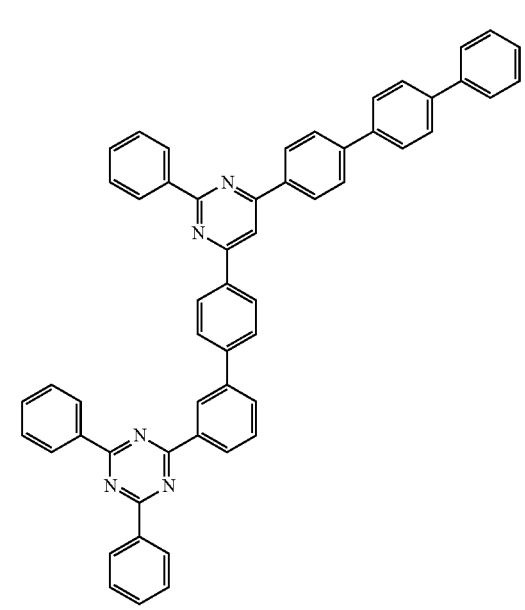
110
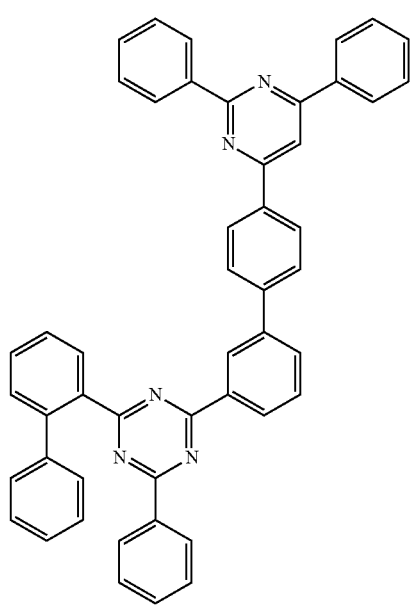
236
-continued
112

113
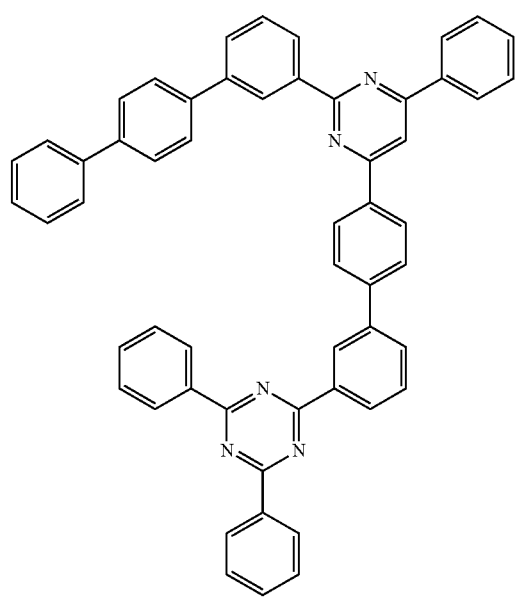
114
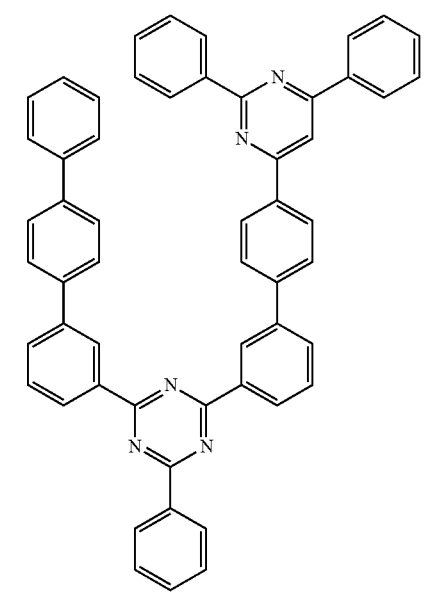
115
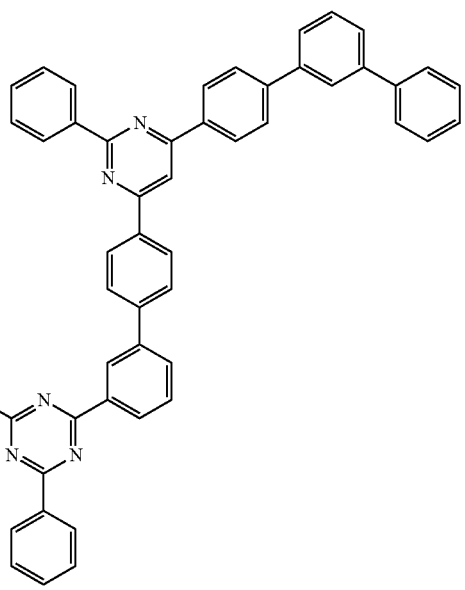
116
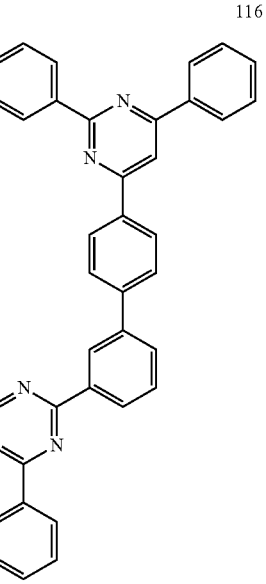

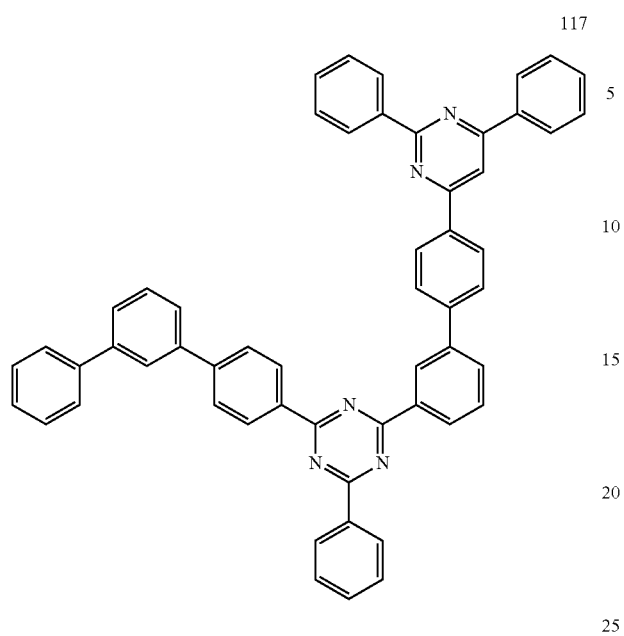
117
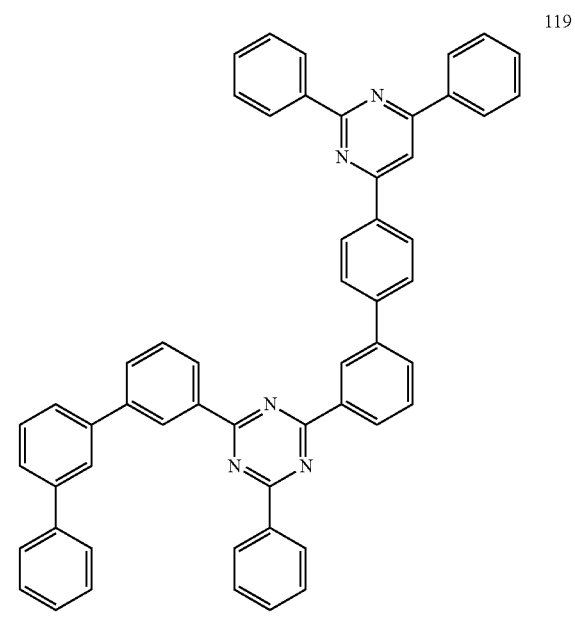
119
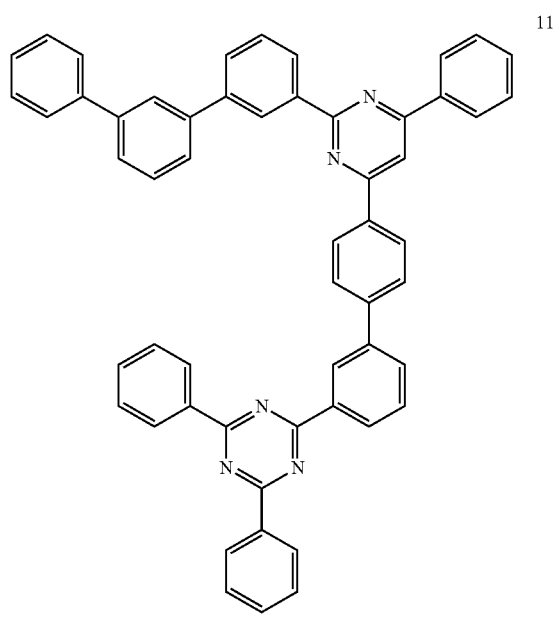
118
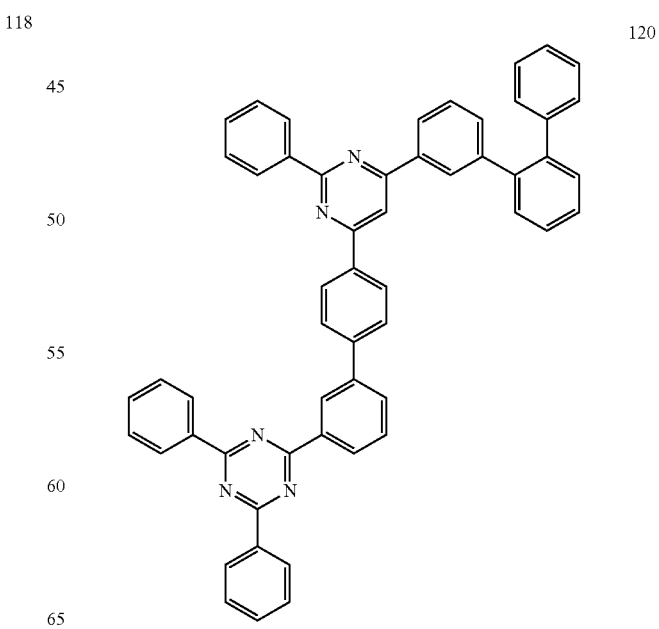
120

241
-continued
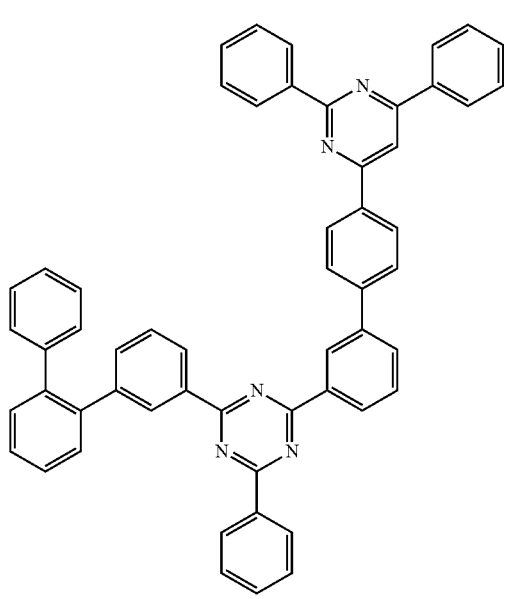
121
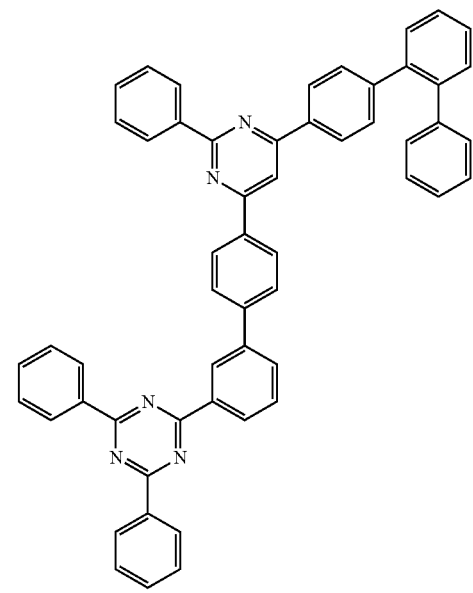
122
242
-continued
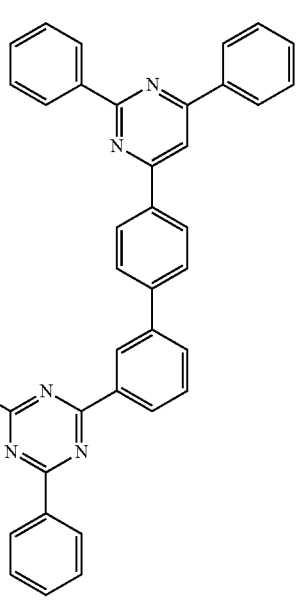
123
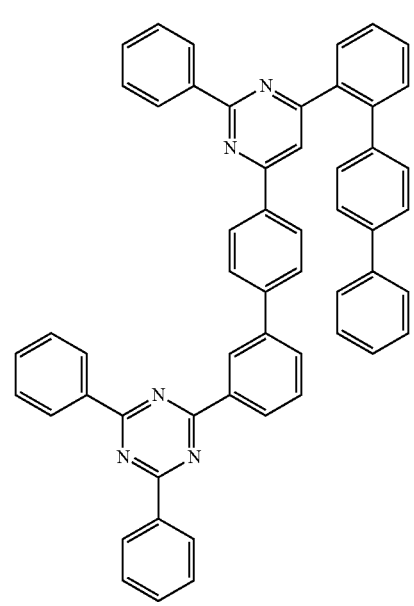
124

243
-continued
125
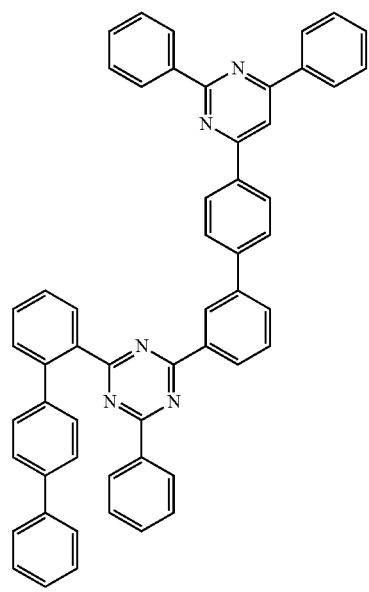
126
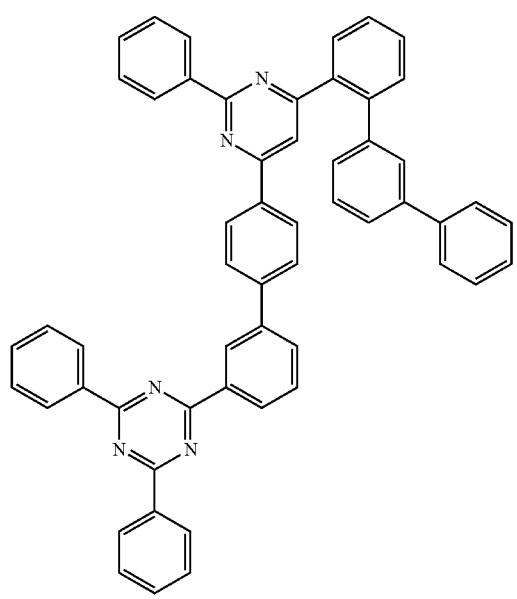
244
-continued
127
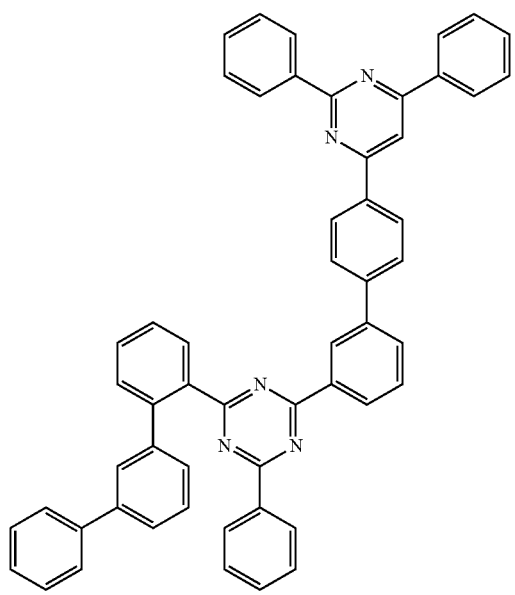
128
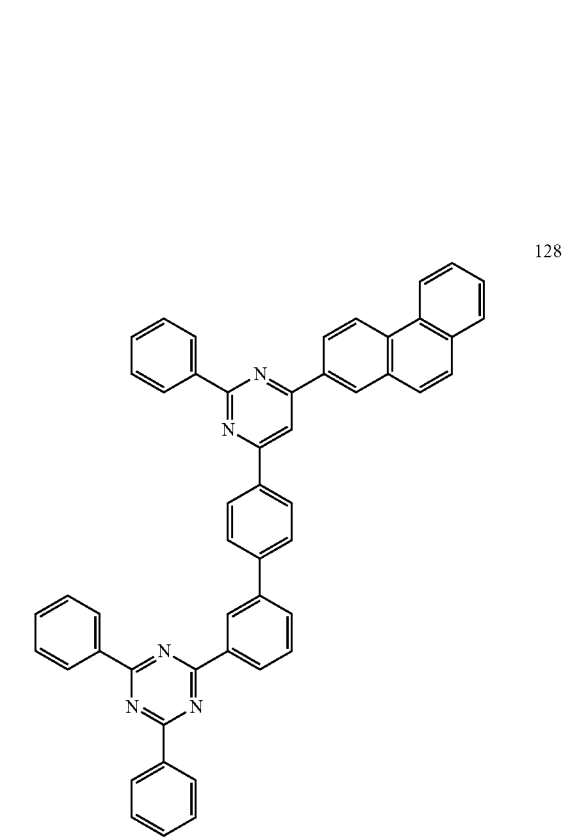

129
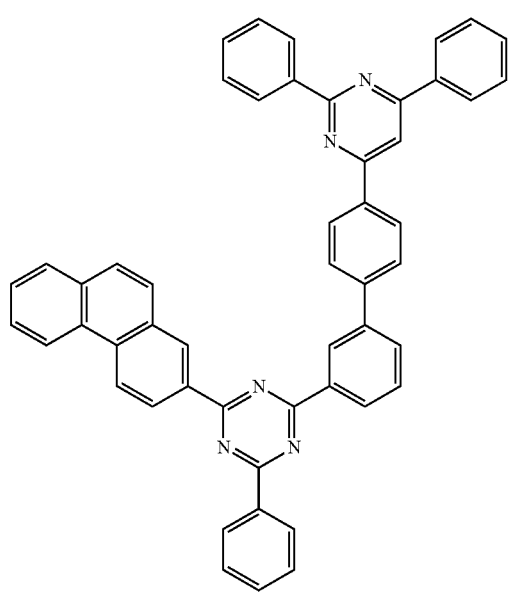
130
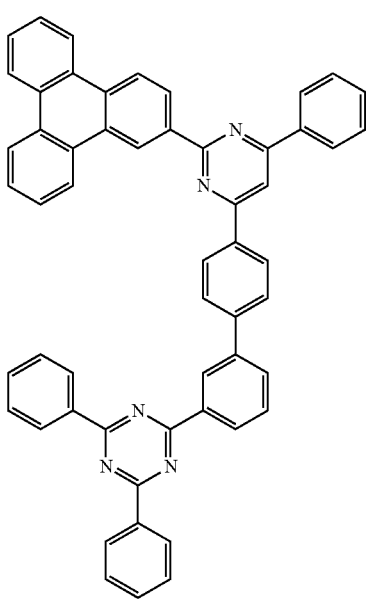
131
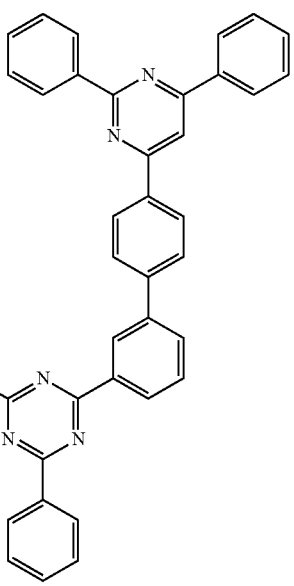
132
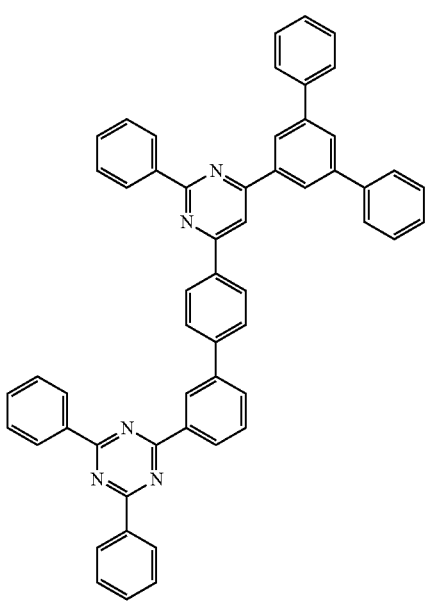

133
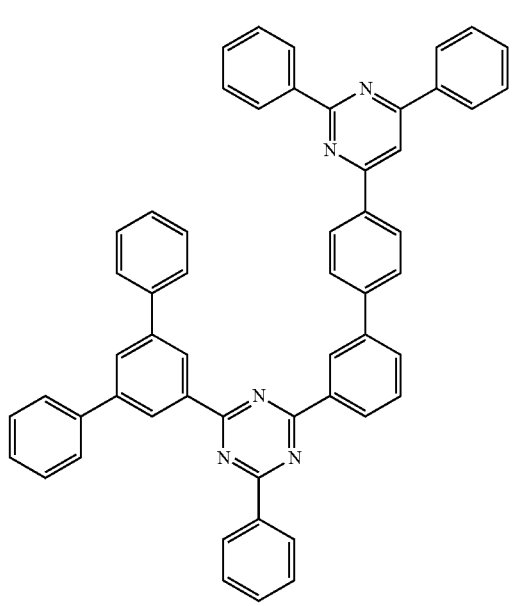
134
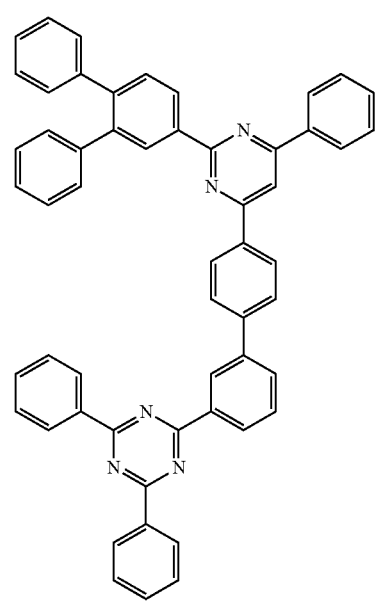
135
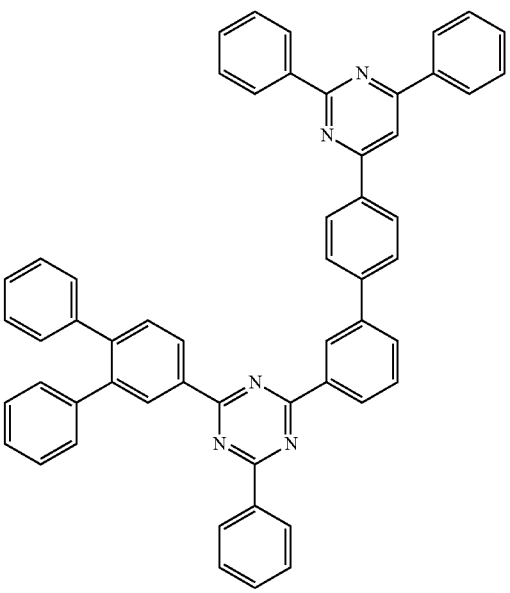
136
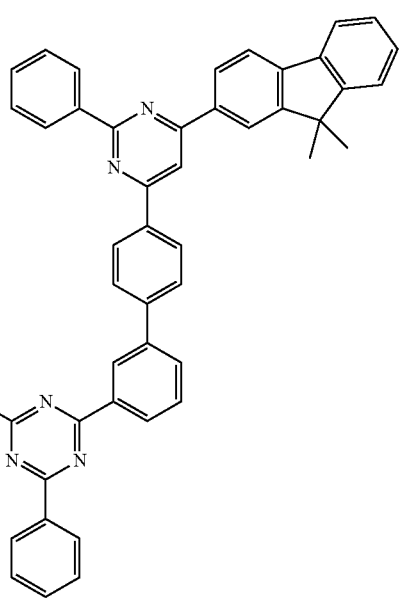

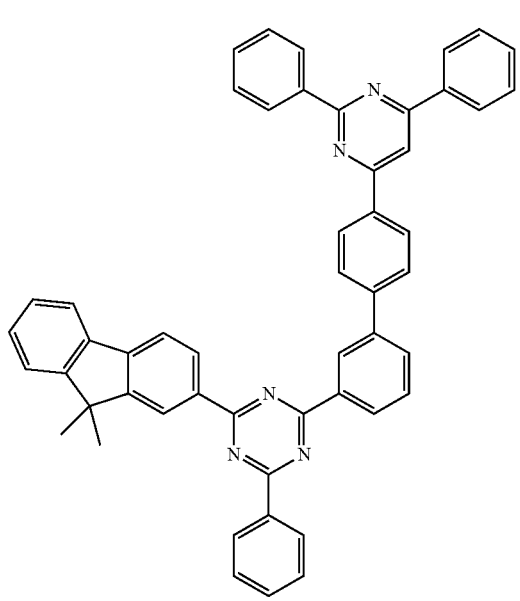
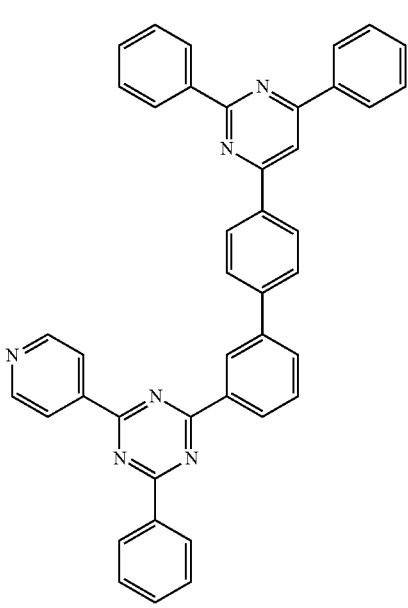

141
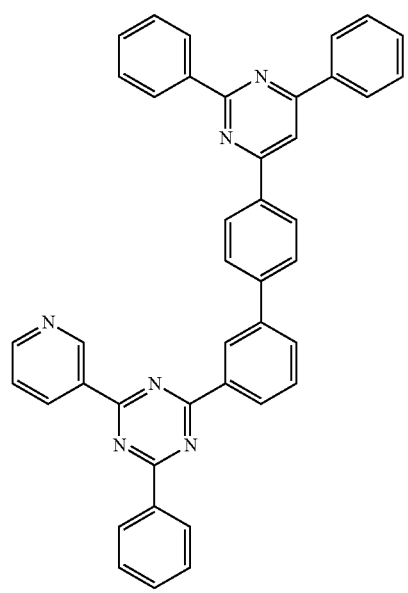
142
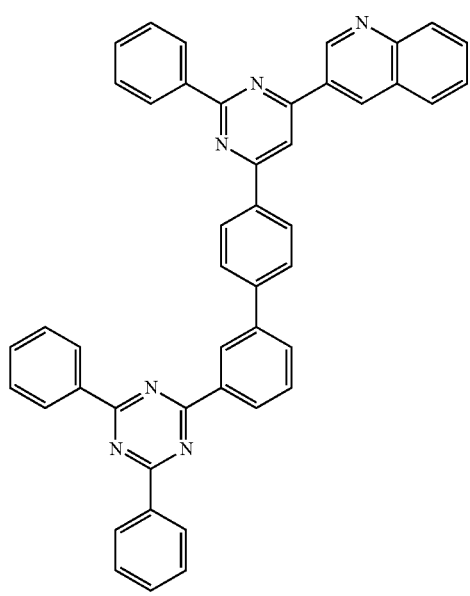
143
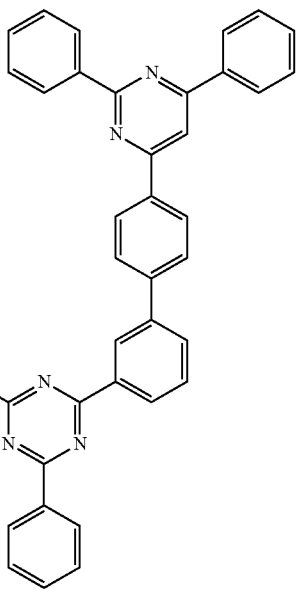
144
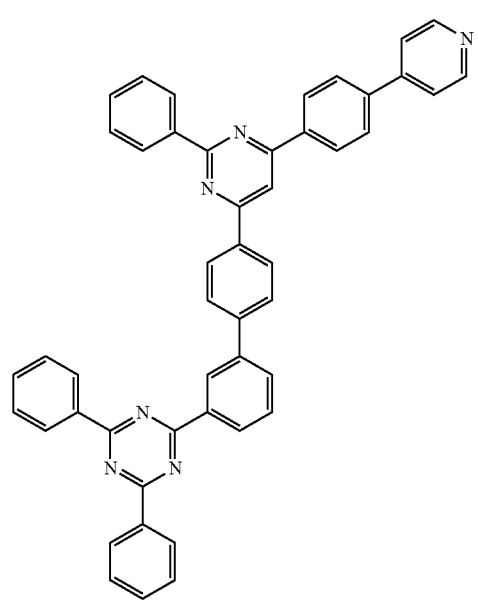

253
-continued
145
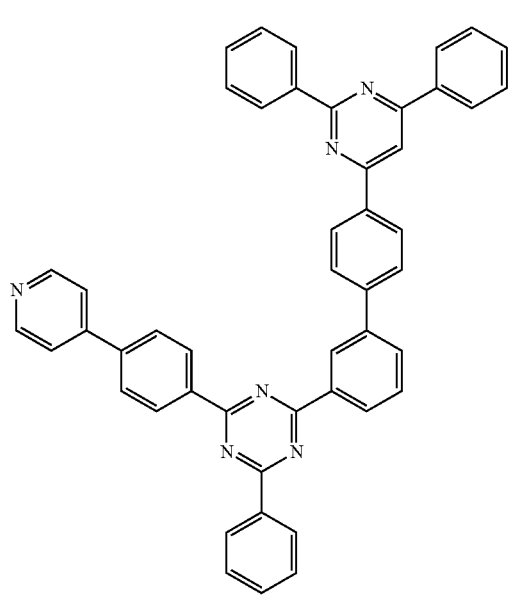
146
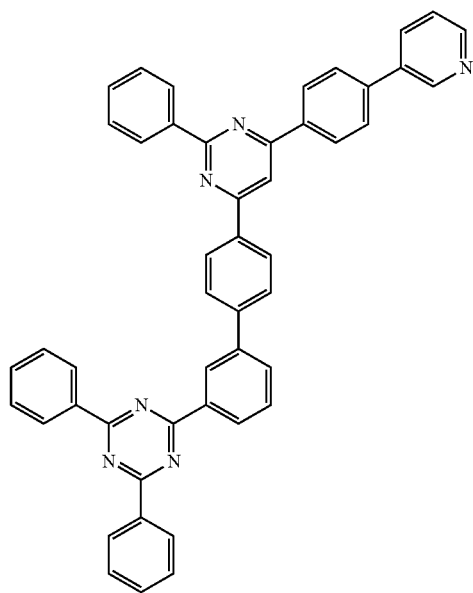
254
-continued
147
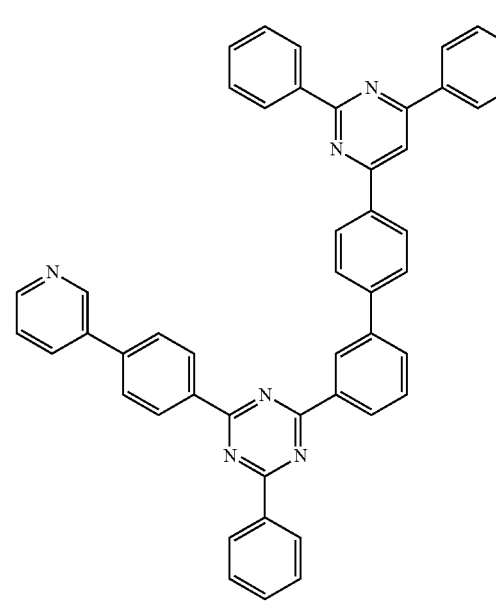
148
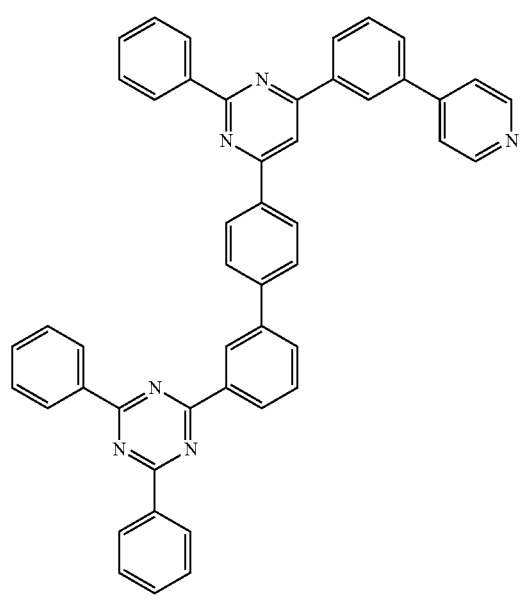

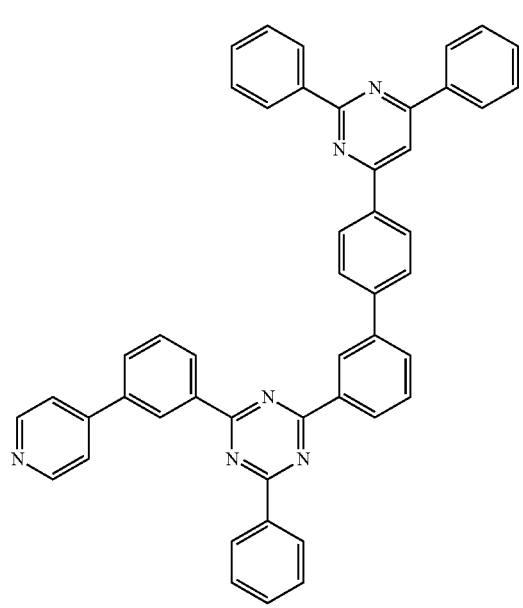
149
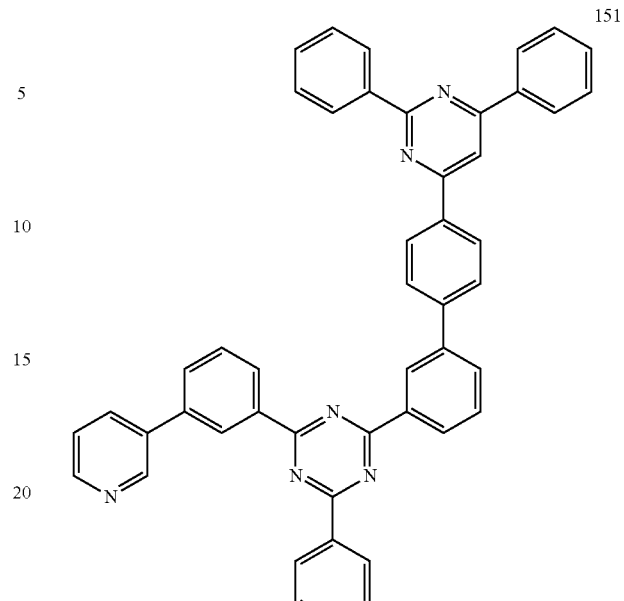
151
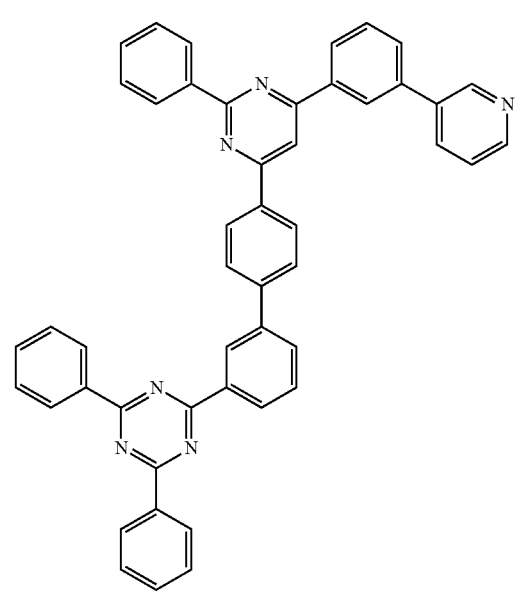
150
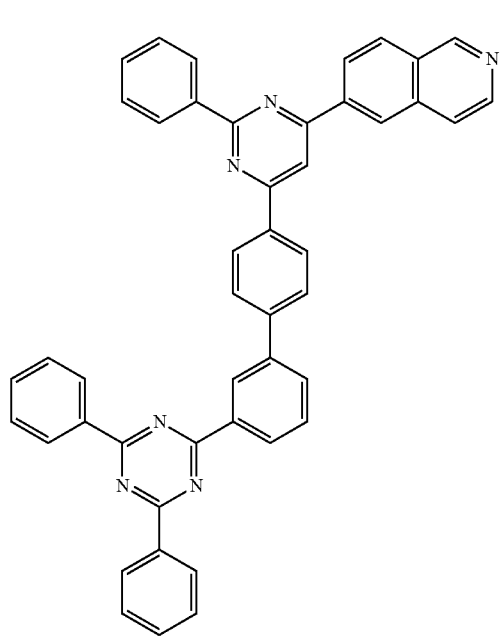
152

257
-continued
153
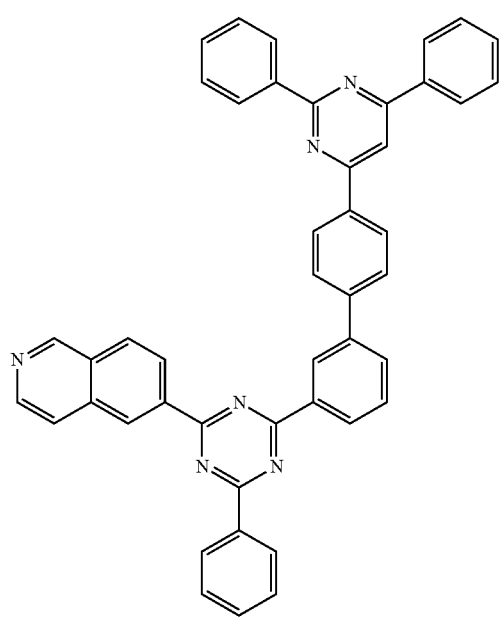
154
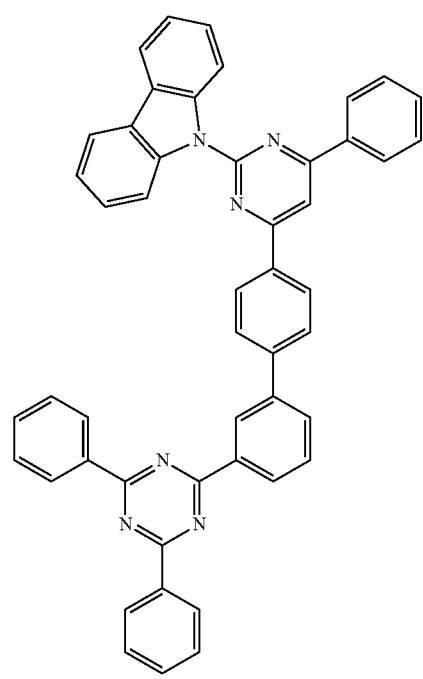
258
-continued
155
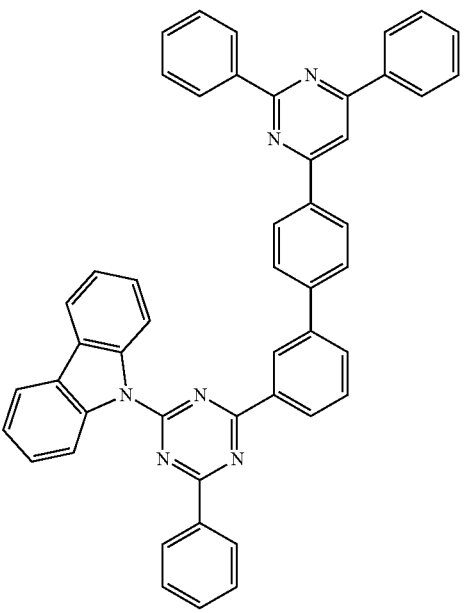
156
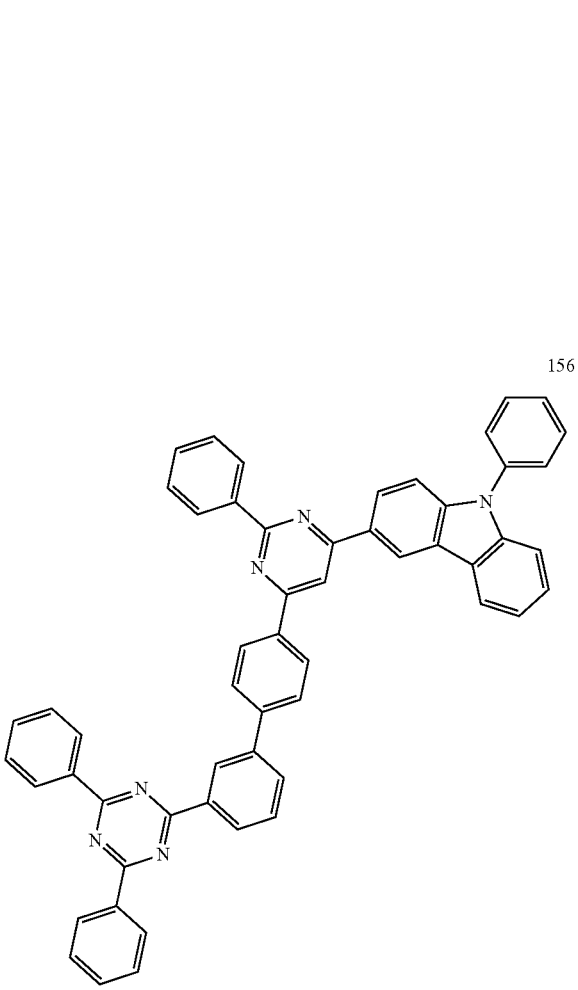

157
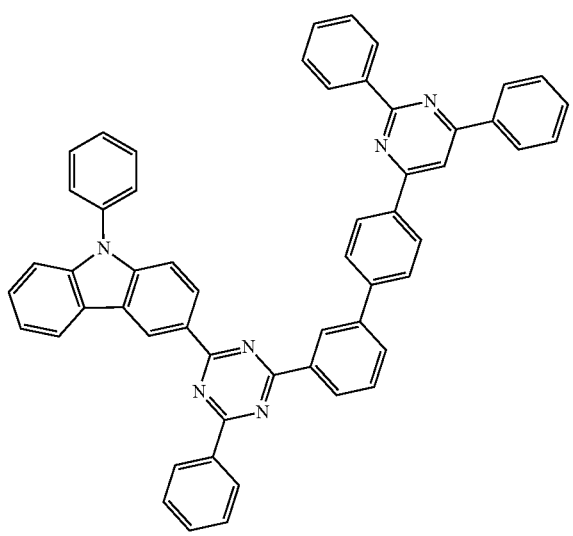
159
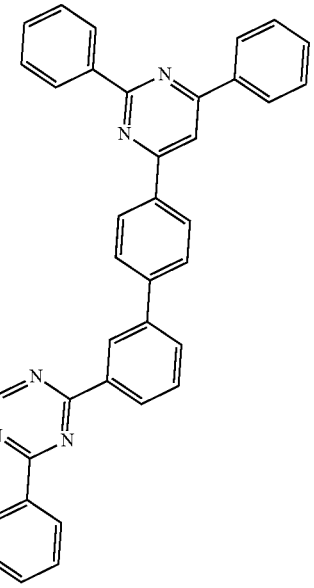
158
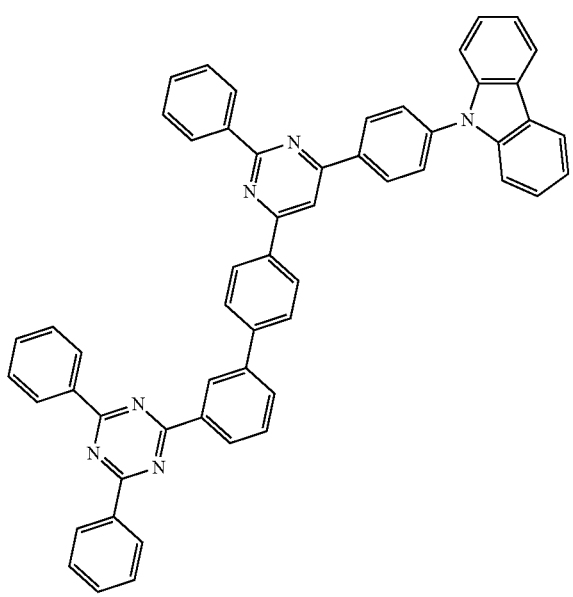
160
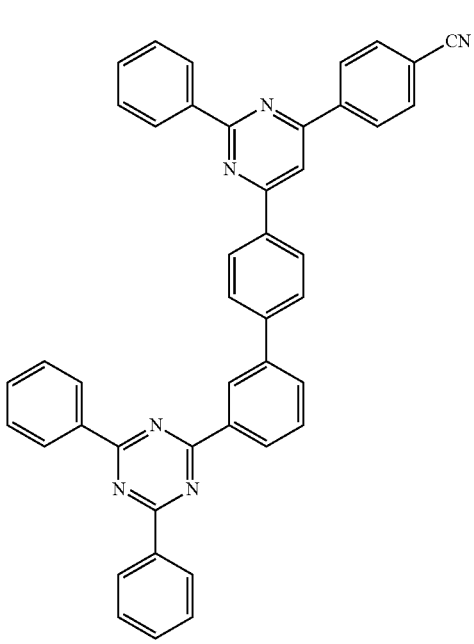

261
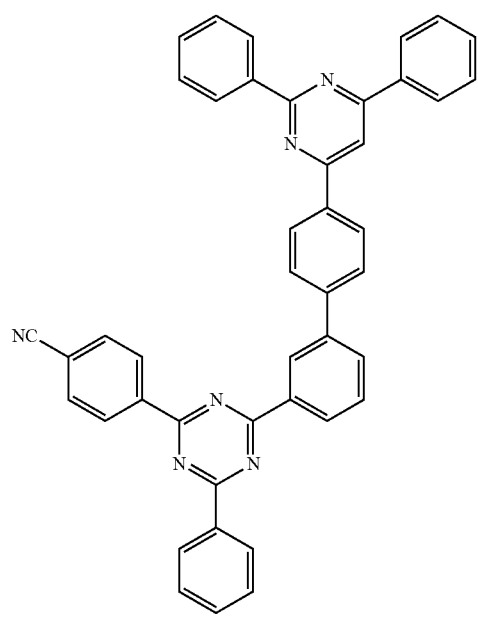
161
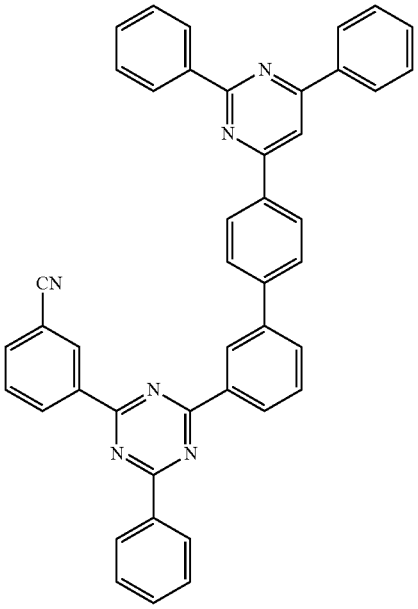
163
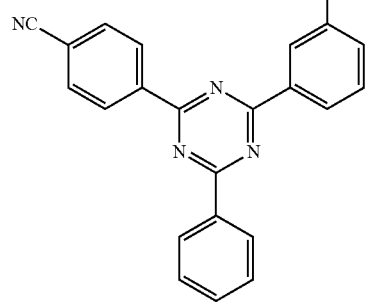
162
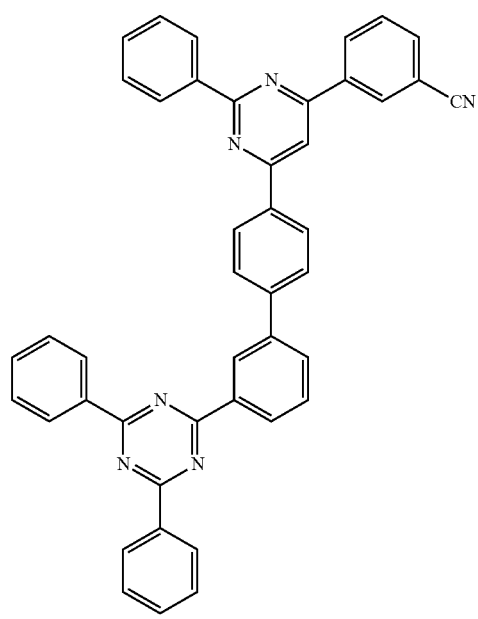
262
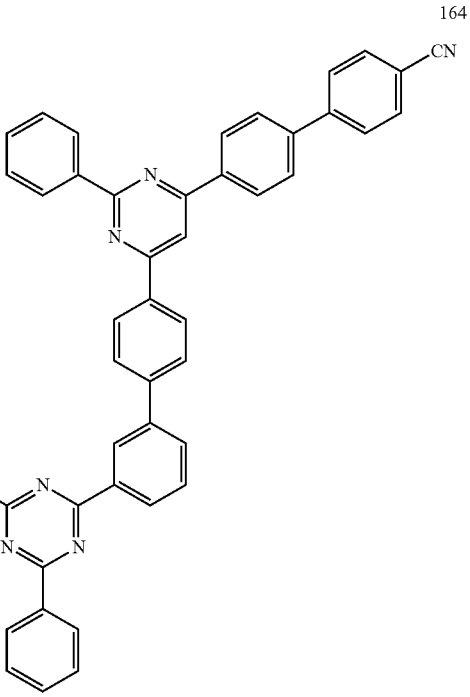
164

-continued
165
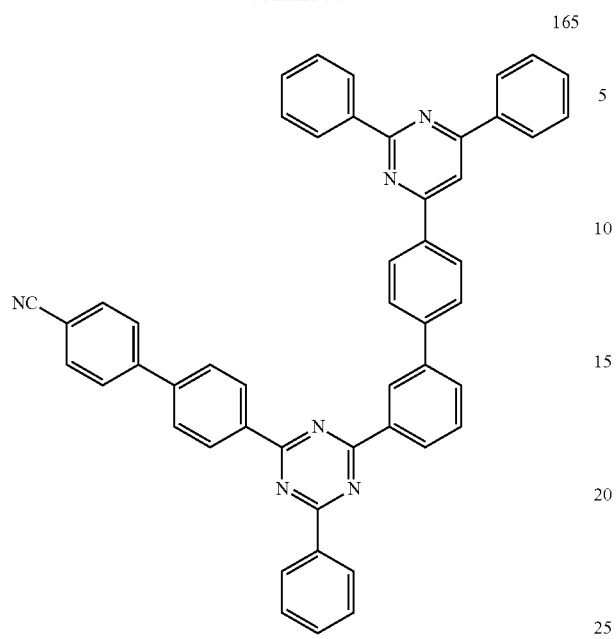
167
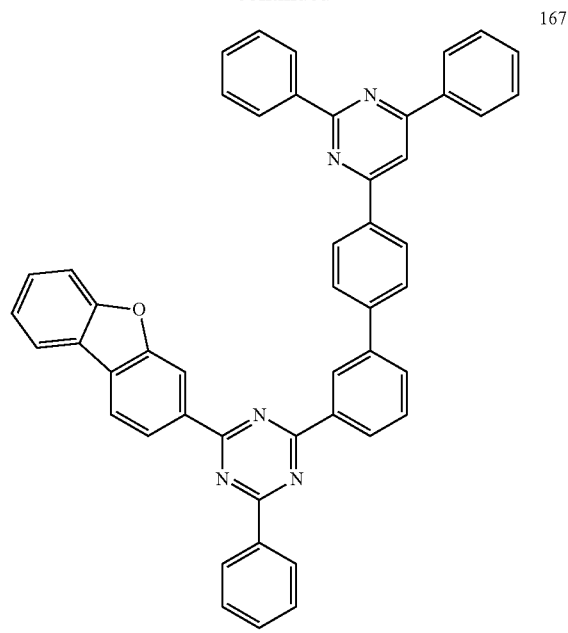
166
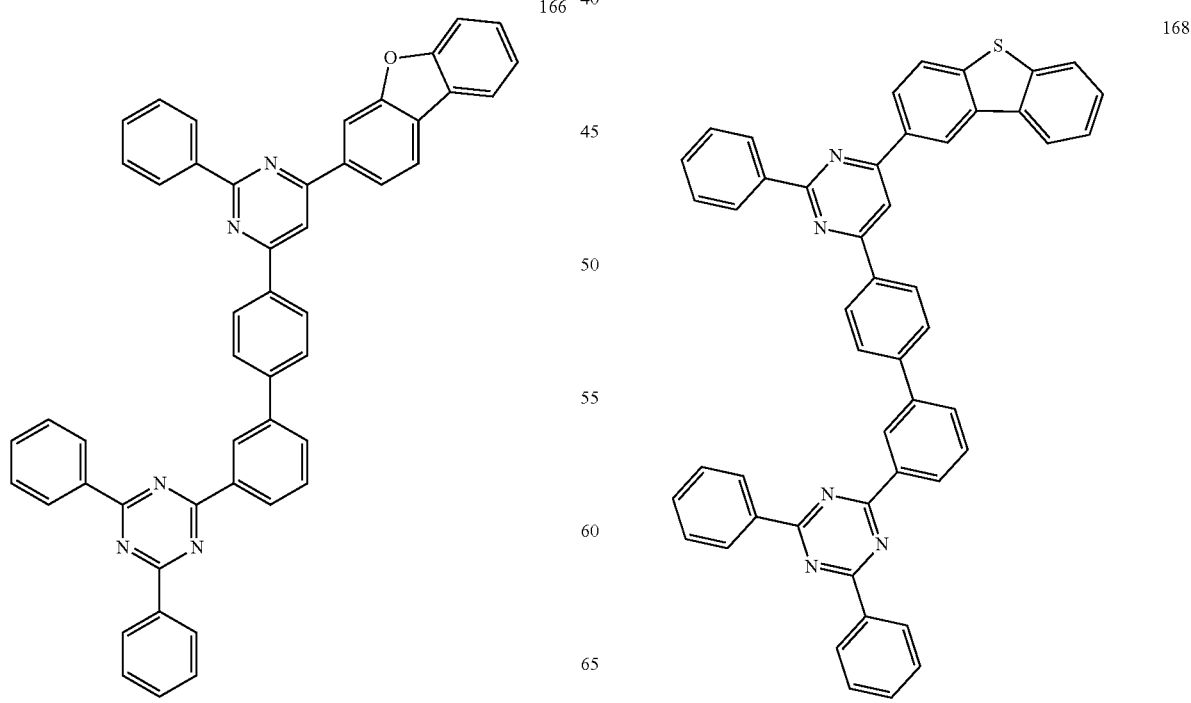
168

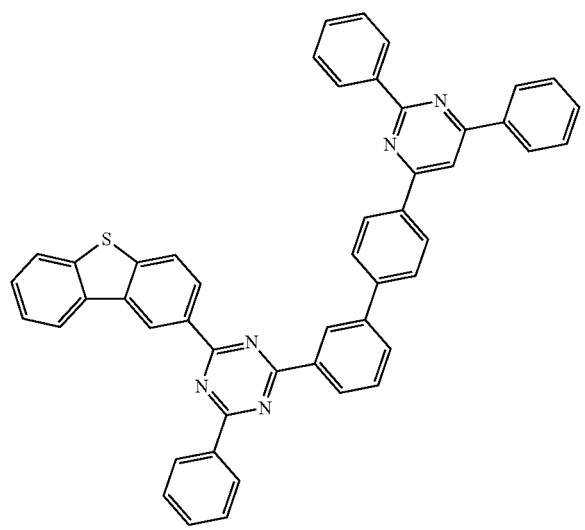
169
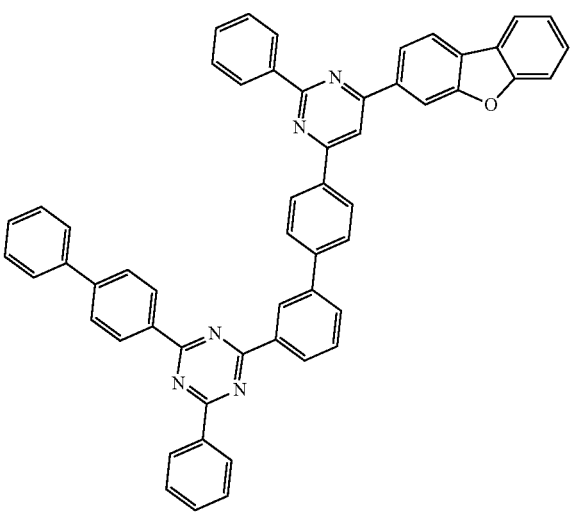
171
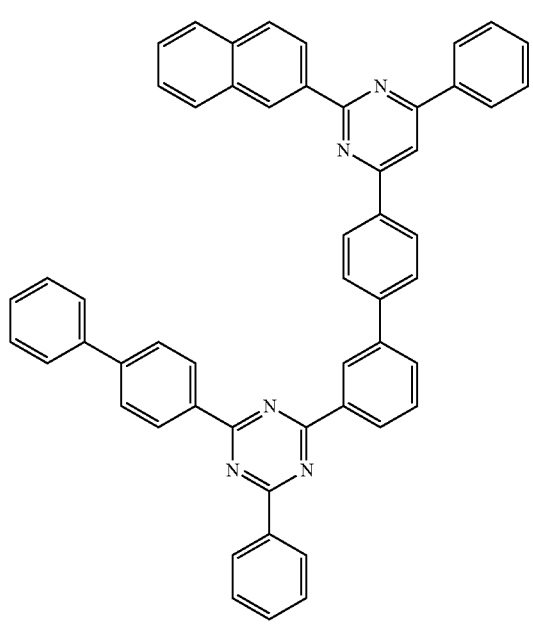
170
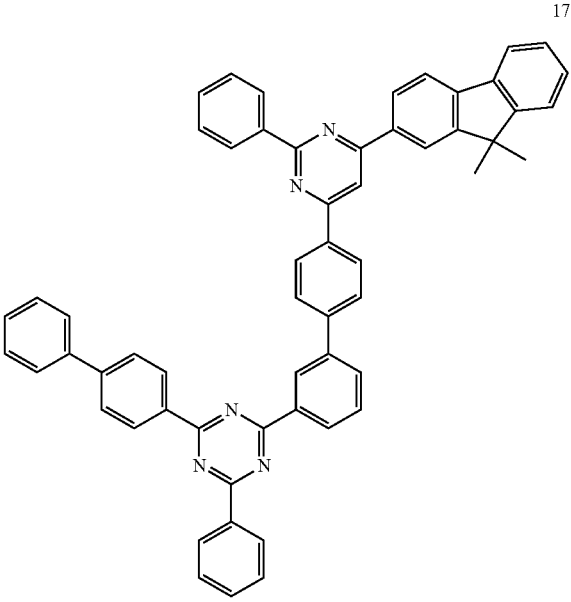
172

267
-continued
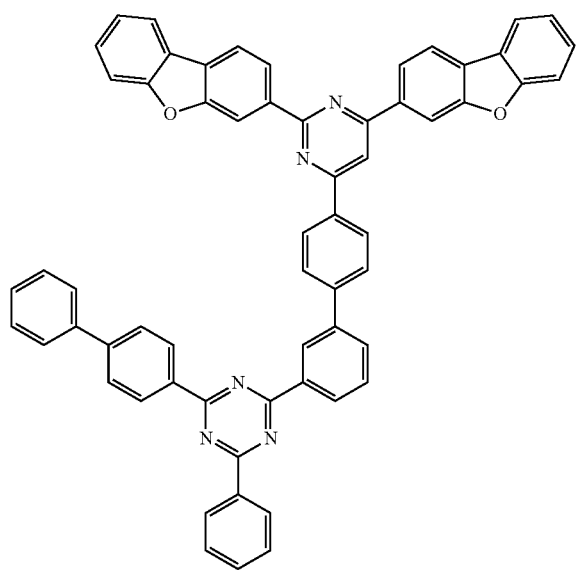
173
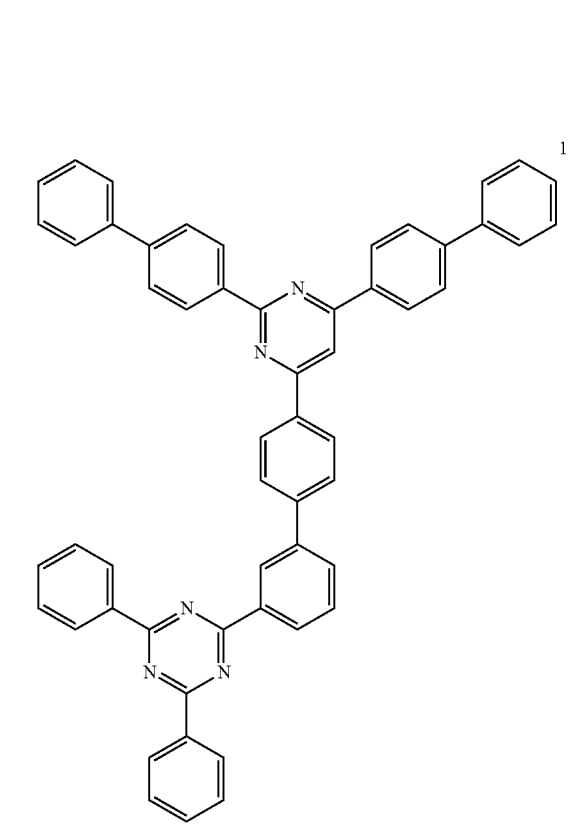
174
268
-continued
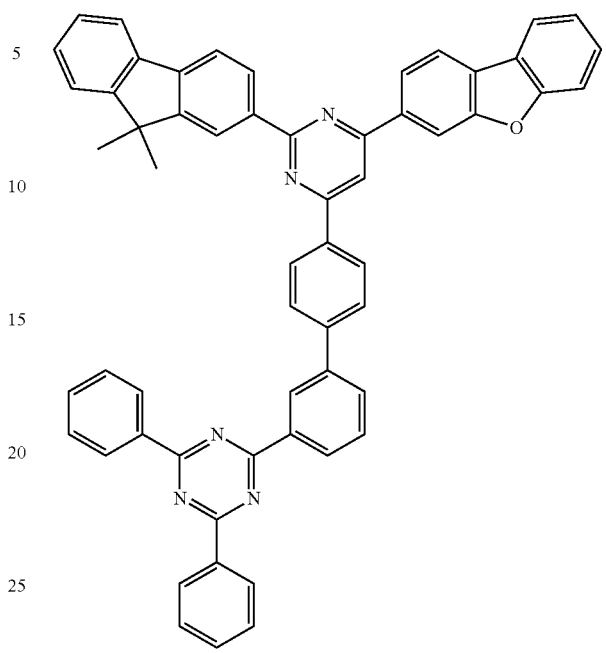
175
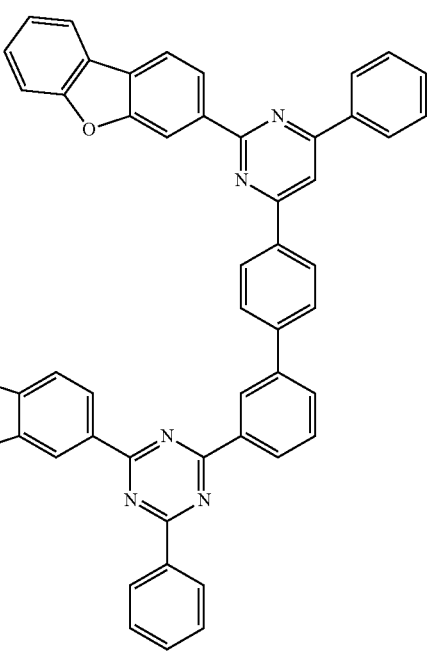
176

269
-continued
177
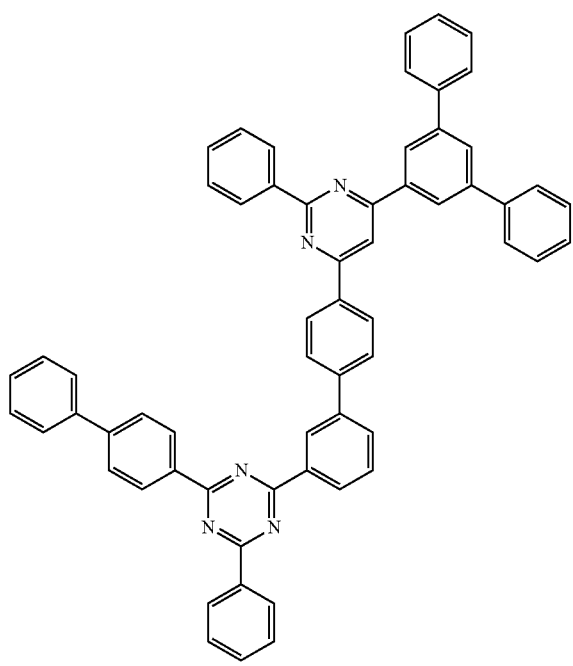
178
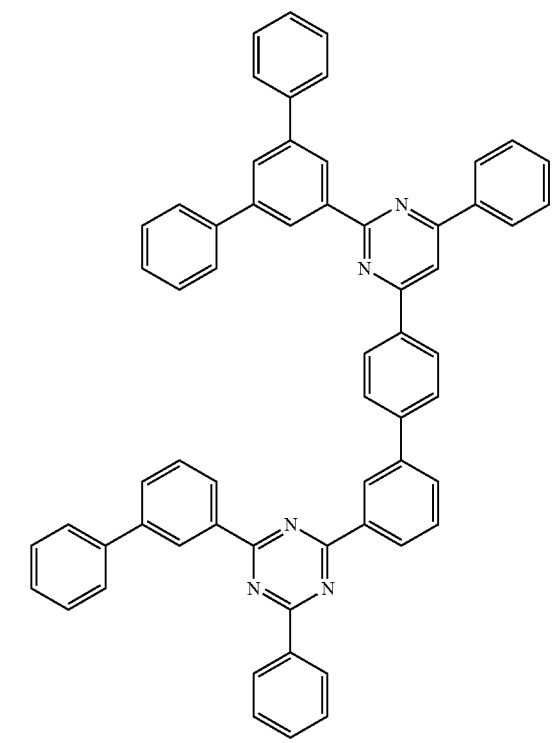
270
-continued
179
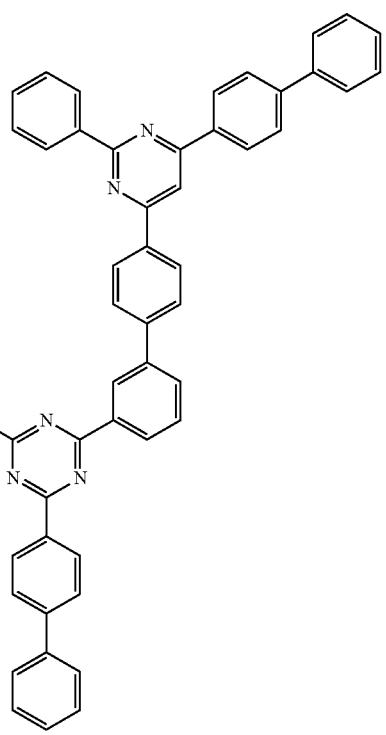
180
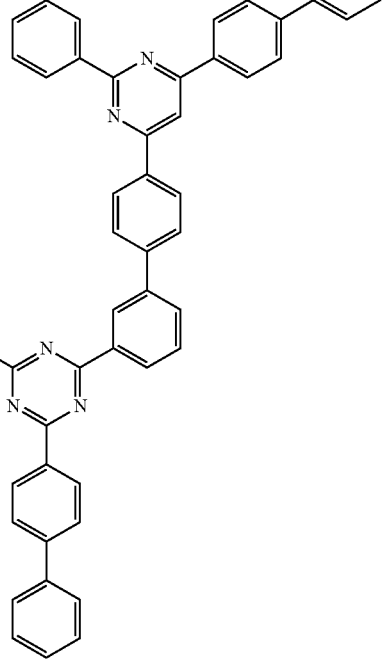

181
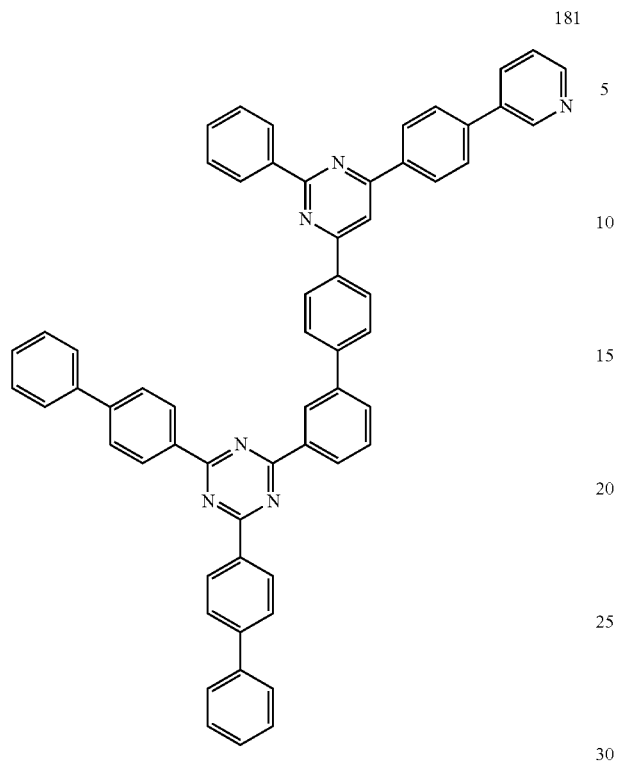
182
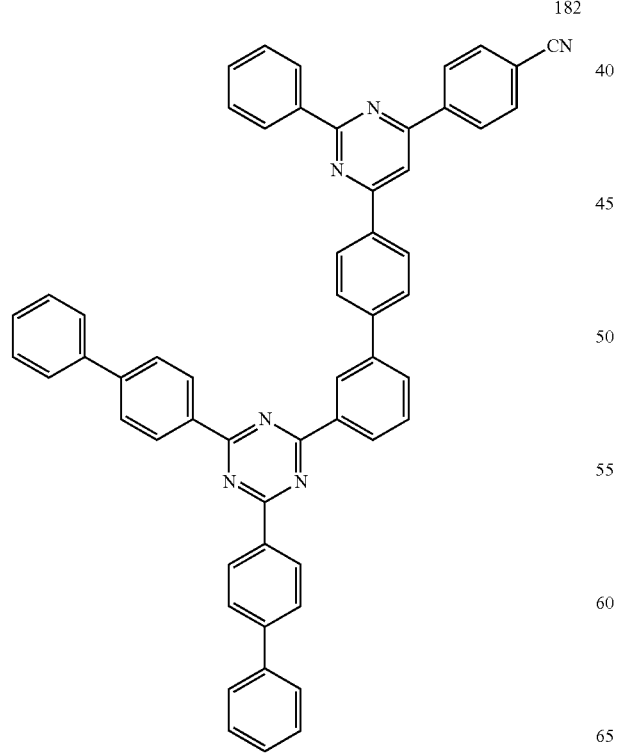
183
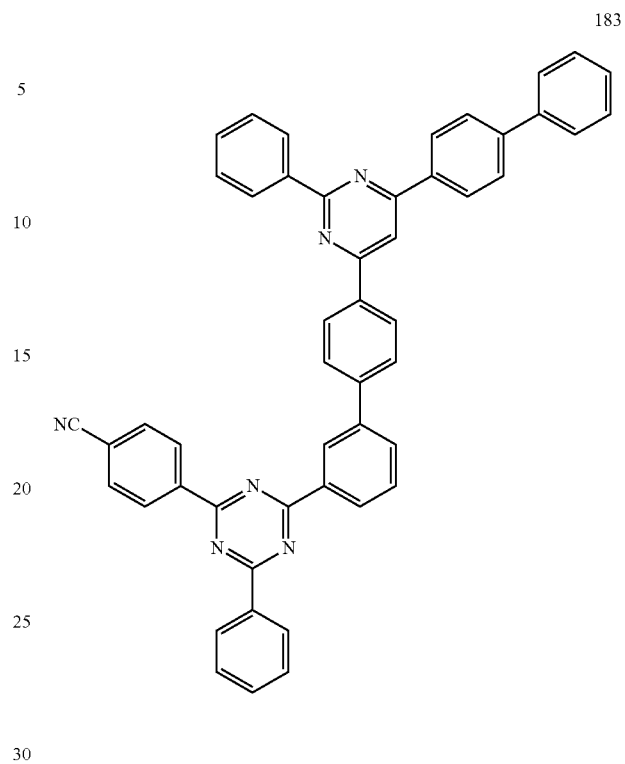
184
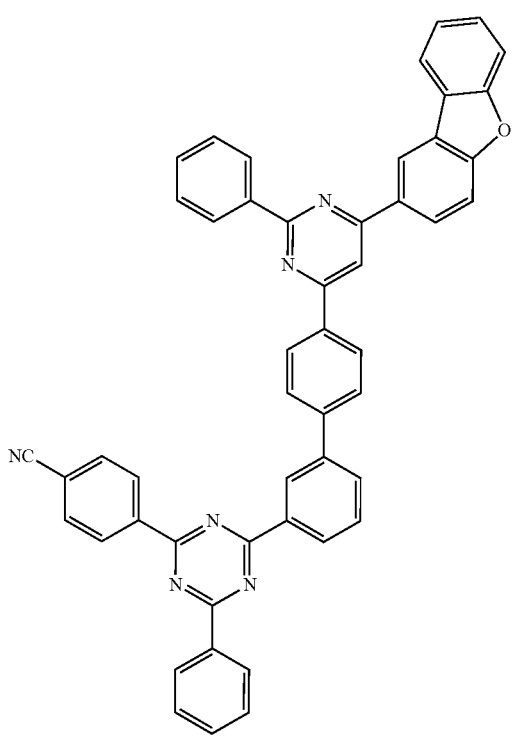

273
-continued
185
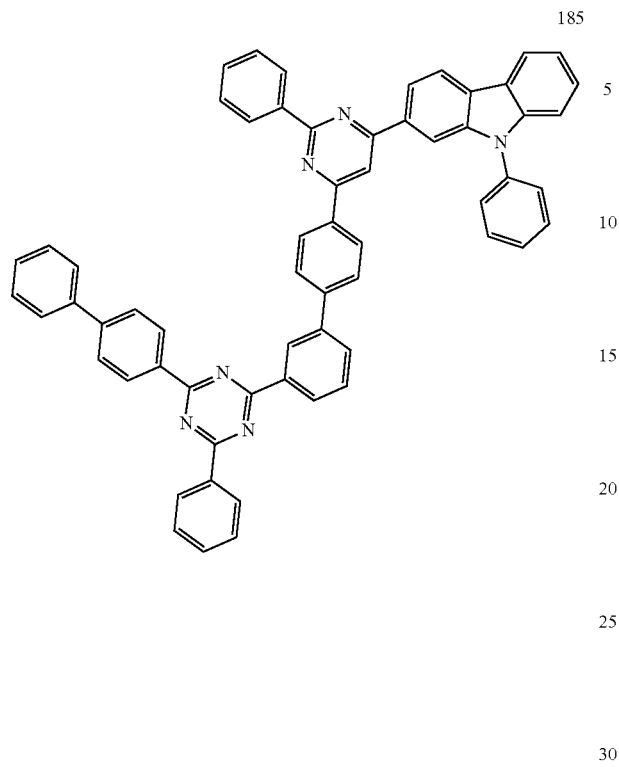
186
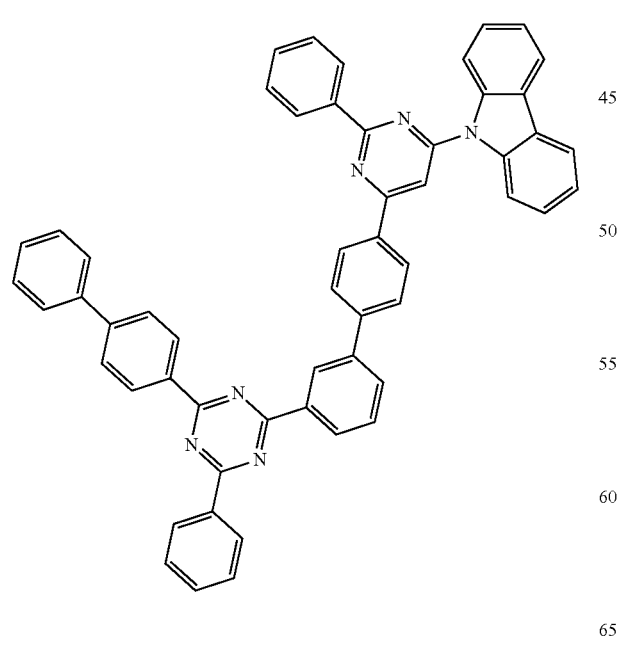
274
-continued
187
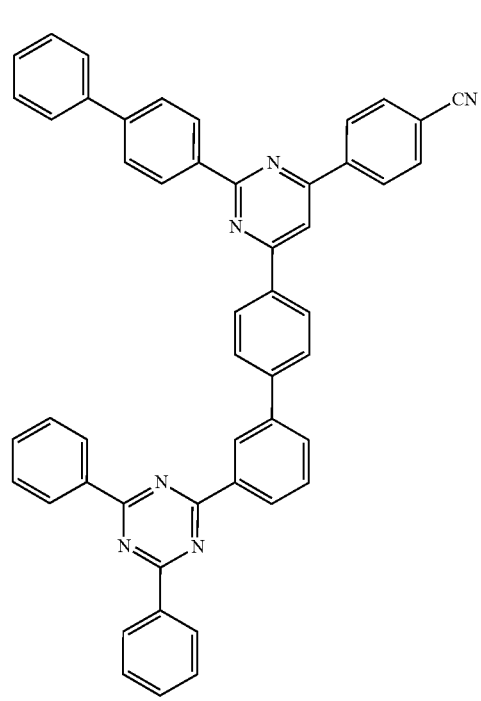
188
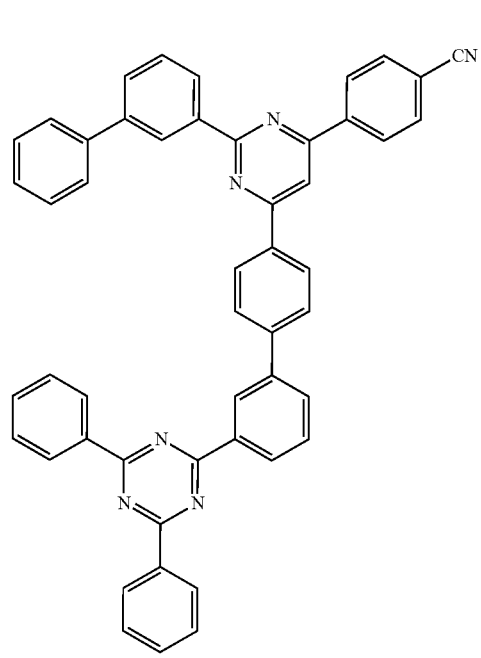

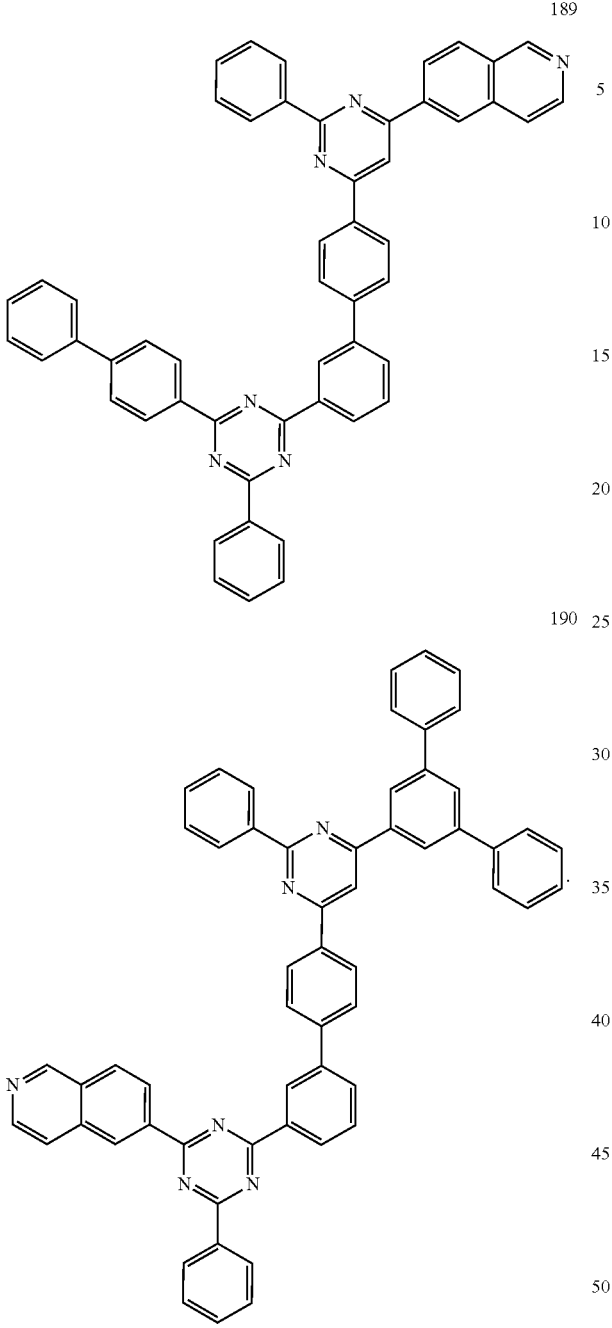

7. The compound of claim 1, wherein the compound of Chemical Formula 1 is an electron transport layer material or an electron transport auxiliary layer material.

8. An electron transport layer comprising the compound according to claim 1.

9. An electron transport auxiliary layer comprising the compound according to claim 1.

10. An electroluminescent device comprising:
an anode,
a cathode, and
one or more organic layer disposed between the anode and the cathode,
wherein at least one of the one or more organic layer comprises the compound of the following chemical Formula 1:

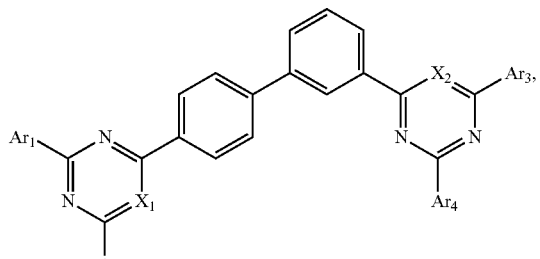

Chemical Formula 1 wherein in Chemical Formula 1, one of $X_1$ and $X_2$ is $CR_1$ and the other is N;

$R_1$ is selected from the group consisting of: hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_1$ to $C_{40}$ phosphine group, a $C_1$ to $C_{40}$ phosphine oxide group and a $C_6$ to $C_{60}$ arylamine group, $Ar_1$ to $Ar_4$ are each independently selected from the group consisting of: a $C_6$ to $C_{60}$ aryl group, and a heteroaryl group having 5 to 60 nuclear atoms, with the proviso that:

(i) the compound in which $Ar_1$ and $Ar_2$ are both naphthyl groups is excluded;

(ii) the compound in which $Ar_1$ and $Ar_4$ are both naphthyl groups is excluded; and (iii) the compound in which $Ar_1$ to $Ar_4$ are all naphthyl groups is excluded; and the alkenyl group, the alkynyl group, the cycloalkyl group, the heterocycloalkyl group, the alkyl group, the aryl group, the heteroaryl group, the alkyloxy group, the aryloxy group, the alkylsilyl group, the arylsilyl group, the alkylboron group, the arylboron group, the arylphosphine group, the arylphosphine oxide group and the arylamine group of $R_1$ and $Ar_1$ to $Ar_4$ are each independently substituted or unsubstituted with one or more kinds of substituents selected from the group consisting of deuterium, a halogen group, a cyano group, a nitro group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_1$ to $C_{40}$ alkyl group, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, and when the substituents are plural in number, the substituents are the same as or different from each other.

11. The electroluminescent device of claim 10, wherein the compound of Chemical Formula 1 is a compound of the following Chemical Formula 2 or Chemical Formula 3:

Chemical Formula 2

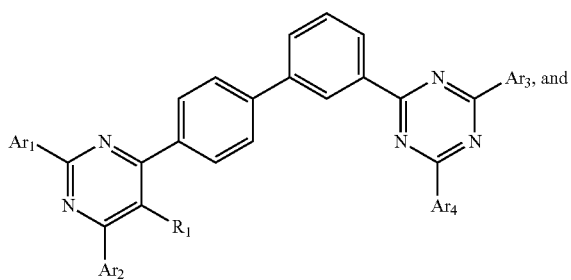

Chemical Formula 3

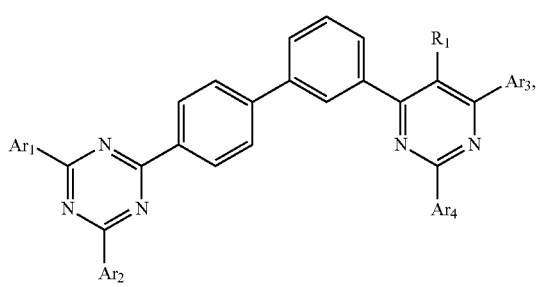

wherein in Chemical Formulas 2 and 3, $R_1$, and $Ar_1$ to $Ar_4$ are as defined in claim 10, respectively.

12. The electroluminescent device of claim 10,
wherein $R_1$ is selected from the group consisting of hydrogen, deuterium, a halogen group, a cyano group, a $C_1$ to $C_{40}$ alkyl group, a $C_6$ to $C_{60}$ aryl group and a heteroaryl group having 5 to 60 nuclear atoms, and the alkyl group, the aryl group, and the heteroaryl group of $R_1$ are each independently substituted or unsubstituted with one or more kinds of substituents selected from the group consisting of deuterium, a halogen group, a cyano group, a nitro group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, and when the substituents are plural in number, the substituents are the same as or different from each other.

13. The electroluminescent device of claim 10,
wherein $Ar_1$ to $Ar_4$ are each independently selected from the group consisting of a $C_6$ to $C_{60}$ aryl group, and a heteroaryl group having 5 to 60 nuclear atoms, except the case where all of $Ar_1$ to $Ar_4$ are the same as each other, and the aryl group, and the heteroaryl group of $Ar_1$ to $Ar_4$ are each independently substituted or unsubstituted with one or more kinds of substituents selected from the group consisting of deuterium, a halogen group, a cyano group, a nitro group, a $C_1$ to $C_{40}$ alkyl group, a $C_6$ to $C_{60}$ aryl group, a heteroaryl group having 5 to 60 nuclear atoms, a $C_6$ to $C_{60}$ aryloxy group, a $C_6$ to $C_{60}$ arylphosphine oxide group and a $C_6$ to $C_{60}$ arylamine group, and when the substituents are plural in number, the substituents are the same as or different from each other.

14. The electroluminescent device of claim 10,
wherein each of $Ar_1$ to $Ar_4$ is selected from the following structural formulas:

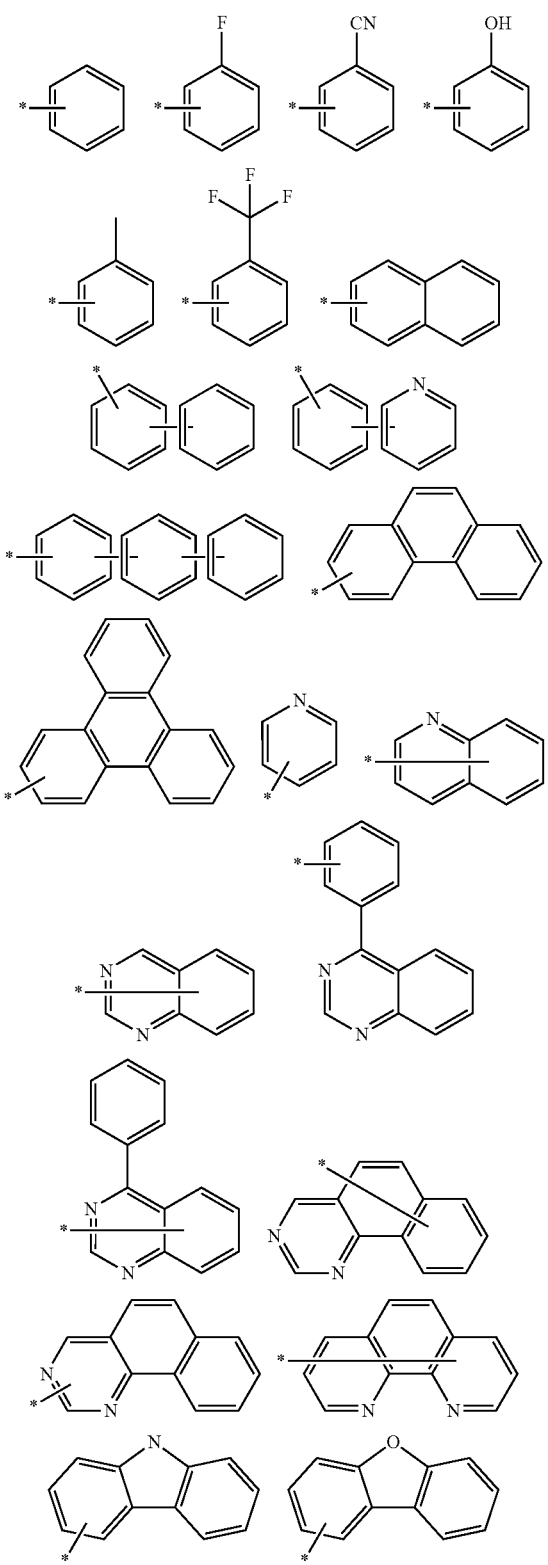

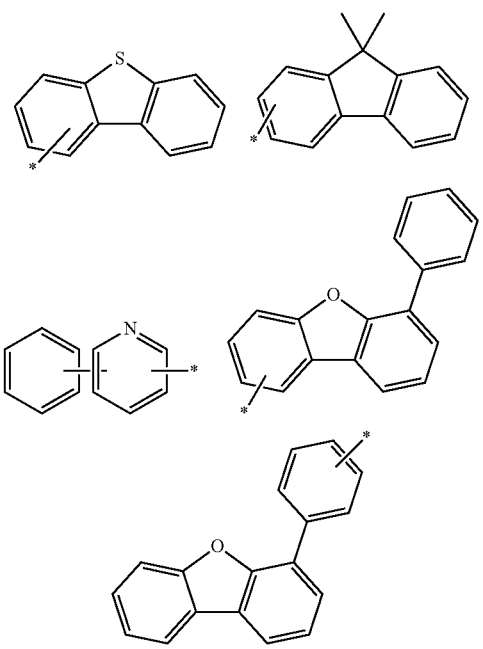
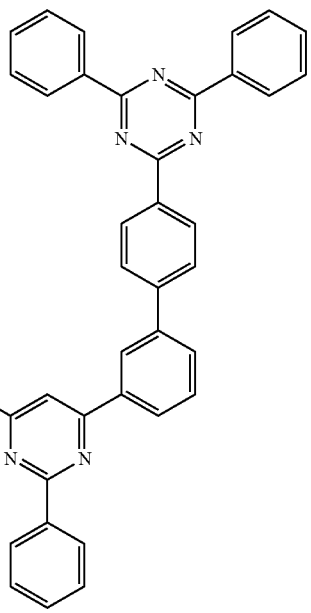
wherein in the above structural formula, * means a site where a bond is made with the compound of Chemical Formula 1.
15. The electroluminescent device of claim 10, wherein the compound of Chemical Formula 1 is represented by any one of the following Chemical Formulas 1 to 190:
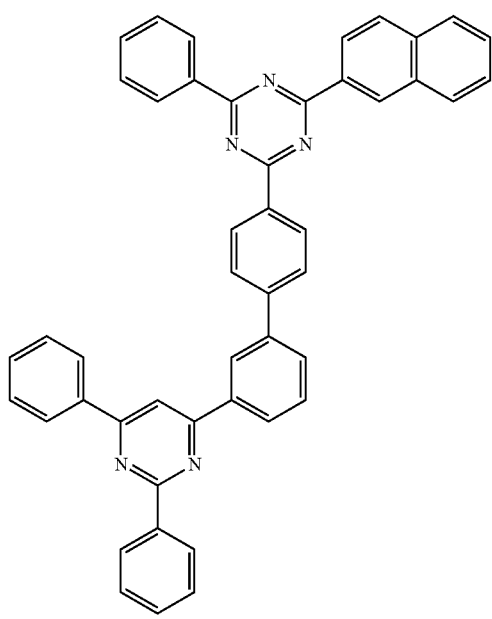
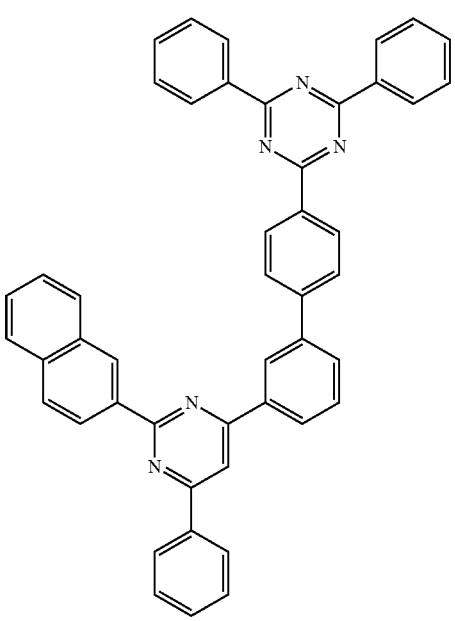

-continued
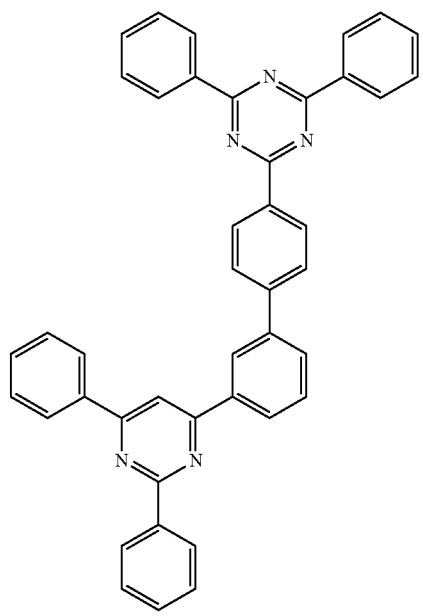
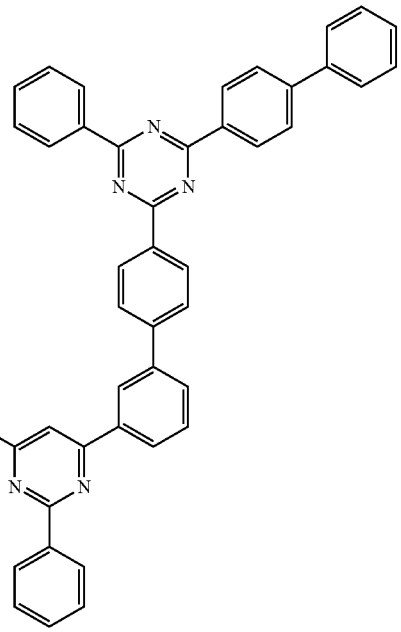

-continued
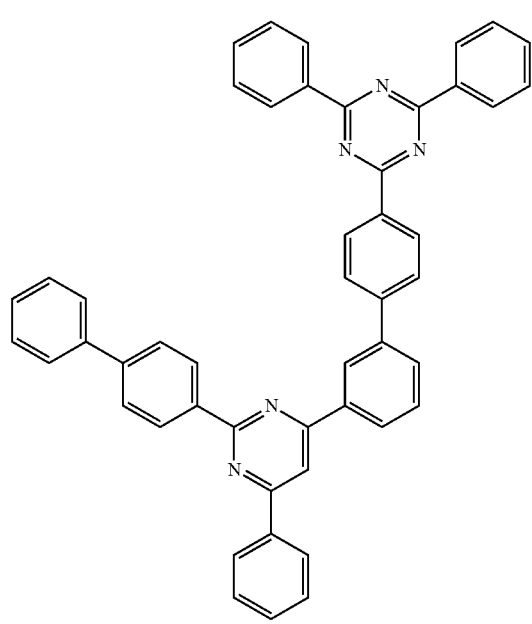
8
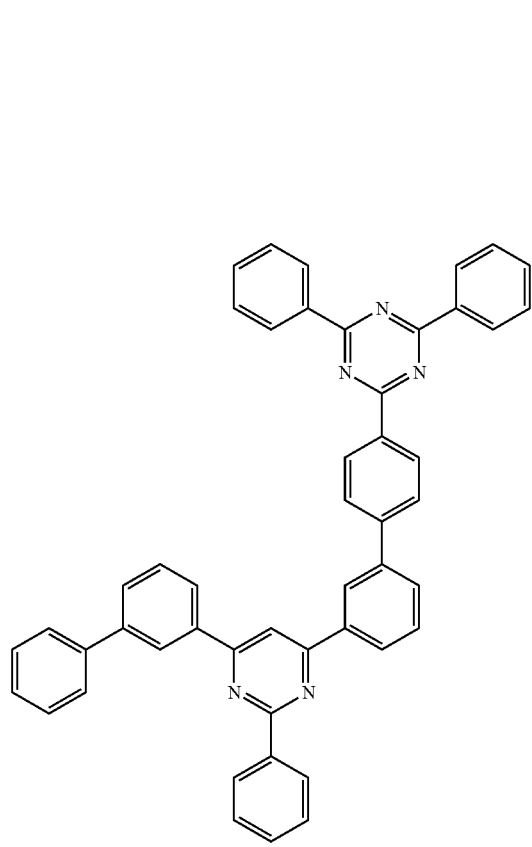
9
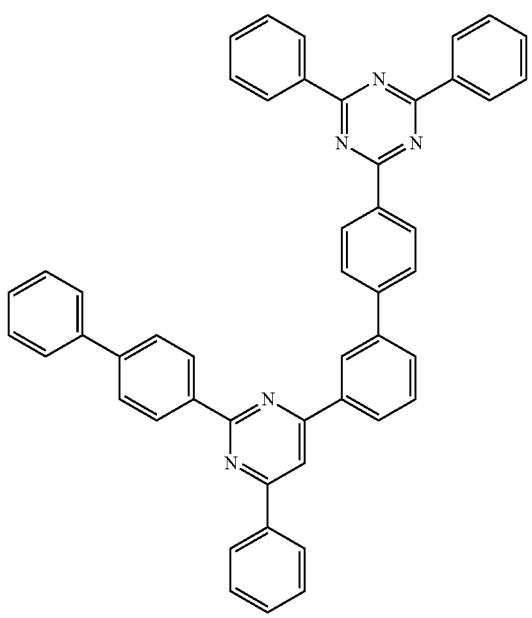
10
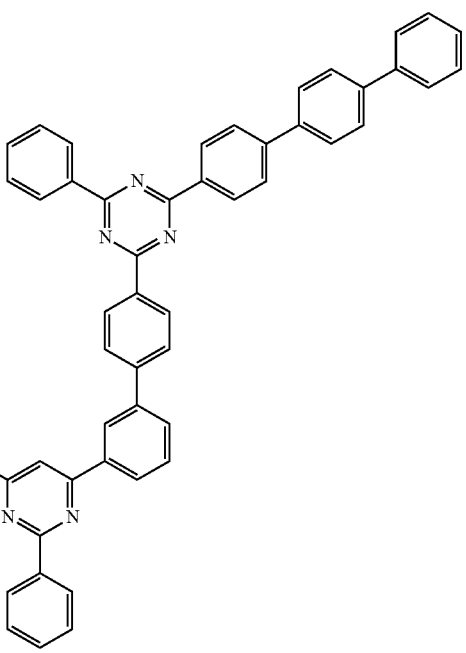
11

12
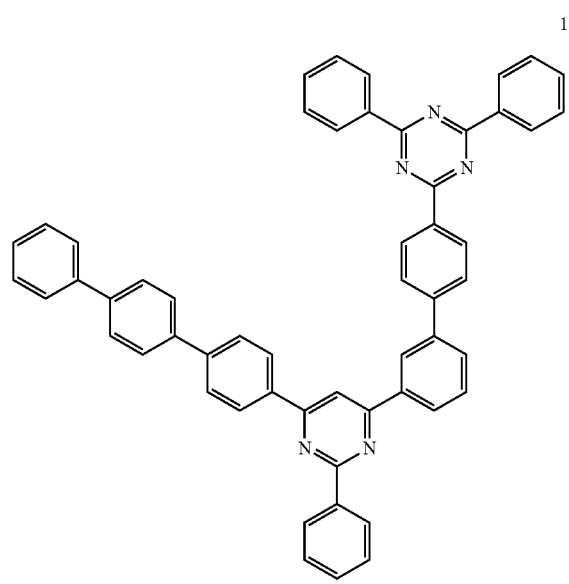
14
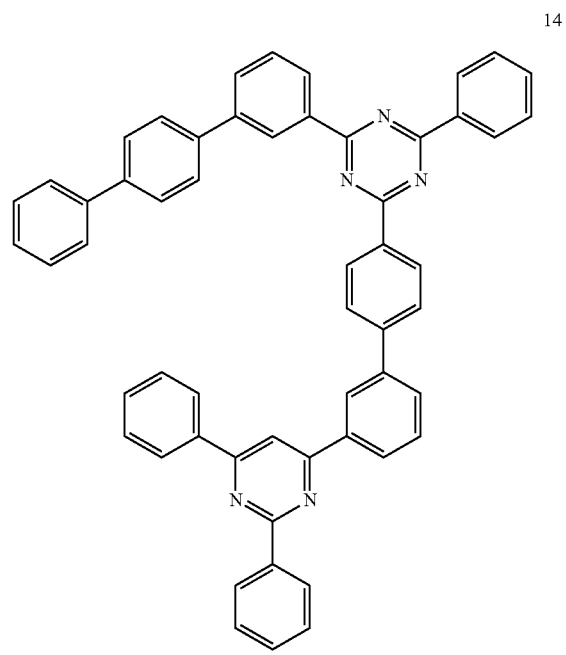
13
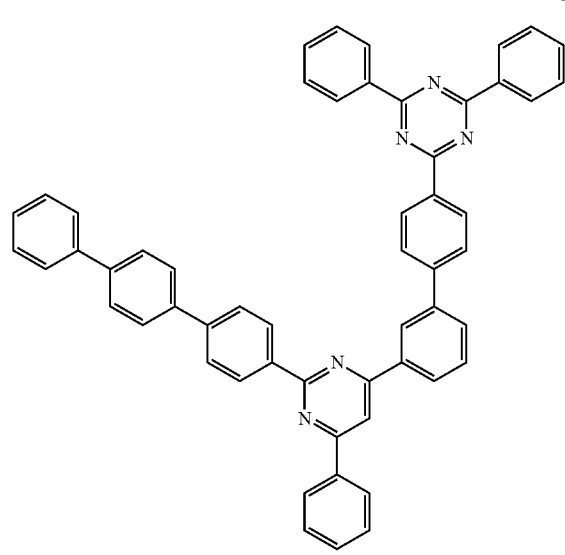
15

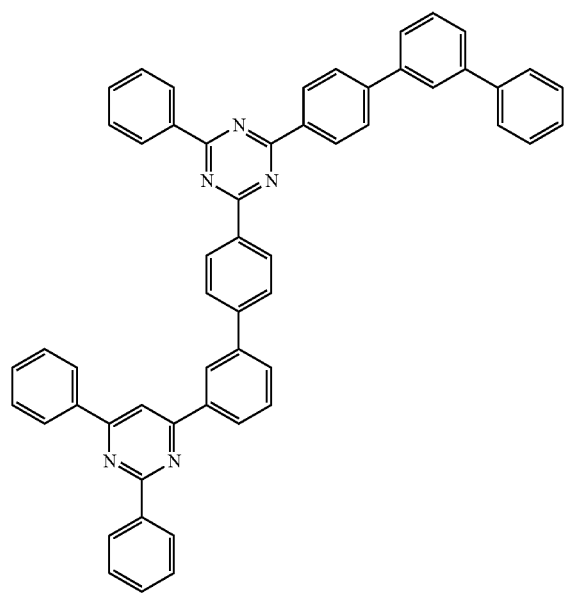
16
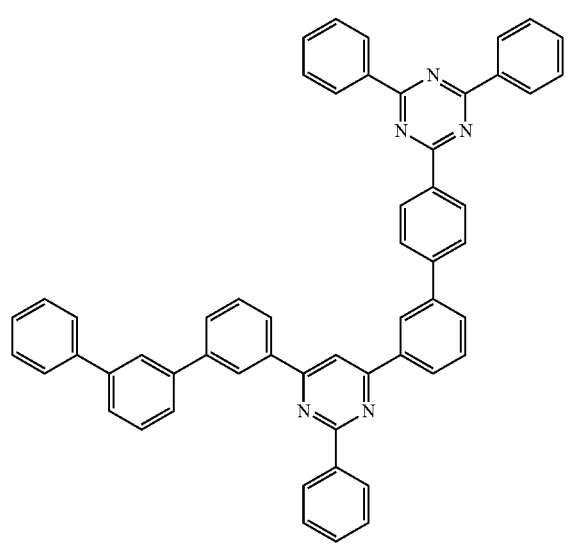
17
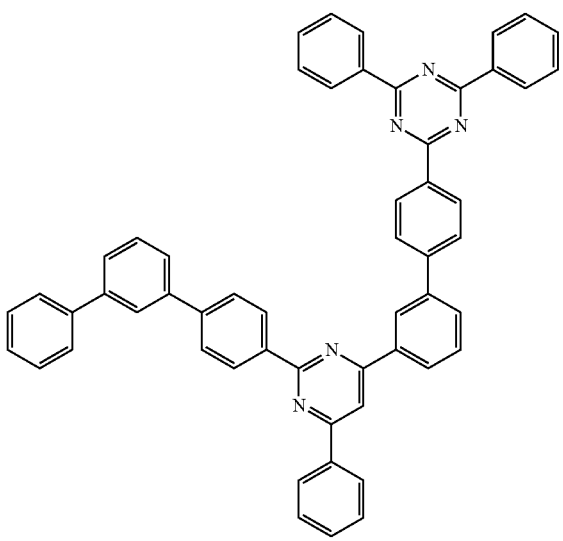
18
19

289
-continued
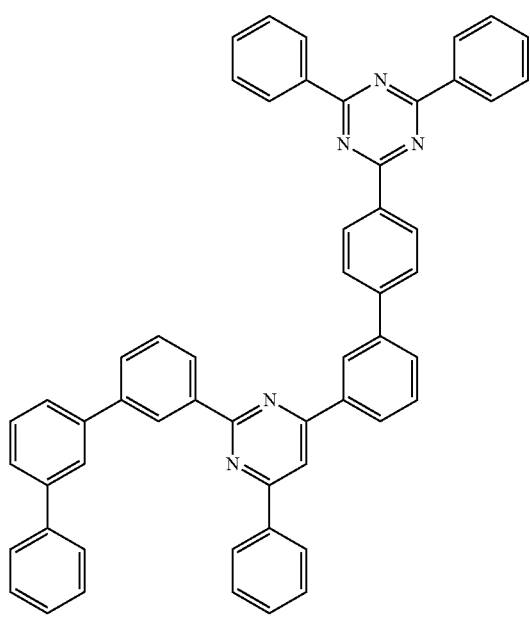
20
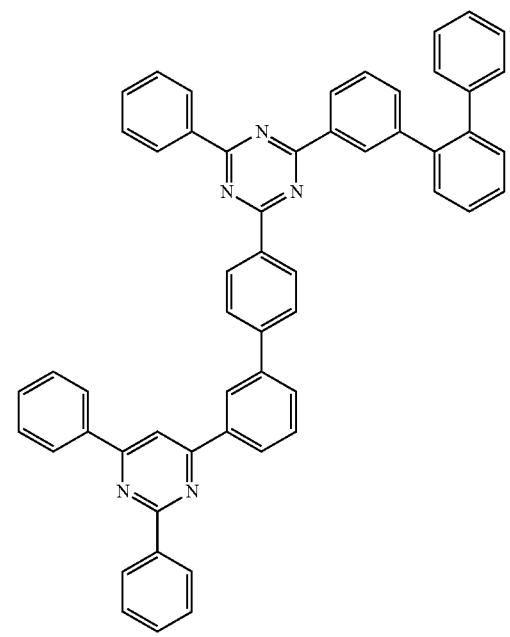
21
290
-continued
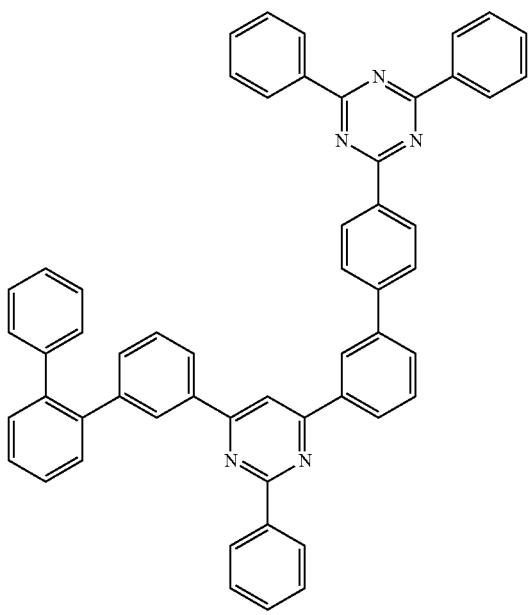
22
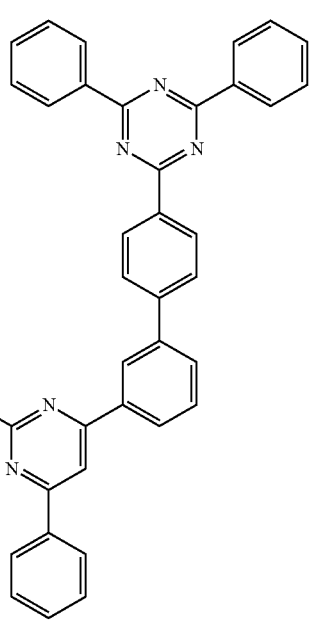
23

291
-continued
292
-continued
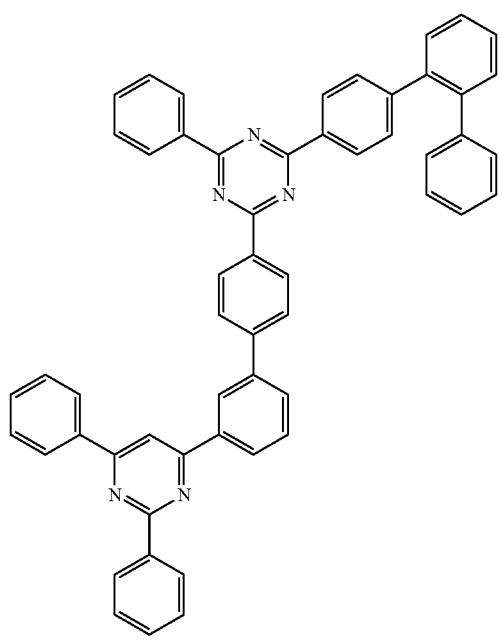
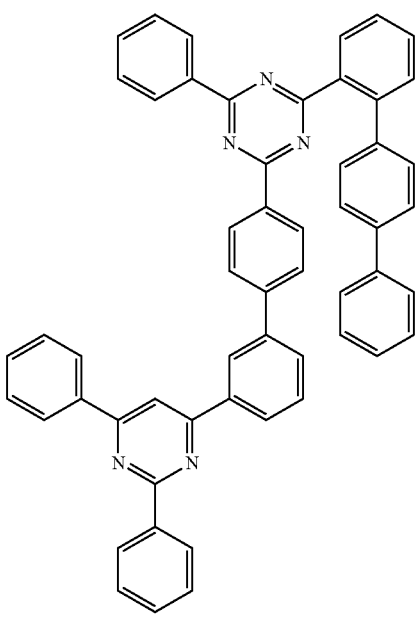

28
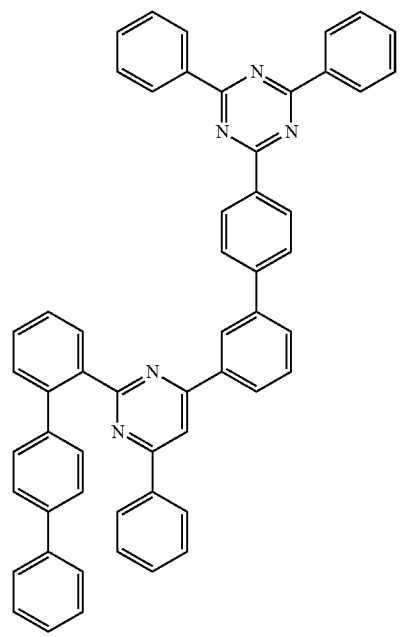
30
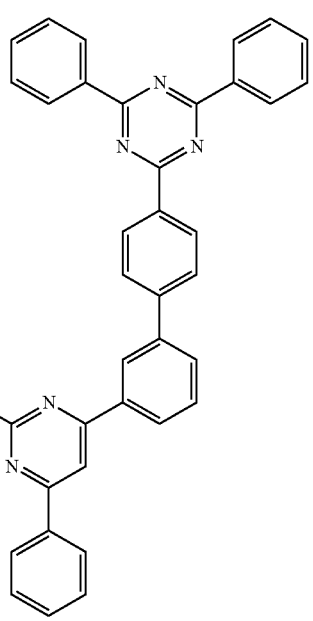
29
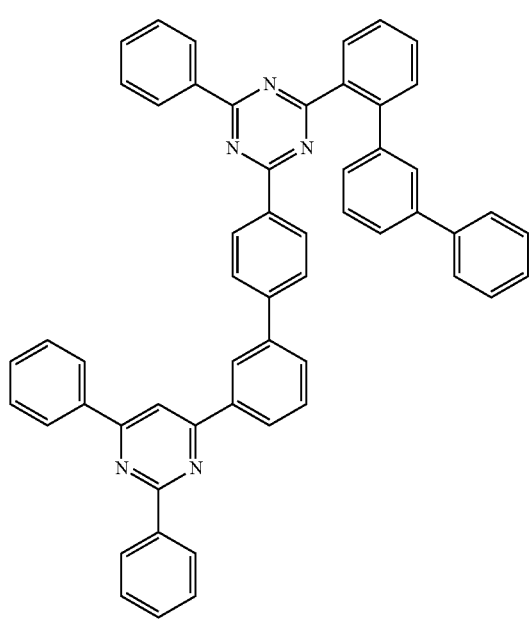
31
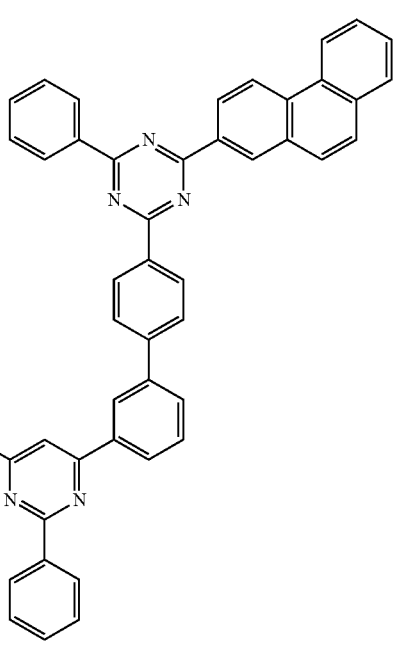

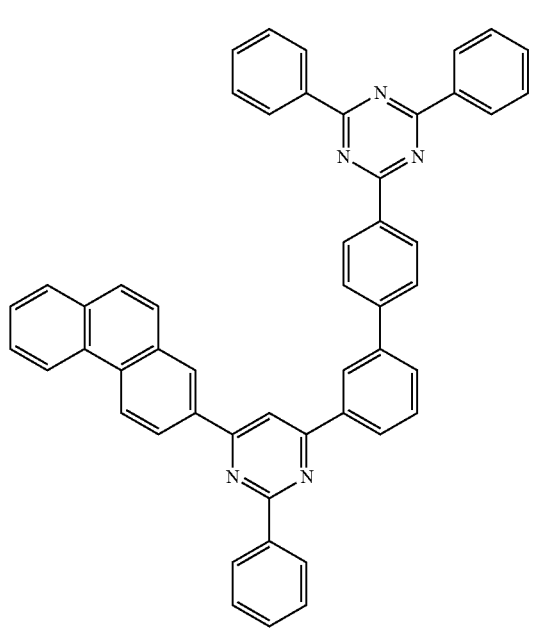
32
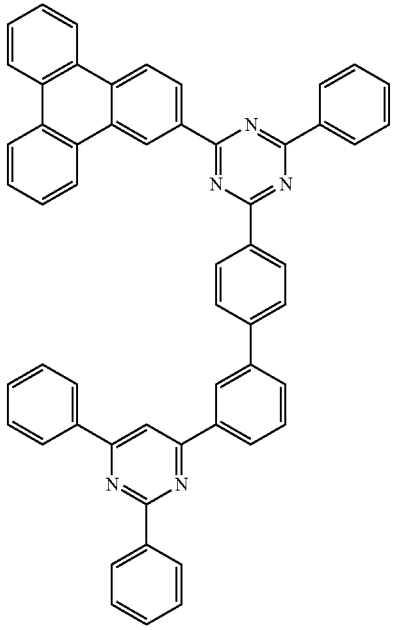
34
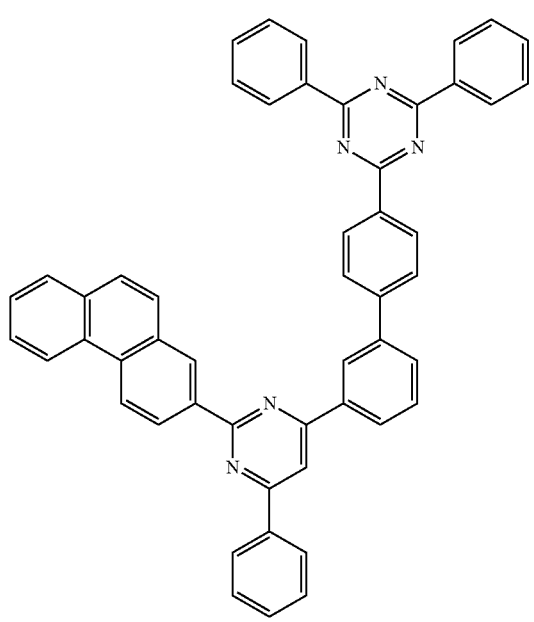
33
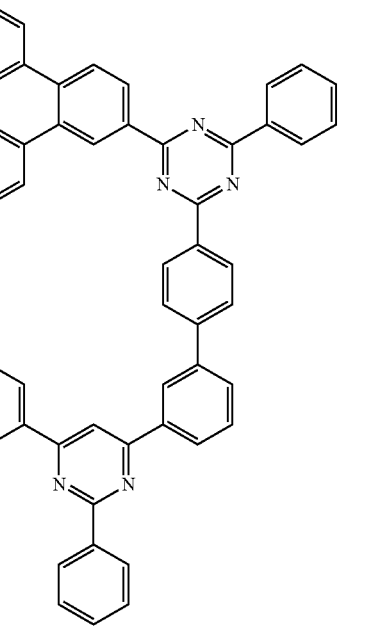
35

297
-continued
36
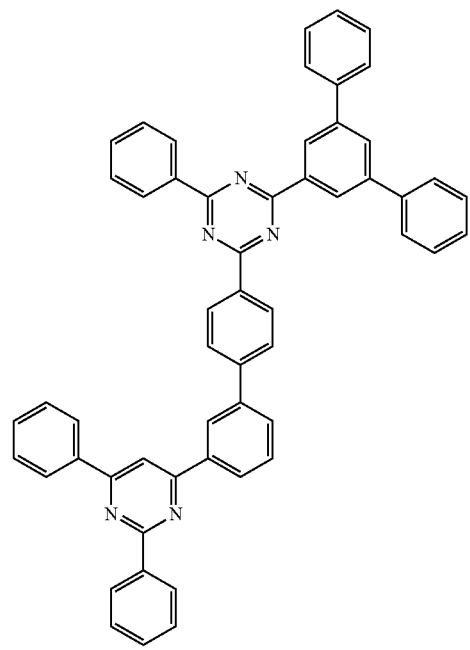
298
-continued
38
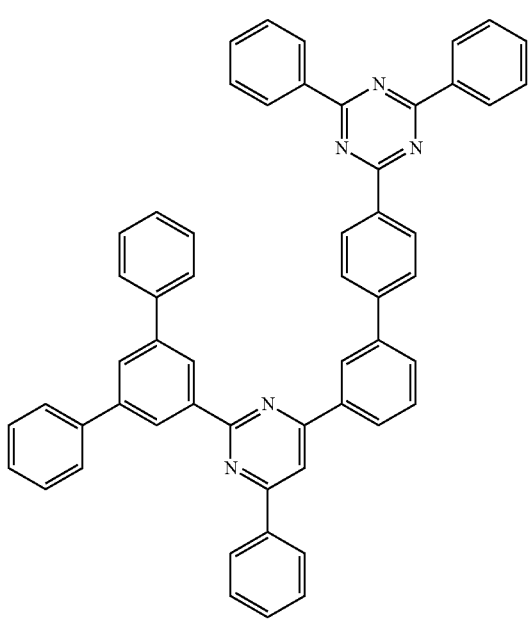
37
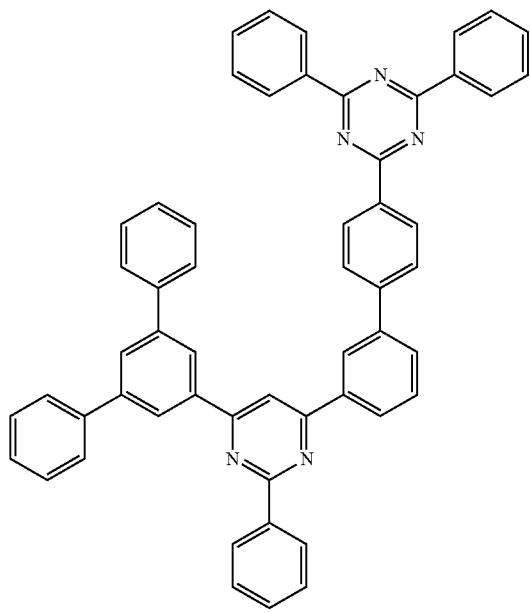
39
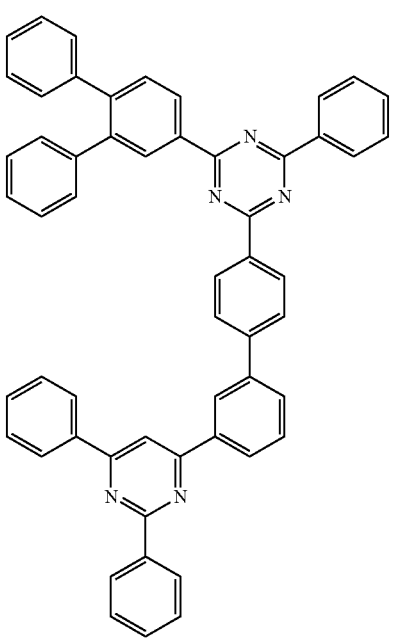

299
-continued
40
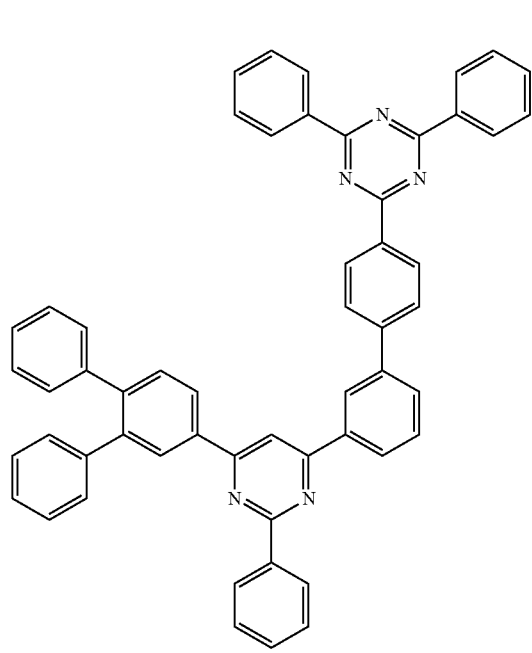
41
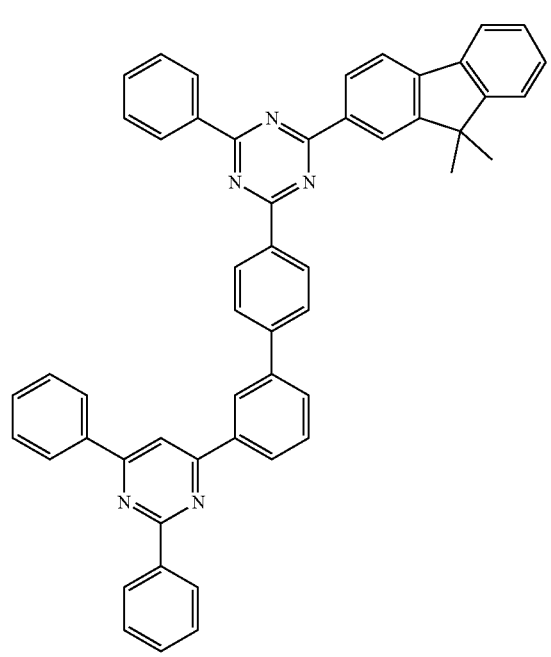
300
-continued
42
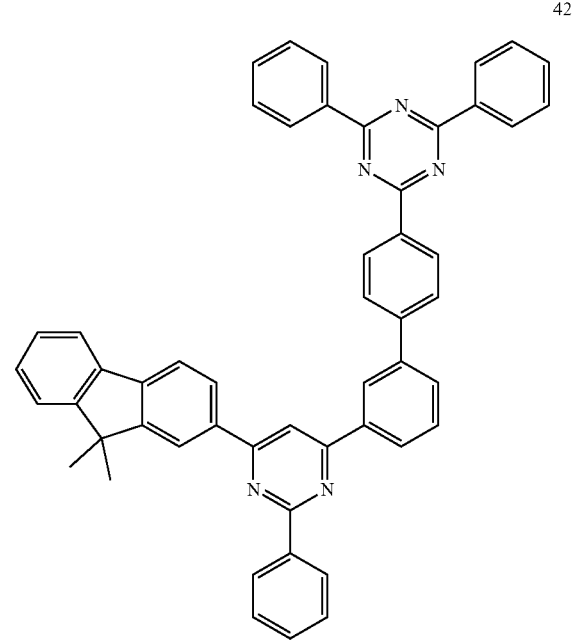
43
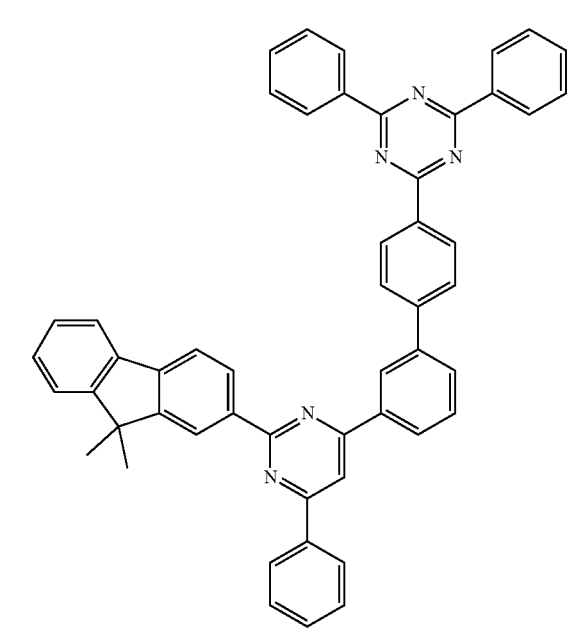

301
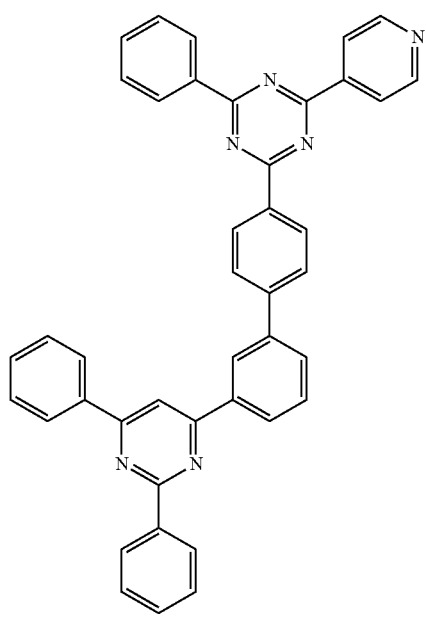
302
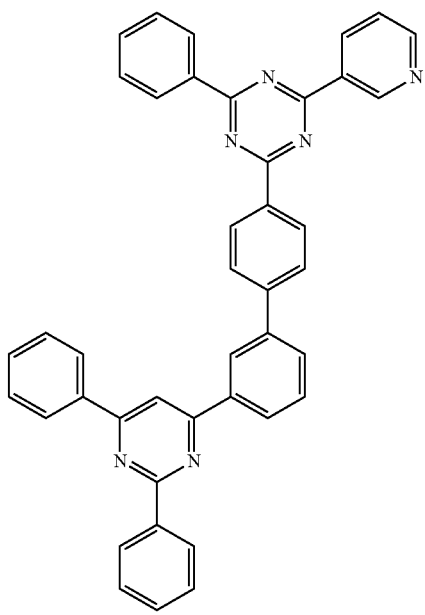
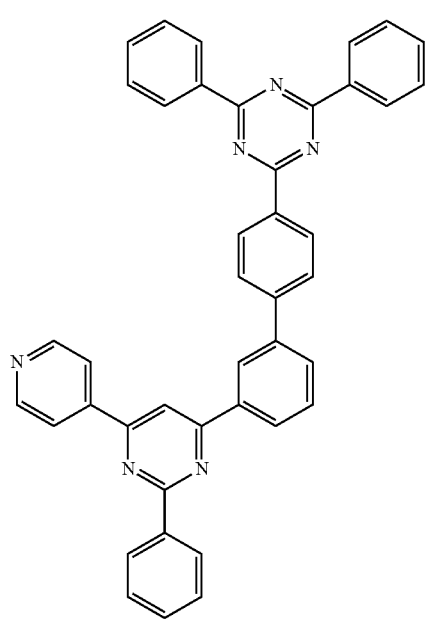
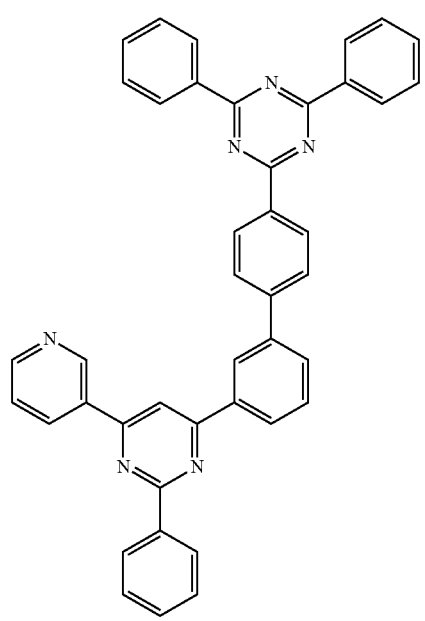

303
-continued
48
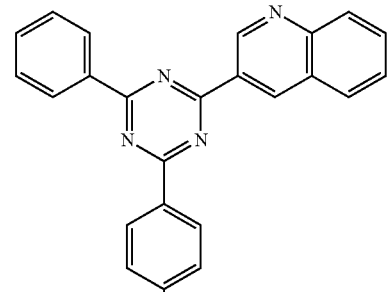
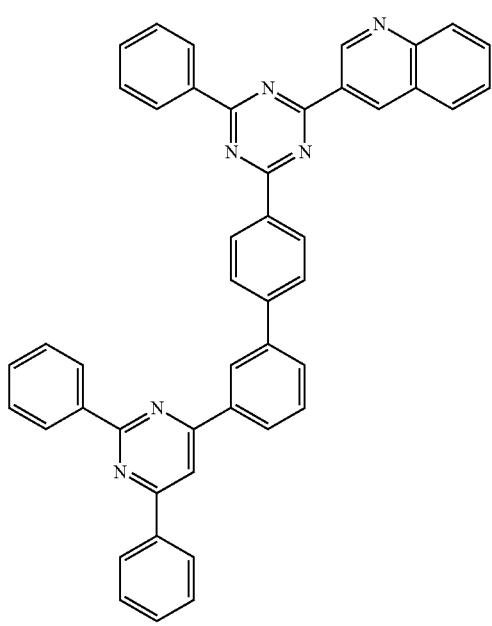
49
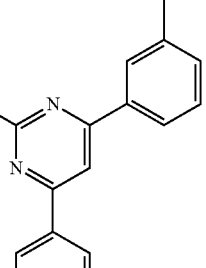
304
-continued
50
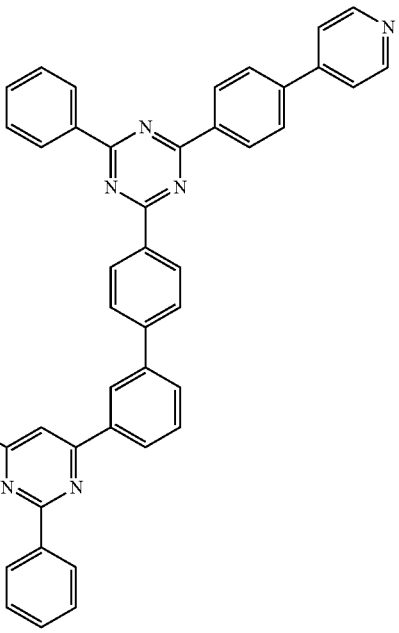
51
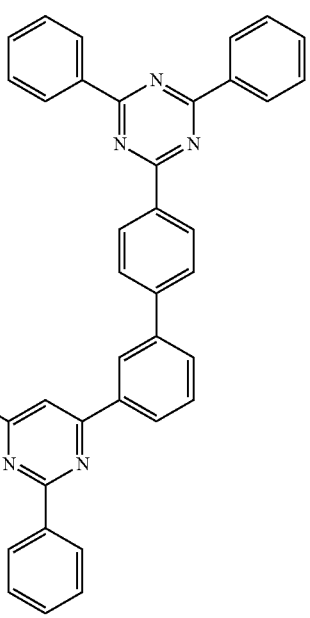

52
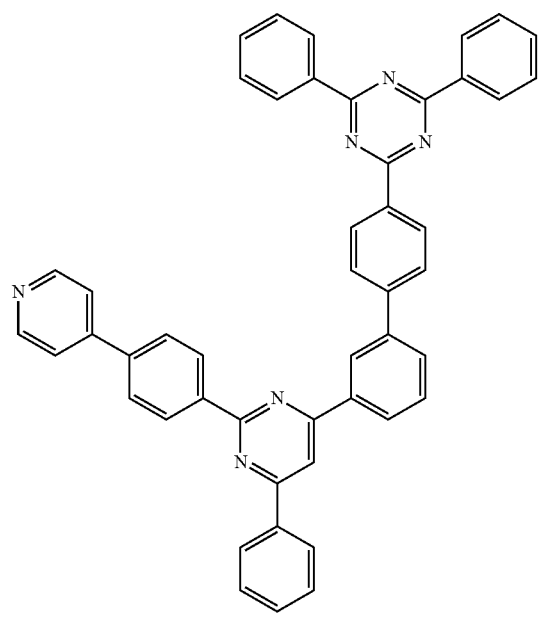
53
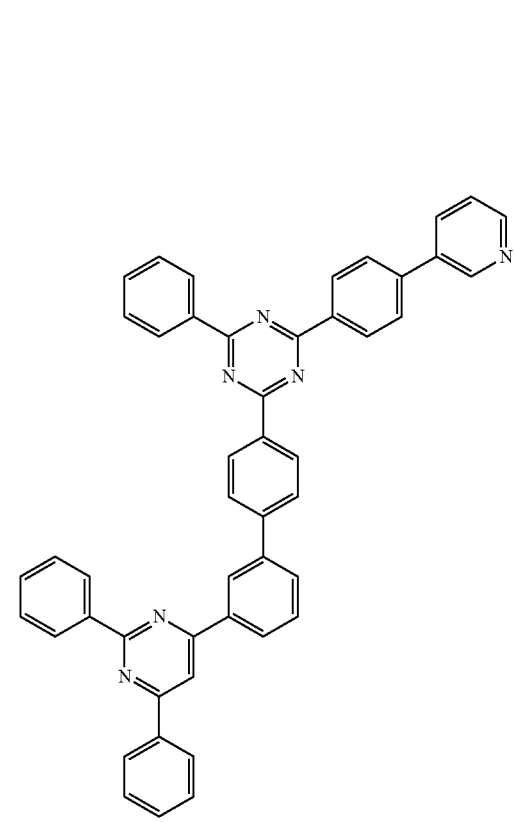
54
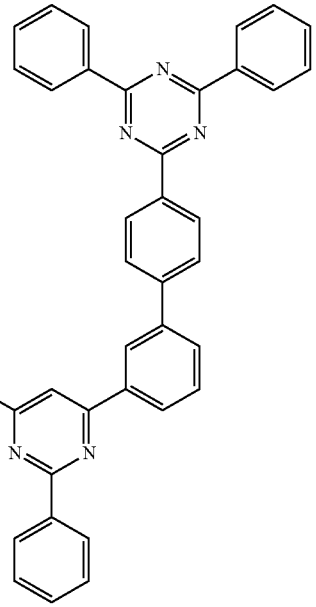
55
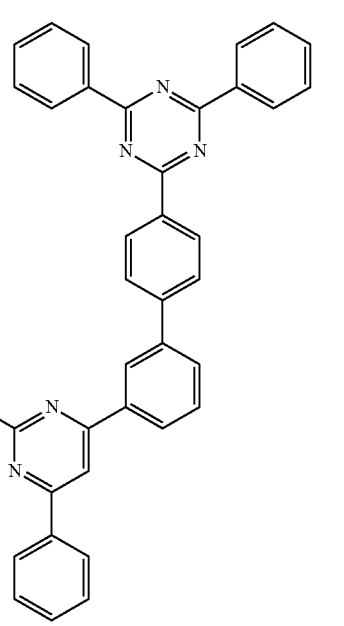

56
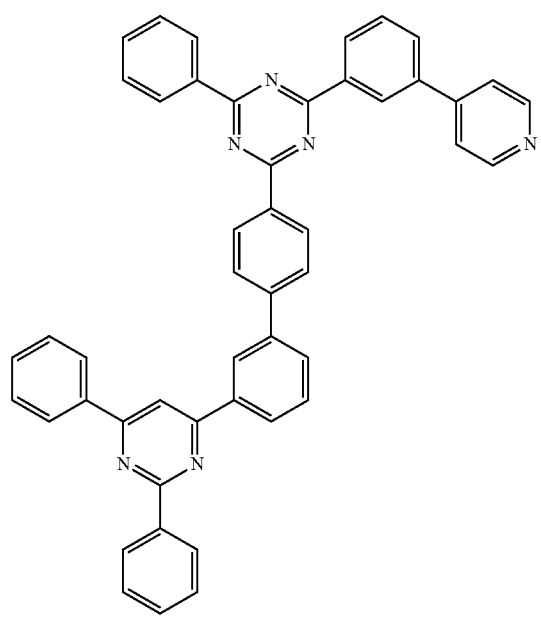
57
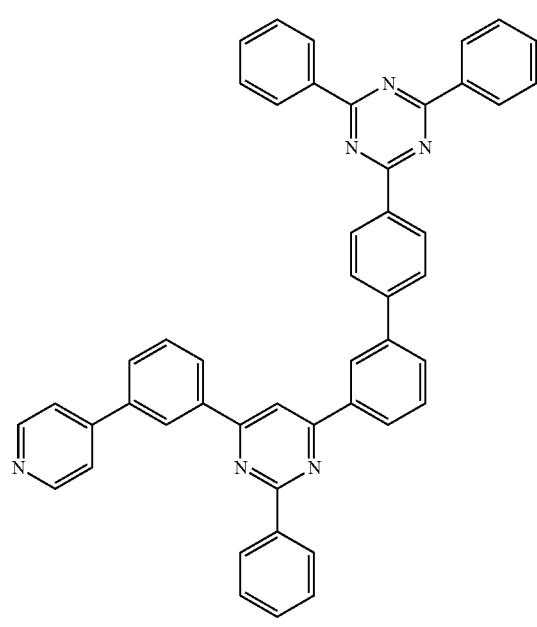
58
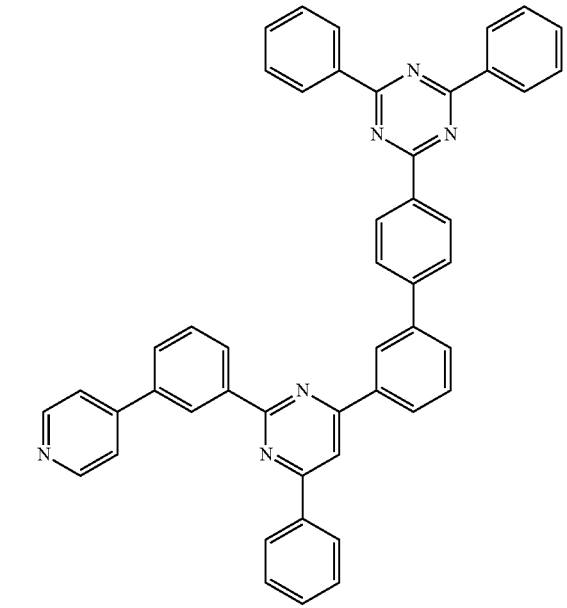
59
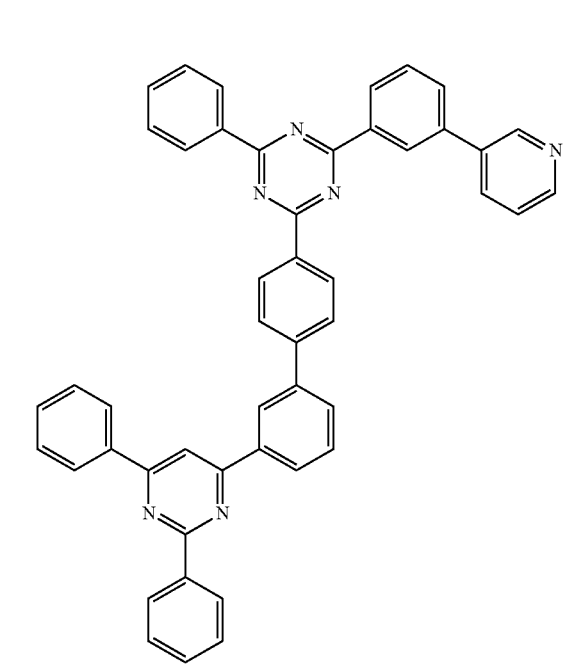

309
-continued
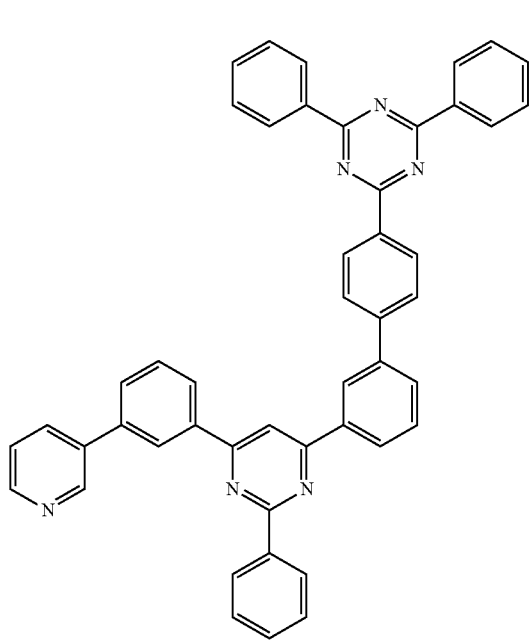
60
310
-continued
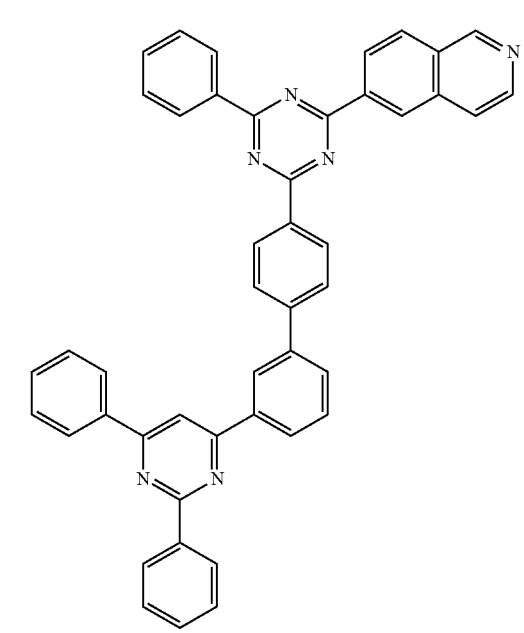
62
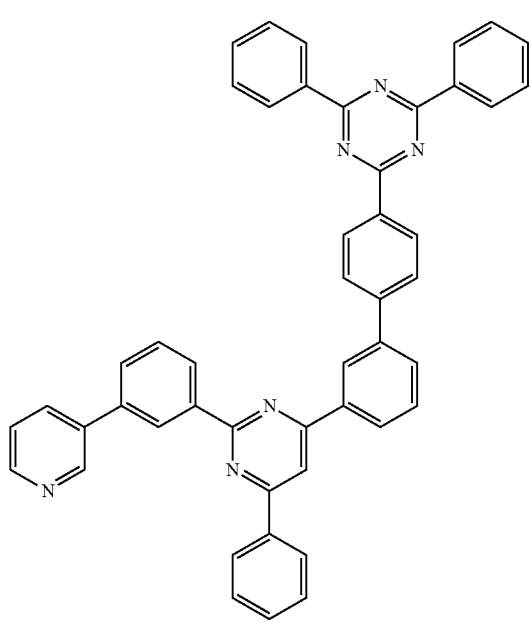
61
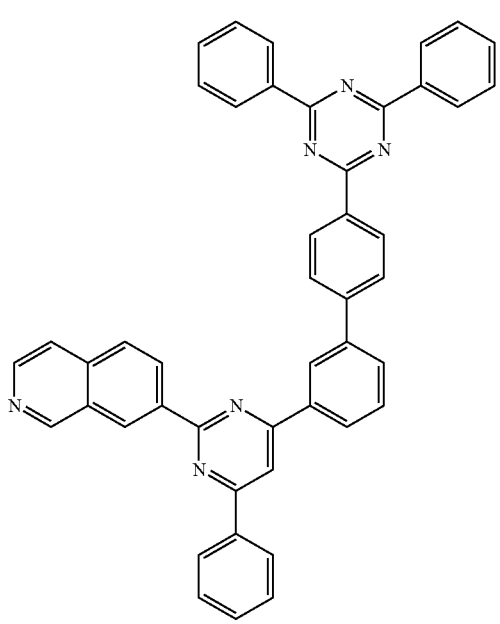
63

311
-continued
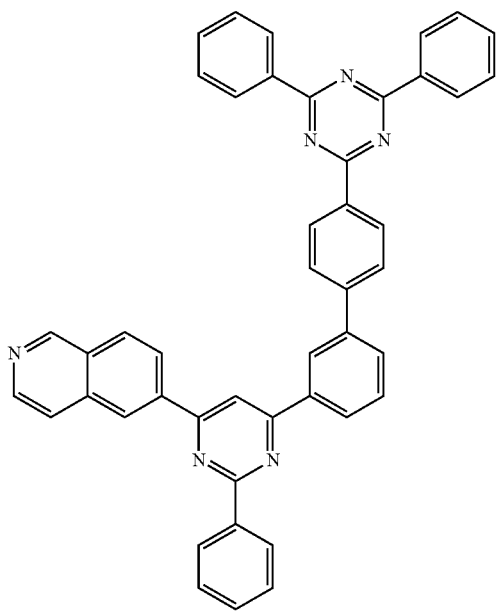
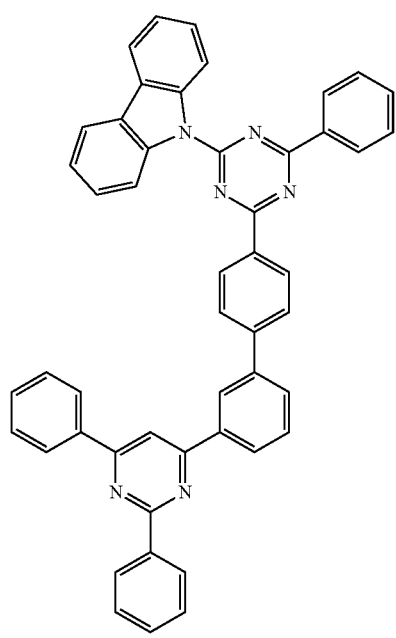
312
-continued
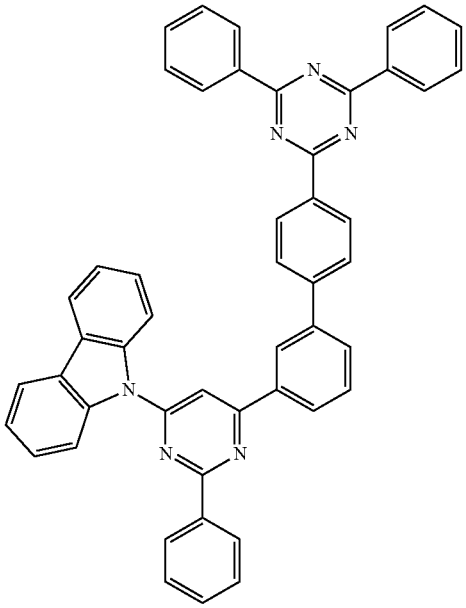
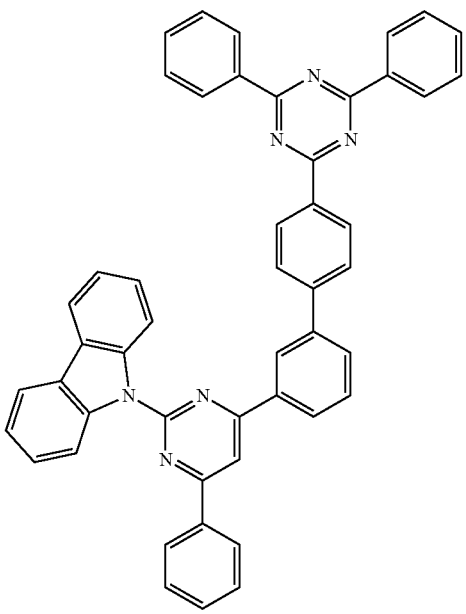

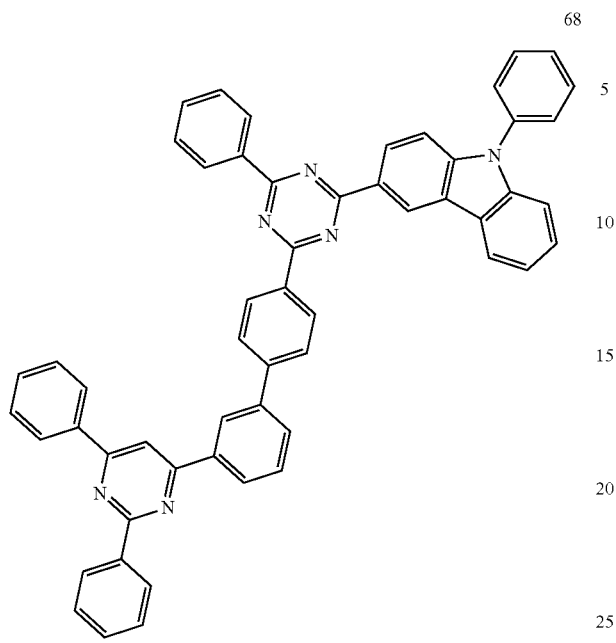
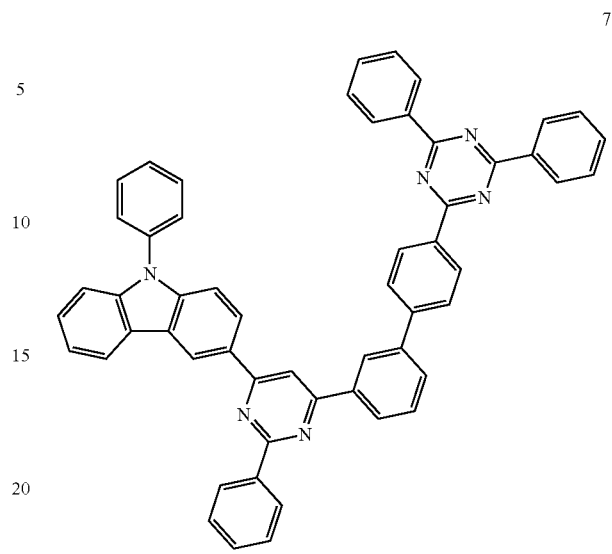
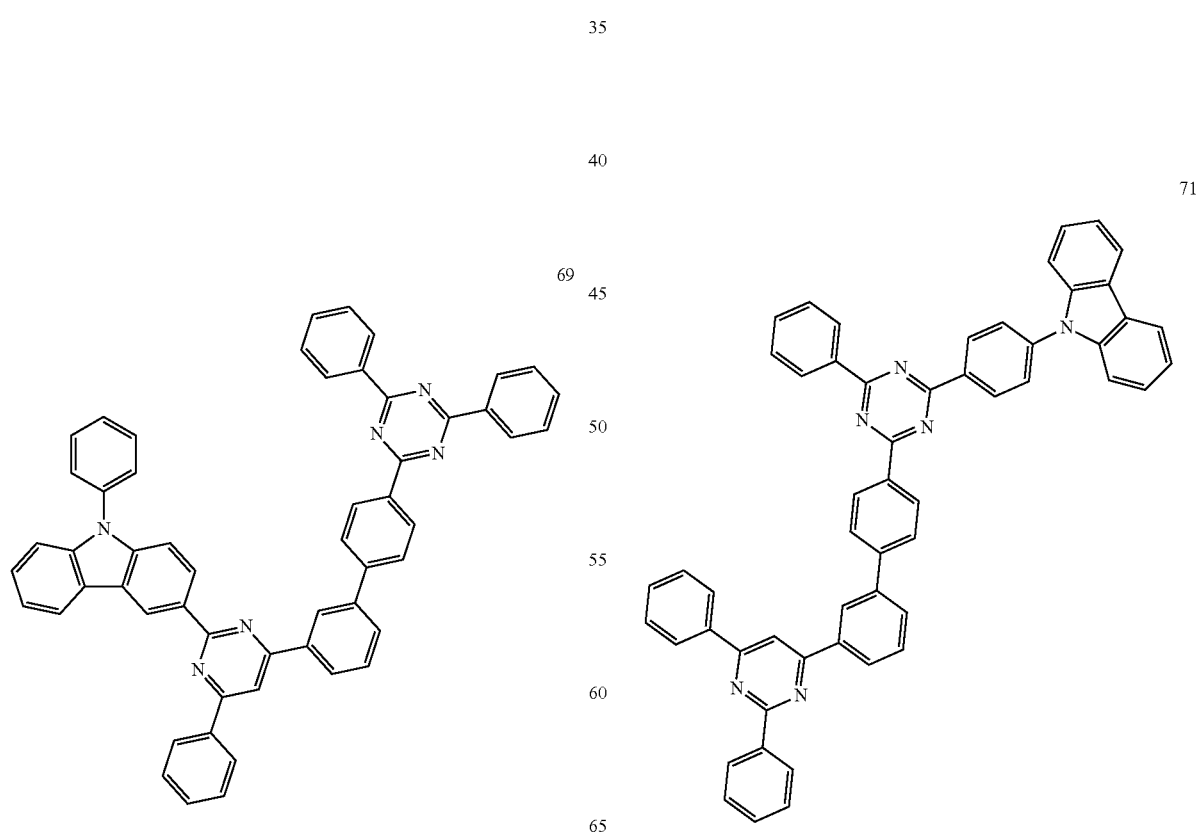

72
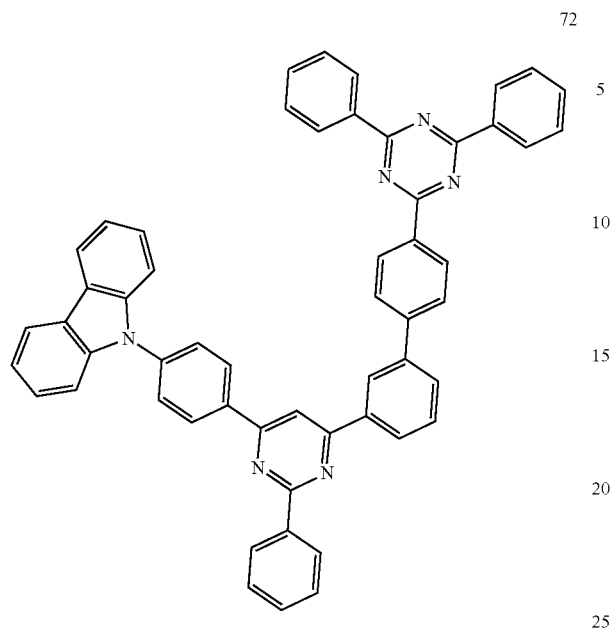
74
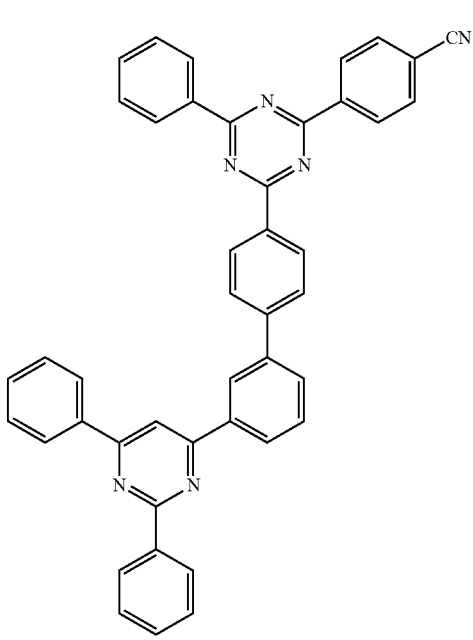
73
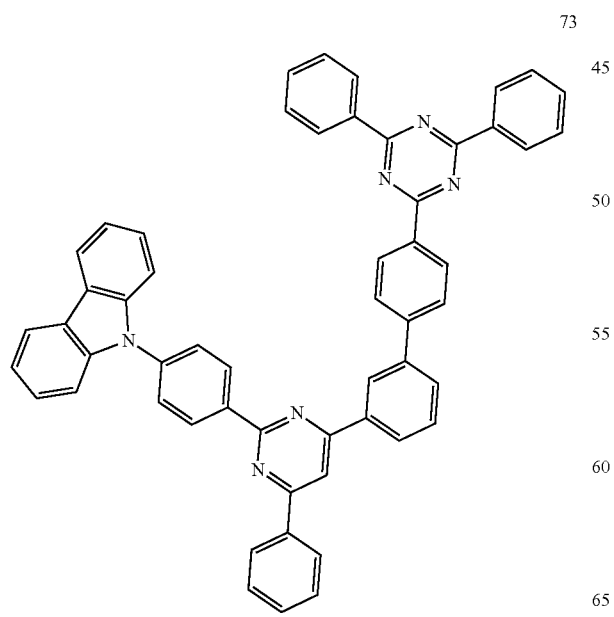
75
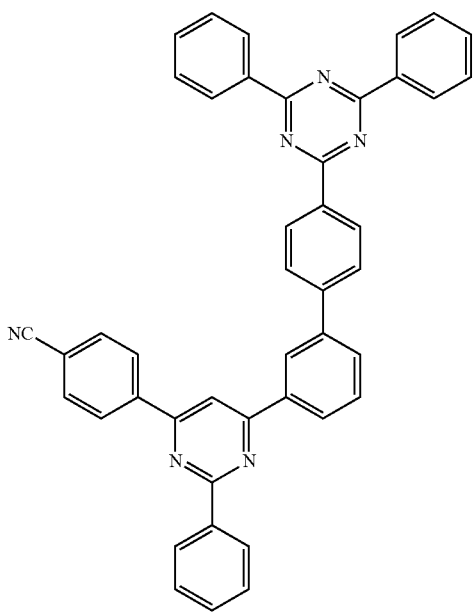

317
-continued
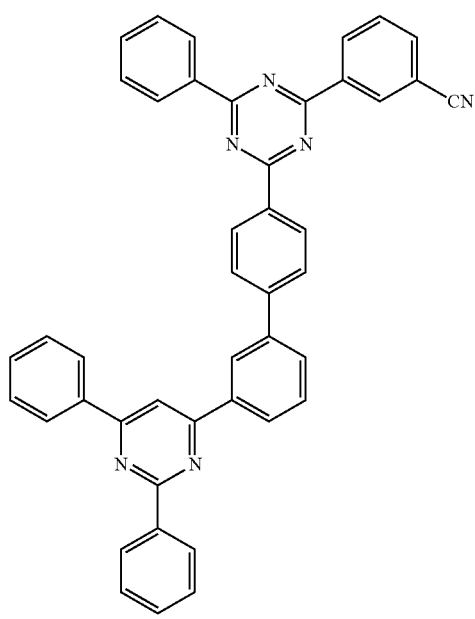
76
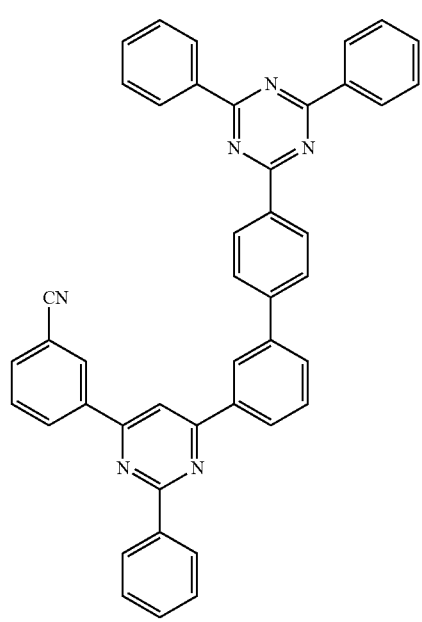
77
318
-continued
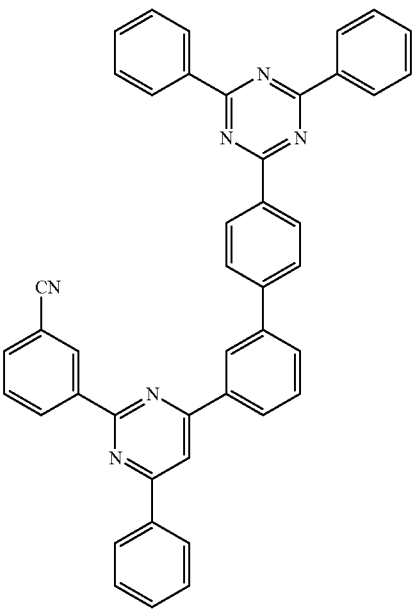
78
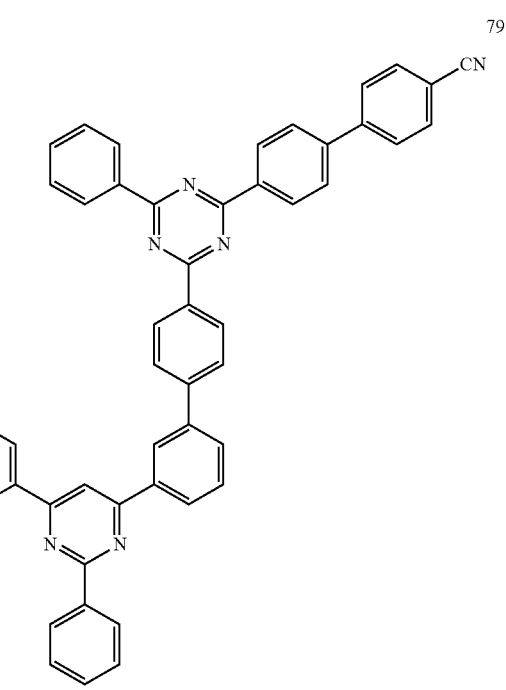
79

80
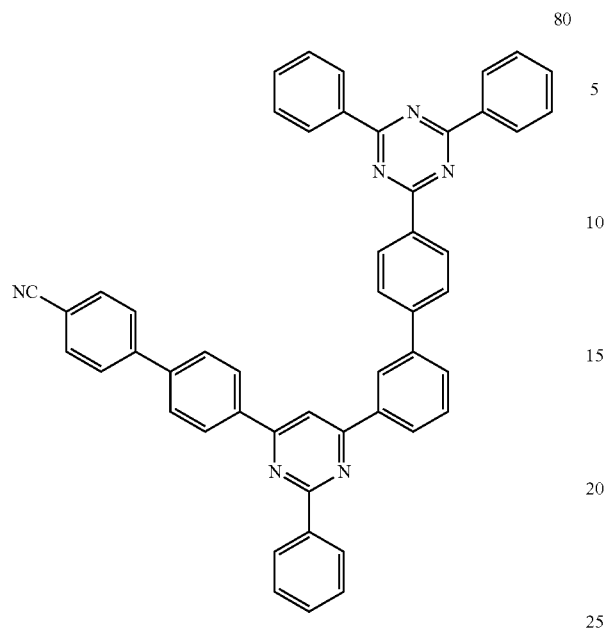
81
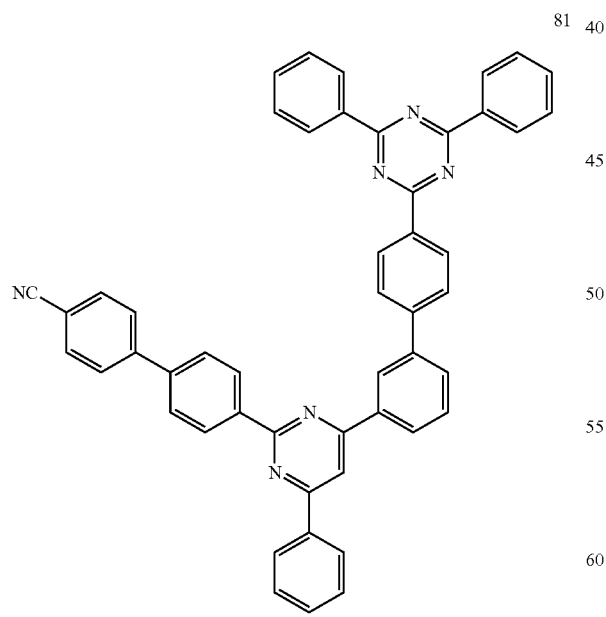
82
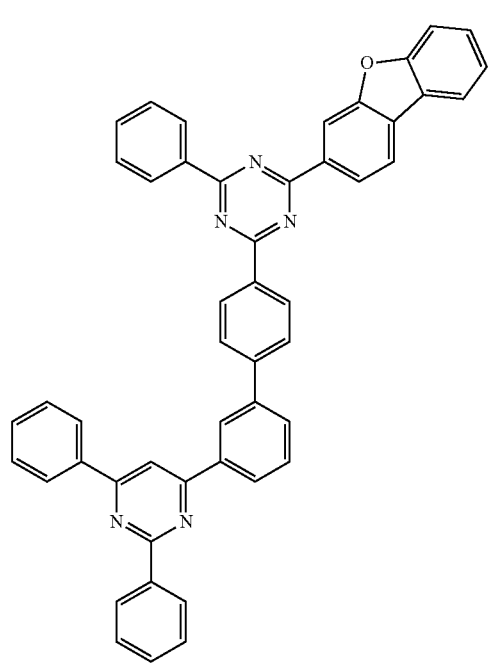
83
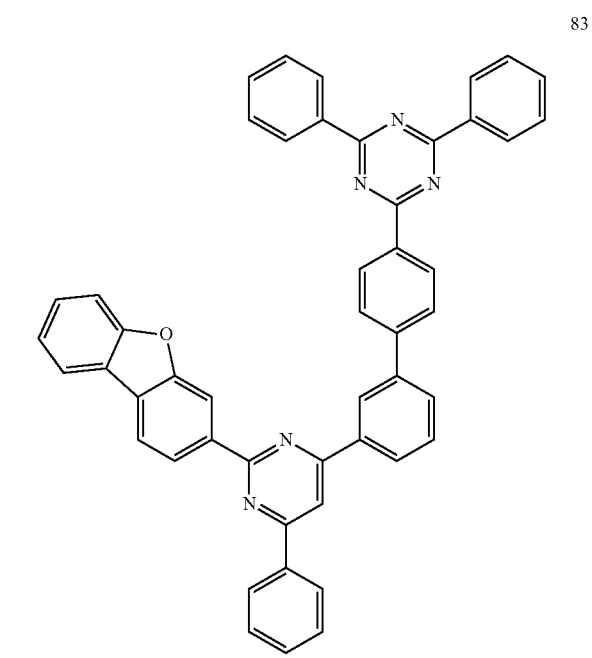

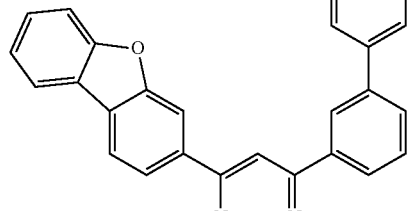
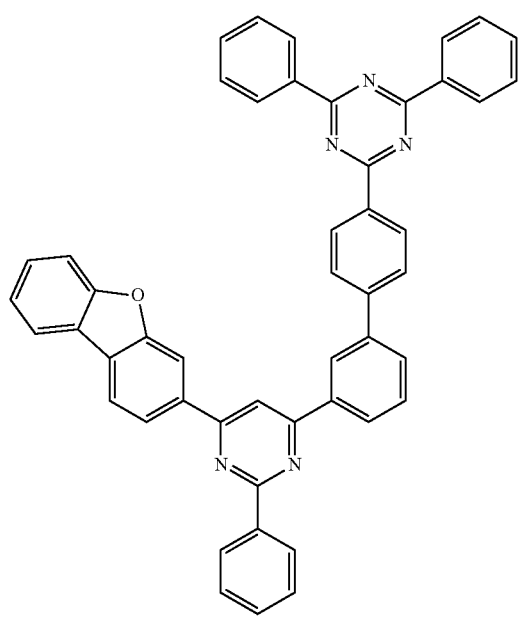
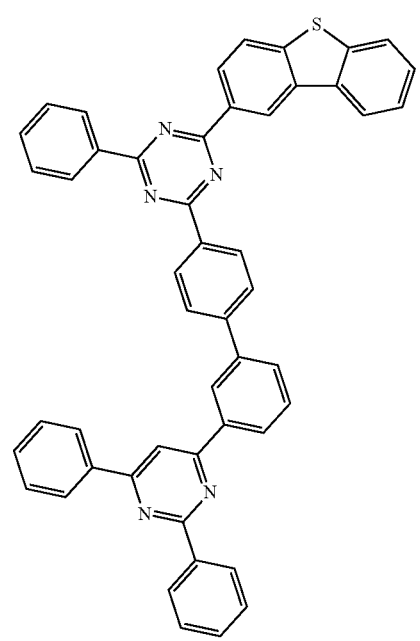
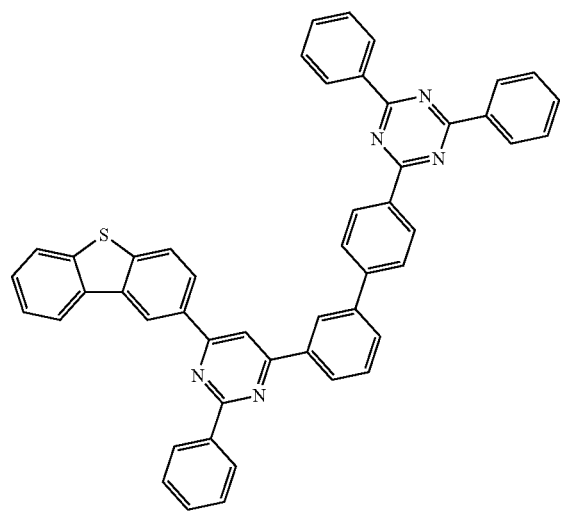
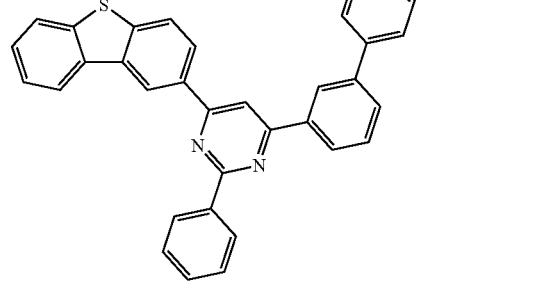
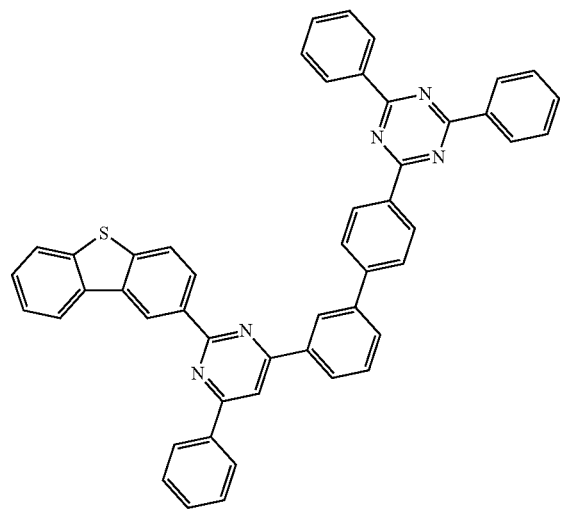

323
-continued
324
-continued
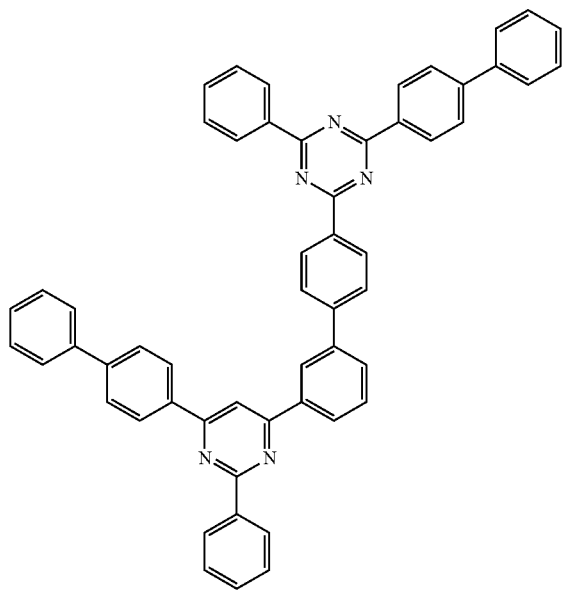
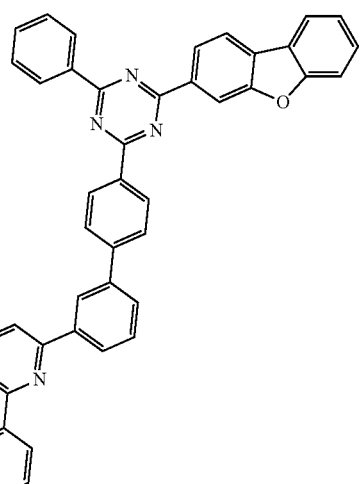

325
-continued
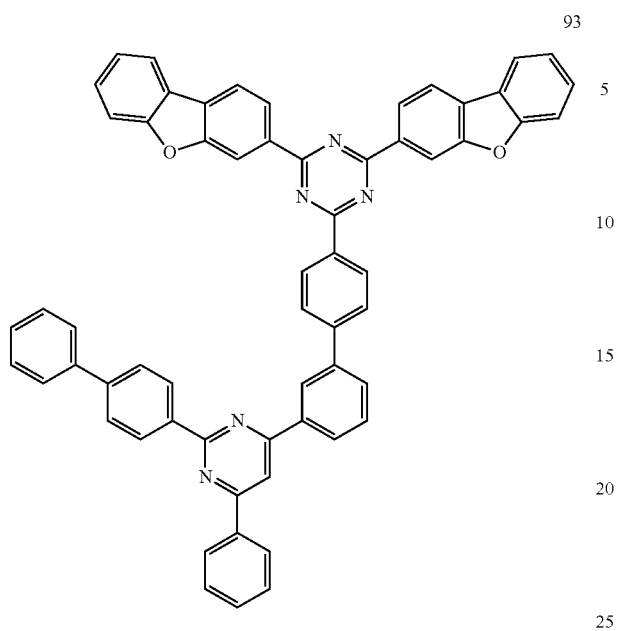
93
94
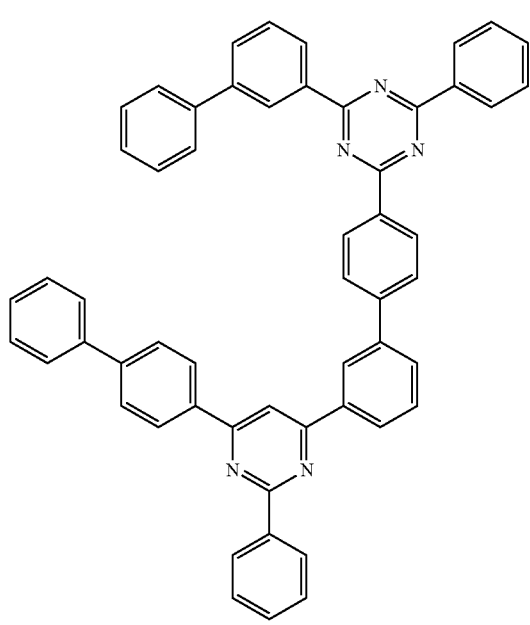
326
-continued
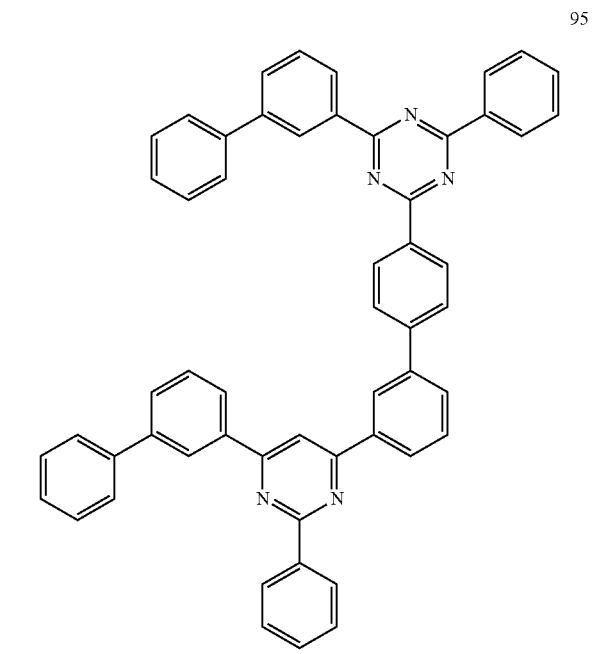
95
96
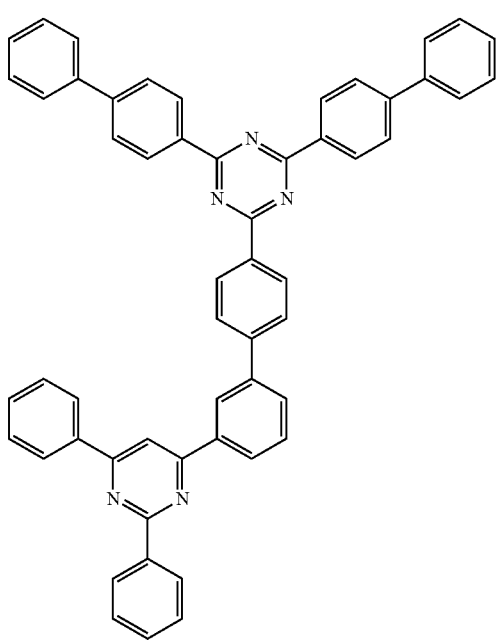

327
-continued
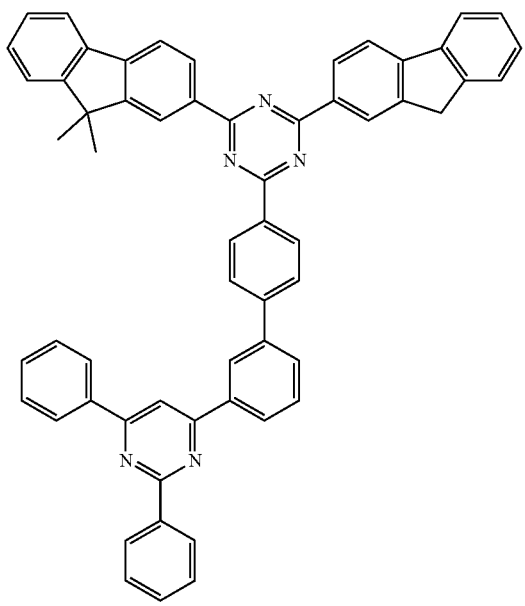
97
328
-continued
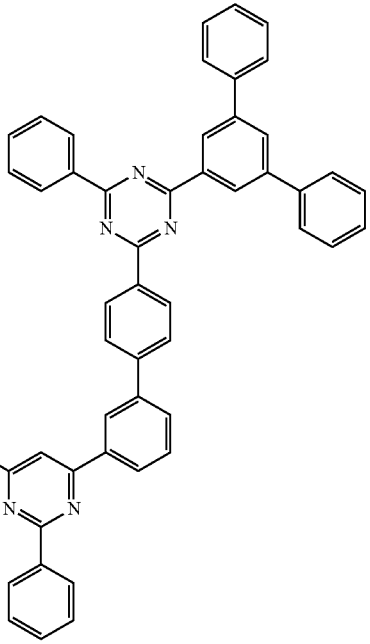
99
98
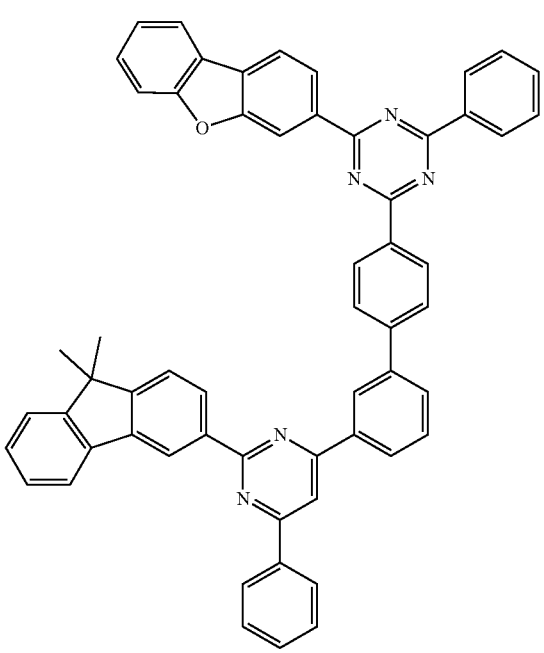
100
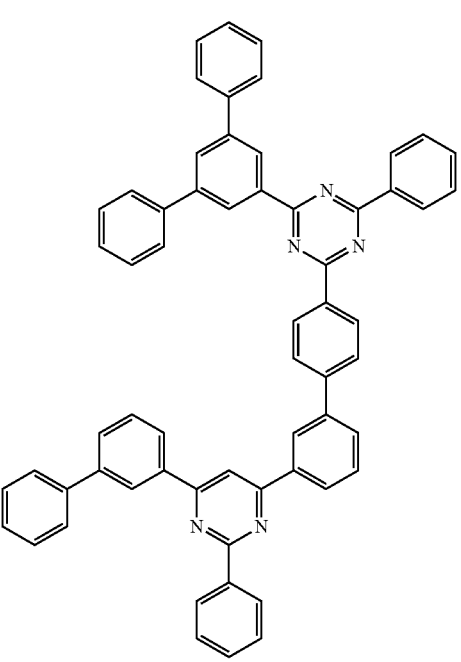

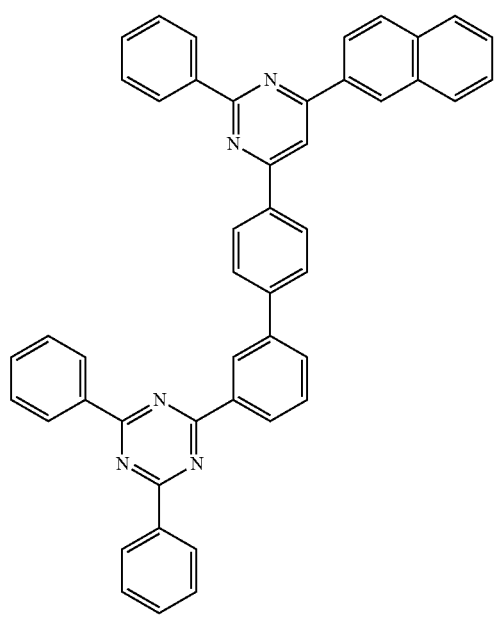
101
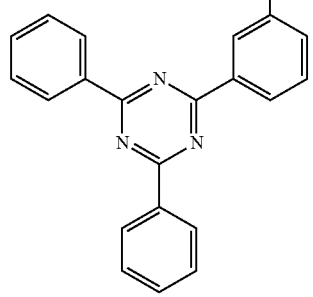
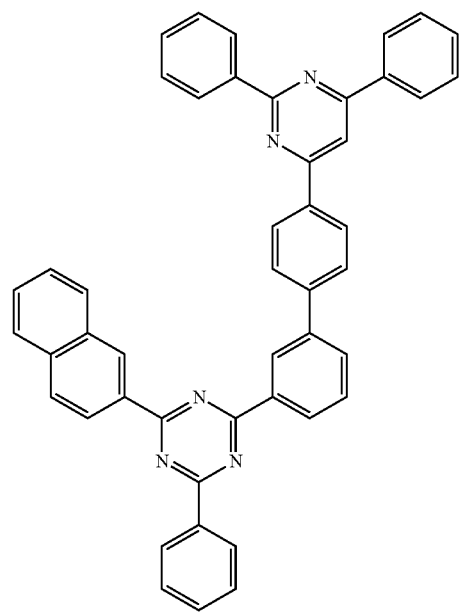
102
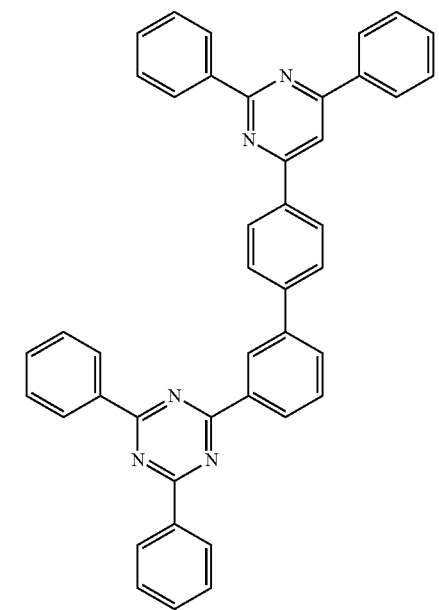
103
104

331
-continued
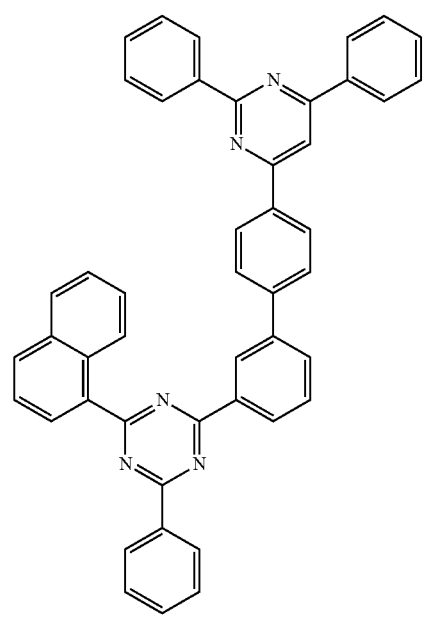
105
332
-continued
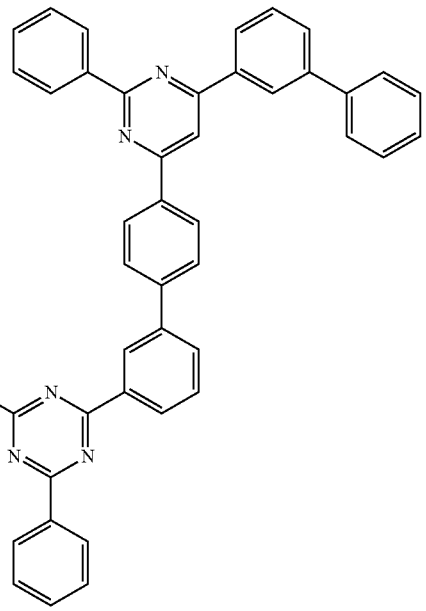
107
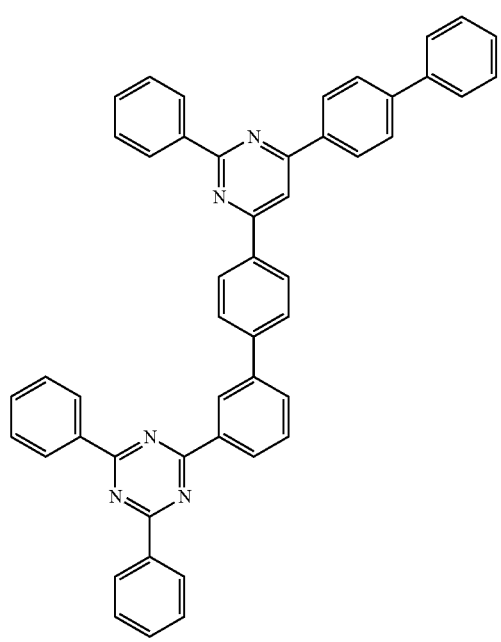
106
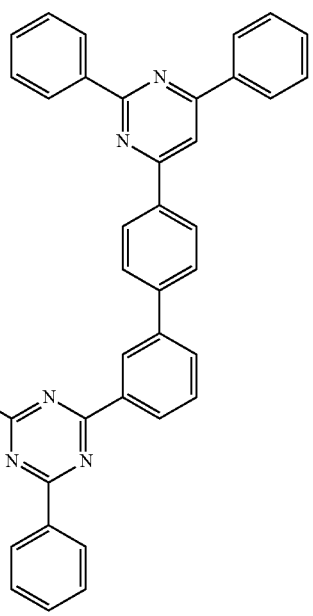
108

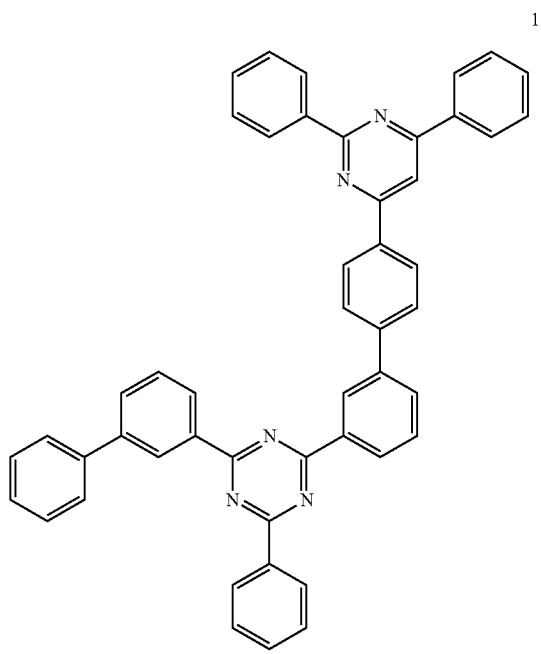
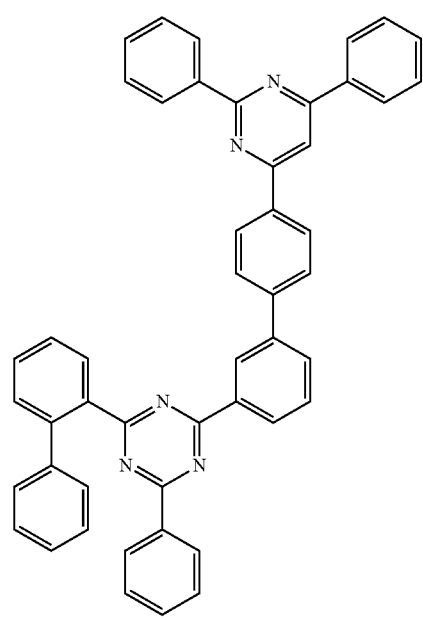
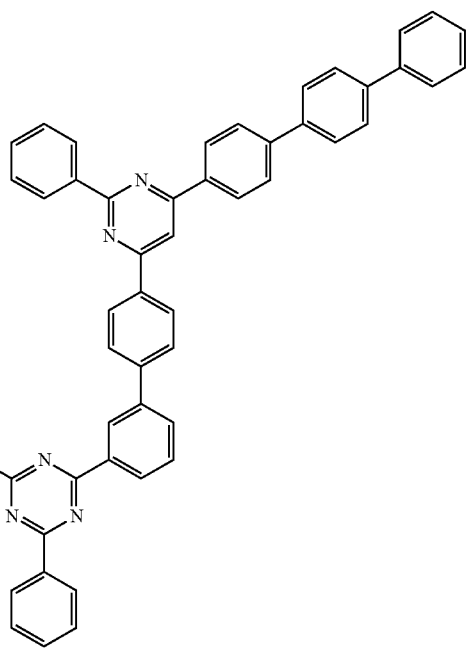
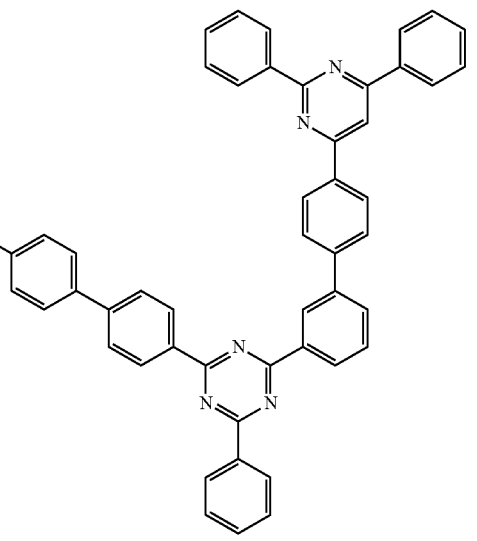

113
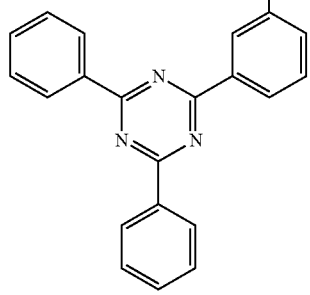
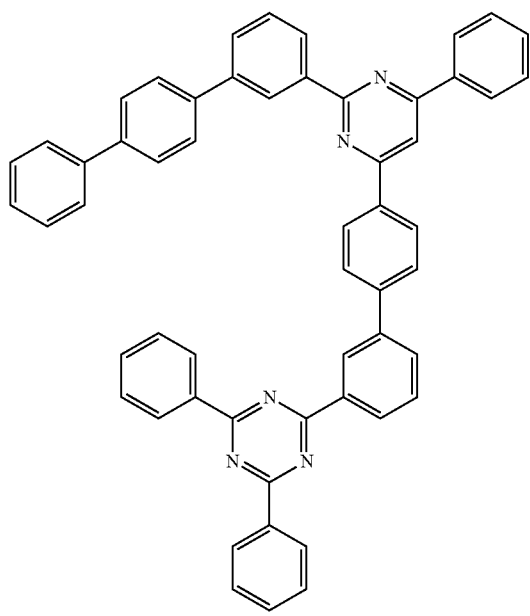
115
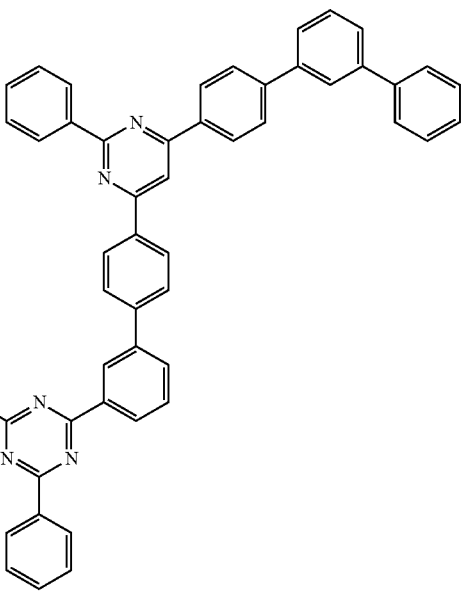
114
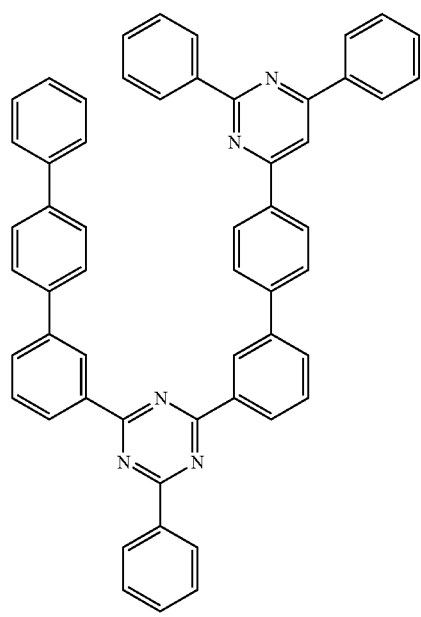
116
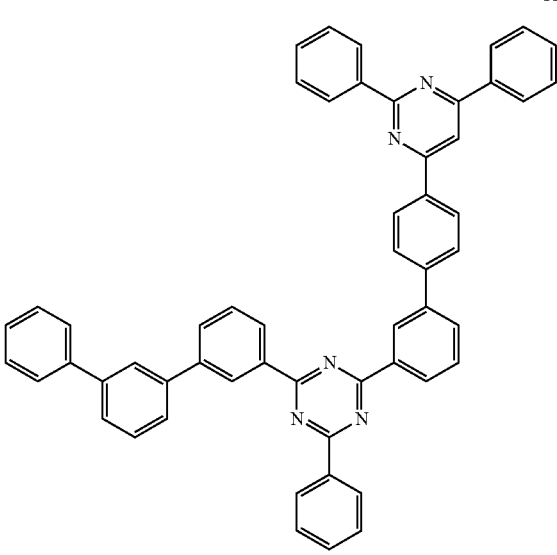

117
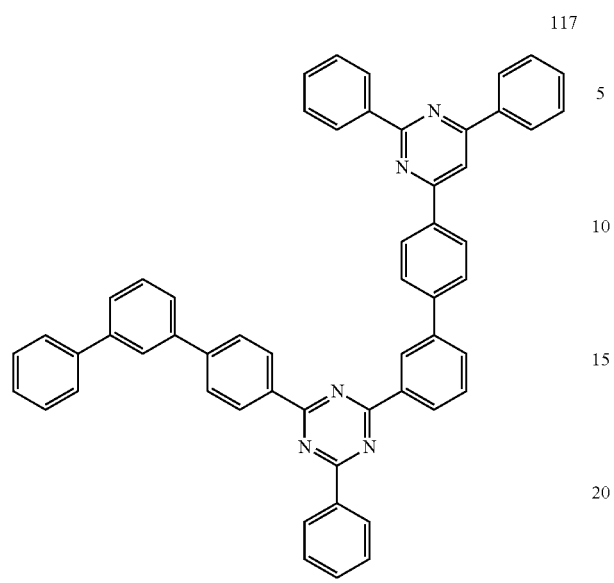
118
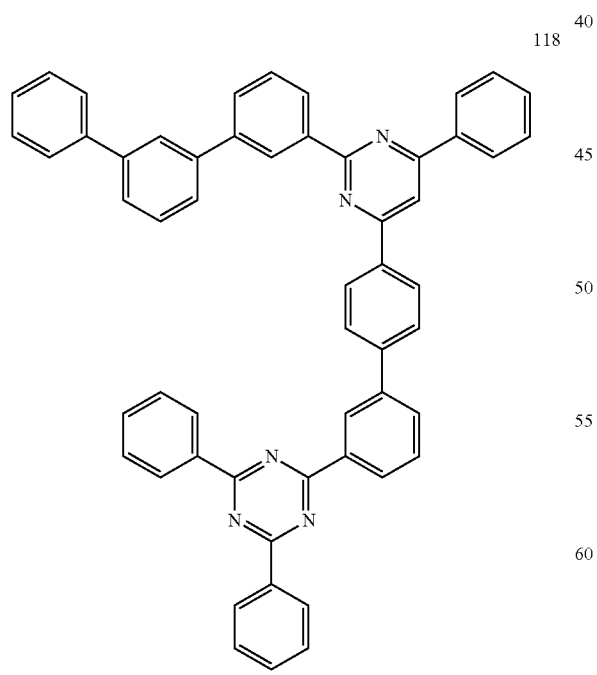
119
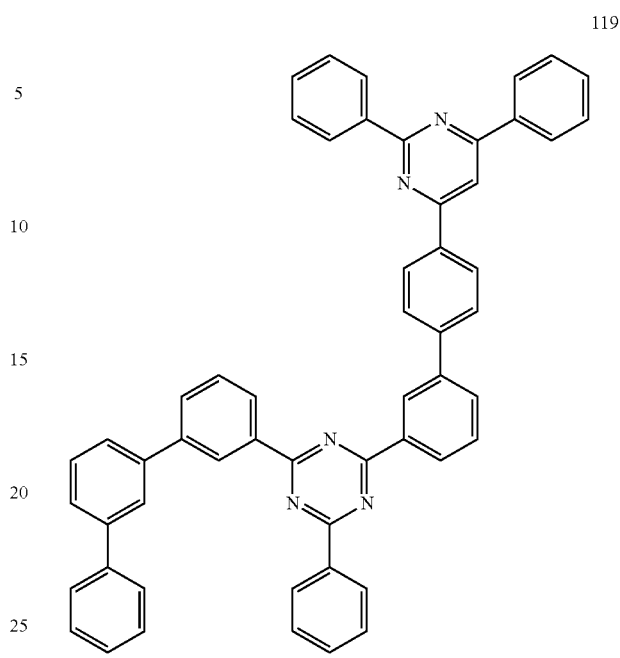
120
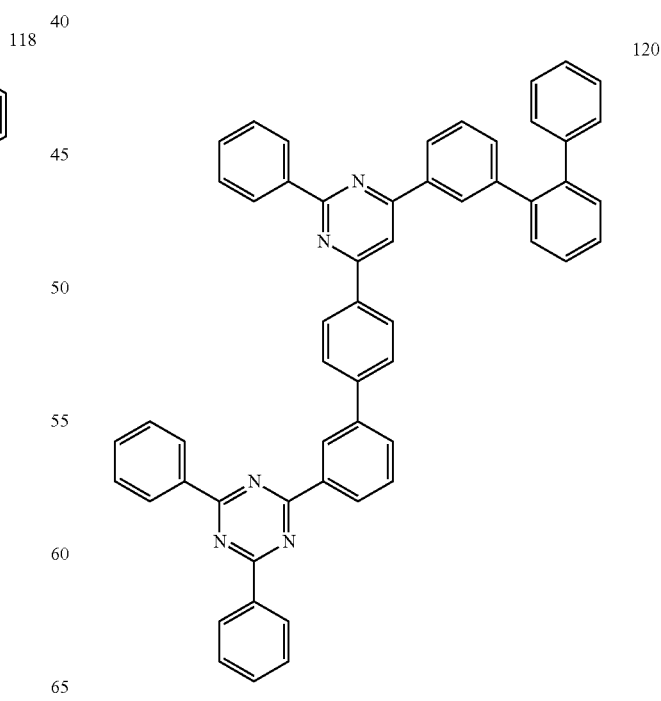

339
-continued
121
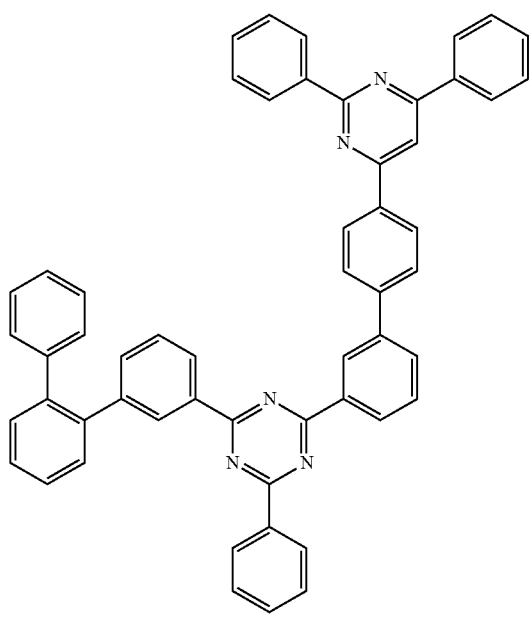
340
-continued
123
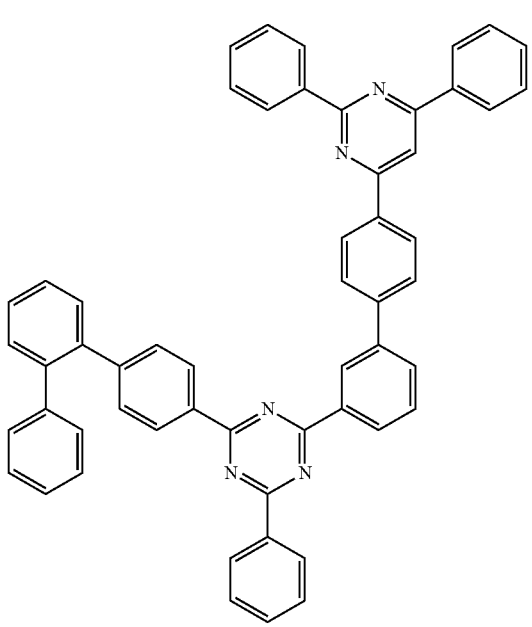
122
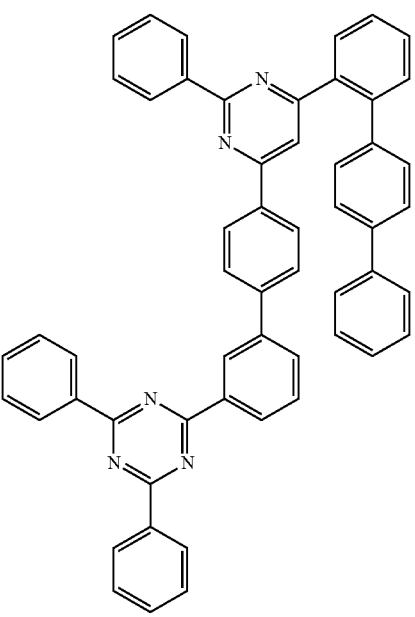
124
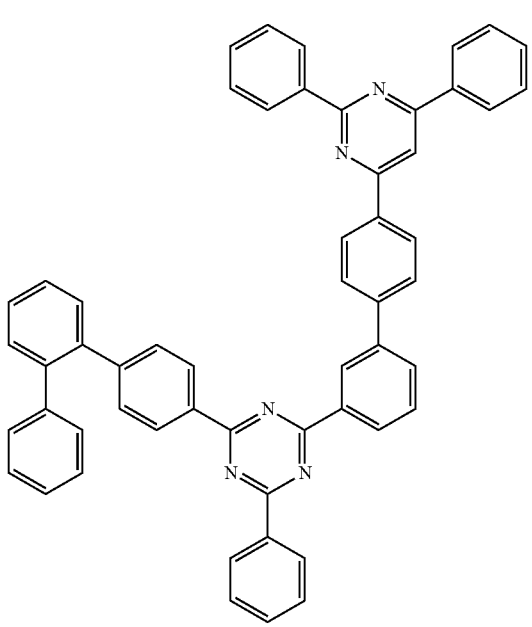

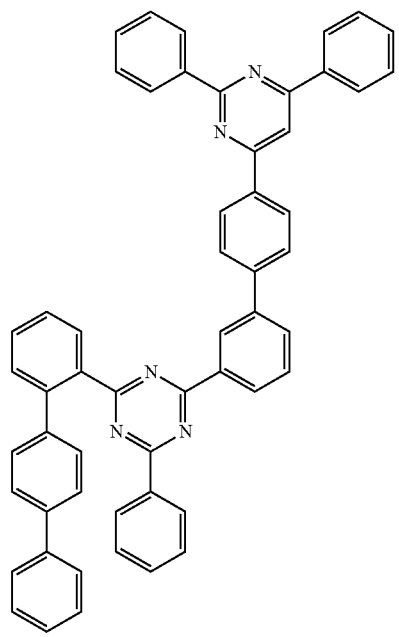
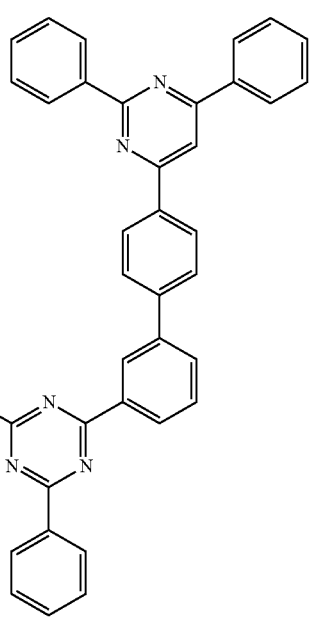

129
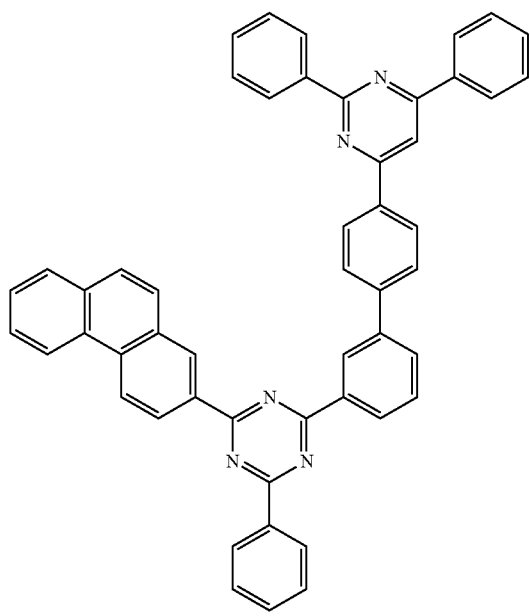
131
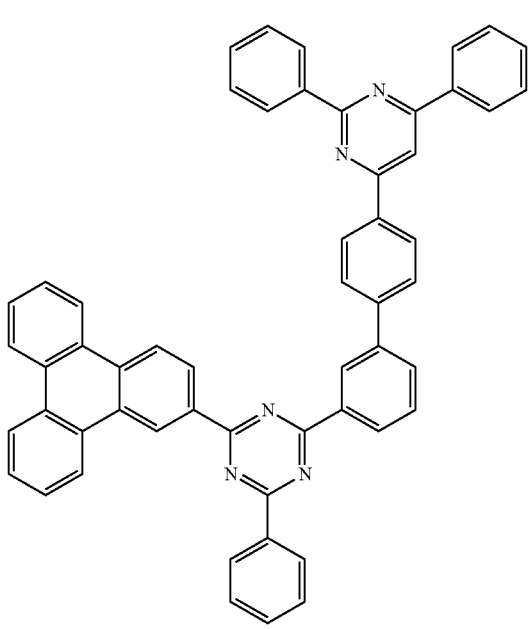
130
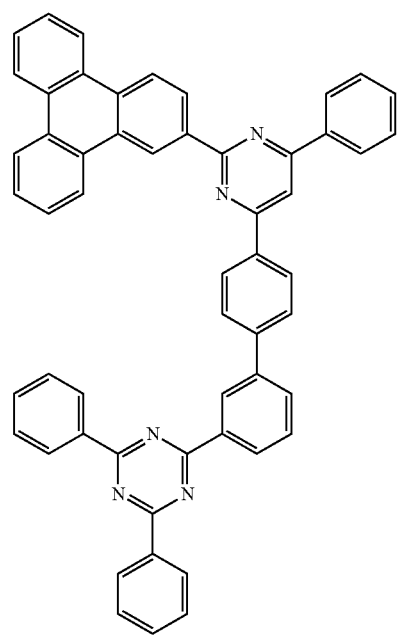
132
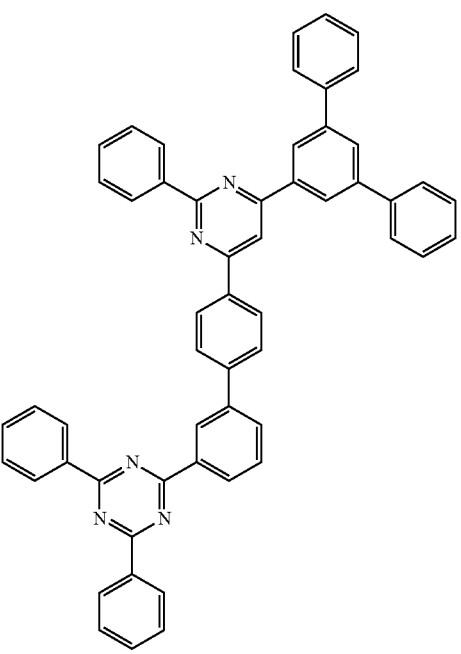

133
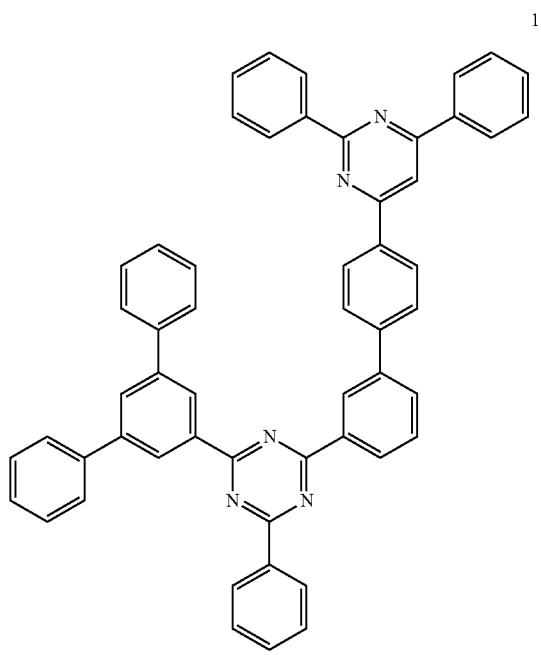
134
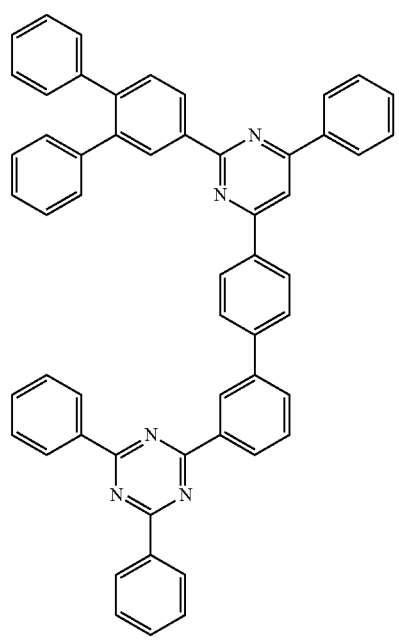
135
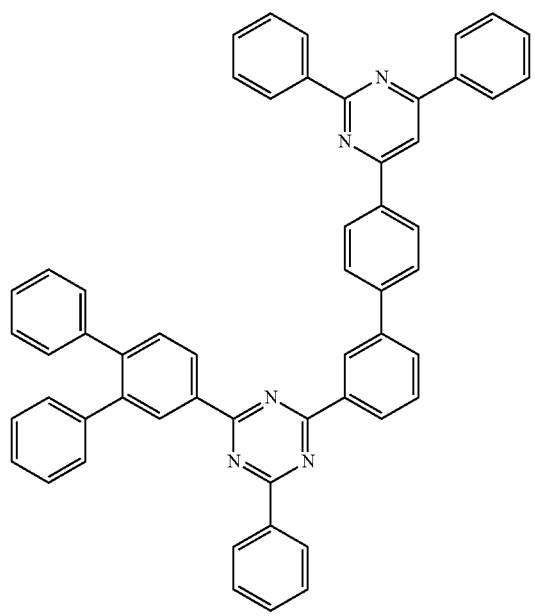
136
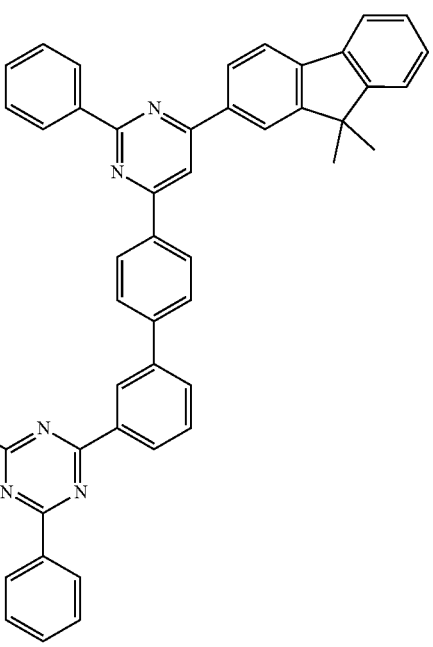

137
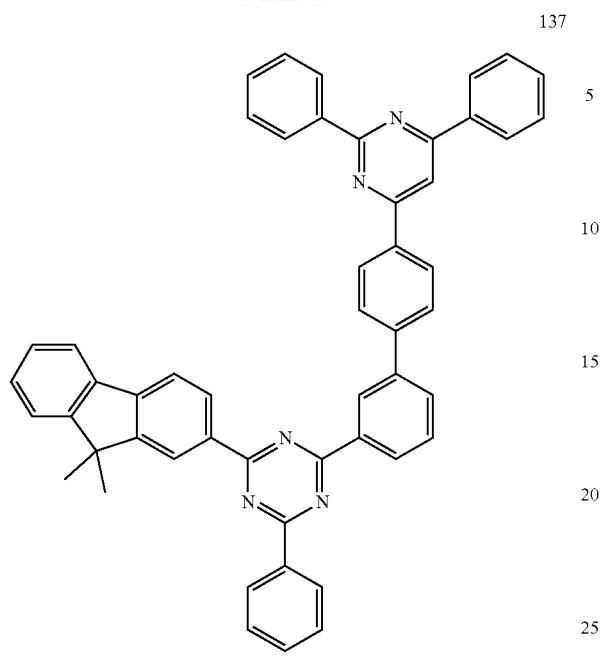
138
139
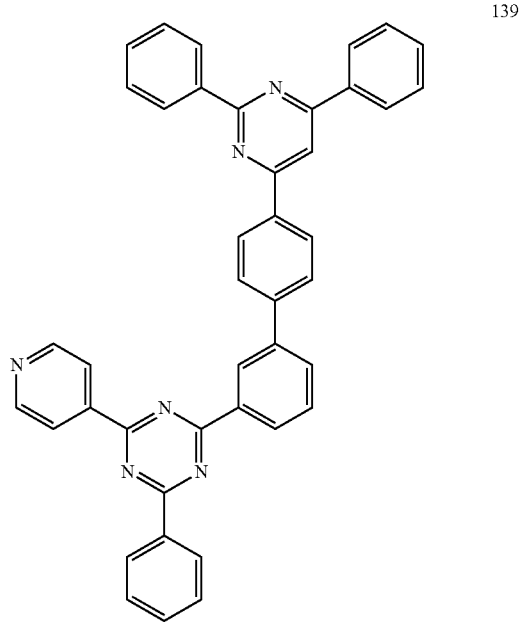
140
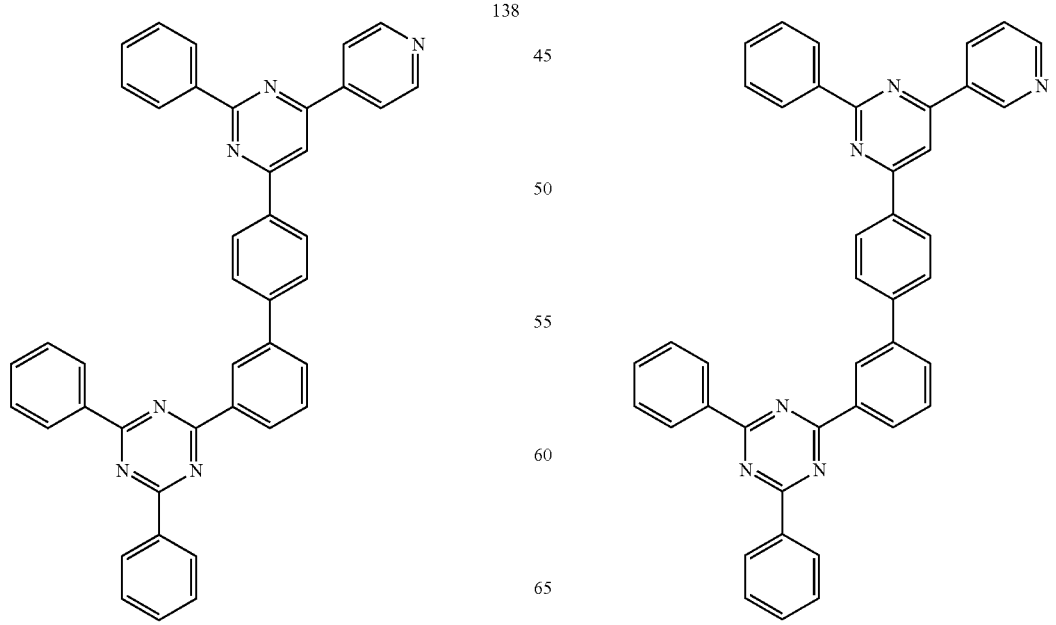

-continued
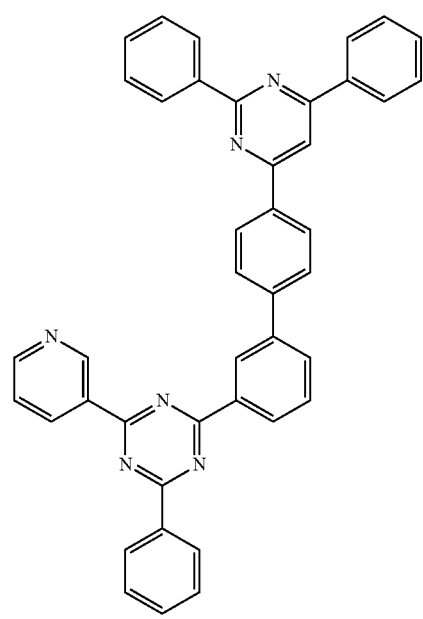
141
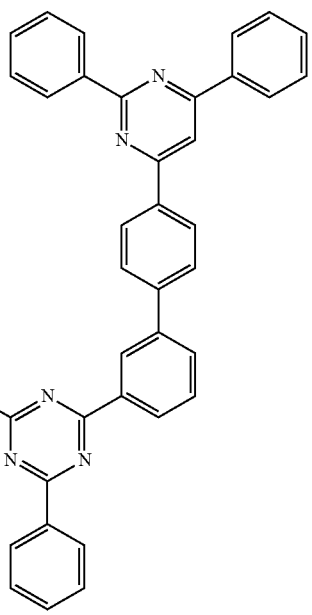
143
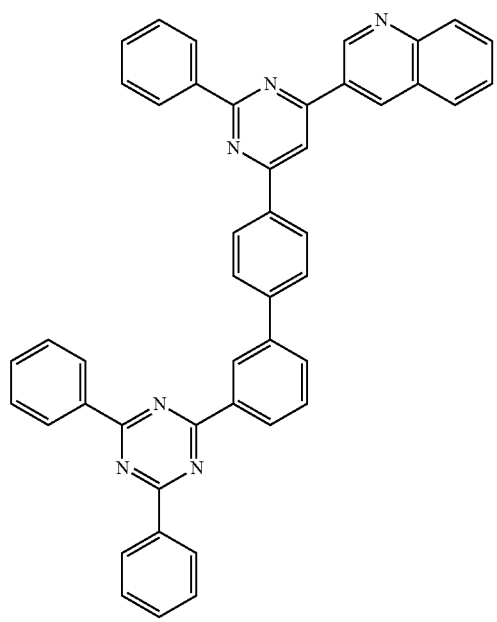
142
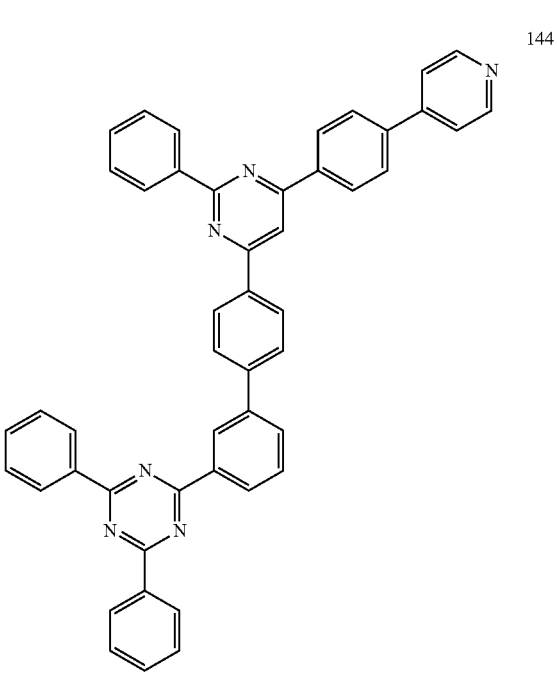
144

351
-continued
352
-continued
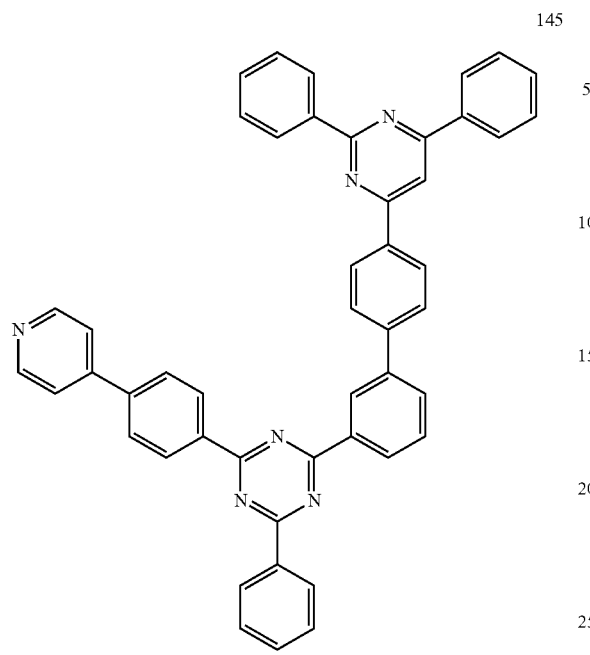
145
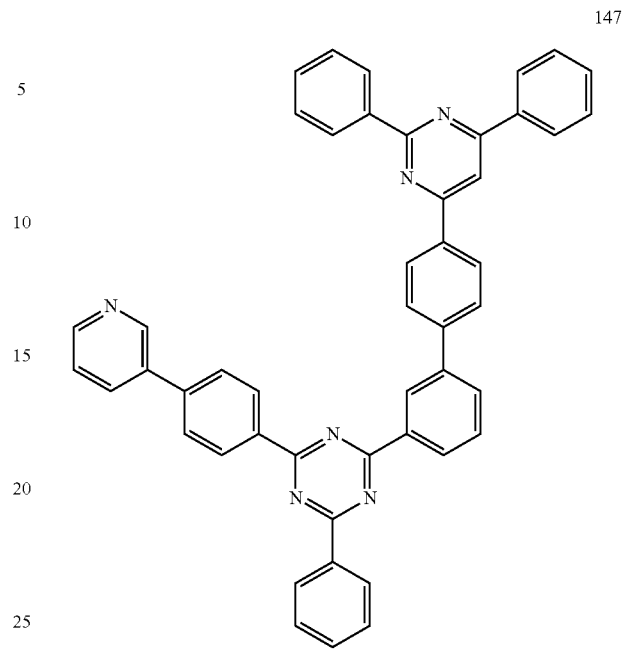
147
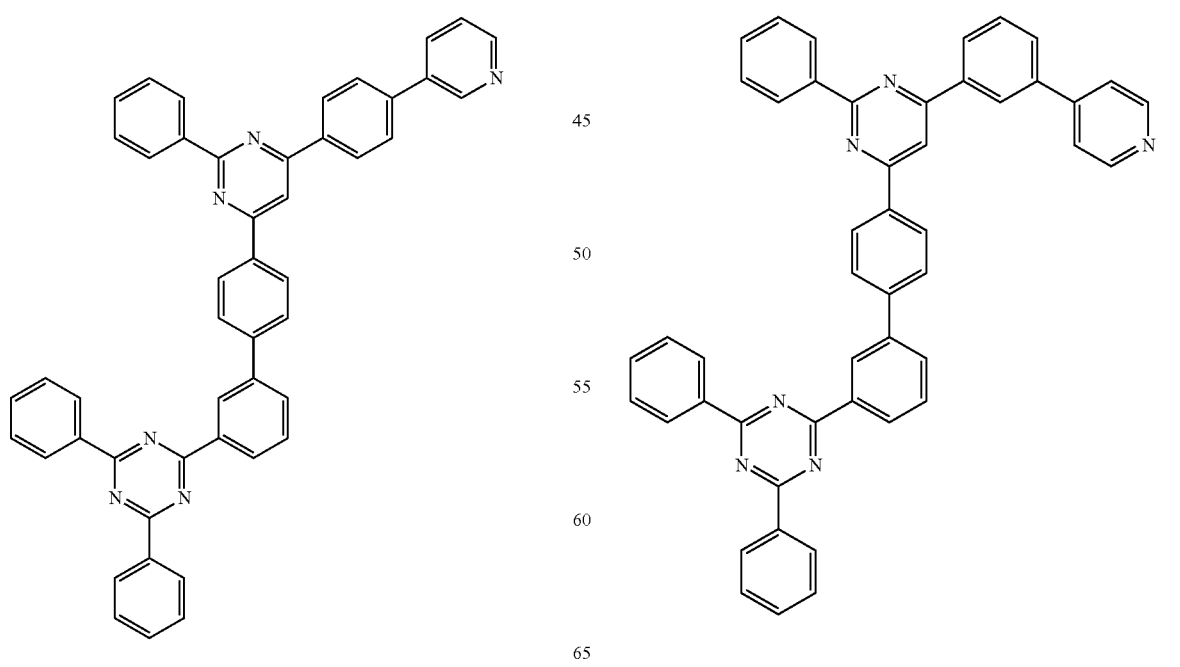

353
-continued
149
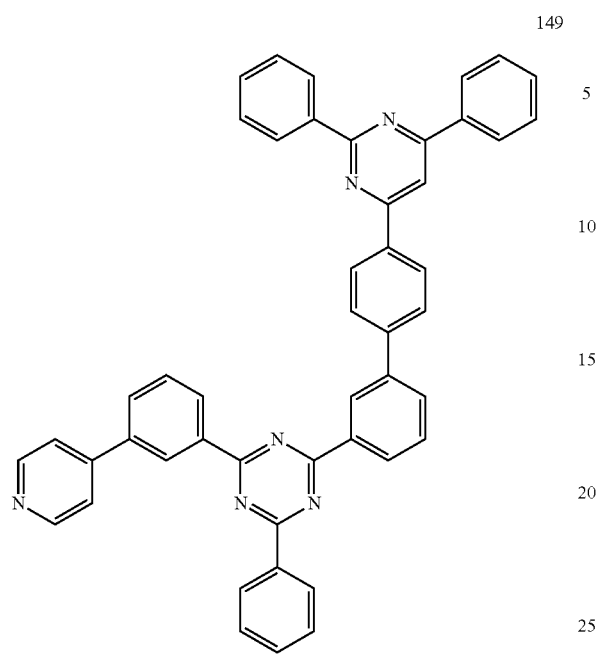
354
151
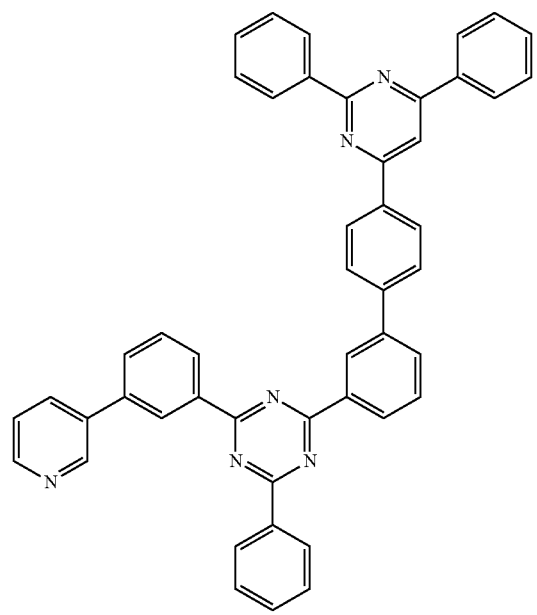
150
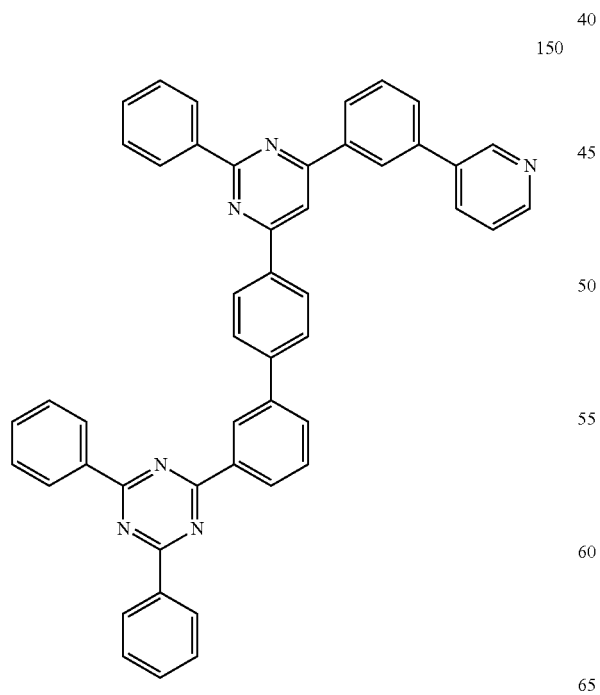
152
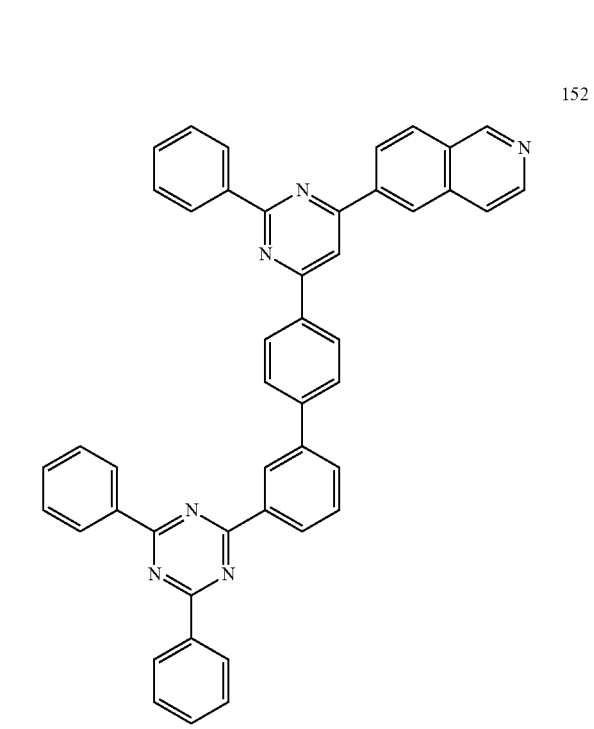

153
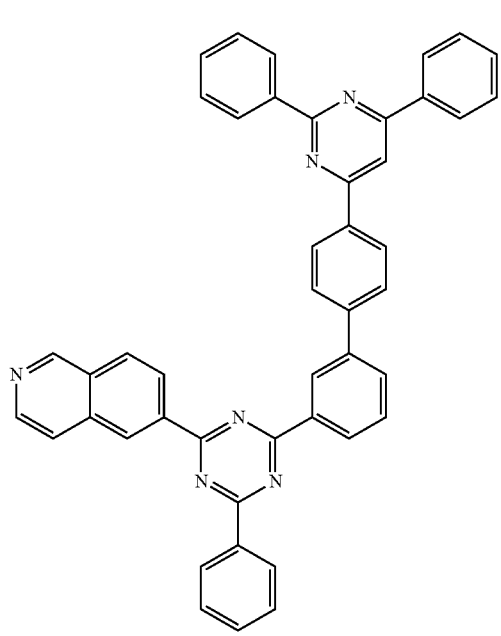
154
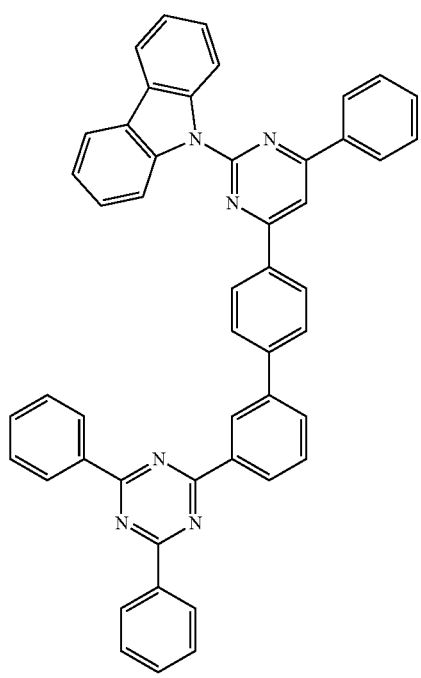
155
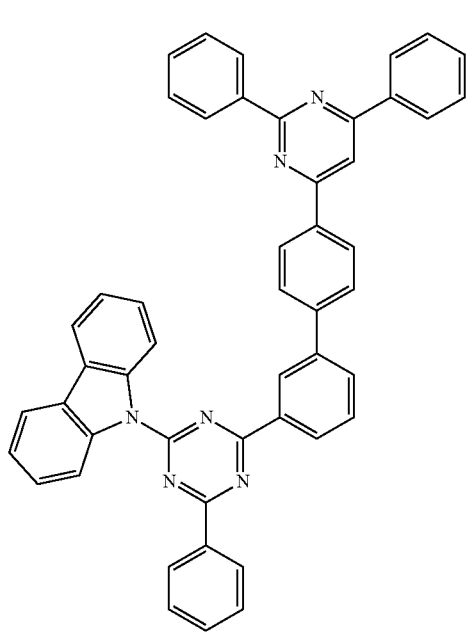
156
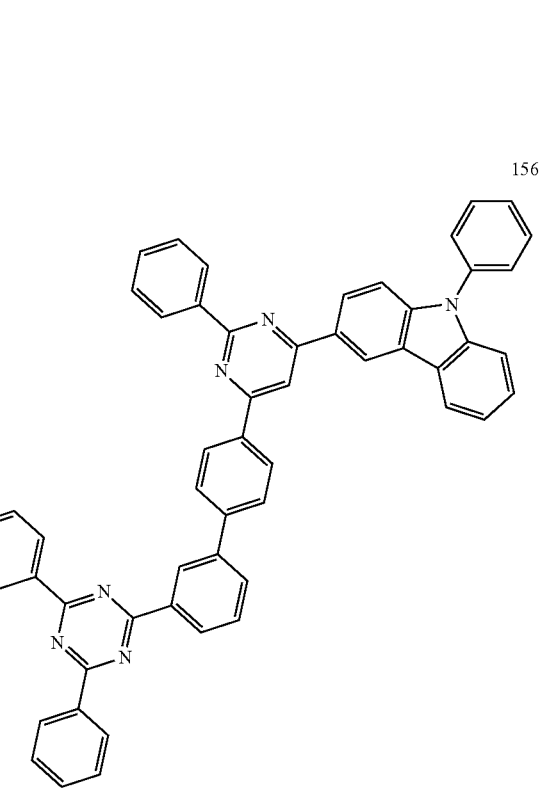

-continued
157
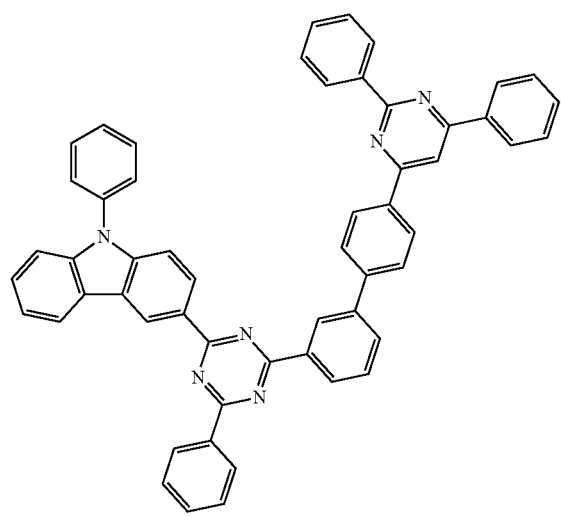
158
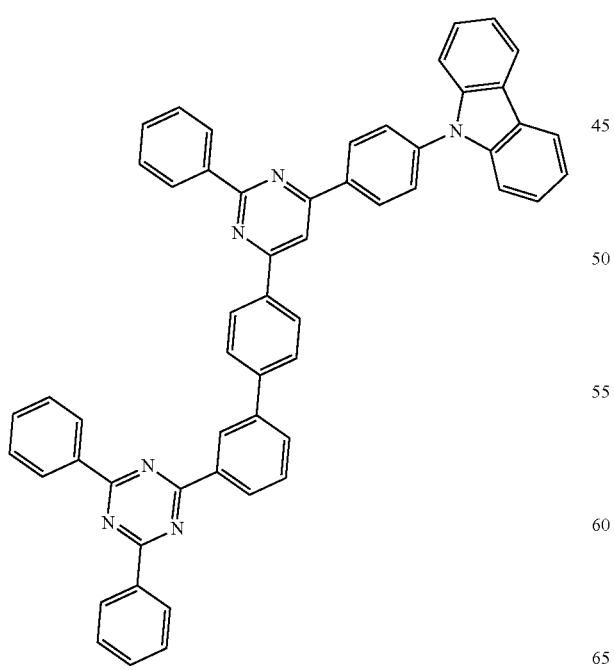
-continued
159
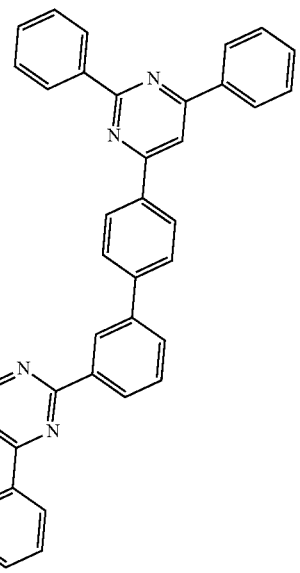
160
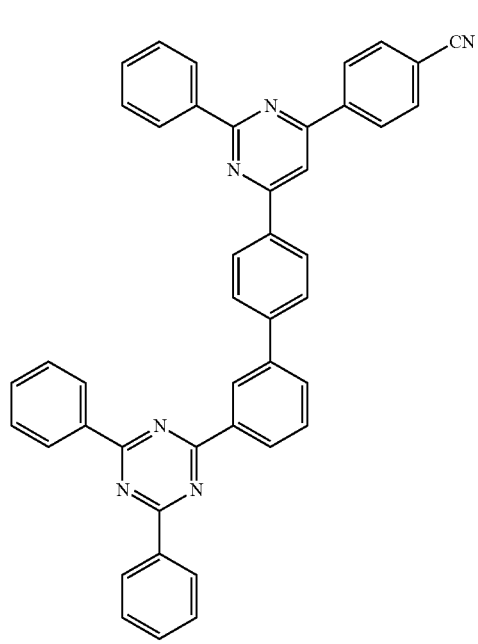

359
-continued
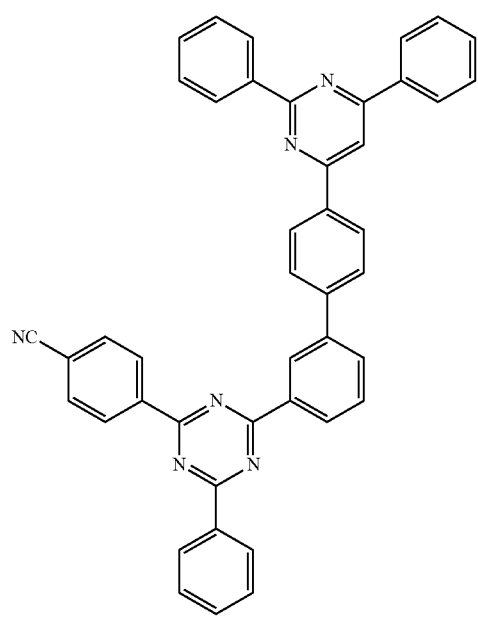
161
360
-continued
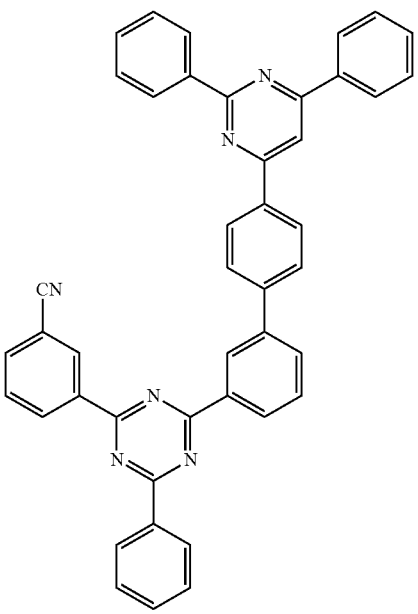
163
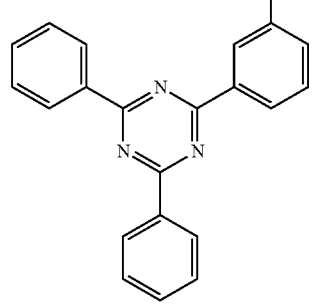
162
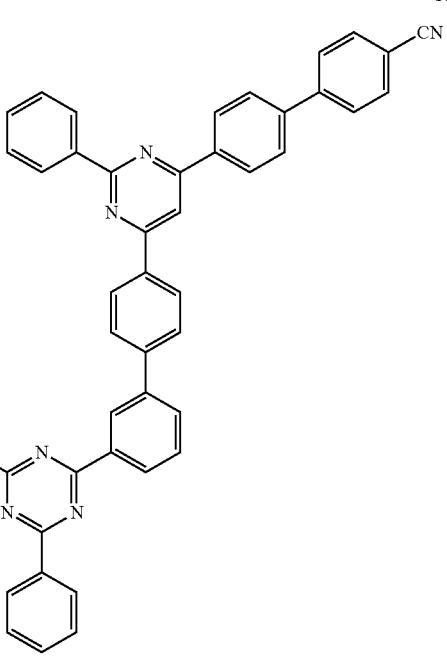
164

361
-continued
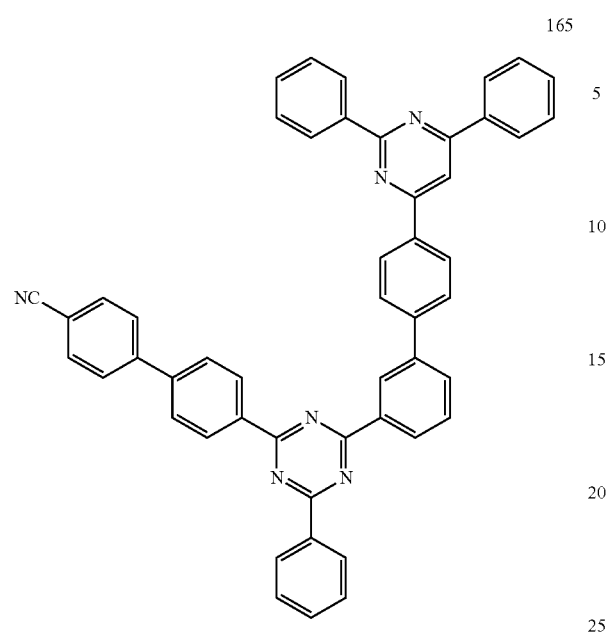
165
362
-continued
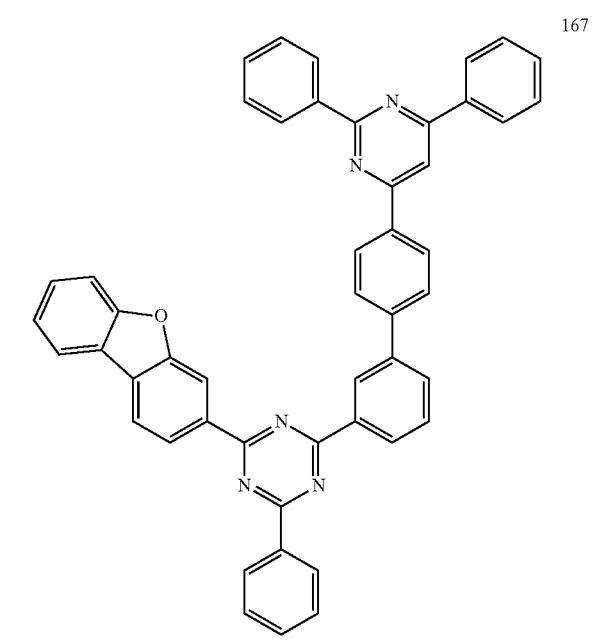
167
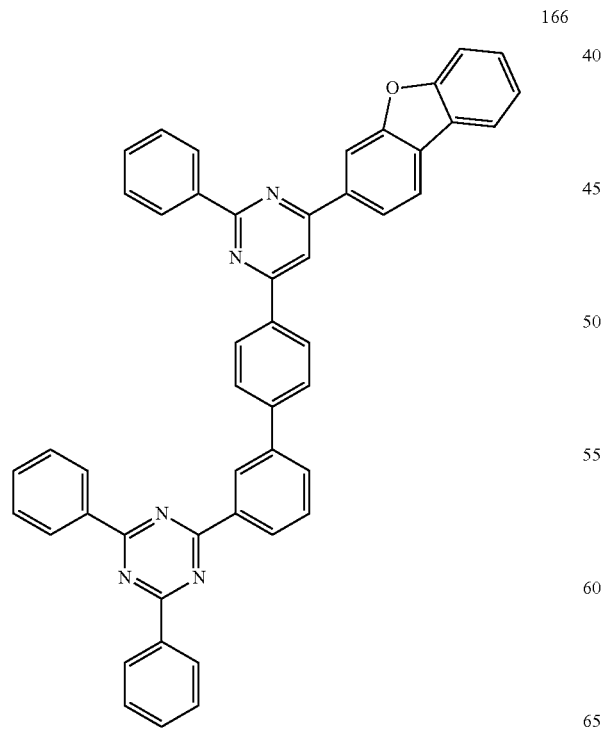
166
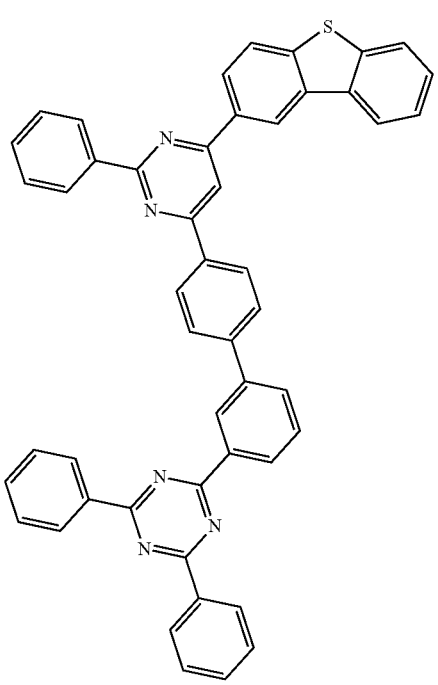
168

363
-continued
169
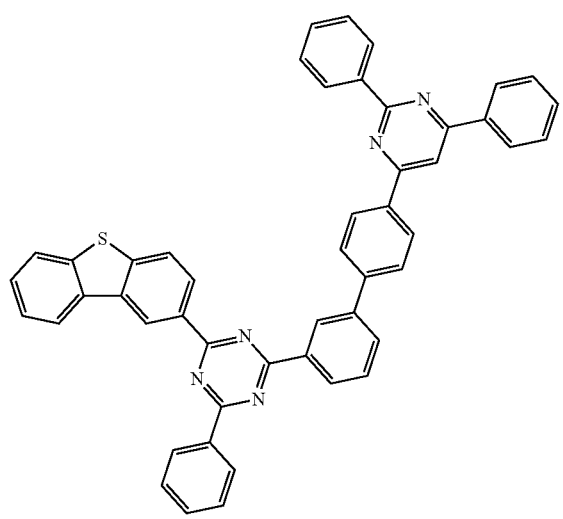
170
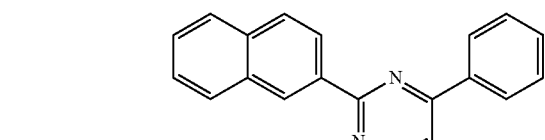
171
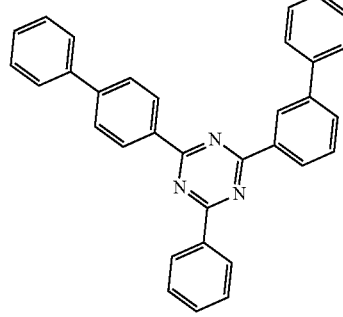
364
-continued
172
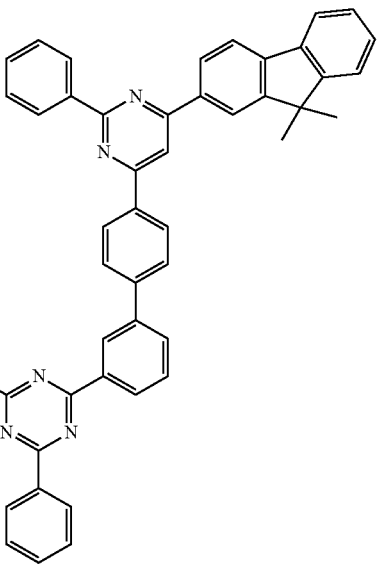
173
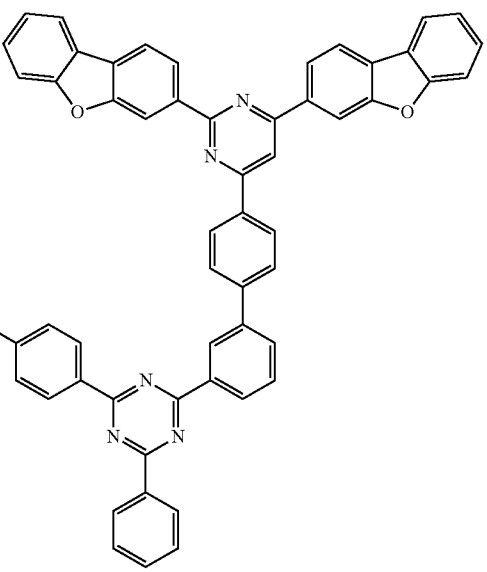

-continued
174
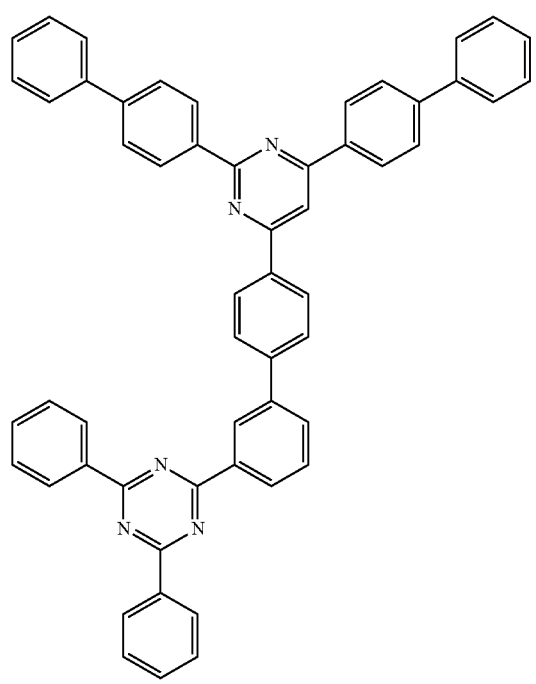
176
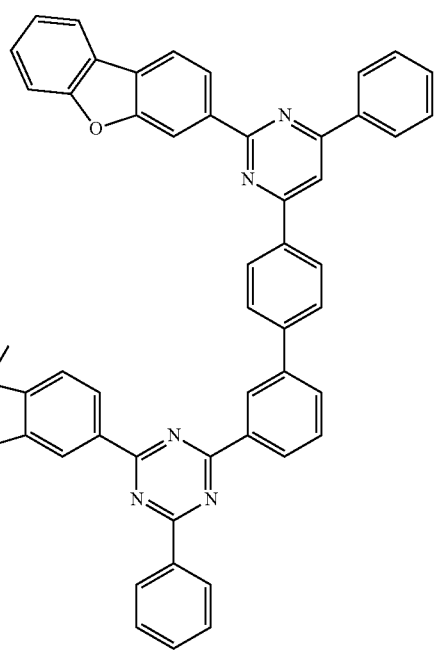
175
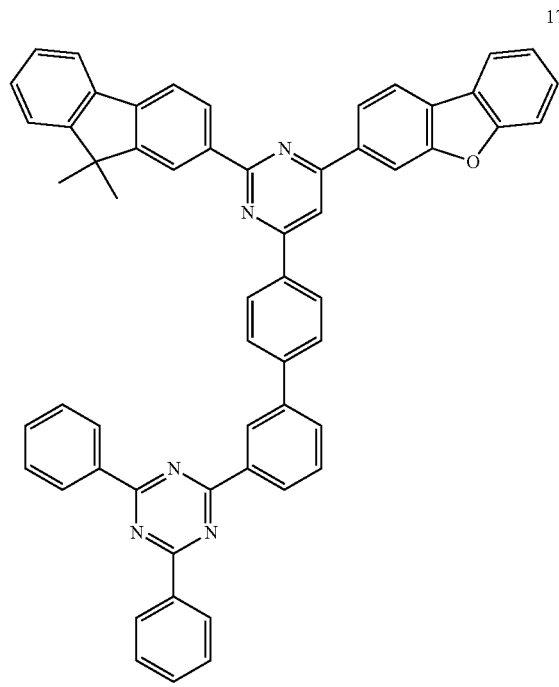
177
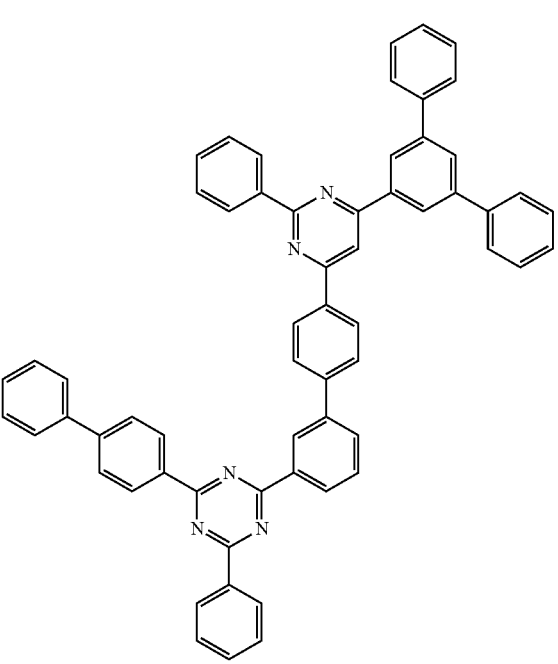

178
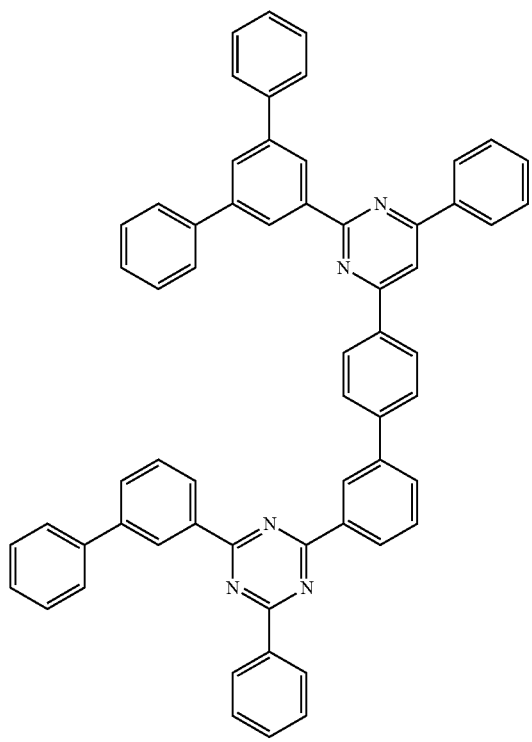
179
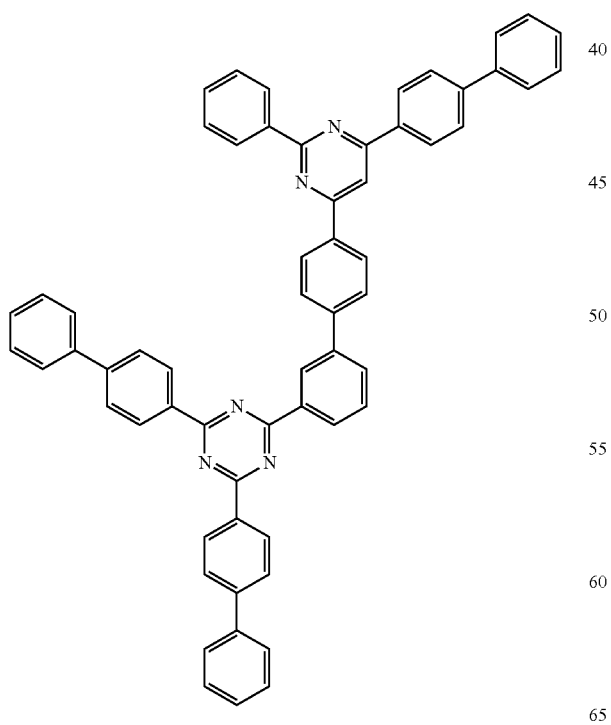
180
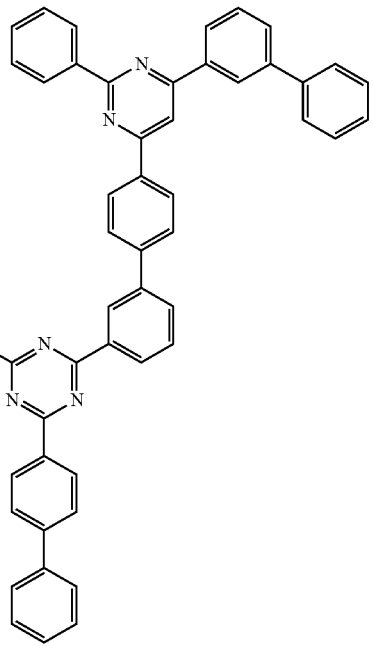
181
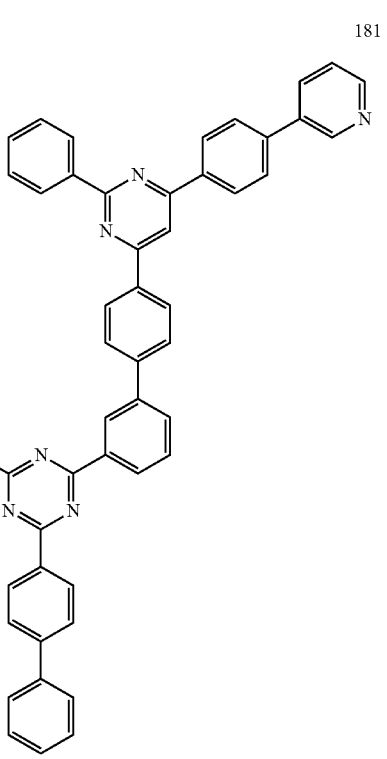

369
-continued
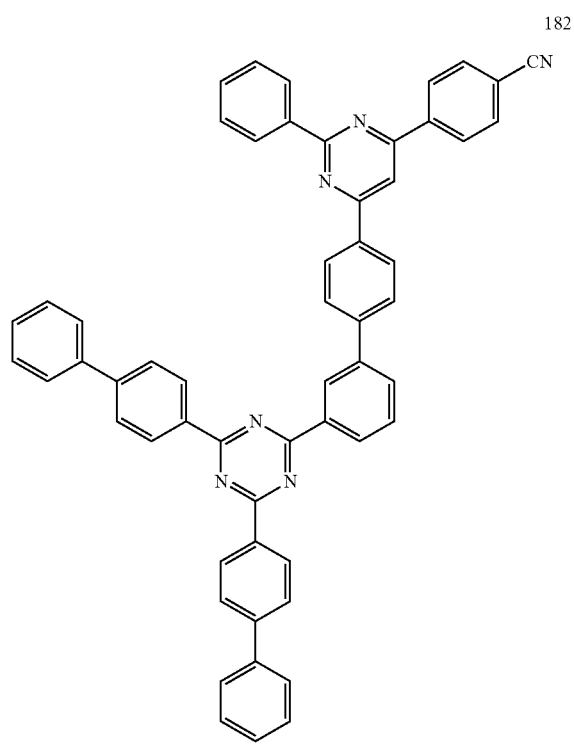
182
183
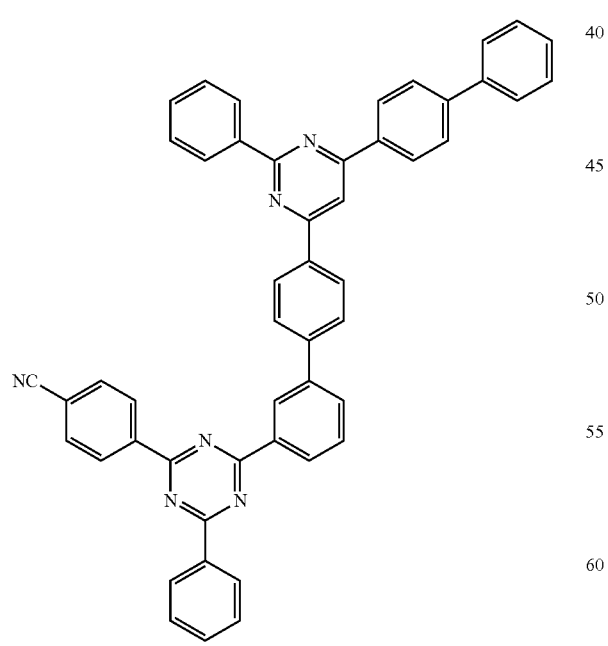
370
-continued
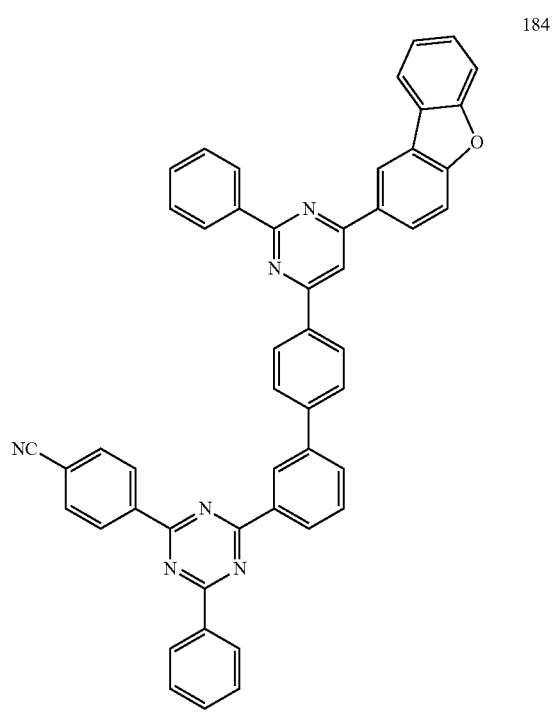
184
185

186
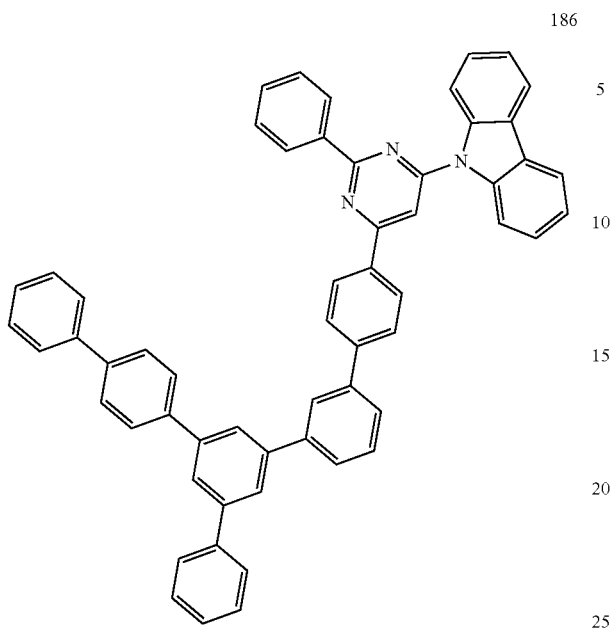
187
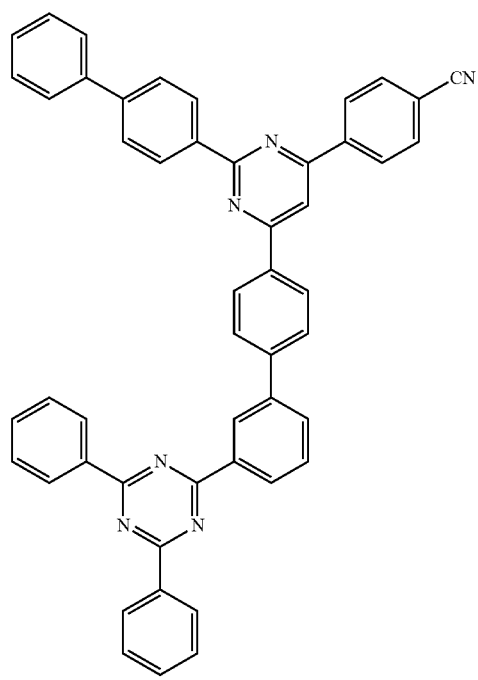
188
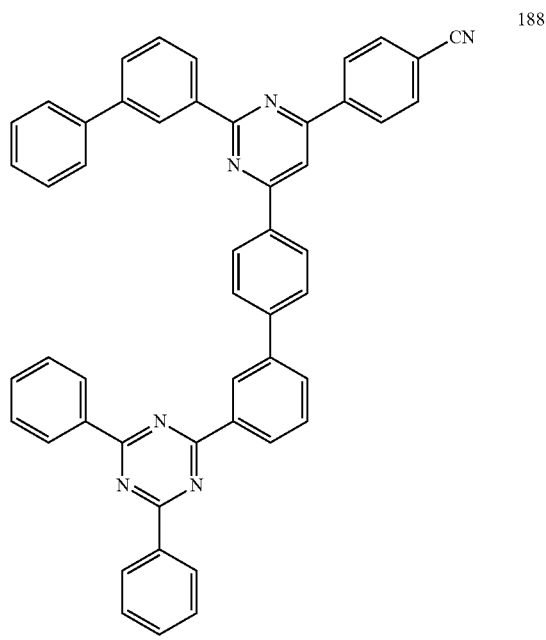
189
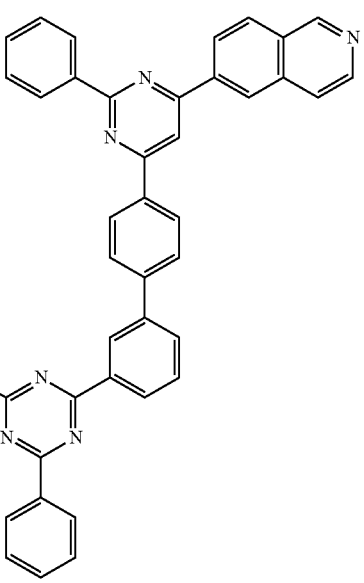

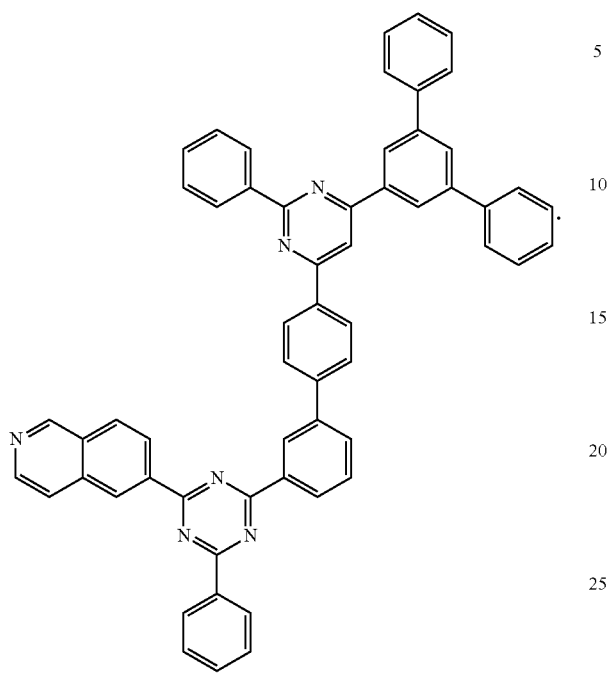
190
16. The electroluminescent device of claim 10, wherein the organic layer comprising the compound is selected from the group consisting of a light emitting layer, a light emitting auxiliary layer, a hole injection layer, a hole transport layer, an electron injection layer, an electron transport layer, and an electron transport auxiliary layer.
* * * * *